(12) United States Patent
Hatakeyama et al.

(10) Patent No.: US 8,703,404 B2
(45) Date of Patent: Apr. 22, 2014

(54) PATTERNING PROCESS

(75) Inventors: Jun Hatakeyama, Joetsu (JP); Masashi Iio, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 120 days.

(21) Appl. No.: 13/368,417

(22) Filed: Feb. 8, 2012

(65) Prior Publication Data

US 2012/0202158 A1 Aug. 9, 2012

(30) Foreign Application Priority Data

Feb. 9, 2011 (JP) .................................. 2011-025594

(51) Int. Cl.
*G03F 7/26* (2006.01)

(52) U.S. Cl.
USPC .......................... 430/322; 430/331; 430/270.1

(58) Field of Classification Search
USPC ........................................................ 430/322
See application file for complete search history.

(56) References Cited

U.S. PATENT DOCUMENTS

| | | | |
|---|---|---|---|
| 5,262,280 A * | 11/1993 | Knudsen et al. ............. | 430/312 |
| 6,448,420 B1 | 9/2002 | Kinsho et al. | |
| 6,599,683 B1 * | 7/2003 | Torek et al. .................. | 430/326 |
| 7,455,952 B2 | 11/2008 | Hatakeyama et al. | |
| 7,537,880 B2 | 5/2009 | Harada et al. | |
| 7,642,034 B2 | 1/2010 | Hatakeyama et al. | |
| 7,670,750 B2 | 3/2010 | Harada et al. | |
| 7,771,913 B2 | 8/2010 | Kaneko et al. | |
| 8,088,537 B2 | 1/2012 | Hatakeyama et al. | |
| 2003/0087179 A1 * | 5/2003 | Iwasaki ........................ | 430/166 |
| 2005/0164507 A1 * | 7/2005 | Li et al. ......................... | 438/689 |
| 2006/0105269 A1 * | 5/2006 | Khojasteh et al. ......... | 430/270.1 |
| 2007/0122741 A1 | 5/2007 | Hatakeyama et al. | |
| 2008/0090172 A1 | 4/2008 | Hatakeyama et al. | |
| 2009/0081595 A1 * | 3/2009 | Hatakeyama et al. ....... | 430/323 |
| 2010/0323305 A1 | 12/2010 | Tsubaki et al. | |

FOREIGN PATENT DOCUMENTS

| | | |
|---|---|---|
| JP | 2000-327633 A | 11/2000 |
| JP | 2006-091798 A | 4/2006 |
| JP | 3790649 B2 | 6/2006 |
| JP | 2007-297590 A | 11/2007 |
| JP | 2007-316581 A | 12/2007 |
| JP | 2008-081716 A | 4/2008 |
| JP | 2008-111089 A | 5/2008 |
| JP | 2008-111103 A | 5/2008 |
| JP | 2008-122932 A | 5/2008 |

(Continued)

OTHER PUBLICATIONS

Nakao,Shuji et al., "0.12γm Hole Pattern Formation by KrF Lithography for Giga Bit DRAM", IEEE, 1996, pp. 3.2.1-3.2.4.

(Continued)

*Primary Examiner* — Cynthia Kelly
*Assistant Examiner* — Caleen Sullivan
(74) *Attorney, Agent, or Firm* — Westerman, Hattori, Daniels & Adrian, LLP

(57) ABSTRACT

A negative pattern is formed by coating a resist composition onto a substrate, exposure, bake, and development in alkaline water. The resist composition comprises a polymer comprising acid labile group-containing recurring units, adapted to turn soluble in alkaline developer under the action of acid, an acid generator and/or an acid, a photobase generator capable of generating an amino-containing compound, a quencher for neutralizing acid for inactivation, and an organic solvent.

21 Claims, 24 Drawing Sheets

(56) References Cited

FOREIGN PATENT DOCUMENTS

| JP | 2009-019113 | * | 1/2009 |
| JP | 2009-205132 A | | 9/2009 |
| JP | 4554665 B2 | | 9/2010 |

OTHER PUBLICATIONS

Nakamura, Hiroko et al., "Contact Hole Formation by Multiple Exposure Technique in Ultra-low k1 Lithography", Proc. of SPIE, 2004, pp. 255-263, vol. 5377.

Owe-Yang, D.C. et al., "Double exposure for the contact layer of the 65-nm mode", Proc of SPIE, 2005, pp. 171-180, vol. 5753.

Truffert, V. et al., "Ultimate contact hole resolution using immersion lithography with line/space imaging", Proc. of SPIE, 2009, pp. 72740N-1-72740N12, vol. 7274.

Hatakeyama, Jun et al., "Inactivation technology for pitch doubling lithography", Proc. of SPIE, 2010, pp. 76392U-1-76392U-11, vol. 7639.

Richter, E. et al., "Negative Tone Resist for Phase-Shifting Mask Technology: A Progress Report", Proc. of SPIE, 2002, pp. 91-101, vol. 3999.

* cited by examiner

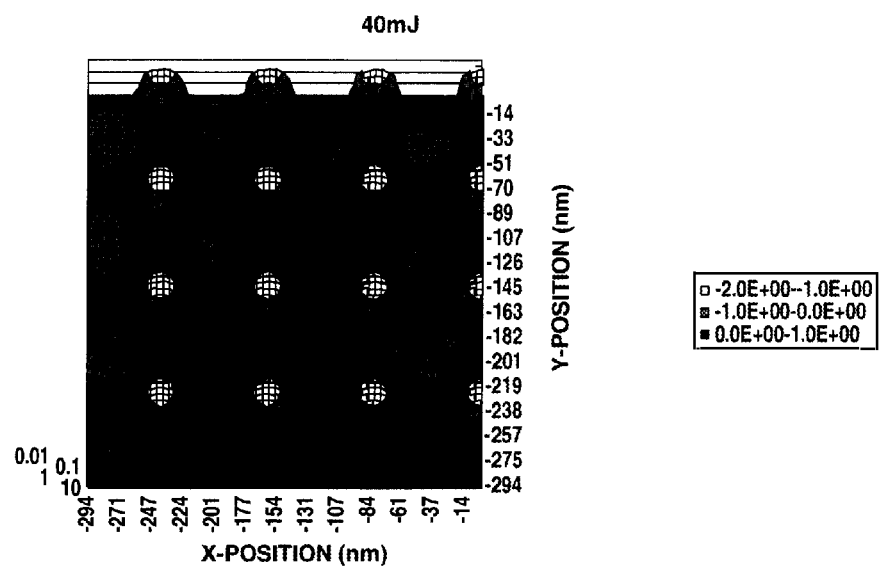
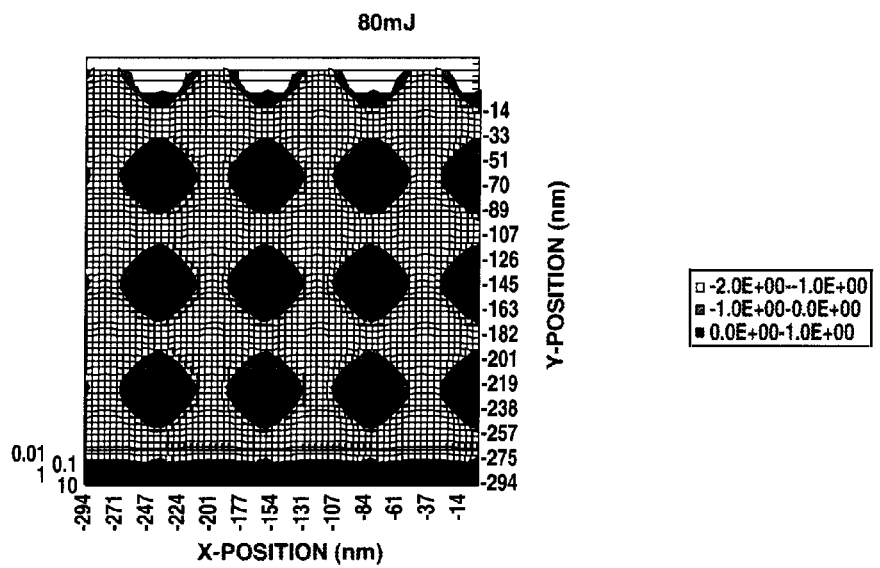

PATTERNING PROCESS

CROSS-REFERENCE TO RELATED APPLICATION

This non-provisional application claims priority under 35 U.S.C. §119(a) on Patent Application No. 2011-025594 filed in Japan on Feb. 9, 2011, the entire contents of which are hereby incorporated by reference.

TECHNICAL FIELD

This invention relates to a negative pattern forming process including one or two exposures and development in alkaline water to form a hole pattern at a high resolution.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 μm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 μm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with the mass-scale fabrication of 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was abandoned and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line edge or width roughness (LER, LWR) of resist film, defect-free MoSi laminate mask, reduced aberration of reflection mirror, and the like.

Another candidate for the 32-nm node lithography is high refractive index liquid immersion lithography. The development of this technology was abandoned because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

As compared with the line pattern, the hole pattern is difficult to reduce the feature size. In order for the prior art method to form fine holes, an attempt is made to form fine holes by under-exposure of a positive resist film combined with a hole pattern mask. This, however, results in the exposure margin being extremely narrowed. It is then proposed to form holes of greater size, followed by thermal flow or RELACS® method to shrink the holes as developed. However, there is a problem that control accuracy becomes lower as the pattern size after development and the size after shrinkage differ greater and the quantity of shrinkage is greater. With the hole shrinking method, the hole size can be shrunk, but the pitch cannot be narrowed.

It is then proposed in Non-Patent Document 1 that a pattern of X-direction lines is formed in a positive resist film using dipole illumination, the resist pattern is cured, another resist material is coated thereon, and a pattern of Y-direction lines is formed in the other resist film using dipole illumination, leaving a lattice-like line pattern, interstices of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in Non-Patent Document 2 to form a hole pattern by exposure of a negative resist film through a Levenson phase shift mask of X-direction lines combined with a Levenson phase shift mask of Y-direction lines. However, the crosslinking negative resist film has the drawback that the resolving power is low as compared with the positive resist film, because the maximum resolution of ultrafine holes is determined by the bridge margin.

A hole pattern resulting from a combination of two exposures of X- and Y-direction lines and subsequent image reversal into a negative pattern can be formed using a high-contrast line pattern of light. Thus holes having a narrow pitch and fine size can be opened as compared with the prior art. However, two exposures must be performed while exchanging the mask, leaving problems including reduced throughputs and misregistration between two exposures.

Non-Patent Document 3 reports three methods for forming hole patterns via image reversal. The three methods are: method (1) involving subjecting a positive resist composition to two double-dipole exposures of X and Y lines to form a dot pattern, depositing a $SiO_2$ film thereon by LPCVD, and effecting $O_2$-RIE for reversal of dots into holes; method (2) involving forming a dot pattern by the same steps as in (1), but using a resist composition designed to turn alkali-soluble and solvent-insoluble upon heating, coating a phenol-base overcoat film thereon, effecting alkaline development for image reversal to form a hole pattern; and method (3) involving double dipole exposure of a positive resist composition and organic solvent development for image reversal to form holes.

The formation of negative pattern through organic solvent development is a traditional technique. A resist composition comprising cyclized rubber is developed using an alkene such as xylene as the developer. An early chemically amplified resist composition comprising poly(t-butoxycarbonyloxystyrene) is developed with anisole as the developer to form a negative pattern.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkali development and organic solvent development is under study.

As the ArF resist composition for negative tone development with organic solvent, positive ArF resist compositions of the prior art design may be used. One pattern forming process is described in Patent Document 1.

In the practice of organic solvent development, a negative pattern can be formed using a common resist material which functions as a positive resist material on alkaline development and a specific organic solvent as the developer. The dissolution rate of unexposed region in organic solvent developer is one or two orders of magnitude lower than the dissolution rate of exposed region in alkaline developer. This implies that if exposure light is of the same optical contrast, the negative pattern resulting from organic solvent development has a narrower margin and a lower maximum resolution than the positive pattern resulting from alkaline development.

When negative development in organic solvent is carried out using a positive resist material, the resist film formed after development contains a large amount of methacrylic acid with the protective group deprotected. Methacrylic acid has little etch resistance because it is free of cyclic structure and rich in oxygen. The negative development has the problem that the resist film after development has so weak etch resistance that dimensional variations may occur during etching transfer of the resist pattern. This is demonstrated in Non-Patent Document 3 reporting the organic solvent development process wherein the dimensional variation after etching is greater than the dimensional variation after development.

Since the organic solvent development process uses organic solvents as both developer and rinse, it is very expensive as compared with the conventional process using alkaline developer and water rinse. It is a negative resist material that can form a negative pattern through common alkaline development. However, crosslinking negative resist material suffers from low maximum resolution due to swell during development. It would be desirable to have a negative resist material which is applicable to alkaline development and exhibits high resolution.

Non-Patent Document 4 reports a dual-tone resist material having both acid generator and base generator added. The material is based on a polymer having both an acid labile group and an adhesive group as used in conventional positive resist materials. A low exposed region forms a positive pattern and a more exposure dose region becomes a negative pattern. Using the material, lines of negative pattern can be formed between lines of positive pattern through a single exposure, leading to a doubling of resolution.

Non-Patent Document 5 proposes a resist material comprising a polymer comprising methacrylate substituted with t-butyl as an acid labile group and maleic anhydride copolymerized therewith, a thermal acid generator in the form of benzylcyclopentylsulfonium trifluoromethanesulfonate, and a photobase generator. The photobase generator generates a base upon exposure to light, and the thermal acid generator generates an acid during high-temperature PEB. The negative pattern formed by alkaline development is converted, through silylation of maleic anhydride with diaminosiloxane and dry etching, into a negative pattern with a high aspect ratio.

CITATION LIST

Patent Document 1: JP 4554665
Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)
Non-Patent Document 4: Proc. SPIE Vol. 7639, p. 76392U-1 (2010)
Non-Patent Document 5: Proc. SPIE Vol. 3999, p. 91 (2000)

DISCLOSURE OF INVENTION

As alluded to previously, the attempt to form a hole pattern by negative development with organic solvent is expensive as compared with the alkaline water development, and the resist pattern after development has extremely low etch resistance. The attempt to form a negative pattern using a crosslinking negative resist material and an alkaline developer fails to resolve a fine hole pattern because the negative resist material has a low resolution in itself.

An object of the invention is to provide a pattern forming process involving using a positive resist material featuring a high resolution and etch resistance, deprotecting the protective group in the positive resist material, and effecting alkaline development, for thereby forming a negative pattern without detracting from etch resistance.

The inventors have found the following. A resist film is formed of a dual-tone resist composition comprising a polymer having a tertiary ester acid labile group containing a cyclic structure and/or an acetal acid labile group, which is substantially insoluble in alkaline developer, as a base resin, a photoacid generator, a quencher, and a photobase generator wherein the total amount of amino group in the quencher and the compound generated by the photobase generator is greater than the amount of acid generated by the photoacid generator, or a negative tone resist composition comprising a thermal acid generator and/or an acid and a photobase generator wherein the amount of amino group in the compound generated by the photobase generator is greater than the total amount of the acid generated by the thermal acid generator and the acid separately added. The resist film is subjected to two exposures of two intersecting line patterns or exposure through a mask bearing a dot pattern or lattice-like pattern. As the exposure dose is increased, the positive portion of resist film is dissolved and the negative portion of resist film is retained. Thus a hole pattern is formed via image reversal.

Accordingly, the invention provides a pattern forming process as defined below.

[1] A pattern forming process comprising the steps of coating a resist composition onto a substrate, exposure, bake, and development in alkaline water to form a negative pattern,
the resist composition comprising a polymer comprising recurring units having a tertiary ester acid labile group containing a cyclic structure and/or an acetal acid labile group, adapted to turn soluble in alkaline developer under the reaction by acid, an acid generator and/or an acid, a photobase generator capable of generating an amino-containing compound, an optional quencher for neutralizing the acid generated by the acid generator for inactivation, and an organic solvent.

[2] The process of [1] wherein the sum of a molar amount of amino group in the quencher and a molar amount of amino group in the compound generated by the photobase generator is greater than the sum of a molar amount of the acid generated by the acid generator and a molar amount of the acid separately added.

[3] The process of [1] or [2] wherein the acid generator generates an acid upon exposure to radiation.

[4] The process of [1], [2] or [3] wherein the acid generator is to generate sulfonic acid, imide acid or methide acid upon exposure to radiation.

[5] The process of [1] or [2] wherein the acid generator generates an acid upon application of heat.

[6] The process of [5] wherein the acid generator is a thermal acid generator comprising a trialkylsulfonium salt of 1 to 10 carbon atoms.

[7] The pattern forming process of [1], comprising the steps of coating a resist composition onto a substrate, bake, exposure, post-exposure bake, and development to form a negative pattern in which a more dose region of resist film is not dissolved and a less dose region of resist film is dissolved in alkaline developer,
the resist composition comprising a polymer comprising recurring units having a tertiary ester acid labile group containing a cyclic structure and/or an acetal acid labile group, adapted to turn soluble in alkaline developer under the reaction by acid, an acid, a photobase generator capable of generating an amino-containing compound, and an organic solvent.

[8] The process of [7] wherein the molar amount of amino group in the compound generated by the photobase generator is greater than the molar amount of the acid separately added.

[9] A pattern forming process comprising the steps of coating a resist composition onto a substrate, bake, exposure, post-exposure bake, and development to form a negative pattern in which a more dose region of resist film is not dissolved and a less dose region of resist film is dissolved in alkaline developer,
the resist composition comprising a polymer comprising recurring units having a tertiary ester acid labile group containing a cyclic structure and/or an acetal acid labile group, adapted to turn soluble in alkaline developer under the reaction by acid, a sulfonium salt and/or iodonium salt, a photobase generator capable of generating an amino-containing compound, a quencher having an amino group for neutralizing the acid generated by the sulfonium salt and/or iodonium salt for inactivation, and an organic solvent.

[10] A pattern forming process comprising the steps of coating a resist composition onto a substrate, bake, exposure, post-exposure bake, and development to form a negative pattern in which a more dose region of resist film is not dissolved and a less dose region of resist film is dissolved in alkaline developer,
the resist composition comprising a polymer comprising recurring units having a tertiary ester acid labile group containing a cyclic structure and/or an acetal acid labile group and recurring units having a sulfonium salt, adapted to turn soluble in alkaline developer under the reaction by acid, a photobase generator capable of generating an amino-containing compound, a quencher having an amino group for neutralizing the acid generated by the sulfonium salt-containing recurring unit for inactivation, and an organic solvent.

[11] The process of [9] wherein the sum of a molar amount of amino group in the quencher and a molar amount of amino group in the compound generated by the photobase generator is greater than the molar amount of the acid generated by the sulfonium salt and/or iodonium salt.

[12] The process of [10] wherein the sum of a molar amount of amino group in the quencher and a molar amount of amino group in the compound generated by the photobase generator is greater than the molar amount of the acid generated by the sulfonium salt-containing recurring unit.

[13] The process of [9], [10], [11] or [12] wherein the acid generator is to generate sulfonic acid, imide acid or methide acid upon exposure to radiation.

[14] The process of any one of [1] to [13] wherein the photobase generator is photo-decomposed to generate an amino-containing compound.

[15] The process of any one of [1] to [14] wherein the photobase generator has a partial structure represented by the following formula (i), (ii) or (iii).

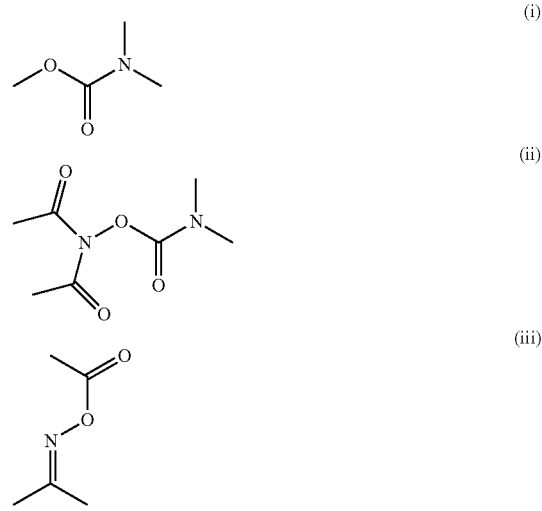

[16] The process of [15] wherein the photobase generator comprises a recurring unit (a1), (a2), (a3) or (a4) in the general formula (1), the recurring unit being attached to the backbone of the polymer.

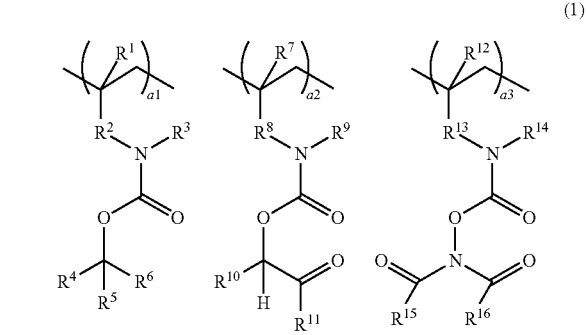

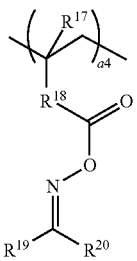

Herein $R^1$, $R^7$, $R^{12}$ and $R^{17}$ each are hydrogen or methyl; $R^2$, $R^8$, $R^{13}$ and $R^{18}$ each are a single bond, methylene, ethylene, phenylene, phenylmethylene, phenylethylene, phenylpropylene, or —C(=O)—O—$R^{21}$—; $R^{21}$ is a straight, branched or cyclic $C_1$-$C_{10}$ alkylene group, $C_6$-$C_{10}$ arylene group, or $C_2$-$C_{12}$ alkenylene group; $R^3$, $R^9$ and $R^{14}$ each are hydrogen, a straight, branched or cyclic $C_1$-$C_{10}$ alkyl group, or $C_6$-$C_{10}$ aryl group, or may bond with $R^{21}$ to form a ring with the nitrogen atom to which they are attached; $R^4$, $R^5$ and $R^6$ each are hydrogen, a straight, branched or cyclic $C_1$-$C_{10}$ alkyl group, or a $C_6$-$C_{14}$ aryl group which may contain a straight, branched or cyclic $C_1$-$C_6$ alkyl, $C_1$-$C_6$ alkoxy, nitro, halogen, cyano or trifluoromethyl radical, or a pair of $R^4$ and $R^5$, $R^5$ and $R^6$, or $R^4$ and $R^6$ may bond together to form a ring with the carbon atom to which they are attached, with the proviso that not all $R^4$, $R^5$ and $R^6$ are hydrogen nor all are alkyl; $R^{10}$ and $R^{11}$ each are a $C_6$-$C_{14}$ aryl group which may contain a straight, branched or cyclic $C_1$-$C_6$ alkyl, $C_1$-$C_6$ alkoxy, nitro, halogen, cyano, trifluoromethyl or carbonyl radical; $R^{15}$ and $R^{16}$ each are a straight or branched $C_1$-$C_6$ alkyl group, or $R^{15}$ and $R^{16}$ may bond together to form a ring with the carbon atoms to which they are attached and the nitrogen atom therebetween, the ring may contain a benzene ring, naphthalene ring, double bond or ether bond; $R^{19}$ and $R^{20}$ each are hydrogen, a straight, branched or cyclic $C_1$-$C_8$ alkyl group, or a $C_6$-$C_{14}$ aryl group which may have a substituent as listed for $R^4$, $R^5$ and $R^6$, at least one of $R^{19}$ and $R^{20}$ is aryl, or both $R^{19}$ and $R^{20}$ may be aryl, or $R^{19}$ and $R^{20}$ may bond together to form a ring with the carbon atom to which they are attached; a1, a2, a3, and a4 are in the range: 0≤a1<1.0, 0≤a2<1.0, 0≤a3<1.0, 0≤a4<1.0, and 0<a1+a2+a3+a4<1.0.

[17] The process of [15] wherein the photobase generator is at least one compound selected from compounds having the general formulae (2) to (9).

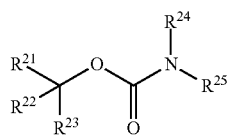

(2)

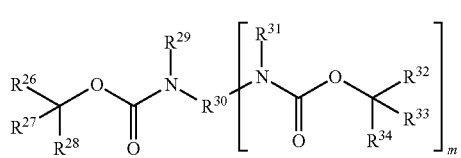

(3)

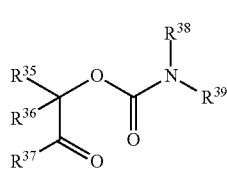

(4)

(5)

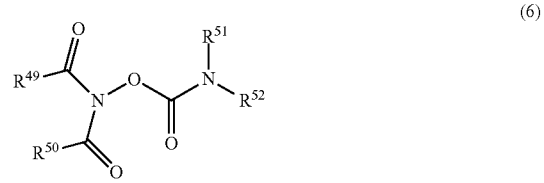

(6)

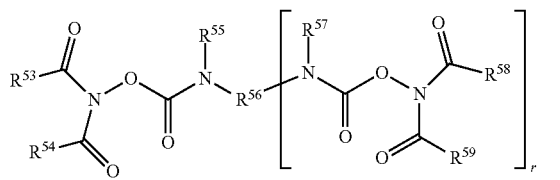

(7)

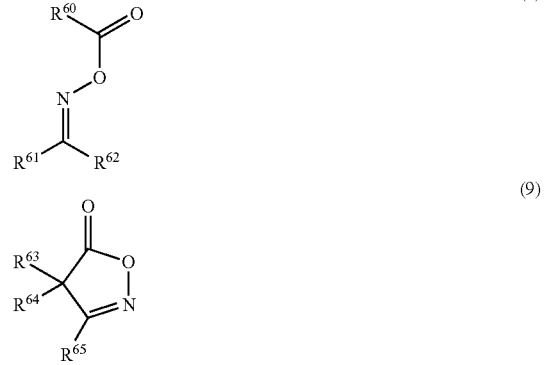

(8)

(9)

Herein $R^{21}$, $R^{22}$, $R^{23}$, $R^{26}$, $R^{27}$, $R^{28}$, $R^{32}$, $R^{33}$, $R^{34}$, $R^{35}$, $R^{36}$, $R^{37}$, $R^{40}$, $R^{41}$, $R^{42}$, $R^{46}$, $R^{47}$, and $R^{48}$ each are hydrogen, a straight, branched or cyclic $C_1$-$C_6$ alkyl group, or a $C_6$-$C_{14}$ aryl group which may contain a straight, branched or cyclic $C_1$-$C_6$ alkyl or alkoxy, nitro, halogen, cyano or trifluoromethyl radical, at least one of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ is an aryl group, and at least one is hydrogen, or at least two of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ may bond together to form a ring with the carbon atom to which they are attached; $R^{24}$, $R^{25}$, $R^{29}$, $R^{31}$, $R^{38}$, $R^{39}$, $R^{43}$, $R^{45}$, $R^{51}$, $R^{52}$, $R^{55}$, and $R^{57}$ each are hydrogen, or a straight, branched or cyclic $C_1$-$C_{12}$ alkyl group which may contain a double bond, ether, amino, carbonyl, hydroxyl, or ester radical, or a pair of $R^{24}$ and $R^{25}$, $R^{29}$ and $R^{31}$, $R^{29}$ and $R^{30}$, $R^{31}$ and $R^{30}$, $R^{38}$ and $R^{39}$, $R^{43}$ and $R^{44}$, $R^{44}$ and $R^{45}$, $R^{43}$ and $R^{45}$, $R^{51}$ and $R^{52}$, $R^{55}$ and $R^{56}$, $R^{55}$ and $R^{57}$, and $R^{56}$ and $R^{57}$ may bond together to form a ring with the nitrogen atom to which they are attached; $R^{30}$, $R^{44}$, and $R^{56}$ each are a single bond, a straight, branched or cyclic $C_1$-$C_{20}$ alkylene group, alkyne group, $C_6$-$C_{20}$ arylene group, $C_2$-$C_{12}$ alkenylene group, or $C_2$-$C_{12}$ alkynylene group, which may contain a double bond, ether, amino, carbonyl, hydroxyl or ester radical; $R^{49}$, $R^{50}$, $R^{53}$, $R^{54}$, $R^{58}$, and $R^{59}$ each are a straight or branched $C_1$-$C_6$ alkyl group, or a pair of $R^{49}$ and $R^{50}$, $R^{53}$ and $R^{54}$, and $R^{58}$ and $R^{59}$ may bond together to form a ring with the carbon atoms to which they are attached and the nitrogen atom therebetween, the ring may contain a benzene ring, naphthalene ring, double bond, or ether bond; $R^{60}$ is a straight, branched or cyclic $C_1$-$C_{16}$ alkyl group, $C_1$-$C_{20}$ aryl group, or $C_2$-$C_{20}$ alkenyl group; $R^{61}$ is a $C_6$-$C_{20}$ aryl group; $R^{62}$ is hydrogen, a straight, branched or cyclic $C_1$-$C_{16}$ alkyl group, or $C_6$-$C_{20}$ aryl group; $R^{63}$, $R^{64}$, and $R^{65}$ each are hydrogen, a straight, branched or cyclic $C_1$-$C_6$ alkyl group, $C_6$-$C_{14}$ aryl group, $C_2$-$C_{10}$ alkenyl or alkoxycarbonyl group, or cyano group, the alkyl, aryl, and alkenyl groups may contain a straight, branched or cyclic $C_1$-$C_6$ alkyl or alkoxy, alkoxycarbonyl, nitro, halogen, cyano, trifluoromethyl, sulfide, amino or ether radical; m, n and r each are 1 or 2.

[18] The pattern forming process of any one of [1] to [17] wherein the process involves positive/negative reversal, and the exposure step includes exposure to ArF excimer laser radiation of 193 nm wavelength, by the immersion lithography wherein water is interposed between a lens and the substrate or the dry lithography wherein air or nitrogen is present between a lens and the substrate.

[19] The pattern forming process of [18] wherein positive/negative reversal is carried out by two exposures of two intersecting line patterns, or exposure of a dot pattern or lattice-like pattern.

[20] The pattern forming process of [19] wherein the two intersecting line patterns, dot pattern or lattice-like pattern is borne on a halftone phase shift mask having a transmittance of 3 to 15%.

[21] The process of [20] wherein the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed.

[22] The process of [20] wherein the phase shift mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

[23] The process of any one of [1] to [22], further comprising the step of forming a protective film on the resist film prior to the exposure step, the protective film being formed of a material comprising a polymer having a 1,1,1,3,3,3-hexafluoro-2-propanol residue dissolved in an alcohol solvent of at least 4 carbon atoms, an ether solvent of 8 to 12 carbon atoms, or a mixture thereof.

A fine hole pattern can be formed by applying the pattern forming process defined herein.

As used herein, the term "amino group" including amino group released from the photobase generator and amino group in the quencher encompass, in addition to genuine amino groups, imino groups and other groups containing a nitrogen atom and providing basicity. That is, the term refers to nitrogen-containing basic groups.

ADVANTAGEOUS EFFECTS OF INVENTION

When a resist film formed of a resist composition comprising a polymer having a tertiary ester acid labile group containing a cyclic structure and/or an acetal acid labile group, which is substantially insoluble in alkaline developer, but turns soluble in alkaline developer under the action of acid, as a base resin, wherein the total amount of amino groups in a quencher and a compound generated by a photobase generator is greater than the total amount of acids generated by a photoacid generator and a sulfonium salt-containing recurring unit is lithographically processed, the resist film displays the dual-tone performance that unexposed and over-exposed regions do not dissolve in alkaline developer and an intermediate dose region dissolves in alkaline developer. When a resist composition is formulated by using a polymer as above and adding a thermal acid generator and/or an acid, it displays the negative performance that the unexposed region dissolves in alkaline developer and the exposed region is insoluble in alkaline developer. By pattern transfer using two masks bearing intersecting line patterns, or a mask bearing a dot or lattice-like pattern, a negative pattern is obtained. In this way, a fine hole pattern is formed.

BRIEF DESCRIPTION OF DRAWINGS

FIG. 1 is a cross-sectional view of a patterning process according one embodiment of the invention.

FIG. 14 illustrates a simulation resist configuration printed as in FIG. 13, but in a dose of 40 mJ/cm$^2$.

FIG. 15 illustrates a simulation resist configuration printed as in FIG. 13, but in a dose of 80 mJ/cm$^2$.

DESCRIPTION OF EMBODIMENTS

Figure 1A:
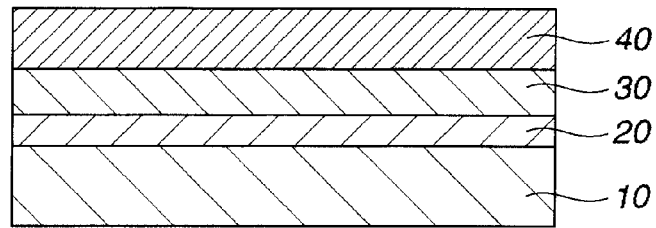
FIG. 1A shows a laminate of a substrate and a resist film disposed thereon.

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$—$C_m$) means a group containing from n to m carbon atoms per group. As used herein, the term "film" is used interchangeably with "coating" or "layer." The term "processable layer" is interchangeable with patternable layer and refers to a layer that can be processed such as by etching to form a pattern therein.

The abbreviations and acronyms have the following meaning.
PAG: photoacid generator
TAG: thermal acid generator
PBG: photobase generator
Mw: weight average molecular weight
Mn: number average molecular weight
Mw/Mn: molecular weight distribution or dispersity
GPC: gel permeation chromatography
PEB: post-exposure bake
PGMEA: propylene glycol monomethyl ether acetate
TMAH: tetramethylammonium hydroxide The invention is directed to a patterning process capable of forming a negative pattern via alkaline development using a polymer for conventional positive resist compositions. The inventors have found that a fine hole pattern can be formed by using a dual-tone resist composition comprising a photoacid generator and a photobase generator in combination or a negative tone resist composition comprising a thermal acid generator and/or an acid and a photobase generator in combination, and effecting exposure through masks having two intersecting line patterns or a mask having a dot pattern or lattice-like pattern, PEB, and development. The dual-tone resist composition has two, positive and negative threshold values. That is, this resist composition displays characteristics of positive resist material at a low exposure dose and characteristics of negative resist material at a high exposure dose. In Non-Patent Document 4, a resist composition with dual-tone characteristics is obtained by using an acid labile group-substituted polymer for conventional positive resist compositions and adding an acid generator, a base generator, and a quencher. In this regard, it is essential that the efficiency of base generation from the base generator be lower than the efficiency of acid generation from the acid generator, and the sum of a molar amount of amino group in the quencher and a molar amount of amino group released from the base generator be greater than the molar amount of acid generated by the acid generator. A region having received a low exposure dose displays a positive tone since the gradient of acid generation relative to an increasing dose is high, whereas a high exposure dose region where decomposition of the acid generator is almost completed displays a negative tone since the gradient of base generation from the base generator is high enough to neutralize the acid for inactivation. Non-Patent Document 4 reports that when the negative sensitivity divided by the positive sensitivity on a contrast curve is equal to 5, a negative line pattern of approximately equal size emerges between lines of a positive line pattern, achieving a doubling of resolution.

Figure 2:
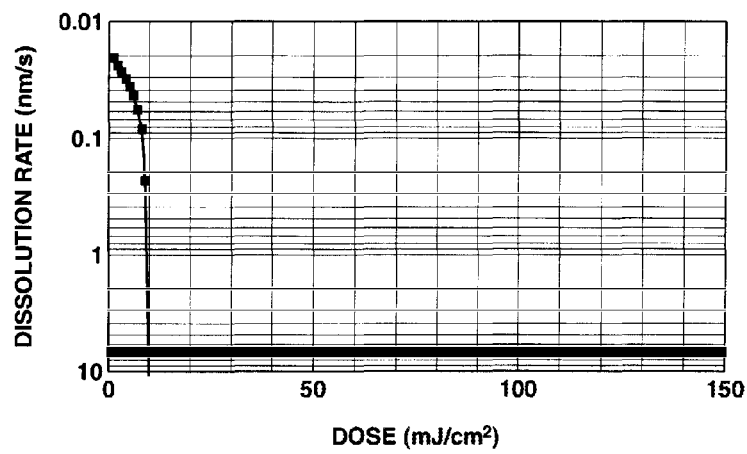
FIG. 2 diagrammatically shows a simulation contrast curve of a conventional positive resist composition.
Figure 3:
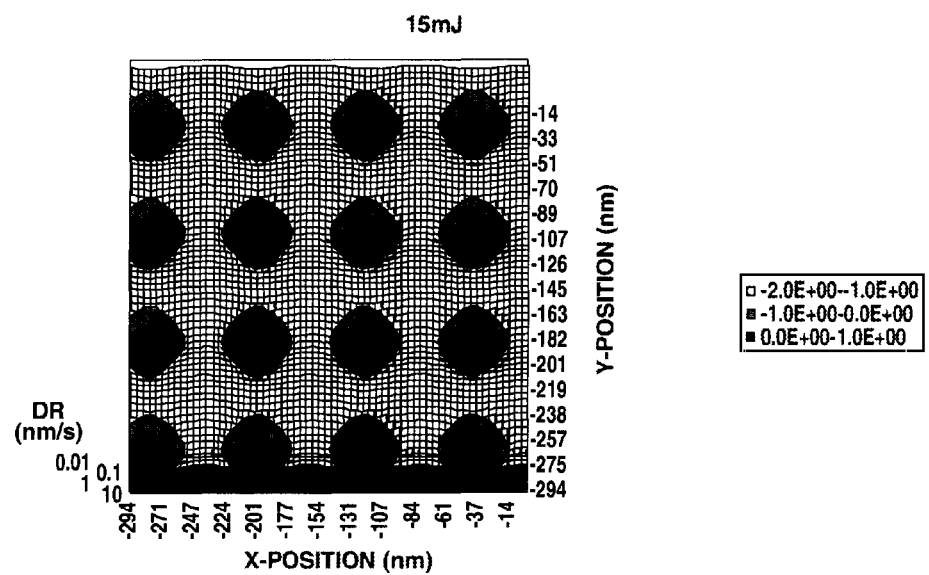
FIG. 3 illustrates a simulation resist configuration printed when a resist film of the resist composition of FIG. 2 is exposed by means of an ArF immersion scanner with NA 1.35 and dipole illumination plus azimuthally polarized illumination, through a halftone phase shift mask (transmittance 6%) bearing a 1:1 line-and-space pattern with an on-wafer size of 40 nm, specifically two exposures of X-direction lines and Y-direction lines in a dose of 15 mJ/cm$^2$, and developed.
Figure 4:
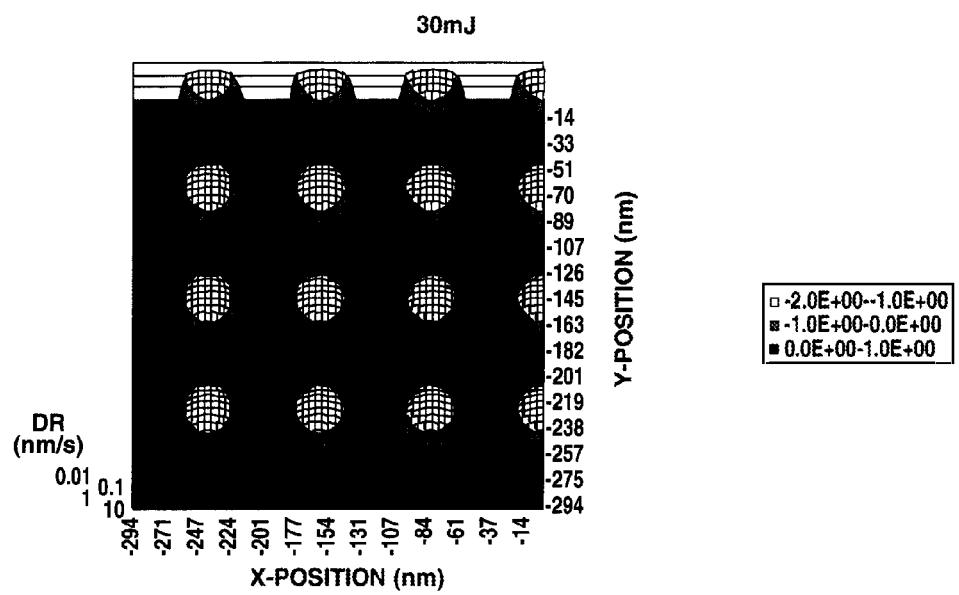
FIG. 4 illustrates a simulation resist configuration printed as in FIG. 3, but in a dose of 30 mJ/cm$^2$.
Figure 5:
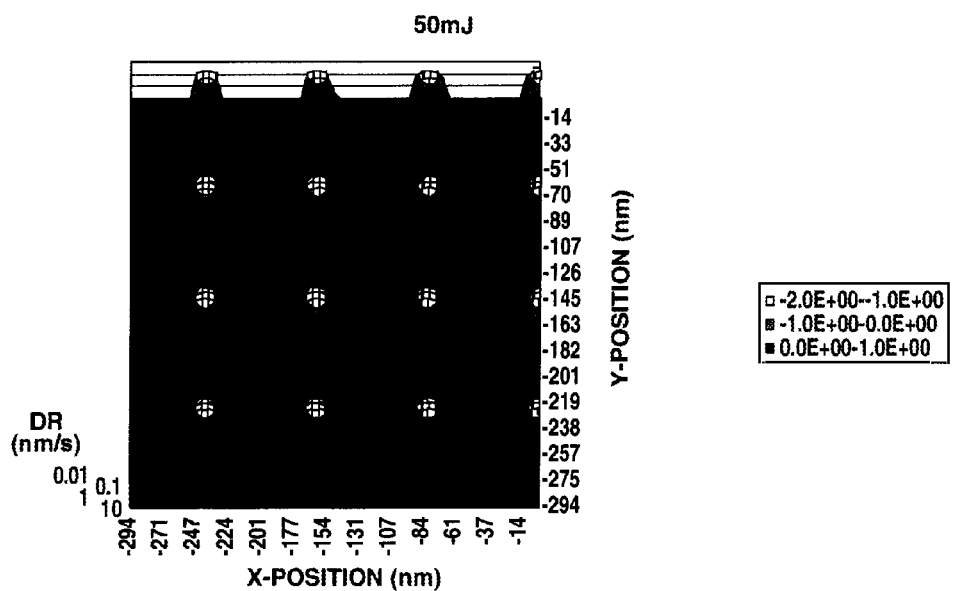
FIG. 5 illustrates a simulation resist configuration printed as in FIG. 3, but in a dose of 50 mJ/cm$^2$.
Figure 6:
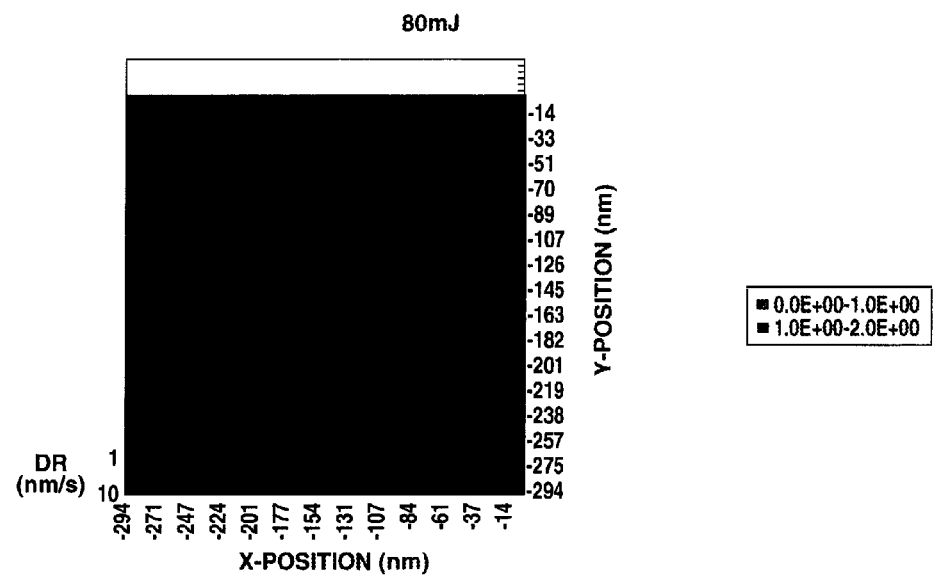
FIG. 6 illustrates a simulation resist configuration printed as in FIG. 3, but in a dose of 80 mJ/cm$^2$.

FIG. 2 diagrammatically shows a simulation contrast curve (or dissolution rate versus dose) of a conventional positive resist composition. FIGS. 3 to 6 illustrate simulation results of resist configurations printed using the resist composition of FIG. 2. A resist film is exposed by means of an ArF immersion scanner with NA 1.35 and dipole illumination plus azimuthally polarized illumination, through a halftone phase shift mask (transmittance 6%) bearing a 1:1 line-and-space pattern with an on-wafer size of 40 nm, specifically two exposures of X-direction lines and Y-direction lines, and developed. On exposure in a dose of 15 mJ/cm$^2$, holes are formed as shown in FIG. 3. In this case, the light contrast for forming a conventional hole pattern is low, and the margin of exposure dose is extremely narrow. FIG. 4 illustrates a resist configuration printed in a dose of 30 mJ/cm$^2$ wherein a pattern of dots is formed between the holes. As the dose is further increased to 50 mJ/cm$^2$, the size of dots is reduced as shown in FIG. 5. When the dose reaches 80 mJ/cm$^2$, dots are extinguished as shown in FIG. 6.

Figure 7:
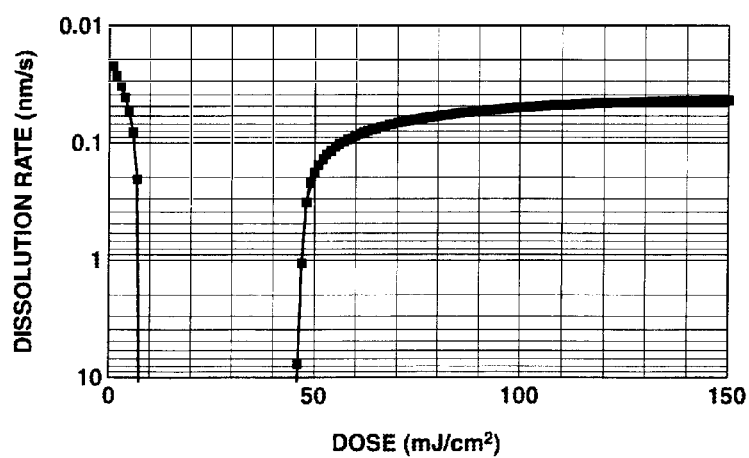
FIG. 7 diagrammatically shows a simulation contrast curve of a dual-tone resist composition in which a negative tone exposure dose is 5 times a positive tone exposure dose.
Figure 8:
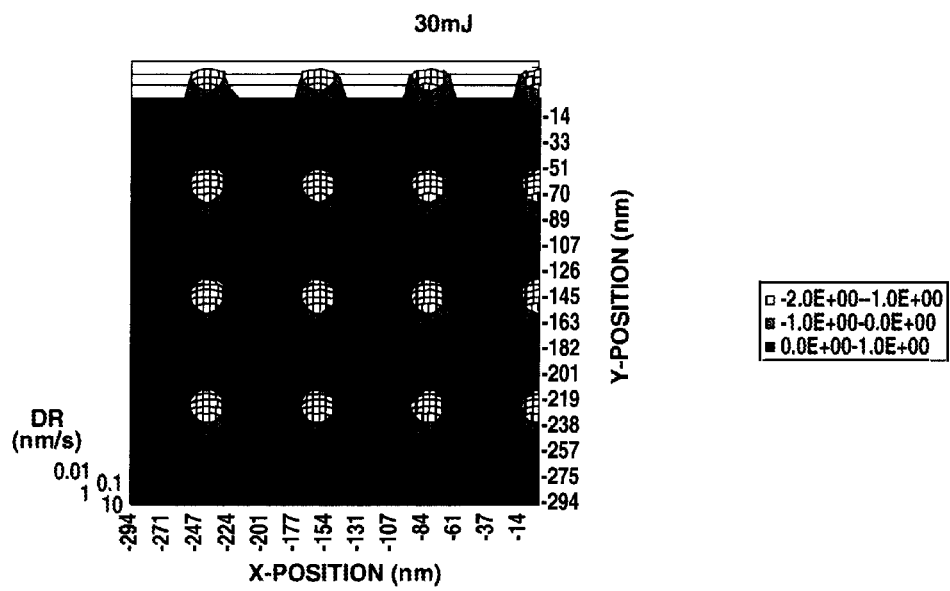
FIG. 8 illustrates a simulation resist configuration printed as in FIG. 3, but using the resist composition of FIG. 7 in a dose of 30 mJ/cm$^2$.
Figure 9:
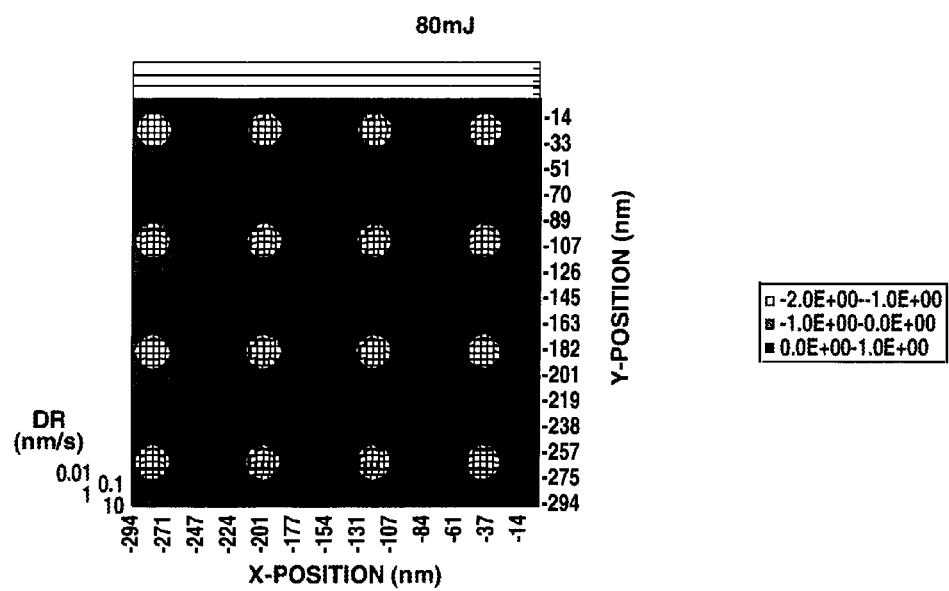
FIG. 9 illustrates a simulation resist configuration printed as in FIG. 8, but in a dose of 80 mJ/cm$^2$.
Figure 10:
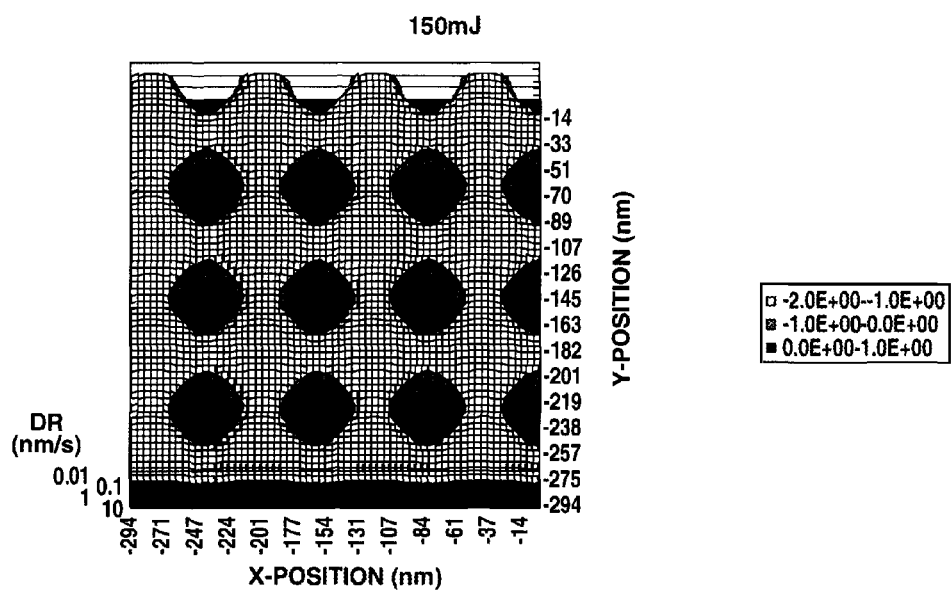
FIG. 10 illustrates a simulation resist configuration printed as in FIG. 8, but in a dose of 150 mJ/cm$^2$.
Figure 11:
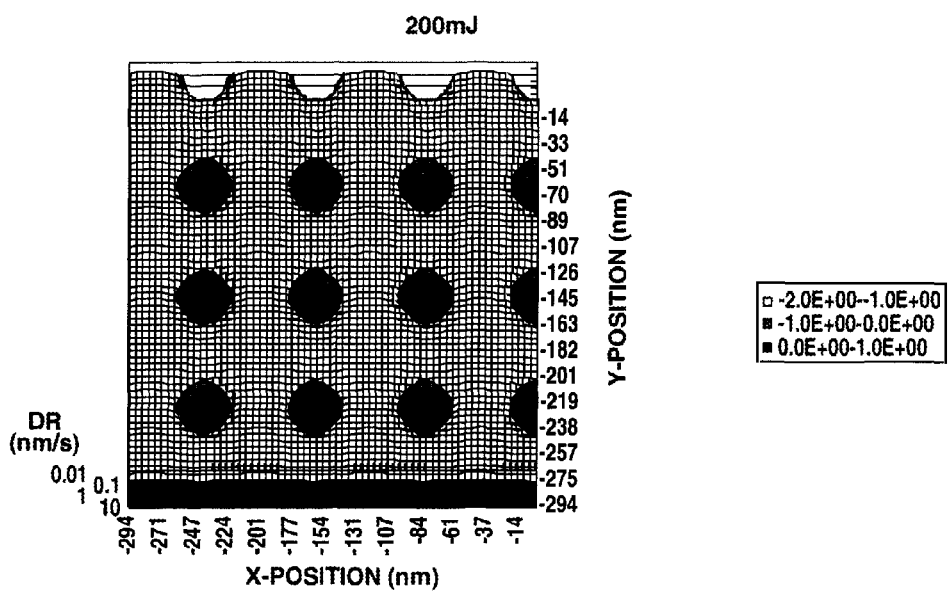
FIG. 11 illustrates a simulation resist configuration printed as in FIG. 8, but in a dose of 200 mJ/cm$^2$.

FIG. 7 diagrammatically shows a simulation contrast curve of a dual-tone resist composition in which a negative tone exposure dose is 5 times a positive tone exposure dose. On use of the resist composition having such a relationship of positive and negative tone doses, the pitch of a line pattern can be doubled as described above. When a resist film of this resist composition is similarly processed, a resist configuration of FIG. 8 is obtained at a dose of 30 mJ/cm$^2$ wherein a positive pattern of dots is formed like FIGS. 4 and 5. When the dose reaches 80 mJ/cm$^2$, positive dots are extinguished and instead, a negative pattern of dots appears between positive dots as shown in FIG. 9. When the dose is further increased to 150 mJ/cm$^2$, a negative pattern of dots is formed as shown in FIG. 10. As the dose is further increased, the hole size is reduced as shown in FIG. 11.

Figure 12:
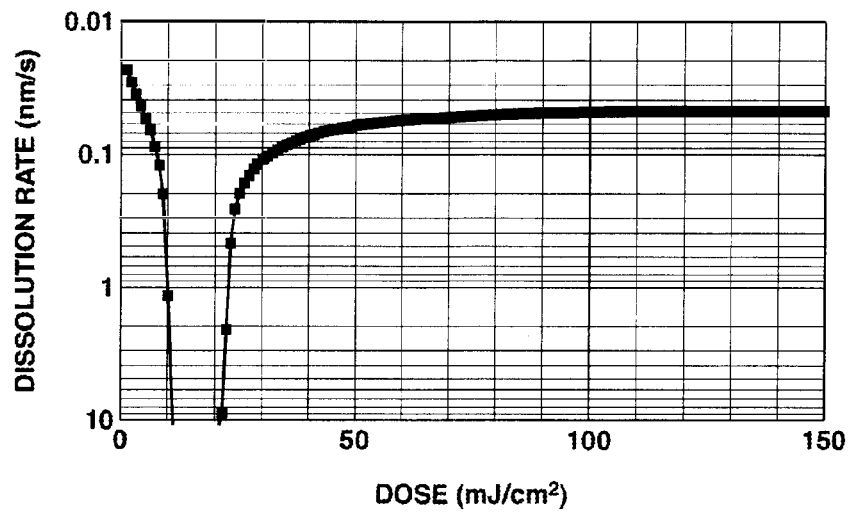
FIG. 12 diagrammatically shows a simulation contrast curve of a resist composition in which a negative tone exposure dose is 2 times a positive tone exposure dose.
Figure 13:
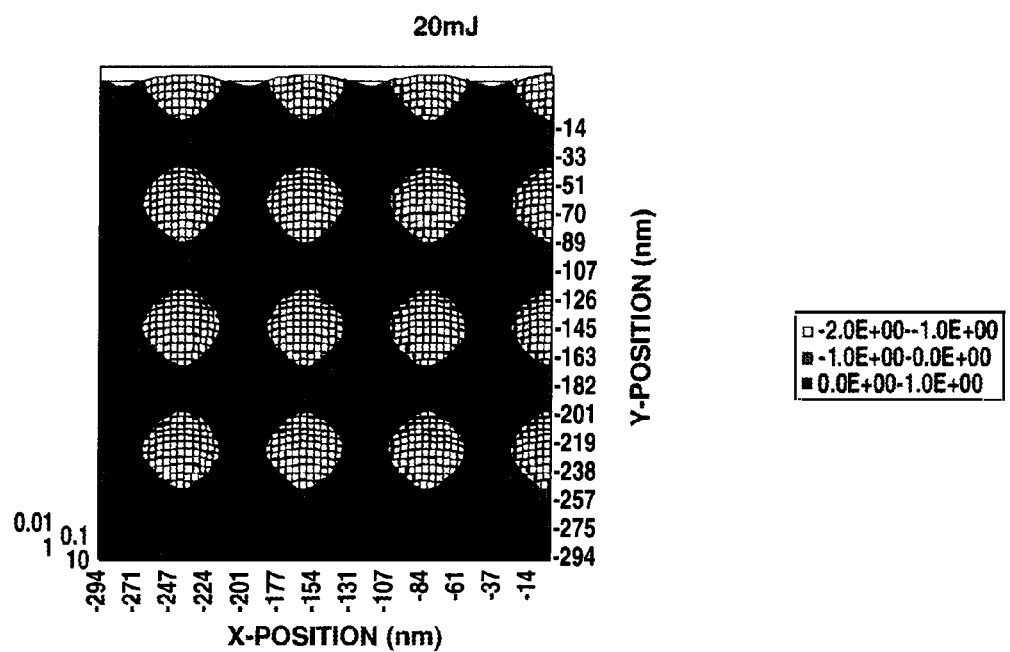
FIG. 13 illustrates a simulation resist configuration printed as in FIG. 3, but using the resist composition of FIG. 12 in a dose of 20 mJ/cm$^2$.
Figure 16:
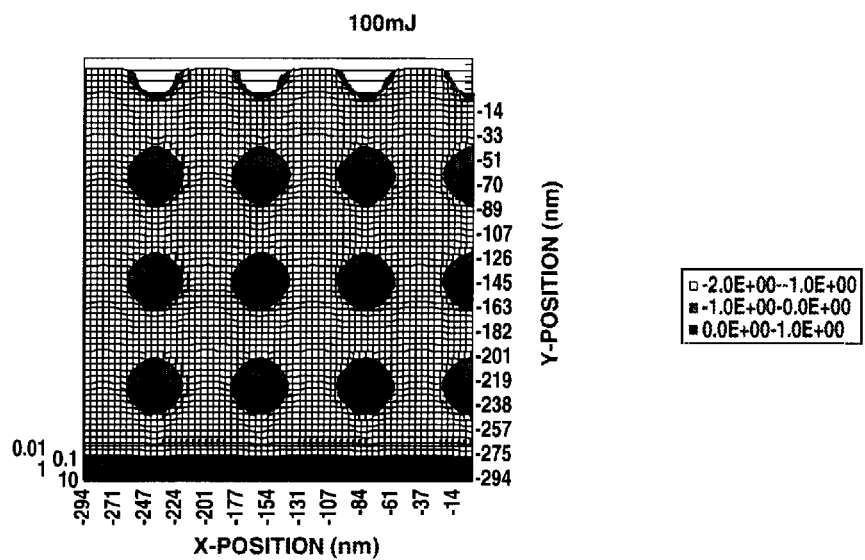
FIG. 16 illustrates a simulation resist configuration printed as in FIG. 13, but in a dose of 100 mJ/cm$^2$.

FIG. 12 diagrammatically shows a simulation contrast curve of a resist composition in which a negative tone exposure dose is 2 times a positive tone exposure dose. With this resist composition, the pitch of a line pattern cannot be doubled because the size of negative lines is significantly greater than the size of positive lines. A film of this resist composition is similarly subjected to double dipole exposure of X and Y-direction lines. Only a positive pattern is formed in a dose of 20 mJ/cm$^2$ as seen from FIG. 13. Both positive and negative dots appear in FIG. 14 corresponding to a dose of 40 mJ/cm$^2$. A negative pattern of holes is formed in a dose of 80 mJ/cm$^2$ as seen from FIG. 15. As the dose is further increased, the hole size is reduced as shown in FIG. 16.

With respect to the formation of a negative pattern of holes by image reversal according to the invention, it is concluded that the formation of a negative pattern of holes is possible even when the ratio of negative sensitivity to positive sensitivity is less than 5, and a lower ratio is rather preferred because the sensitivity at which the negative pattern is formed is improved. However, the dose margin for hole opening becomes narrow when the ratio of negative sensitivity to positive sensitivity is equal to or less than 1.5. Thus, the ratio should be at least 2.

Figure 17:
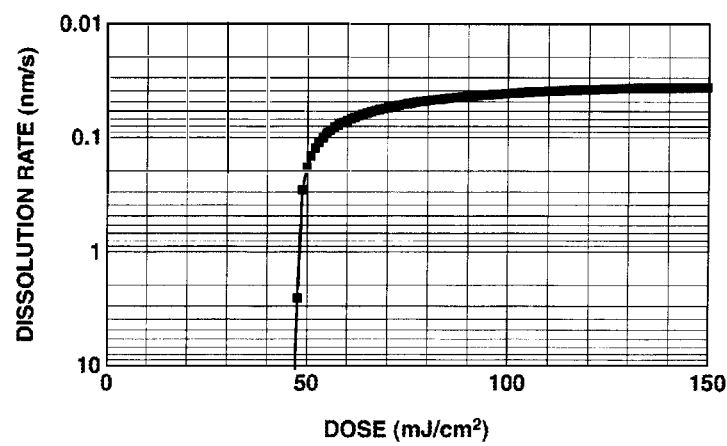
FIG. 17 diagrammatically shows a simulation contrast curve of a negative resist composition having an acid and/or thermal acid generator and a photobase generator added thereto.
Figure 18:
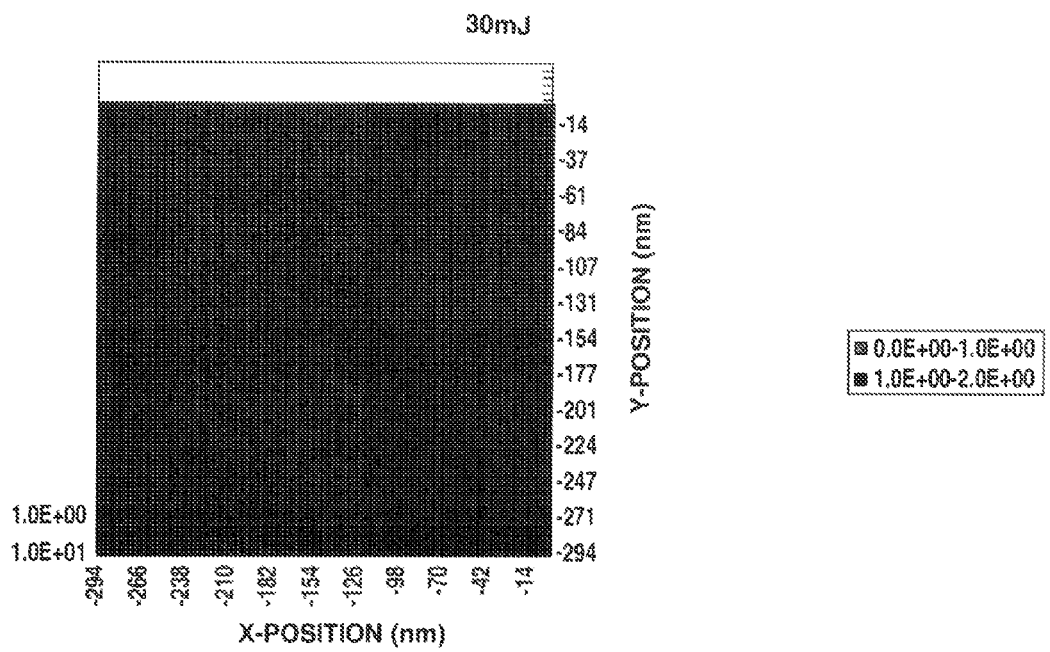
FIG. 18 illustrates a simulation resist configuration printed as in FIG. 3, but using the resist composition of FIG. 17 in a dose of 30 mJ/cm$^2$.
Figure 19:
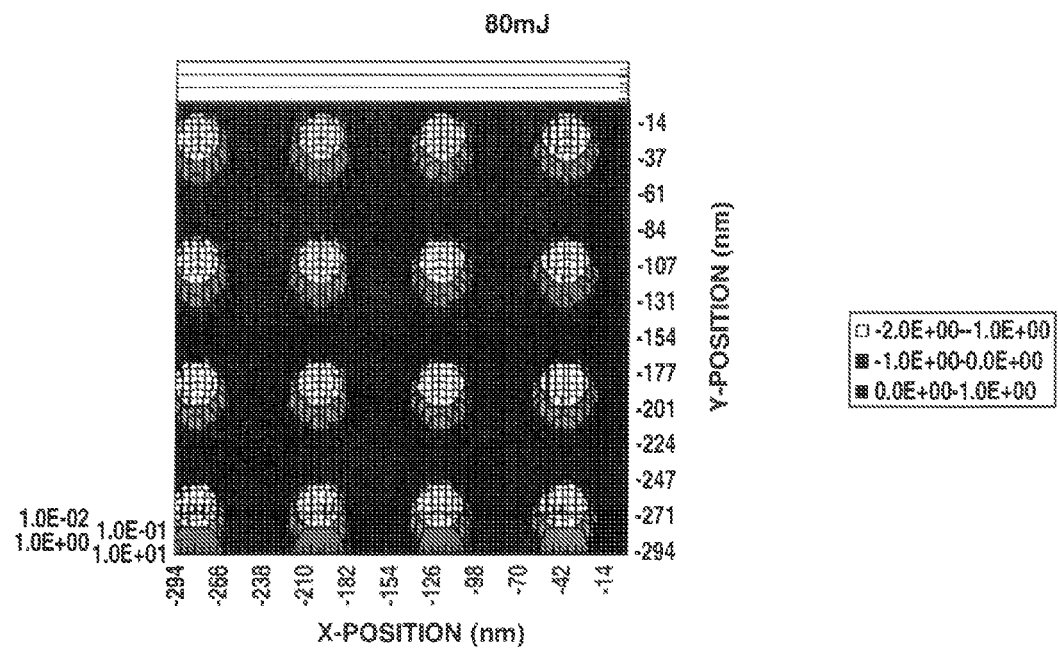
FIG. 19 illustrates a simulation resist pattern printed as in FIG. 18, but in a dose of 80 mJ/cm$^2$.
Figure 20:
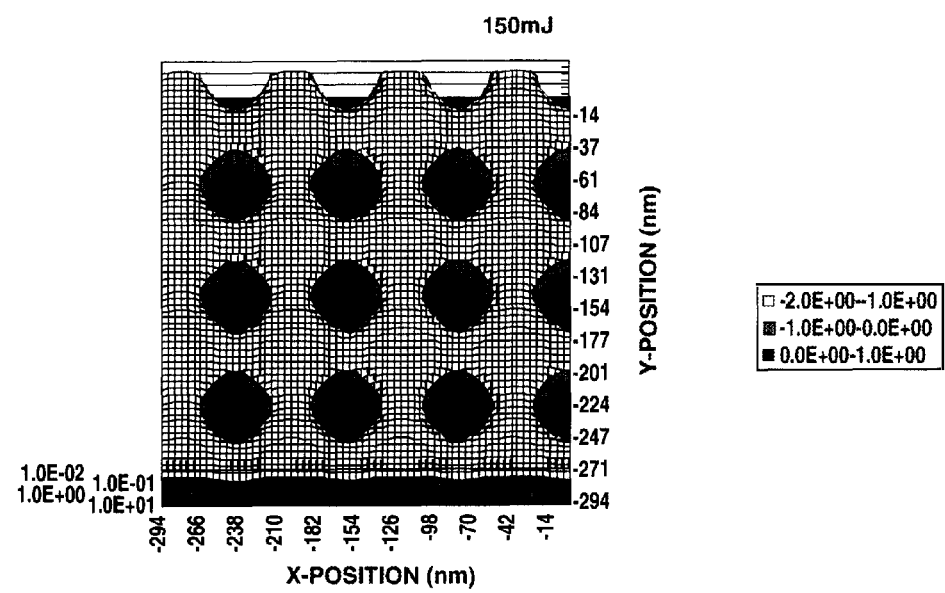
FIG. 20 illustrates a simulation resist pattern printed as in FIG. 18, but in a dose of 150 mJ/cm$^2$.
Figure 21:
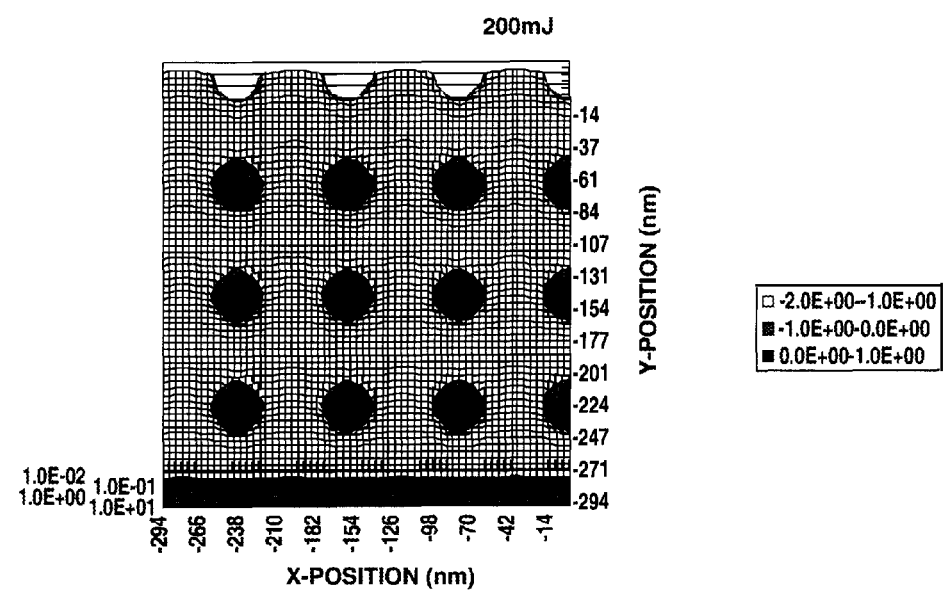
FIG. 21 illustrates a simulation resist pattern printed as in FIG. 18, but in a dose of 200 mJ/cm$^2$.

FIG. 17 diagrammatically shows negative tone characteristics of a resist composition comprising a thermal acid generator (TAG) and/or an acid combined with a photobase generator (PBG) wherein the molar amount of the PBG is greater than the total molar amount of the acid generated by the TAG and the acid separately added. A low dose region where deprotection with acid takes place is dissolved in alkaline developer, whereas a high dose region where no deprotection takes place because a total molar amount of amine is greater than a total molar amount of acid becomes insolubilized in alkaline developer. On use of the negative resist composition, the film is entirely dissolved in a low dose as shown in FIG. 18. As the dose is increased, a dot pattern appears as in FIG. 19. As the dose is further increased, a hole pattern is formed as shown in FIG. 20. As the dose is still further increased, the hole size is shrunk as shown in FIG. 21.

Next, the principles of dual-tone resist composition and negative resist composition are described. According to the invention, negative resist characteristics are obtained by inactivation of acid as taught in Non-Patent Document 4, rather than by adding a crosslinker. A resist composition contains both a PAG and a PBG, or both a TAG and a PBG, or both an acid and a PAG, and the PAG has a higher generation efficiency than the PBG. As the exposure dose is increased, acid is first generated, whereby deprotection reaction takes place during PEB, indicating positive working. As the dose is further increased, the acid generation by decomposition of the acid generator is suppressed, and the acid is inactivated when the sum of the base generated by the base generator and the base of the quencher exceeds the amount of the acid. As a result, deprotection reaction during PEB is inhibited, indicating negative working. In this way, dual-tone characteristics are displayed. In case the TAG or acid is used instead of the PAG, a negative behavior occurs in that deprotection reaction takes place in a low dose region whereas deprotection reaction is inhibited in a high dose region because the amount of photo-generated base exceeds the amount of acid generated by the TAG or acid separately added.

The PBG used herein may have a partial structure selected from (i) carbamate structure, (ii) imide carbamate structure, and (iii) oxime ester structure, which are shown below.

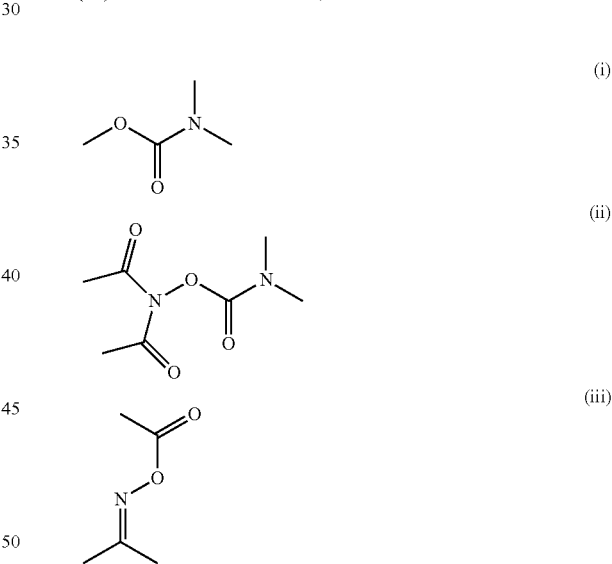

At a dose capable of inducing inactivation of acid, base is present in excess. Acid is present in excess in a region where deprotection reaction takes place during PEB so that it may be dissolved after development. If the acid in this region is inactivated by evaporation of base from the base-rich site and re-deposition, the region to be originally dissolved in developer is insolubilized. To prevent evaporation and re-deposition of base, a polymer in which the amino group to be photo-generated is attached to its backbone is preferred. Moreover, a polymer serving as a base resin in the resist composition favors that recurring units having a PBG are copolymerized with recurring units having an acid labile group. For example, a homopolymer of recurring units having a PBG may be blended with a polymer comprising recurring units having an acid labile group as a base resin in the resist composition. In such a polymer blend, however, phase separation can occur between the polymers to cause separation between the site where inactivation occurs and the site where inactivation does not occur, resulting in increased edge roughness of resist pattern after development and formation of defects such as bridge defects and line losses. To uniformly disperse the PBG in the base polymer of the resist composition, it is preferred to incorporate the PBG into the base polymer in copolymerized form.

Accordingly, in the preferred embodiment, the PBG is incorporated in a polymer serving as the base resin. That is, a recurring unit having any one of structures (i) to (iii) as a PBG group is attached to the backbone of a polymer.

Preferred examples of the recurring unit having a PBG group to be copolymerized in a polymer serving as the base resin include recurring units (a1) to (a4) represented by the general formula (1).

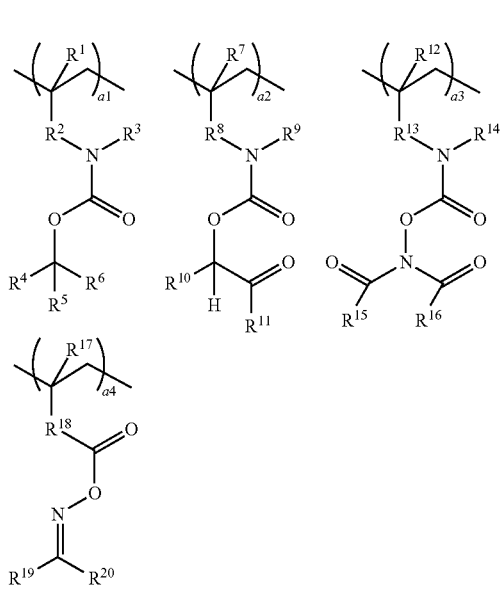

(1)

Herein $R^1$, $R^7$, $R^{12}$ and $R^{17}$ each are hydrogen or methyl. $R^2$, $R^8$, $R^{13}$ and $R^{18}$ each are a single bond, methylene, ethylene, phenylene, phenylmethylene, phenylethylene, phenylpropylene, or —C(=O)—O—$R^{21}$—, wherein $R^{21}$ is a straight, branched or cyclic $C_1$-$C_{10}$ alkylene group, $C_6$-$C_{10}$ arylene group, or $C_2$-$C_{12}$ alkenylene group. $R^3$, $R^9$ and $R^{14}$ each are hydrogen, a straight, branched or cyclic $C_1$-$C_{10}$ alkyl group, or $C_6$-$C_{10}$ aryl group, or may bond with $R^{21}$ to form a ring with the nitrogen atom to which they are attached, the ring preferably having 3 to 8 carbon atoms, more preferably 4 to 6 carbon atoms. $R^4$, $R^5$ and $R^6$ each are hydrogen, a straight, branched or cyclic $C_1$-$C_{10}$ alkyl group, or a $C_6$-$C_{14}$ aryl group, the aryl group may contain a straight, branched or cyclic $C_1$-$C_6$ alkyl, $C_1$-$C_6$ alkoxy, nitro, halogen, cyano or trifluoromethyl radical, or a pair of $R^4$ and $R^5$, $R^5$ and $R^6$, or $R^4$ and $R^6$ may bond together to form a non-aromatic ring with the carbon atom to which they are attached, the ring preferably having 3 to 10 carbon atoms, more preferably 4 to 8 carbon atoms, with the proviso that not all $R^4$, $R^5$ and $R^6$ are hydrogen and not all $R^4$, $R^5$ and $R^6$ are alkyl. $R^{10}$ and $R^{11}$ each are an aryl group of 6 to 14 carbon atoms, preferably 6 to 10 carbon atoms, which may contain a straight, branched or cyclic $C_1$-$C_6$ alkyl, $C_1$-$C_6$ alkoxy, nitro, halogen, cyano, trifluoromethyl or carbonyl radical. $R^{15}$ and $R^{16}$ each are a straight or branched $C_1$-$C_6$ alkyl group, or $R^{15}$ and $R^{16}$ may bond together to form a ring with the carbon atoms to which they are attached and the nitrogen atom therebetween, the ring has 4 to 12 carbon atoms, more preferably 4 to 10 carbon atoms, and the ring may contain a benzene ring, naphthalene ring, double bond or ether bond. $R^{19}$ and $R^{20}$ each are hydrogen, a straight, branched or cyclic alkyl group of 1 to 8 carbon atoms, preferably 1 to 6 carbon atoms, or an aryl group of 6 to 14 carbon atoms, preferably 6 to 10 carbon atoms, the aryl group may have a substituent as listed for $R^4$, $R^5$ and $R^6$, at least one of $R^{19}$ and $R^{20}$ is aryl, or both $R^{19}$ and $R^{20}$ may be aryl, or $R^{19}$ and $R^{20}$ may bond together to form a non-aromatic ring with the carbon atom to which they are attached, the ring has 4 to 10 carbon atoms, preferably 4 to 8 carbon atoms. The subscripts a1, a2, a3, and a4 are numbers in the range: $0 \leq a1 < 1.0$, $0 \leq a2 < 1.0$, $0 \leq a3 < 1.0$, $0 \leq a4 < 1.0$, and $0 < a1+a2+a3+a4 < 1.0$; preferably $0 \leq a1 \leq 0.5$, $0 \leq a2 \leq 0.5$, $0 \leq a3 \leq 0.5$, $0 \leq a4 \leq 0.5$, and $0.01 a1+a2+a3+a4 \leq 0.5$; and more preferably $0 \leq a1 \leq 0.3$, $0 a2 \leq 0.3$, $0 \leq a3 \leq 0.3$, $0 \leq a4 \leq 0.3$, and $0.015 a1+a2+a3+a4 \leq 0.3$.

The benzyl carbamate base generator represented by recurring unit (a1) in formula (1) generates amine via a decomposition mechanism represented by the following reaction scheme (1)-a1; the benzoin carbamate base generator represented by recurring unit (a2) generates amine via a decomposition mechanism represented by reaction scheme (1)-a2; the imide carbamate base generator represented by recurring unit (a3) generates amine via a decomposition mechanism represented by reaction scheme (1)-a3; and the oxime ester base generator represented by recurring unit (a4) generates amine via a decomposition mechanism represented by reaction scheme (1)-a4. As a result of decomposition, carbon dioxide, a secondary or primary amine compound and sometimes another compound form.

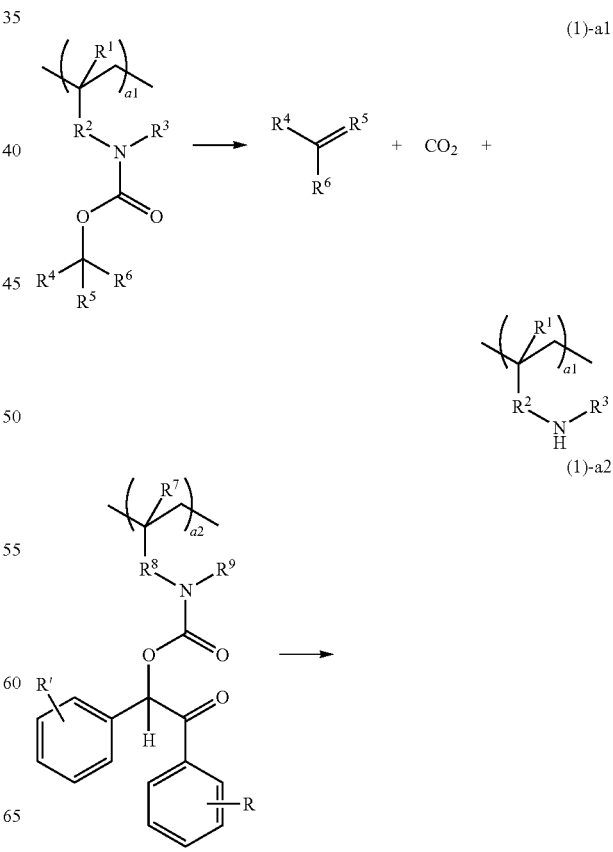

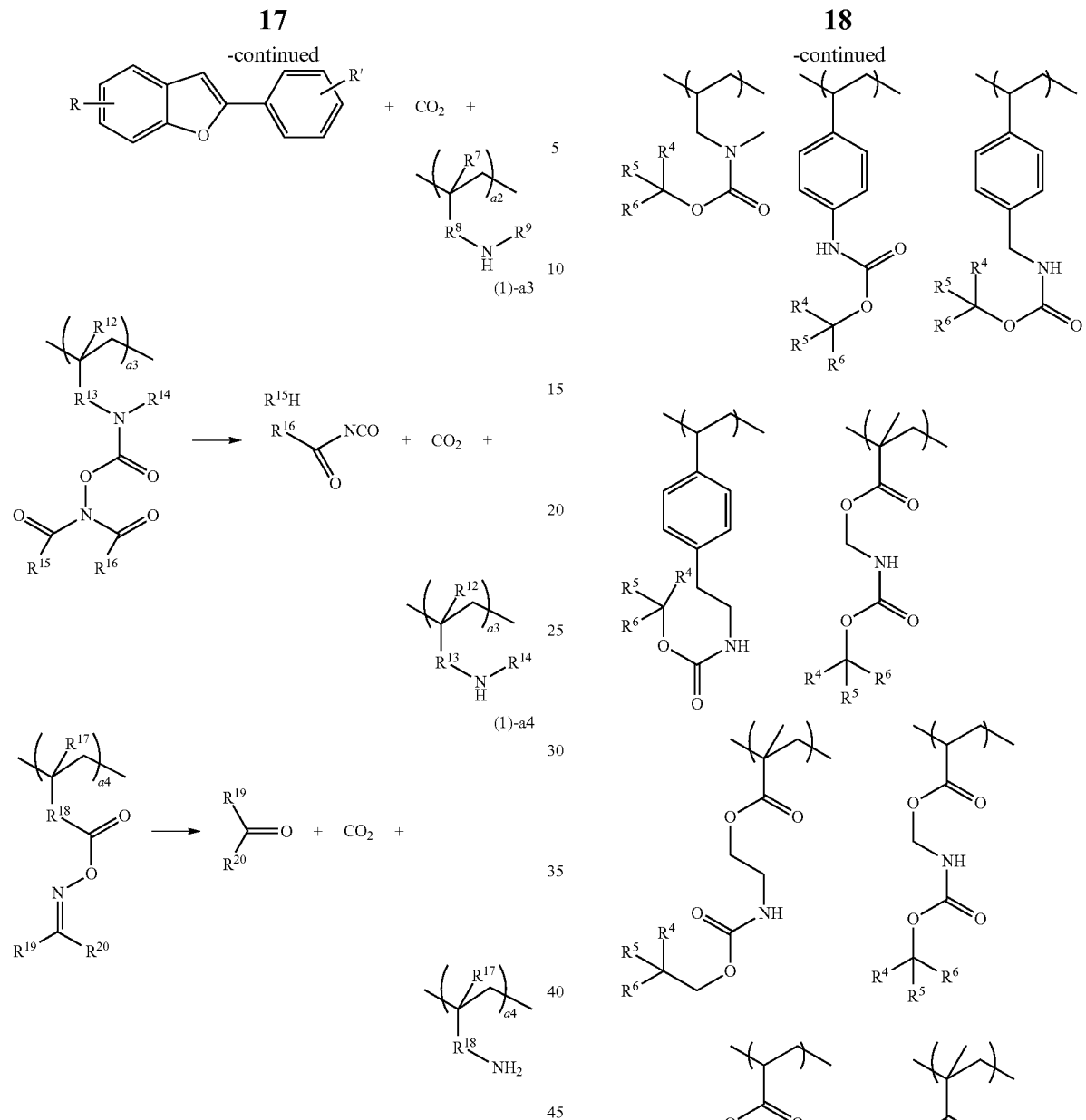

Herein $R^1$ to $R^9$, $R^{12}$ to $R^{20}$ are as defined above, R and R' are substituent radicals on aryl groups as illustrated for $R^{10}$ and $R^{11}$.

In recurring units (a1), (a2) and (a3), nitrogen atom is attached to the backbone. In recurring unit (a4), decomposition is accompanied by rearrangement reaction to generate an amino group attached to the backbone.

Examples of the base generator represented by recurring unit (a1) in formula (1) are illustrated below wherein $R^4$ to $R^6$ are as defined above.

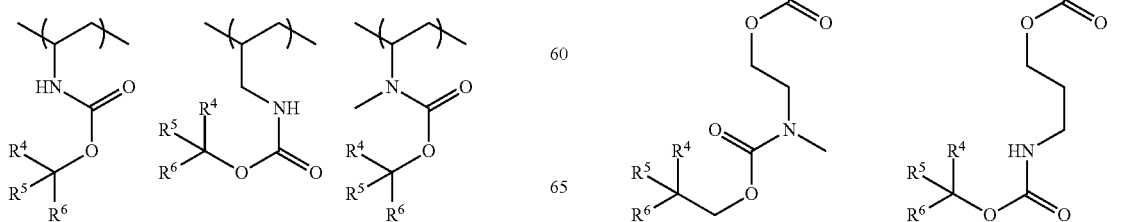

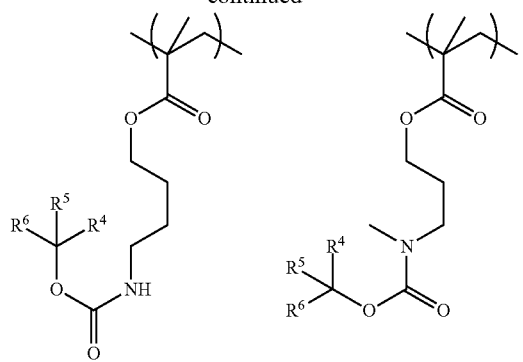
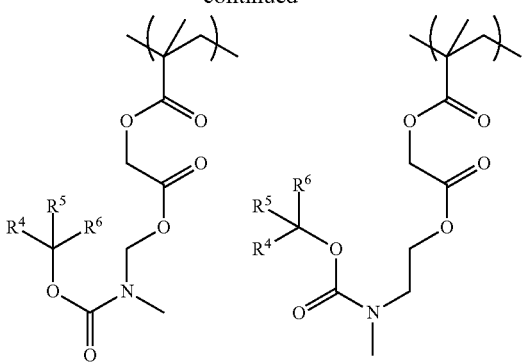
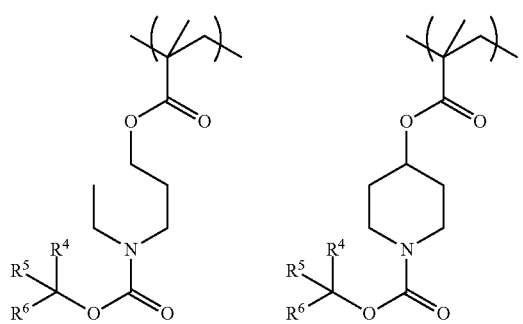
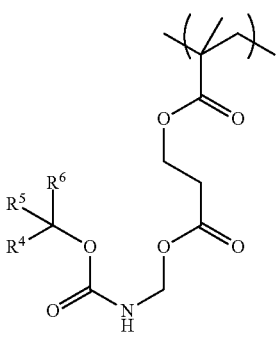
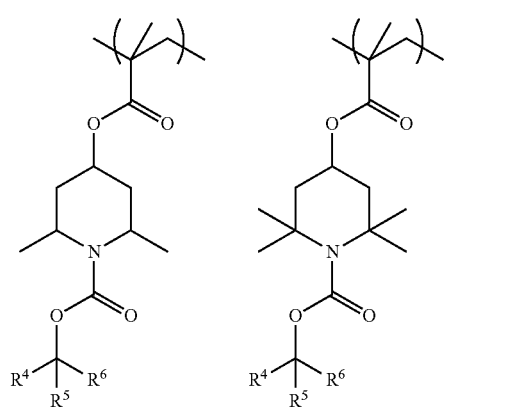
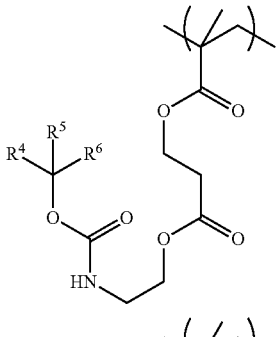
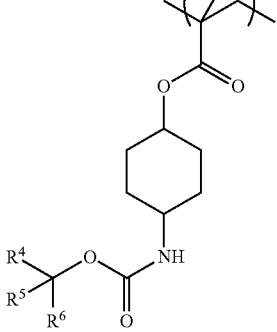
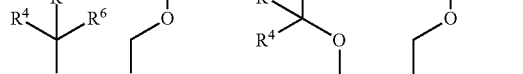
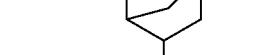

-continued
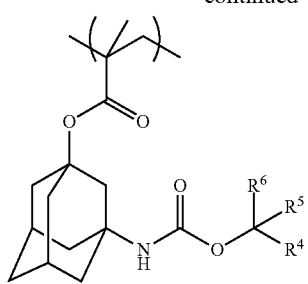
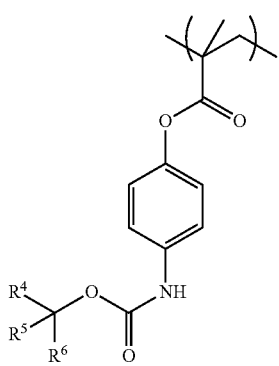
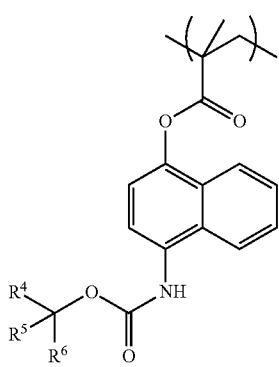
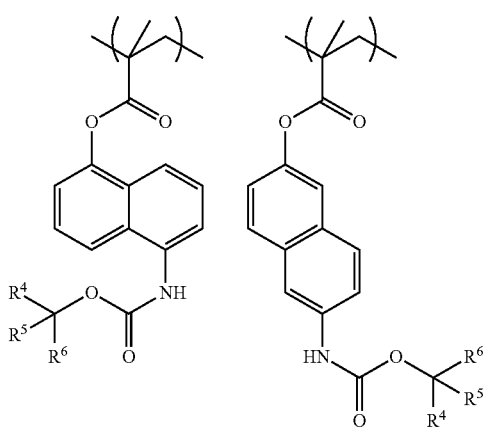
R⁴ to R⁶ in the base generator represented by recurring unit (a1) in formula (1) are exemplified below wherein R¹ to R³ are as defined above.
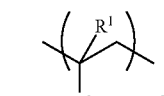 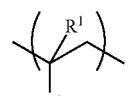
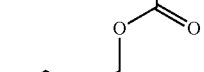 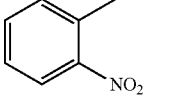
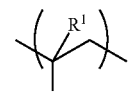 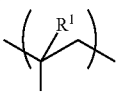
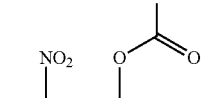 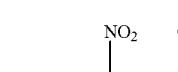
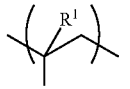
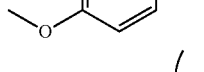 
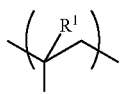 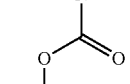
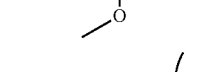 
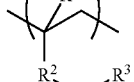 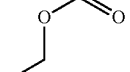
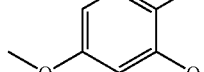 
 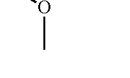

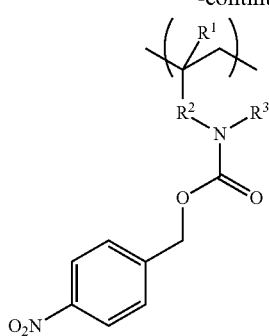
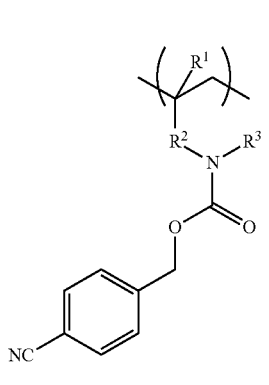 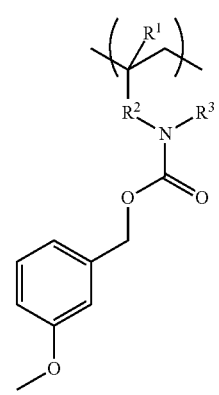
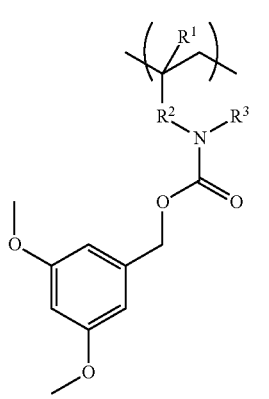 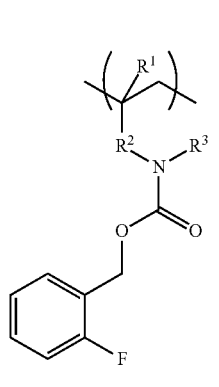
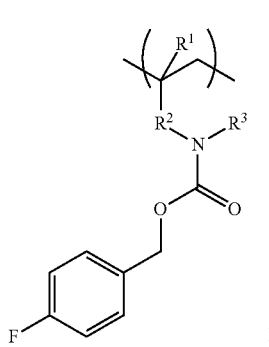 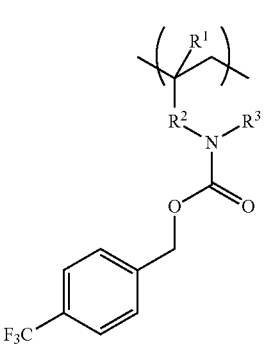
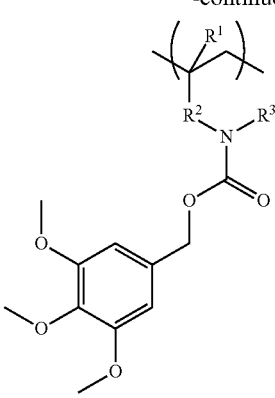
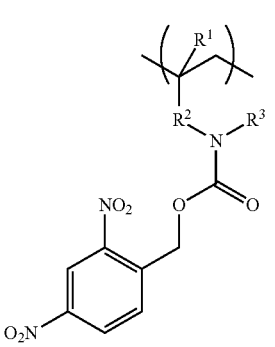 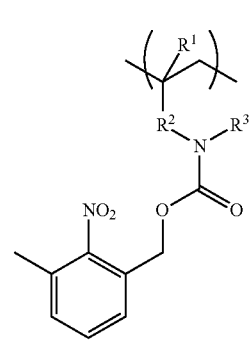
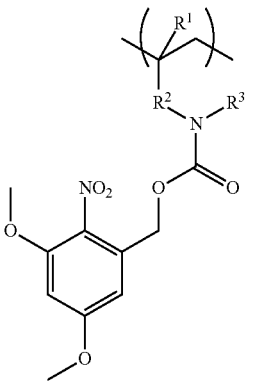
The recurring unit (a1) may be selected from those recurring units having combinations of $R^1$ to $R^3$ with $R^4$ to $R^6$ as exemplified above.
Examples of the base generator represented by recurring unit (a2) in formula (1) are illustrated below.
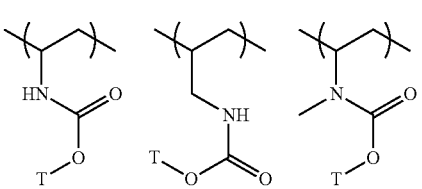

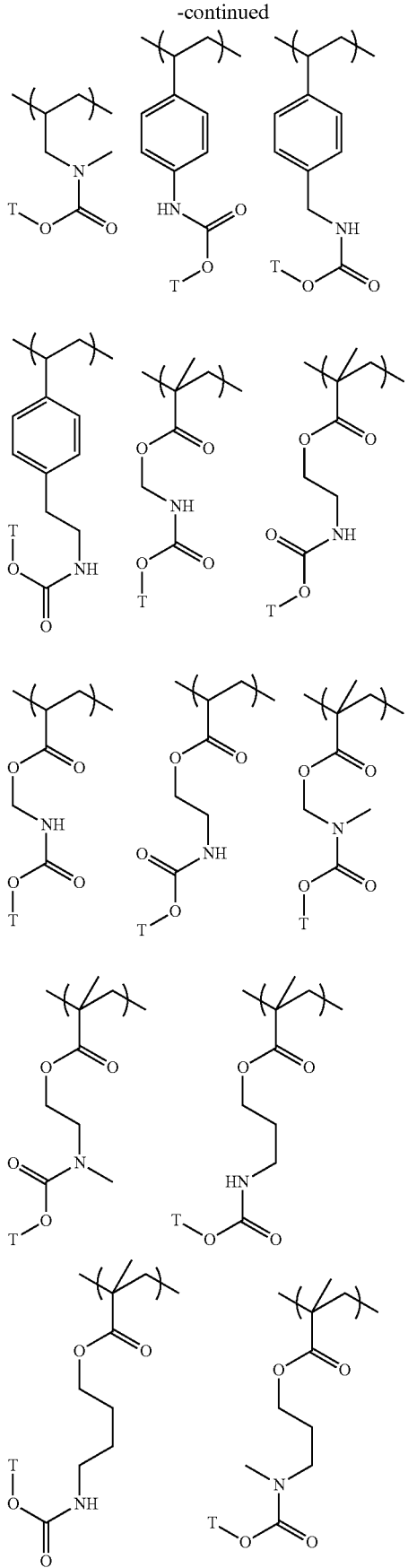
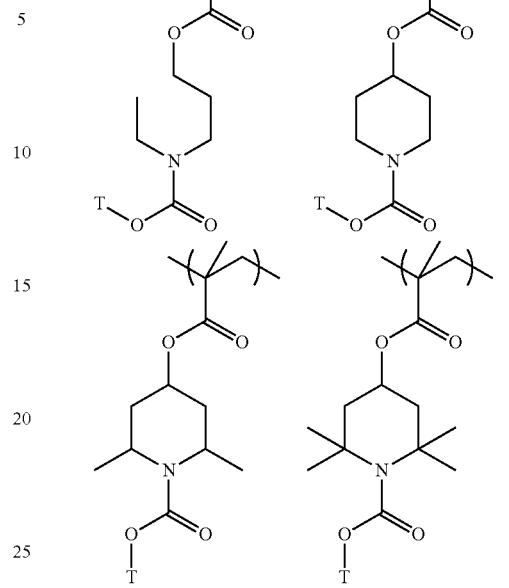
Herein, T denotes
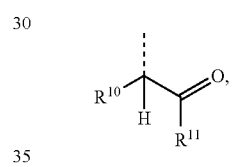
the broken line denotes a valence bond, $R^{10}$ and $R^{11}$ are as defined above.
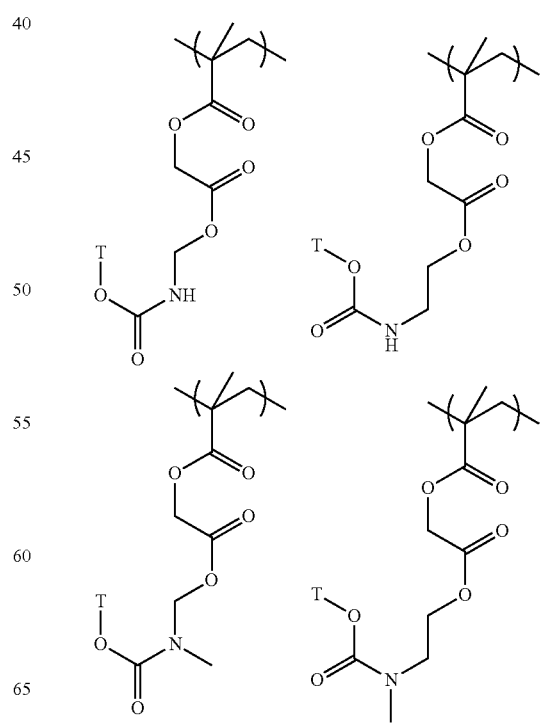

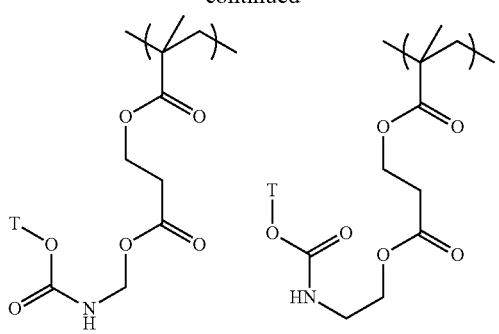
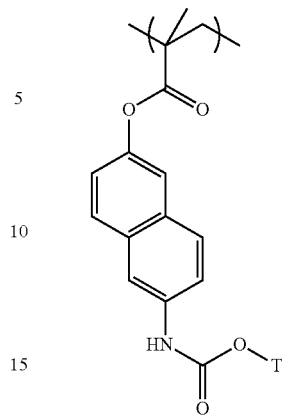
Herein, T denotes
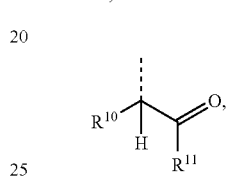
the broken line denotes a valence bond, $R^{10}$ and $R^{11}$ are as defined above.
$R^{10}$ and $R^{11}$ in the base generator represented by recurring unit (a2) in formula (1) are exemplified below wherein $R^7$ to $R^9$ are as defined above.
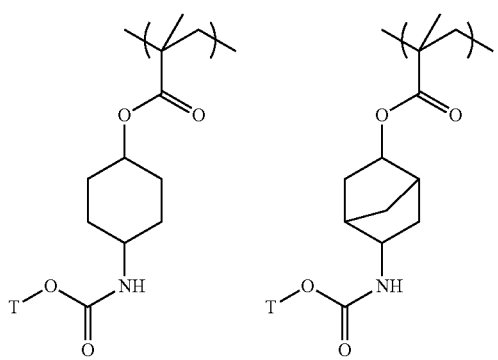
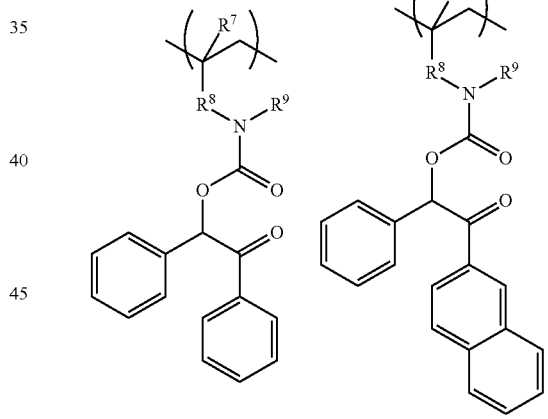
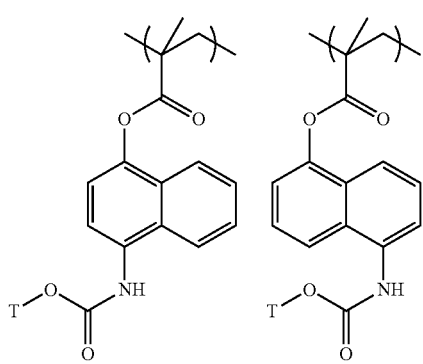
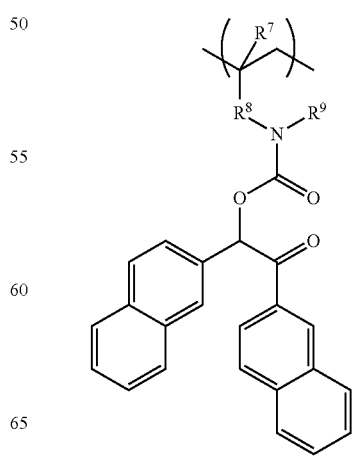

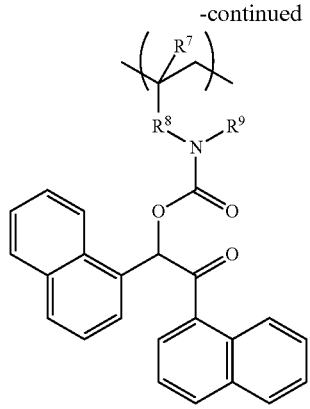
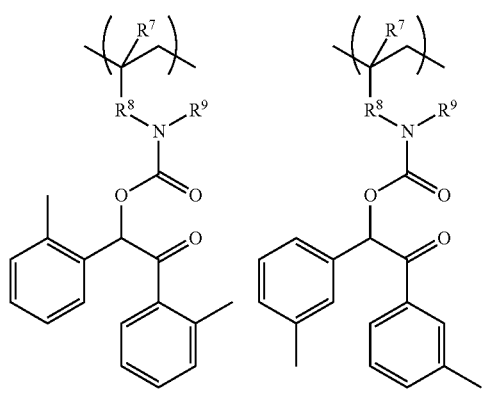
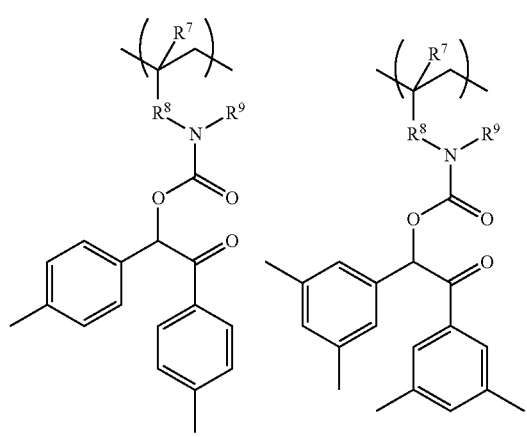
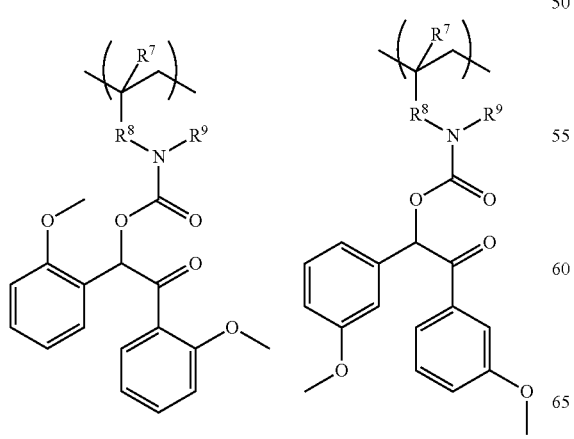
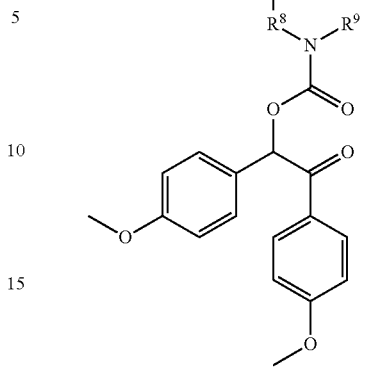
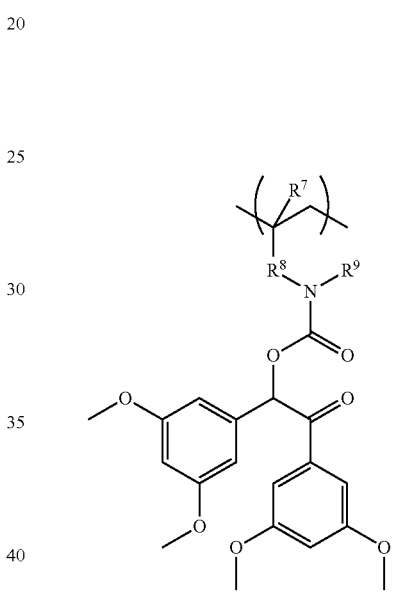
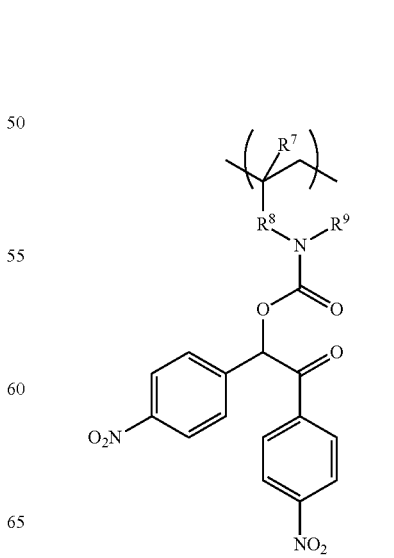

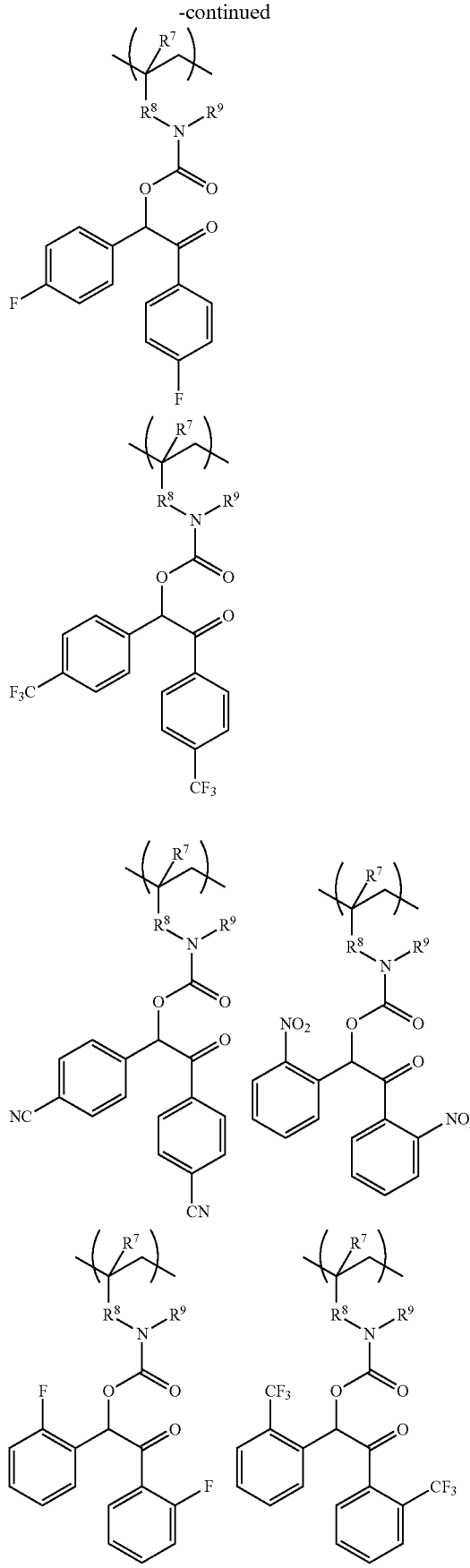
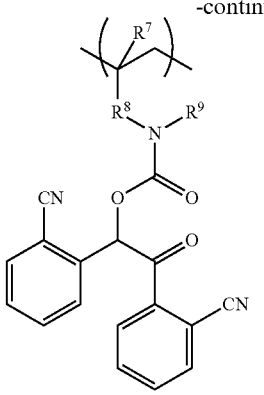
The recurring unit (a2) may be selected from those recurring units having combinations of $R^7$ to $R^9$ with $R^{10}$ and $R^{11}$ as exemplified above.
Examples of the base generator represented by recurring unit (a3) in formula (1) are illustrated below.

-continued
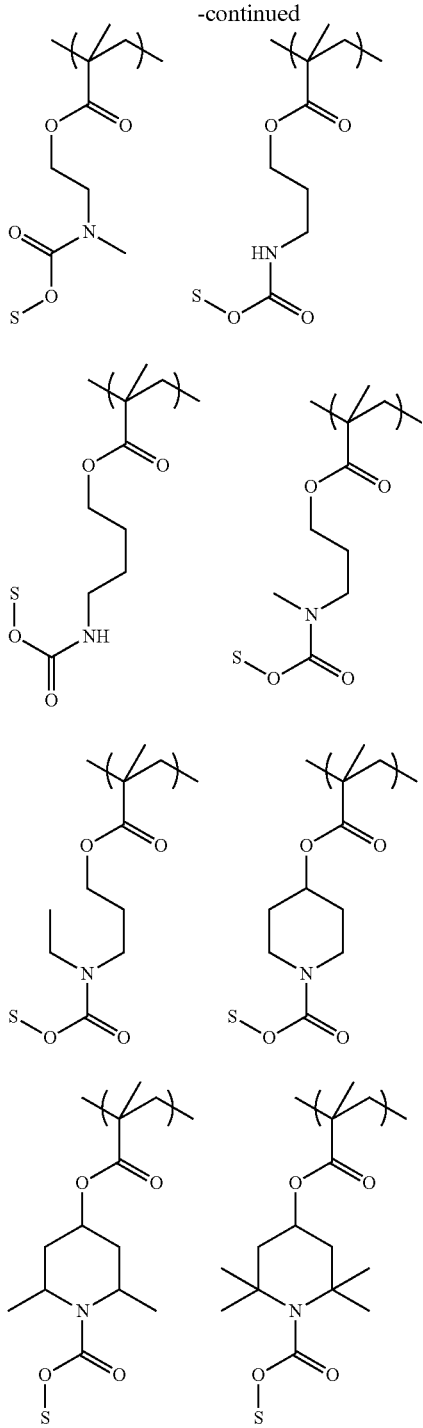
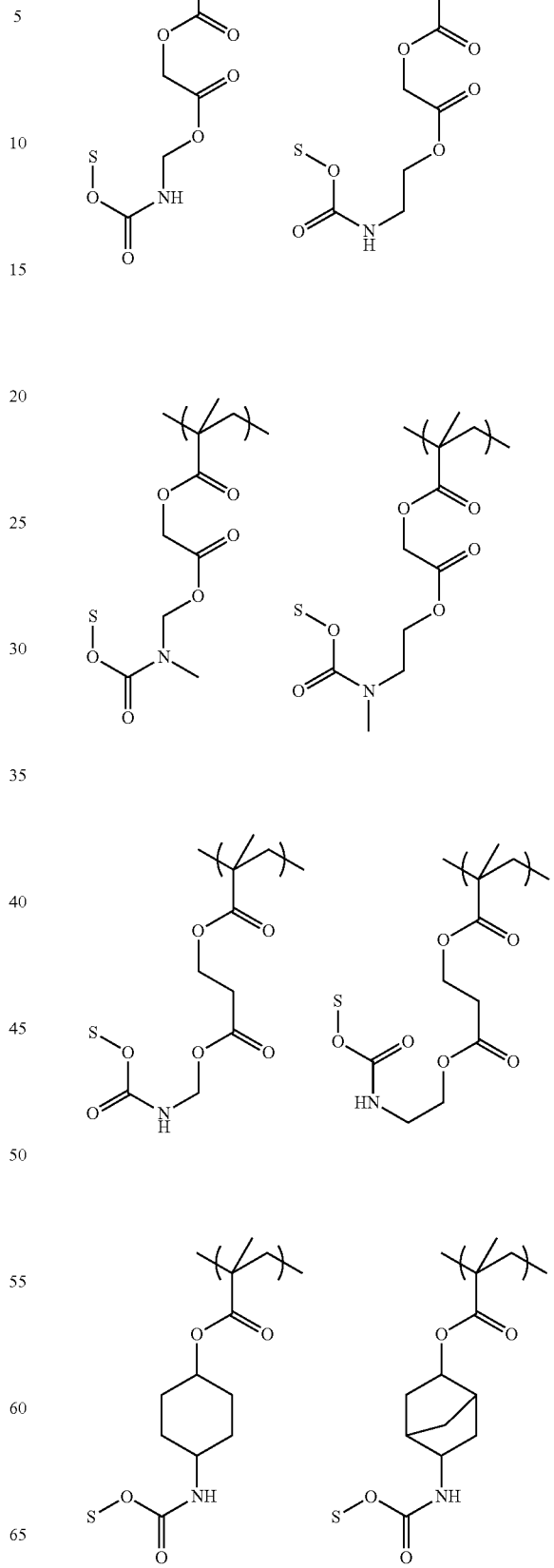
Herein, S denotes
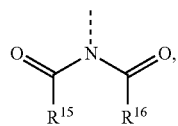
the broken line denotes a valence bond, $R^{15}$ and $R^{16}$ are as defined above.

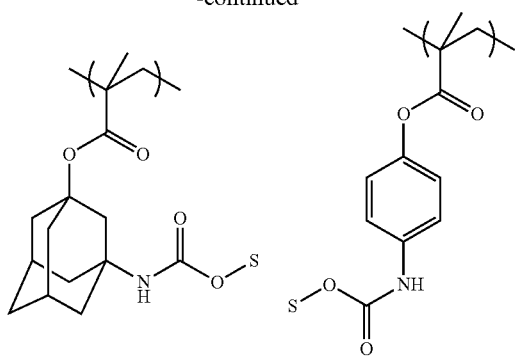
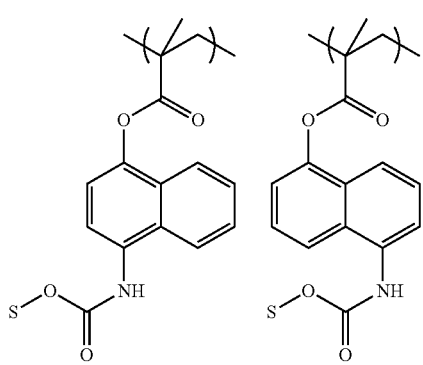
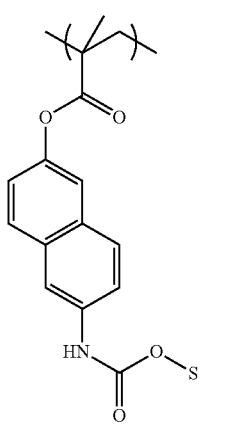
Herein, S denotes
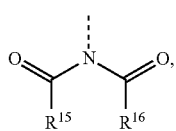
the broken line denotes a valence bond, $R^{15}$ and $R^{16}$ are as defined above.
$R^{15}$ and $R^{16}$ in the base generator represented by recurring unit (a3) in formula (1) are exemplified below wherein $R^{12}$ to $R^{14}$ are as defined above.
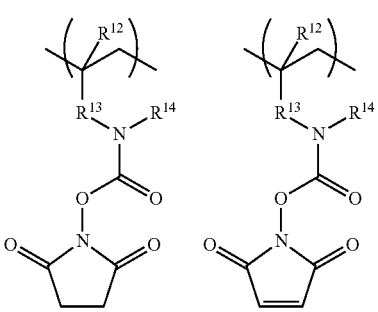
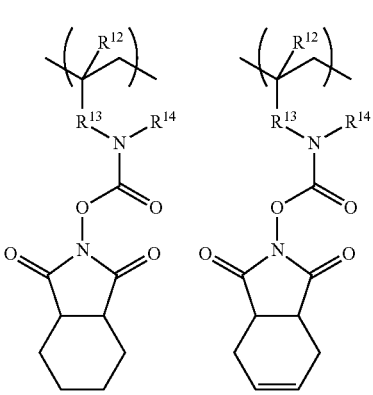
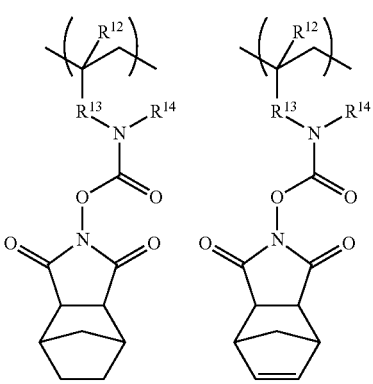
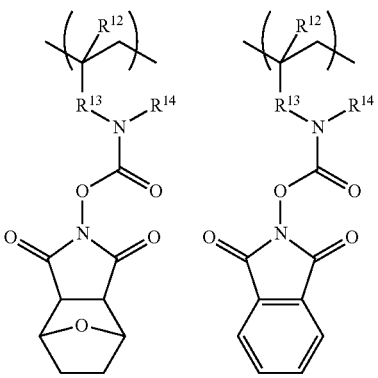

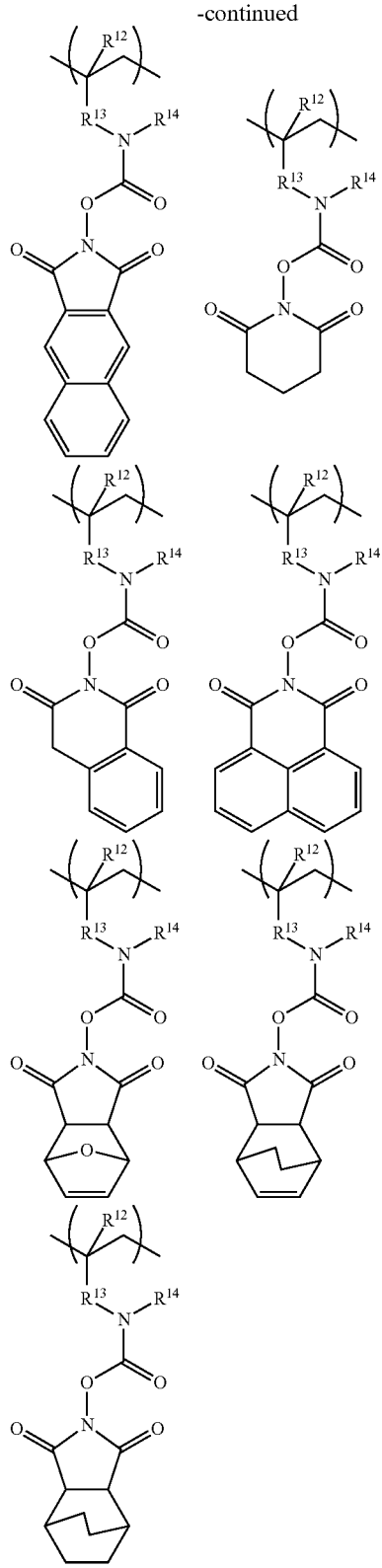
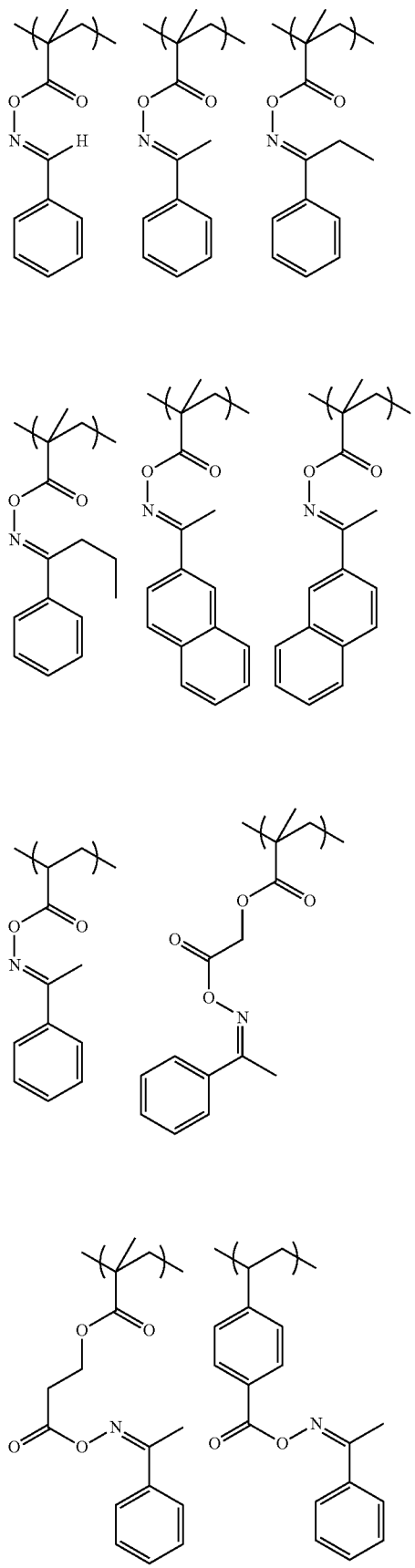
The recurring unit (a3) may be selected from those recurring units having combinations of $R^{12}$ to $R^{14}$ with $R^{15}$ and $R^{16}$ as exemplified above.
Examples of the base generator represented by recurring unit (a4) in formula (1) are illustrated below.

-continued

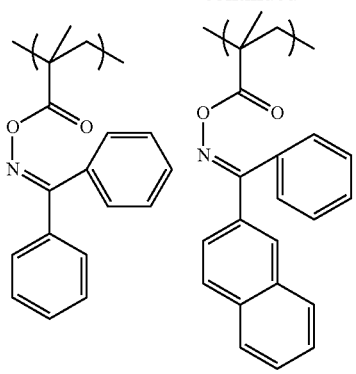
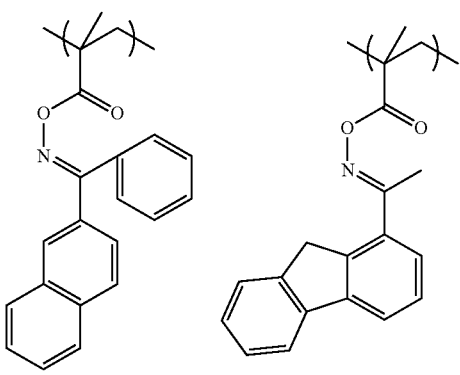
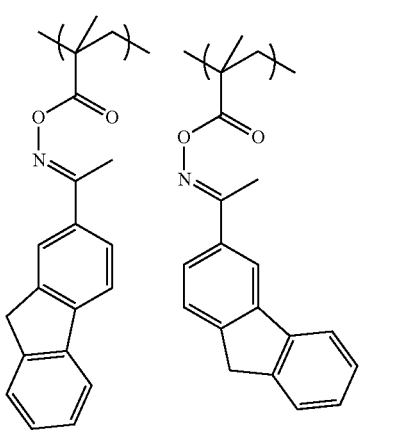
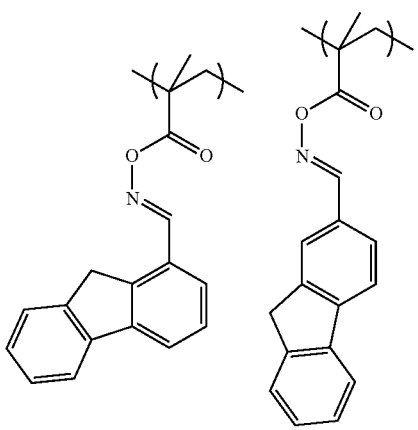

-continued

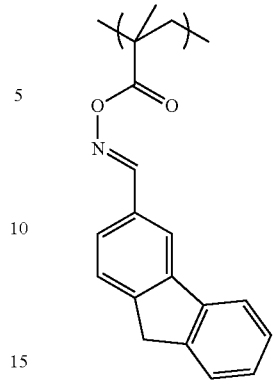

The polymer serving as the base resin in the resist composition used in the pattern forming process of the invention comprises recurring units (b) having an acid labile group, preferably recurring units having the general formula (AL). In a preferred embodiment, recurring units (b) are copolymerized with PBG group-containing recurring units (a1) to (a4) in formula (1).

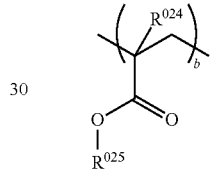

(AL)

Herein $R^{024}$ is hydrogen or methyl, and $R^{025}$ is an acid labile group.

The acid labile group represented by $R^{025}$ in formula (AL) may be selected from a variety of such groups.

Preferred acid labile groups are groups of formula (AL-11), tertiary alkyl groups of formula (AL-12), and oxoalkyl groups of 4 to 20 carbon atoms, but not limited thereto.

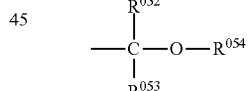

(AL-11)

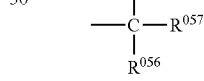

(AL-12)

In formula (AL-11), $R^{054}$ is a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. $R^{052}$ and $R^{053}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{052}$ and $R^{053}$, $R^{052}$ and $R^{054}$, or $R^{053}$ and $R^{054}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{055}$, $R^{056}$ and $R^{057}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{055}$ and $R^{056}$, $R^{055}$ and $R^{057}$, or $R^{056}$ and $R^{057}$, taken together, may form a ring, specifically aliphatic ring, with the carbon atom to which they are attached, the ring having 3 to 20 carbon atoms, especially 4 to 16 carbon atoms.

Illustrative examples of the acetal group of formula (AL-11) include those of the following formulae (AL-11)-1 to (AL-11)-112.

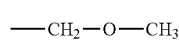 (AL-11)-1

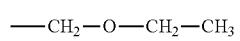 (AL-11)-2

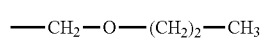 (AL-11)-3

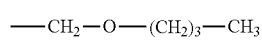 (AL-11)-4

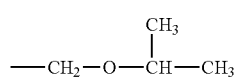 (AL-11)-5

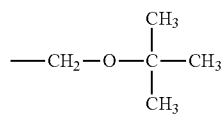 (AL-11)-6

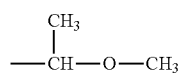 (AL-11)-7

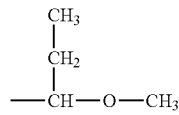 (AL-11)-8

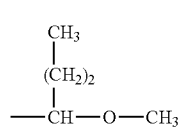 (AL-11)-9

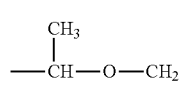 (AL-11)-10

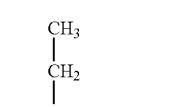 (AL-11)-11

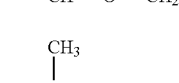 (AL-11)-12

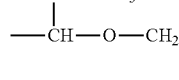 (AL-11)-13

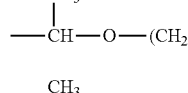 (AL-11)-14

-continued

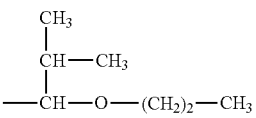 (AL-11)-15

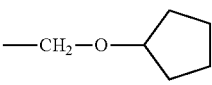 (AL-11)-16

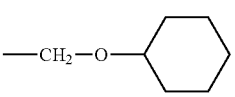 (AL-11)-17

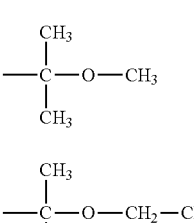 (AL-11)-18

(AL-11)-19

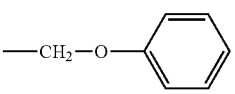 (AL-11)-20

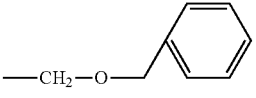 (AL-11)-21

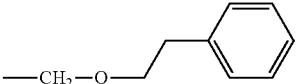 (AL-11)-22

 (AL-11)-23

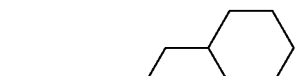 (AL-11)-24

 (AL-11)-25

 (AL-11)-26

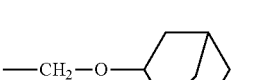 (AL-11)-27

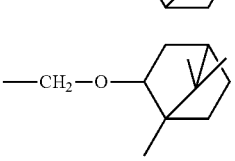 (AL-11)-28

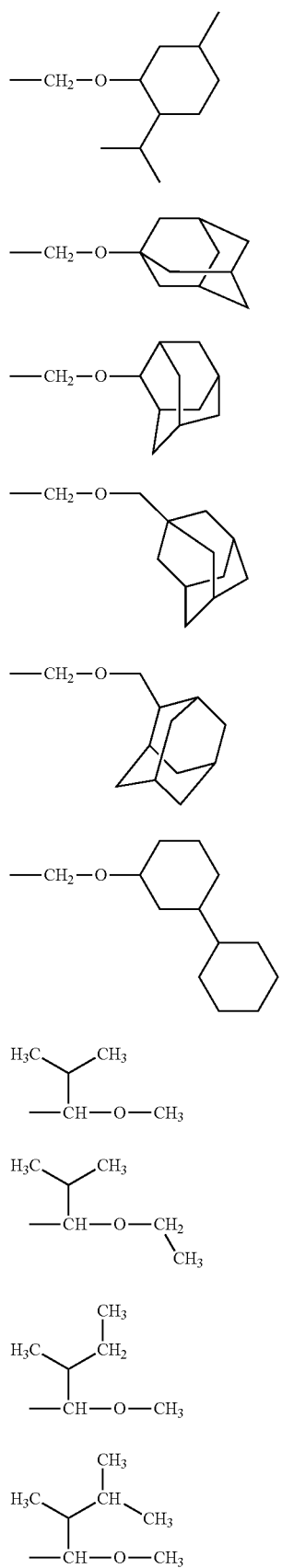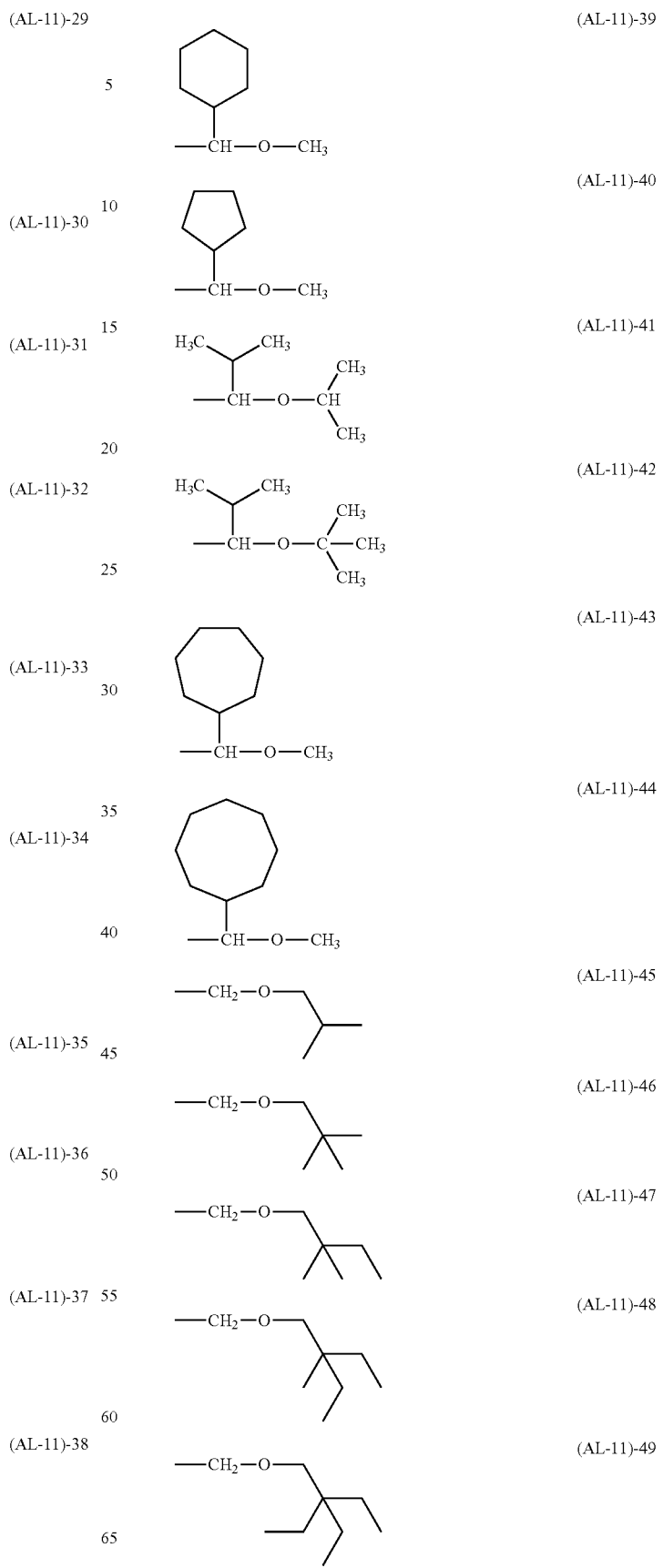

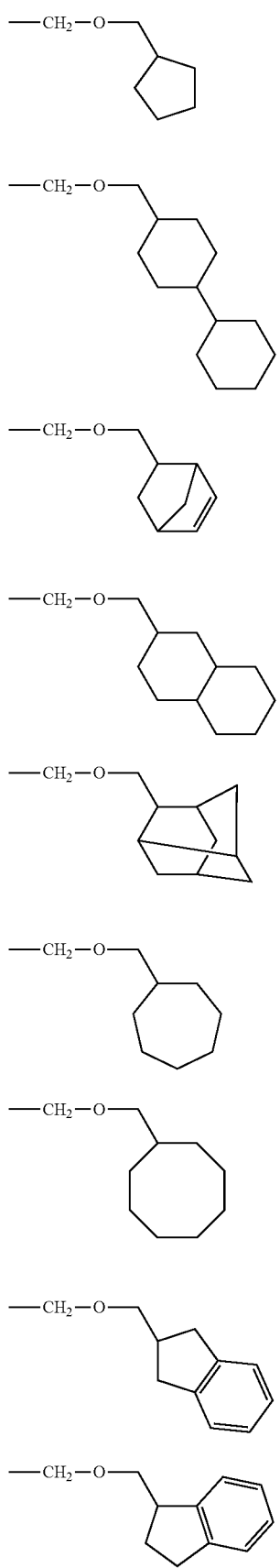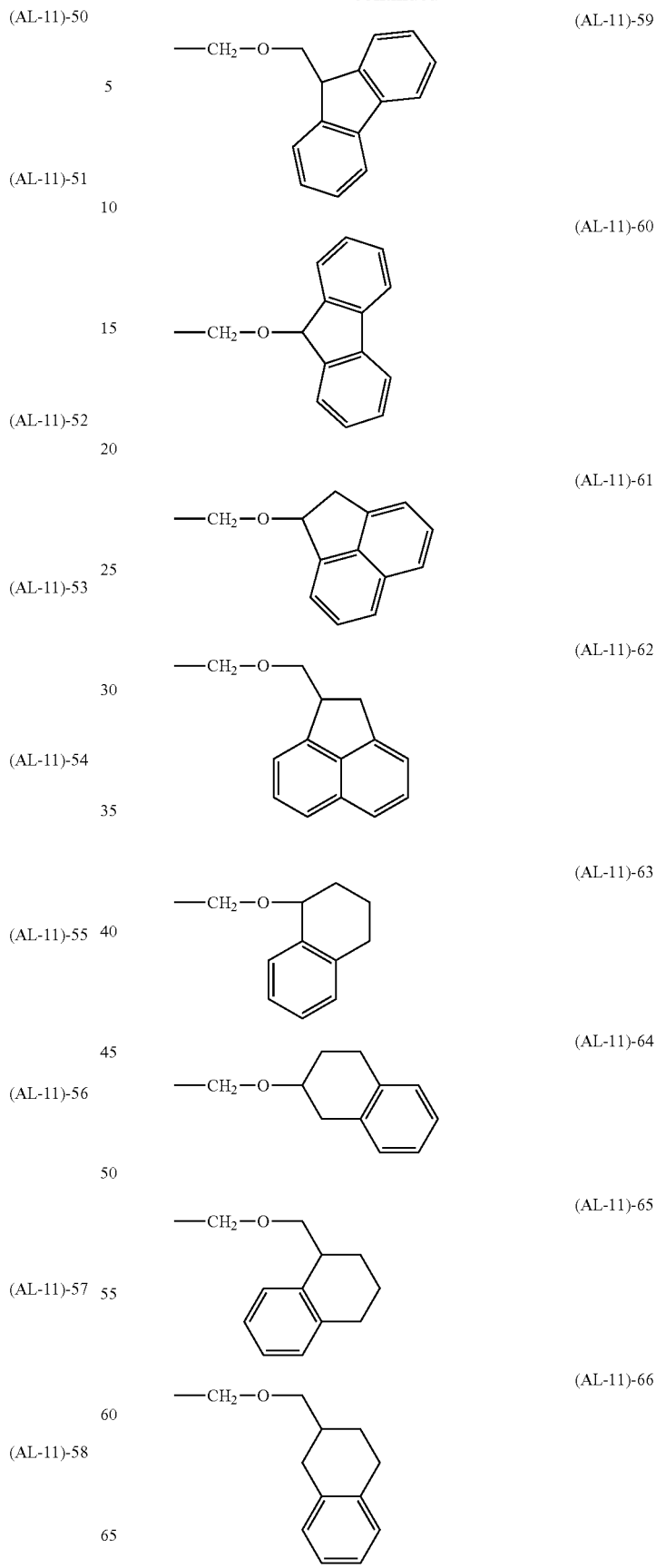

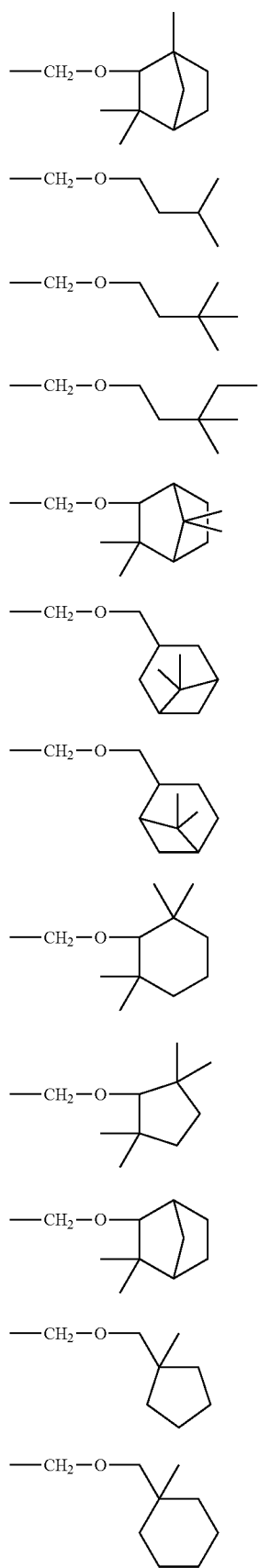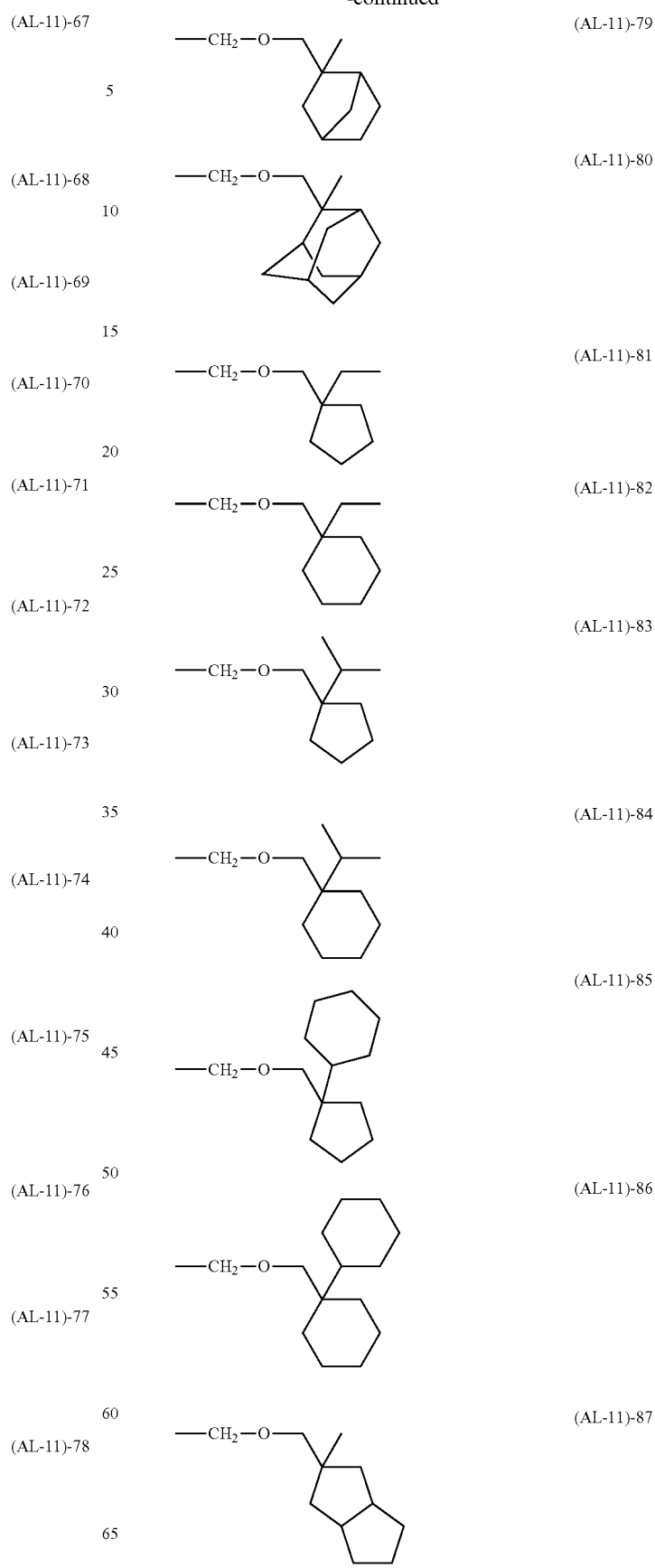

(AL-11)-88
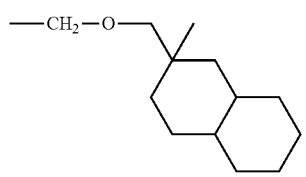
(AL-11)-89
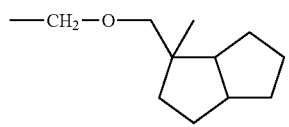
(AL-11)-90
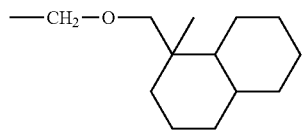
(AL-11)-91
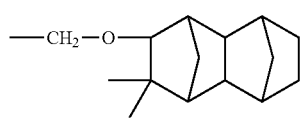
(AL-11)-92
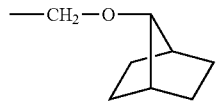
(AL-11)-93
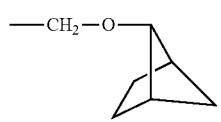
(AL-11)-94
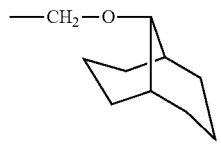
(AL-11)-95
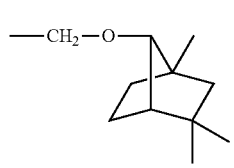
(AL-11)-96
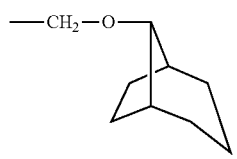
(AL-11)-97
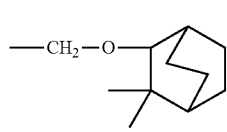
(AL-11)-98
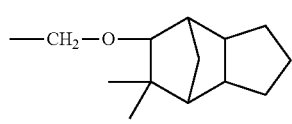
(AL-11)-99
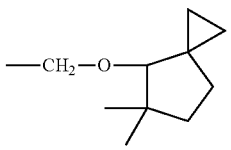
(AL-11)-100
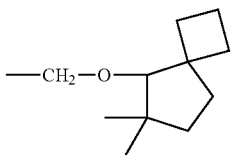
(AL-11)-101
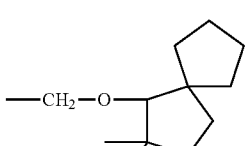
(AL-11)-102
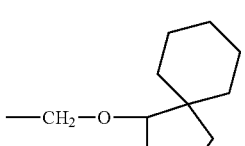
(AL-11)-103
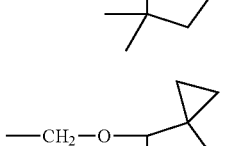
(AL-11)-104
(AL-11)-105
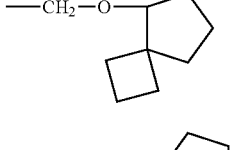
(AL-11)-106
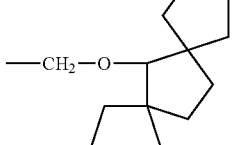
(AL-11)-107
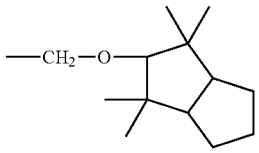

(AL-11)-108 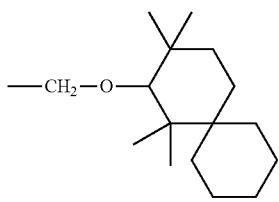

(AL-11)-109 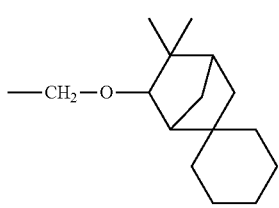

(AL-11)-110 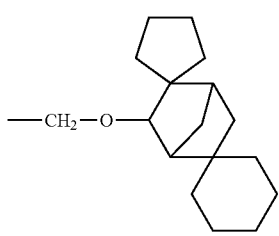

(AL-11)-111 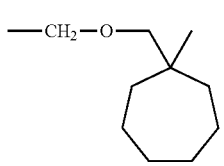

(AL-11)-112 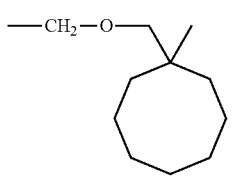

The polymer may be crosslinked within the molecule or between molecules with acid labile groups of formula (AL-11a) or (AL-11b).

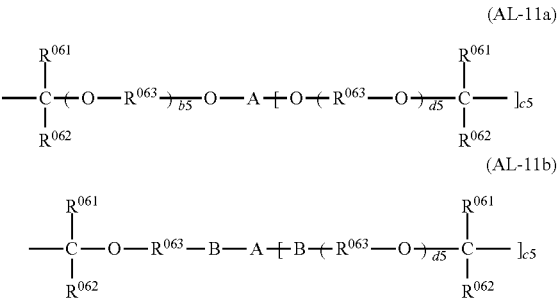

(AL-11a)

(AL-11b)

Herein $R^{061}$ and $R^{062}$ each are hydrogen or a straight, branched or cyclic $C_1$-$C_8$ alkyl group, or $R^{061}$ and $R^{062}$, taken together, may form a ring with the carbon atom to which they are attached, and $R^{061}$ and $R^{062}$ are straight or branched $C_1$-$C_8$ alkylene groups when they form a ring. $R^{063}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some hydrogen atoms attached to carbon atoms may be substituted by hydroxyl, carboxyl, carbonyl radicals or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11)-113 through (AL-11)-120.

(AL-11)-113 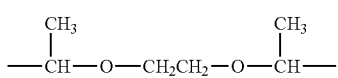

(AL-11)-114 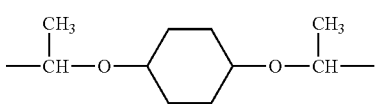

(AL-11)-115 

(AL-11)-116 

(AL-11)-117 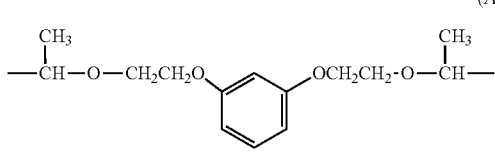

(AL-11)-118 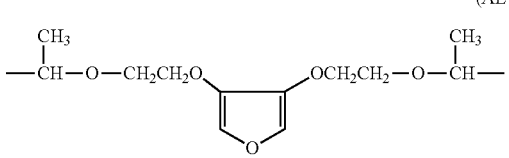

-continued
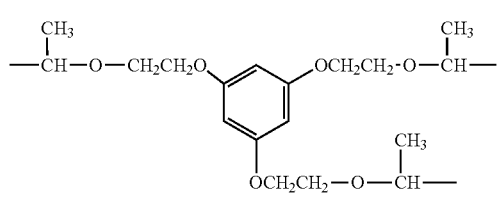
(AL-11)-119
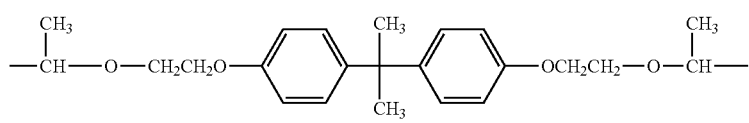
(AL-11)-120
Illustrative examples of the tertiary alkyl of formula (AL-12) include those of (AL-12)-1 to (AL-12)-16.
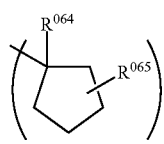
(AL-12)-1
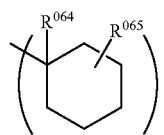
(AL-12)-2
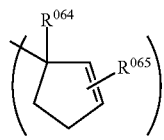
(AL-12)-3
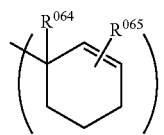
(AL-12)-4
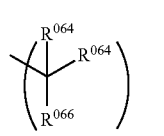
(AL-12)-5
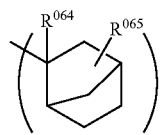
(AL-12)-6
(AL-12)-7
-continued
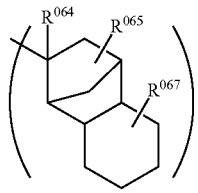
(AL-12)-8
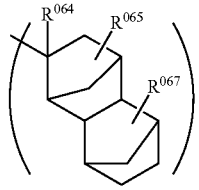
(AL-12)-9
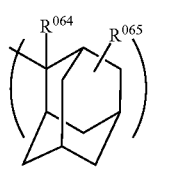
(AL-12)-10
(AL-12)-11
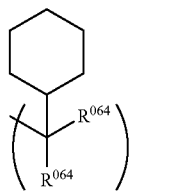
(AL-12)-12
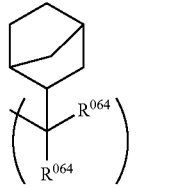
(AL-12)-13
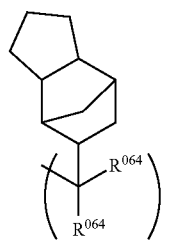

-continued (AL-12)-14

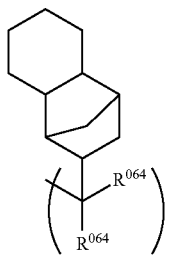

(AL-12)-15

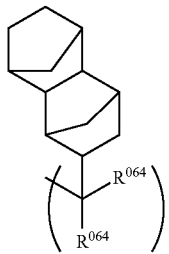

(AL-12)-16

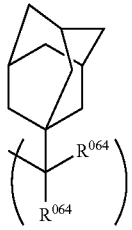

Herein $R^{064}$ is independently a straight, branched or cyclic $C_1$-$C_8$ alkyl, $C_2$-$C_6$ alkenyl, $C_6$-$C_{20}$ aryl or $C_7$-$C_{20}$ aralkyl group. $R^{065}$ and $R^{067}$ each are hydrogen or a straight, branched or cyclic $C_1$-$C_{20}$ alkyl group. $R^{066}$ is a $C_3$-$C_{16}$ cyclic alkyl, $C_2$-$C_6$ alkenyl, $C_6$-$C_{20}$ aryl or $C_7$-$C_{20}$ aralkyl group.

With acid labile groups comprising $R^{068}$ representative of a di- or more valent alkylene or arylene group being included as shown in formulae (AL-12)-17 and (AL-12)-18, the polymer may be crosslinked within the molecule or between molecules.

(AL-12)-17

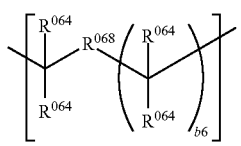

(AL-12)-18

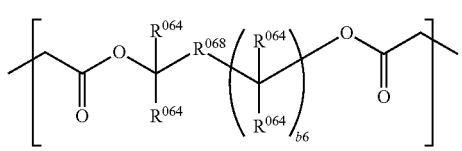

In formulae (AL-12)-17 and (AL-12)-18, $R^{064}$ is as defined above; $R^{068}$ is a straight, branched or cyclic $C_1$-$C_{20}$ alkylene group or arylene group, which may contain a heteroatom such as oxygen, sulfur or nitrogen; and b6 is an integer of 1 to 3.

The groups represented by $R^{064}$, $R^{065}$, $R^{066}$ and $R^{067}$ may contain a heteroatom such as oxygen, nitrogen or sulfur. Such groups are exemplified by those of the following formulae (AL-13)-1 to (AL-13)-7.

(AL-13)-1
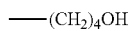

(AL-13)-2
—(CH$_2$)$_2$O(CH$_2$)$_3$CH$_3$ (AL-13)-3
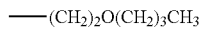

(AL-13)-4
—(CH$_2$)$_2$O(CH$_2$)$_2$OH (AL-13)-5
—(CH$_2$)$_6$OH (AL-13)-6
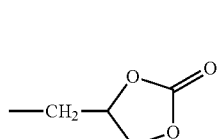

(AL-13)-7
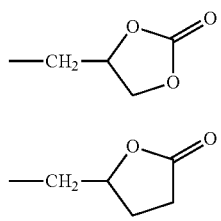

Of the acid labile groups of formula (AL-12), recurring units having an exo-form structure represented by the formula (AL-12)-19 are preferred.

(AL-12)-19

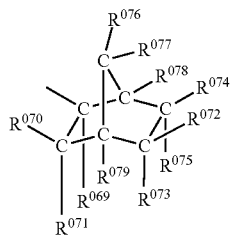

Herein, $R^{069}$ is a straight, branched or cyclic $C_1$-$C_8$ alkyl group or an optionally substituted $C_6$-$C_{20}$ aryl group; $R^{070}$ to $R^{075}$, $R^{078}$ and $R^{079}$ are each independently hydrogen or a monovalent hydrocarbon group, typically alkyl, of 1 to 15 carbon atoms which may contain a heteroatom; and $R^{076}$ and $R^{077}$ are hydrogen or a monovalent hydrocarbon group, typically alkyl, of 1 to 15 carbon atoms which may contain a heteroatom. Alternatively, a pair of $R^{070}$ and $R^{071}$, $R^{072}$ and $R^{074}$, $R^{072}$ and $R^{075}$, $R^{073}$ and $R^{075}$, $R^{073}$ and $R^{079}$, $R^{074}$ and $R^{078}$, $R^{076}$ and $R^{077}$, or $R^{077}$ and $R^{078}$ may bond together to form a ring, typically alicyclic, with the carbon atom to which they are attached, and in this case, each group participating in ring formation is a divalent hydrocarbon group, typically alkylene, of 1 to 15 carbon atoms which may contain a heteroatom. Also, a pair of $R^{070}$ and $R^{079}$, $R^{076}$ and $R^{079}$, or $R^{072}$ and $R^{074}$ which are attached to vicinal carbon atoms may bond together directly to form a double bond. The formula also represents an enantiomer.

The ester form monomers from which recurring units having an exo-form structure represented by the formula (AL-12)-19 shown below are derived are described in U.S. Pat. No. 6,448,420 (JP-A 2000-327633).

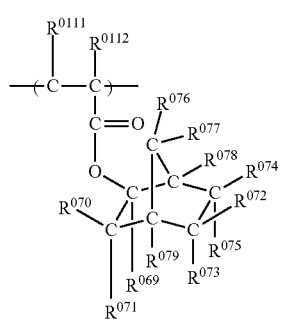
Herein, $R^{069}$ to $R^{078}$ are as defined above, $R^{0111}$ and $R^{0112}$ are each independently hydrogen, methyl, —COOCH$_3$ or —CH$_2$COOCH$_3$. Illustrative non-limiting examples of suitable monomers are given below.
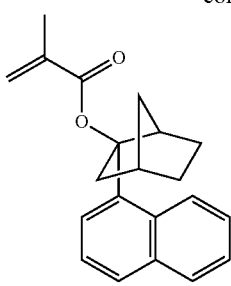
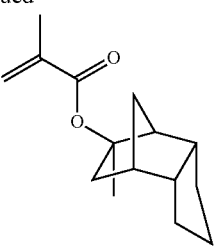
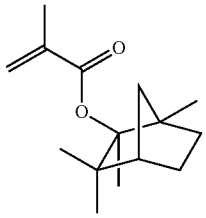
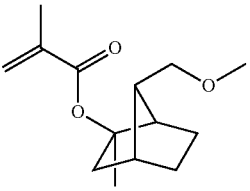
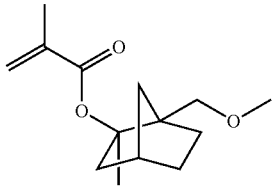
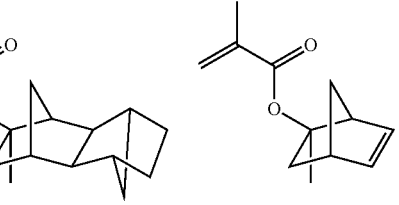
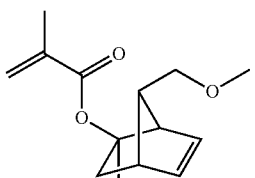
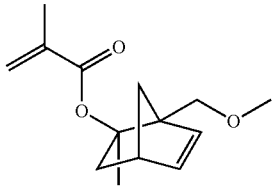
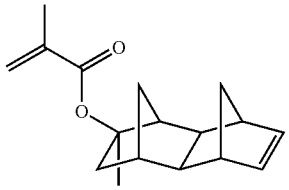
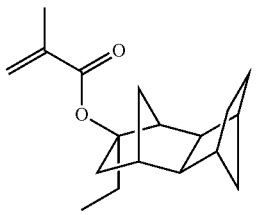
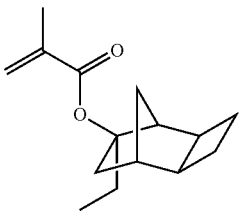

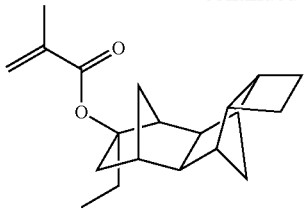 [SMILES: C=C(C)C(=O)OC1(CC)CC2CC1C1C3CC(C4CCC43)C21]

Also included in the acid labile groups of formula (AL-12) are acid labile groups having furandiyl, tetrahydrofurandiyl or oxanorbornanediyl as represented by the following formula (AL-12)-20.

(AL-12)-20

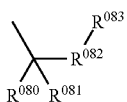

Herein, $R^{080}$ and $R^{081}$ are each independently a monovalent hydrocarbon group, typically a straight, branched or cyclic $C_1$-$C_{10}$ alkyl group. $R^{080}$ and $R^{081}$, taken together, may form an aliphatic hydrocarbon ring of 3 to 20 carbon atoms with the carbon atom to which they are attached. $R^{082}$ is a divalent group selected from furandiyl, tetrahydrofurandiyl and oxanorbornanediyl. $R^{083}$ is hydrogen or a monovalent hydrocarbon group, typically a straight, branched or cyclic $C_1$-$C_{10}$ alkyl group, which may contain a heteroatom.

Recurring units substituted with an acid labile group having furandiyl, tetrahydrofurandiyl or oxanorbornanediyl as represented by the formula:

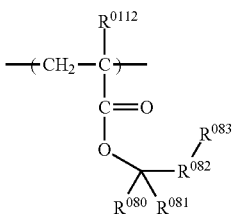

(wherein $R^{080}$ to $R^{083}$ and $R^{0112}$ are as defined above) are derived from monomers, examples of which are shown below. Note that Me is methyl and Ac is acetyl.

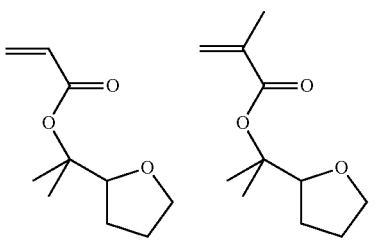

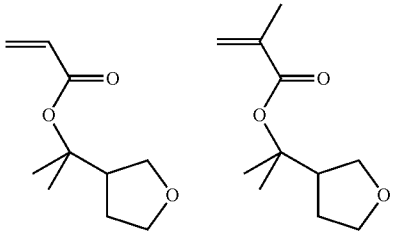

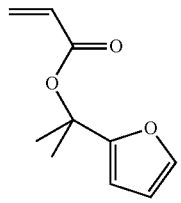

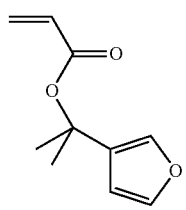

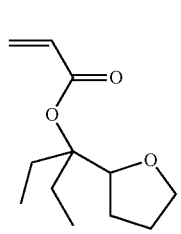

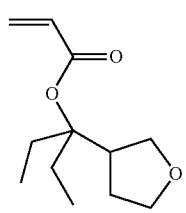

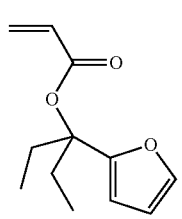

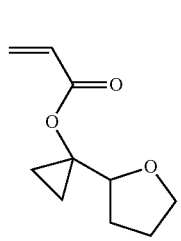

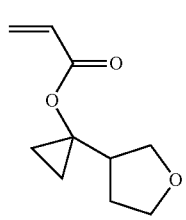

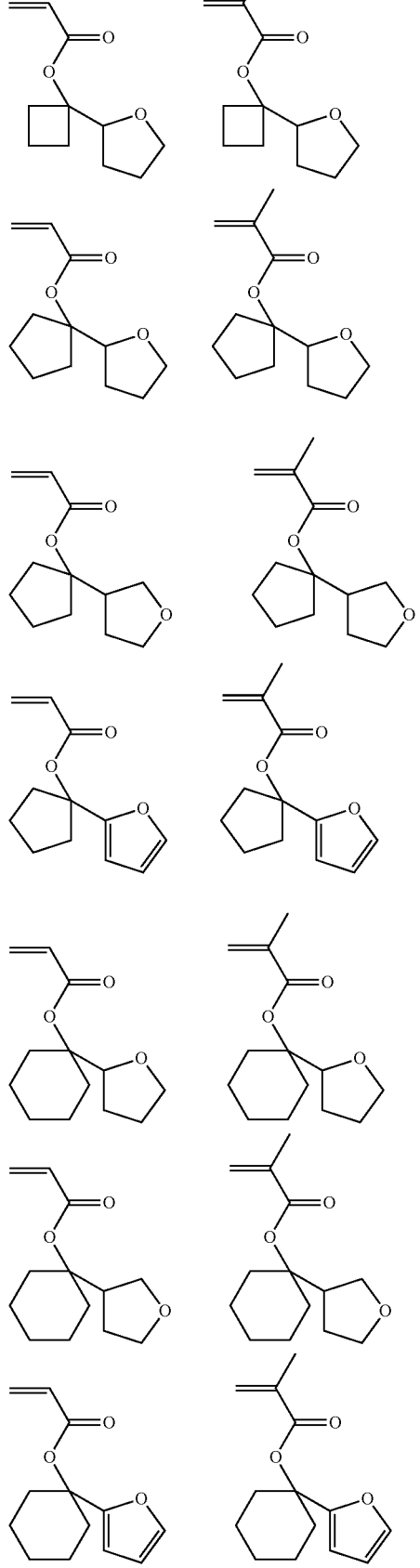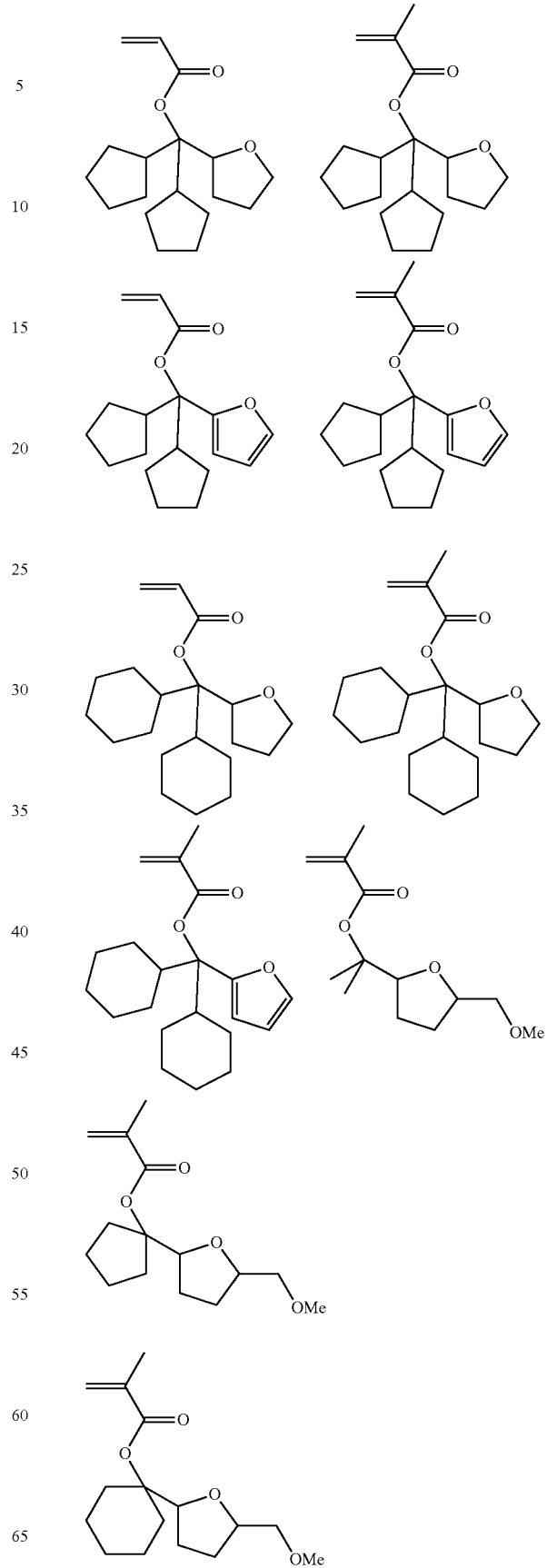

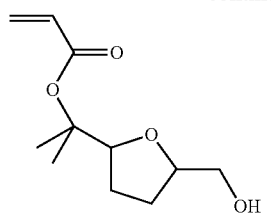
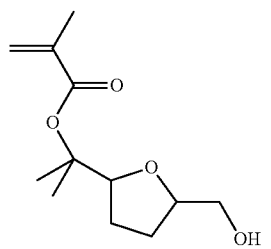
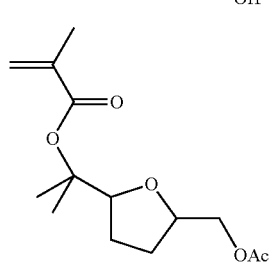
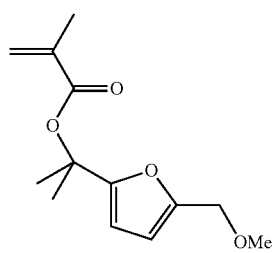
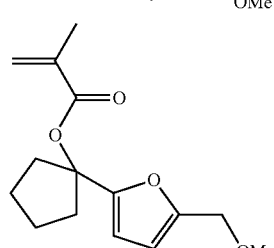
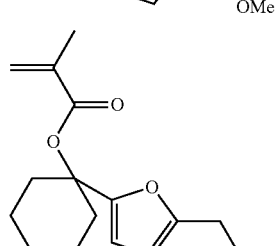
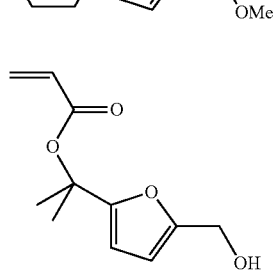

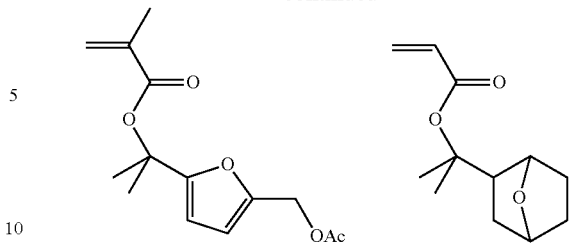
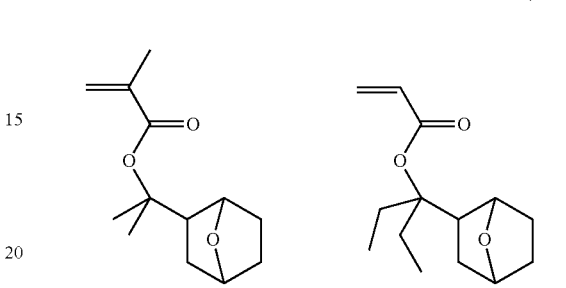
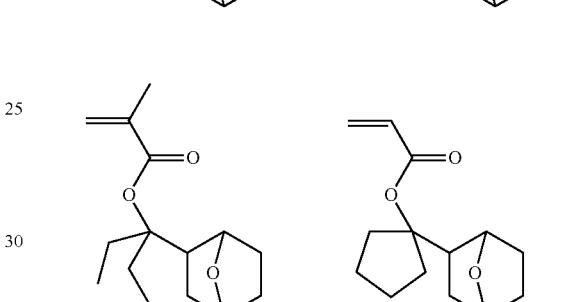
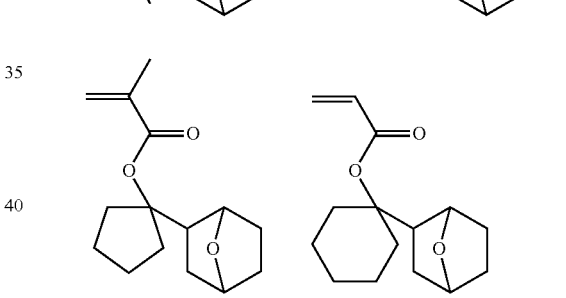
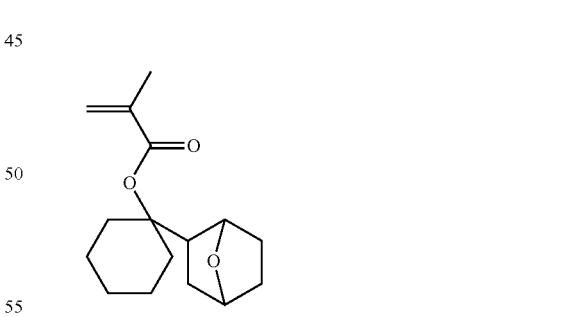

While the polymer used as the base resin in the resist composition preferably includes base generator-bearing recurring units (a1), (a2), (a3) or (a4) represented by formula (1) and recurring units (b) having an acid labile group of formula (AL), it may have further copolymerized therein recurring units (c) derived from monomers having an adhesive group such as a hydroxy, cyano, carbonyl, ester, ether group, lactone ring, carboxyl or carboxylic anhydride group. Examples of monomers from which recurring units (c) are derived are given below.

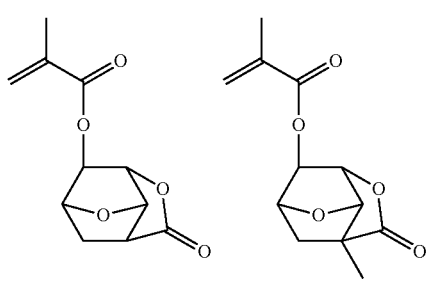
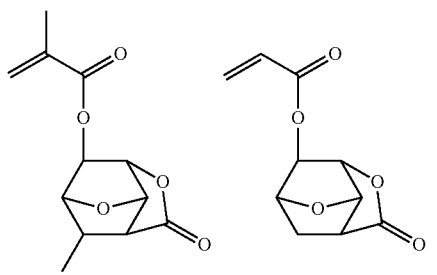
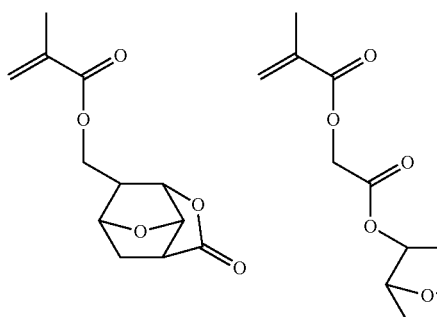
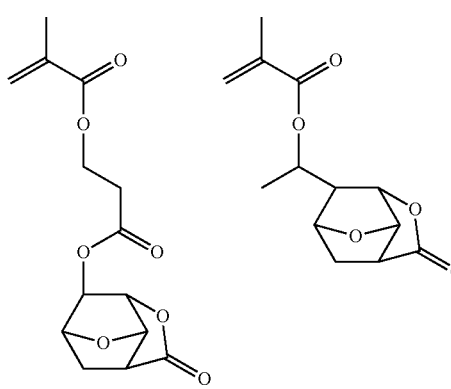
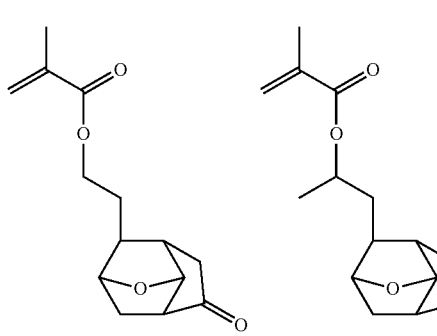
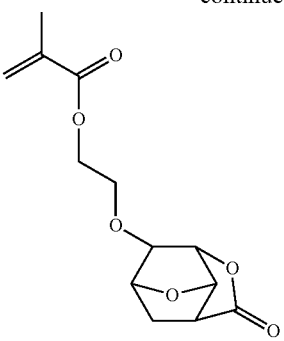
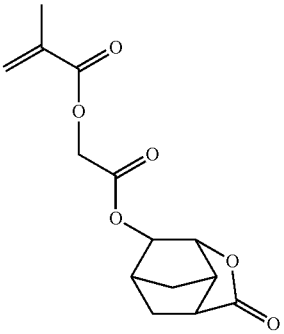
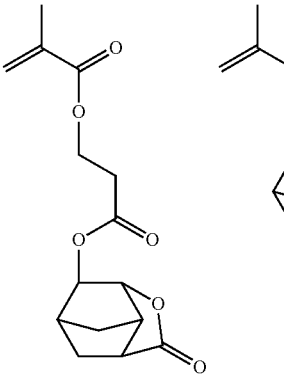
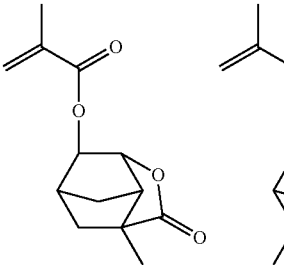
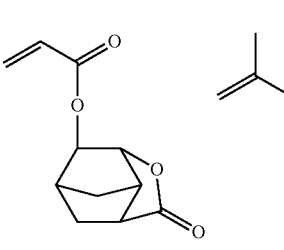

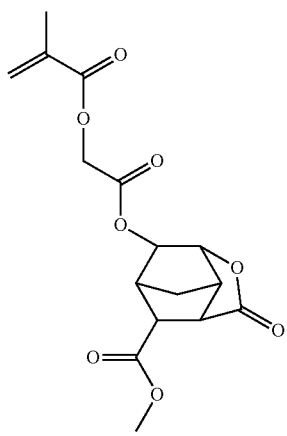
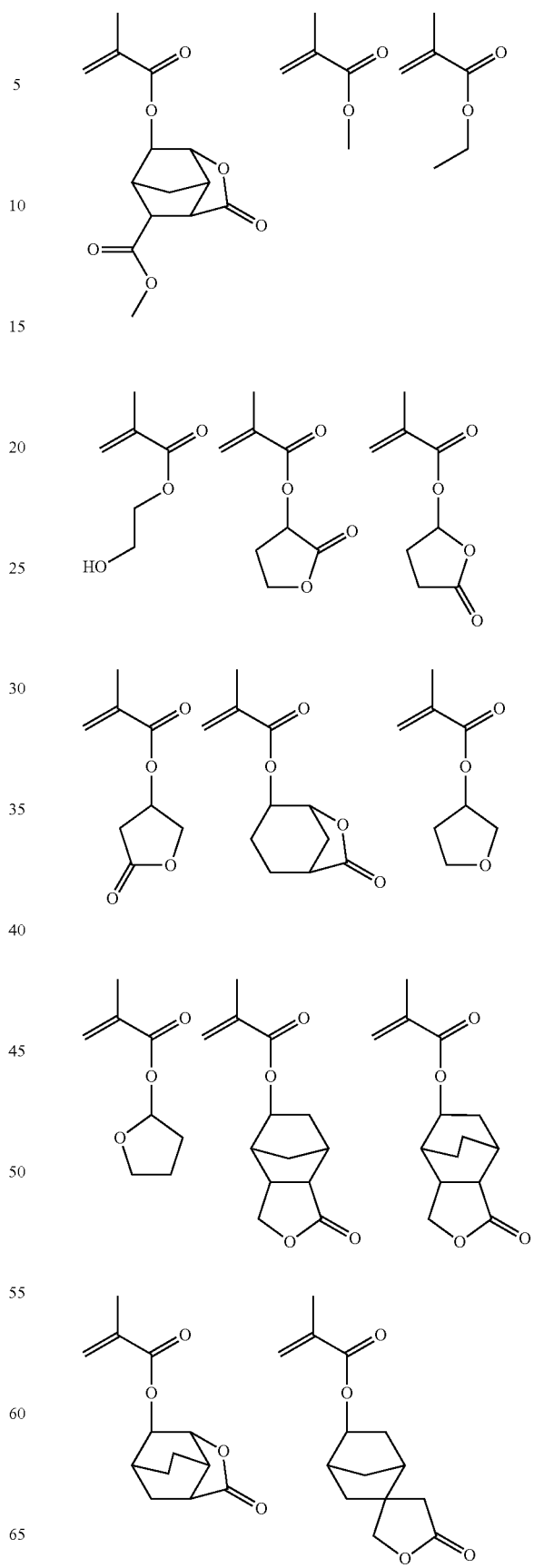

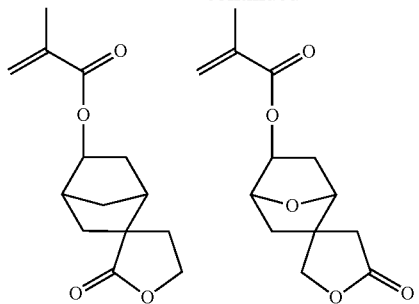
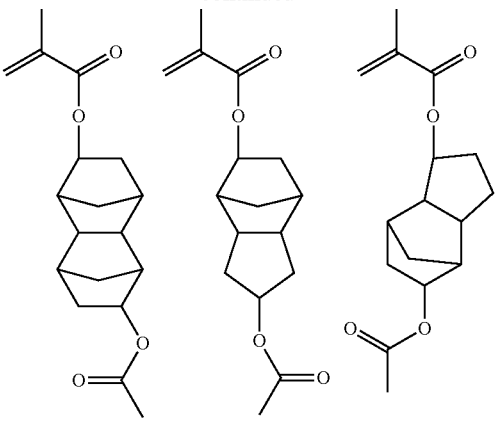
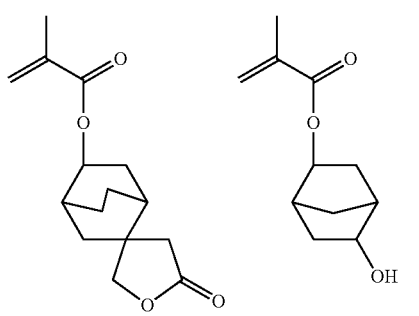
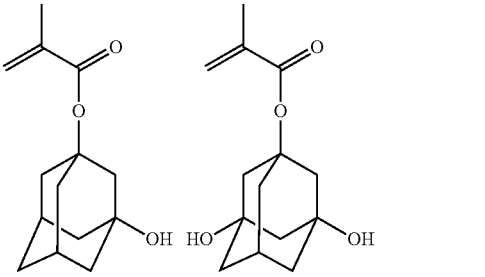
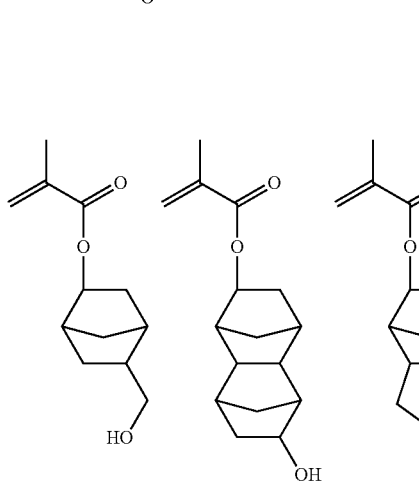
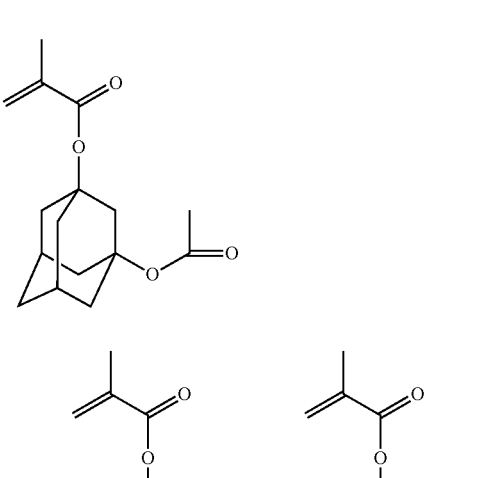
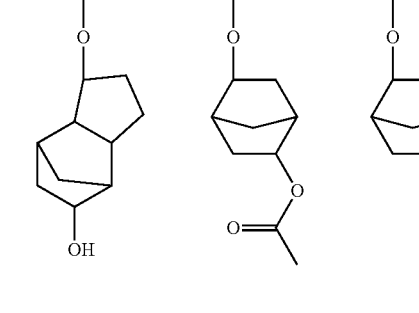
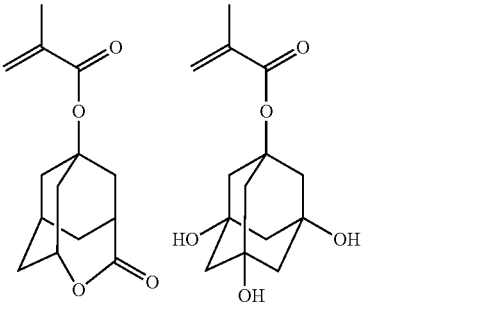

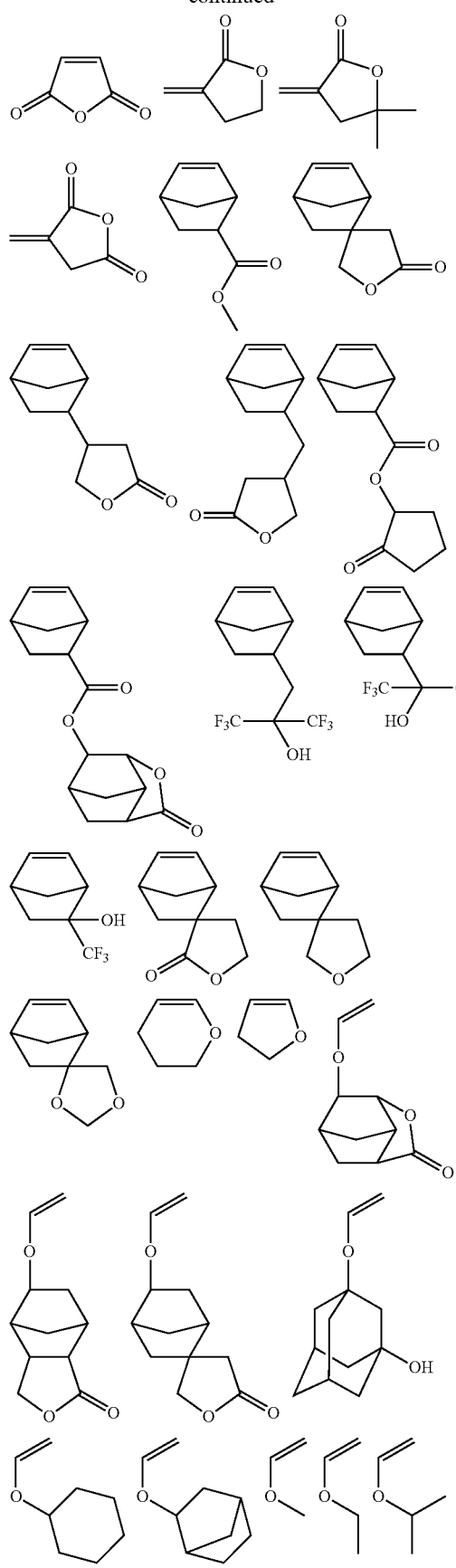
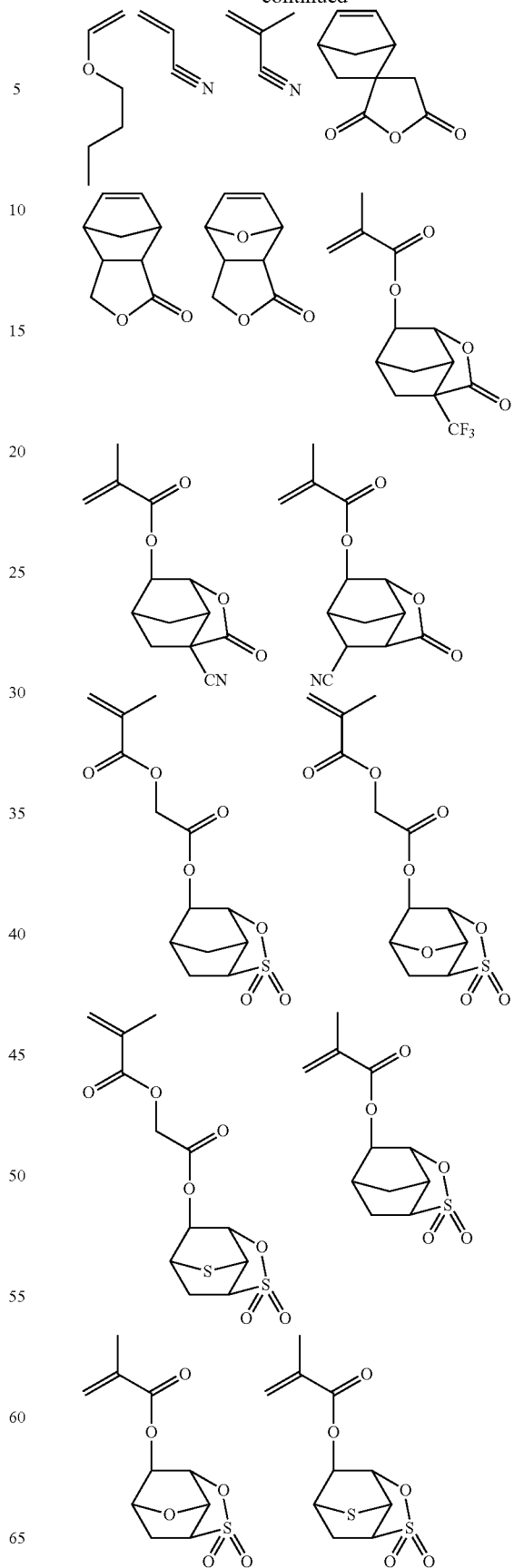

73
-continued
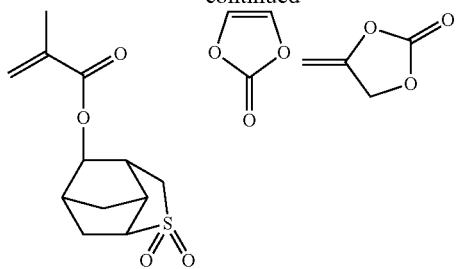
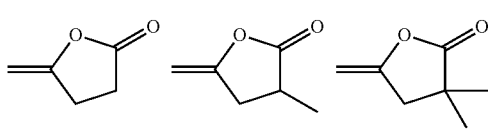
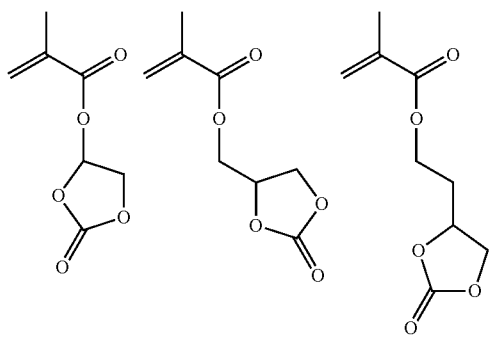
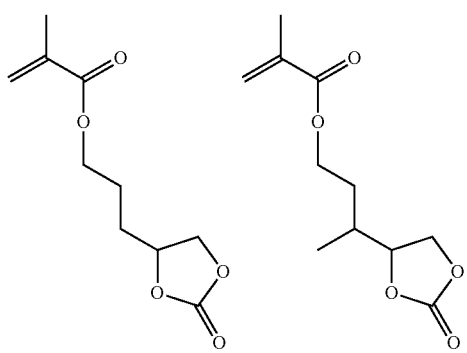
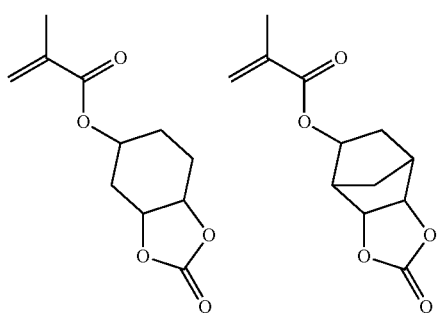
74
-continued
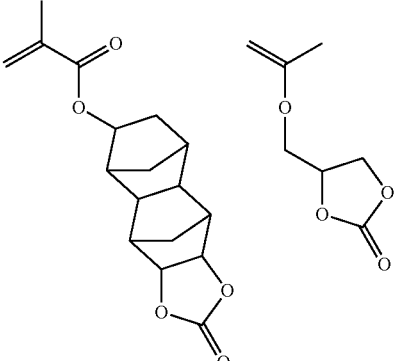
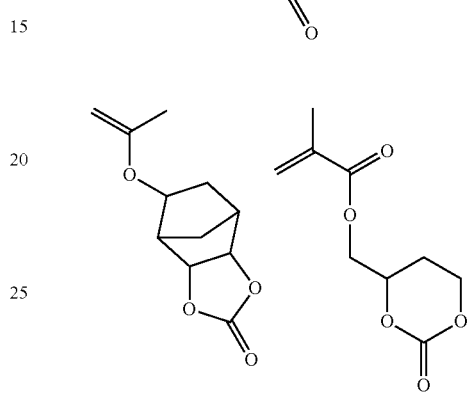
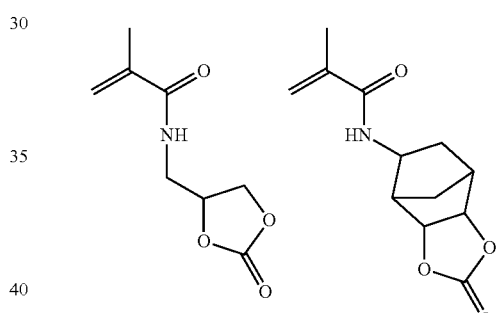
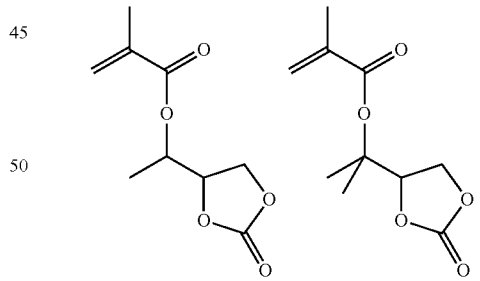
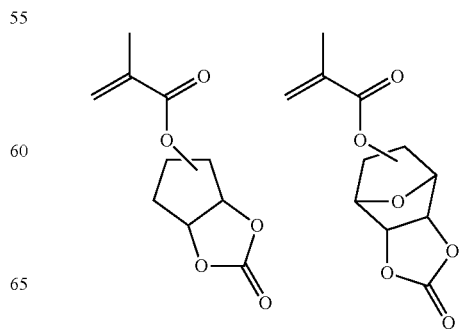

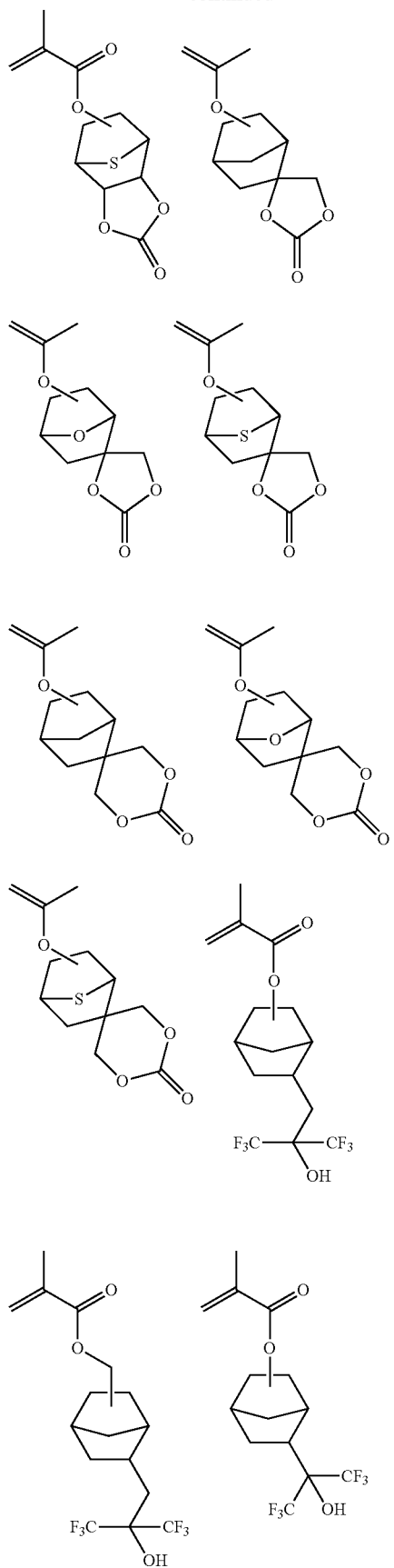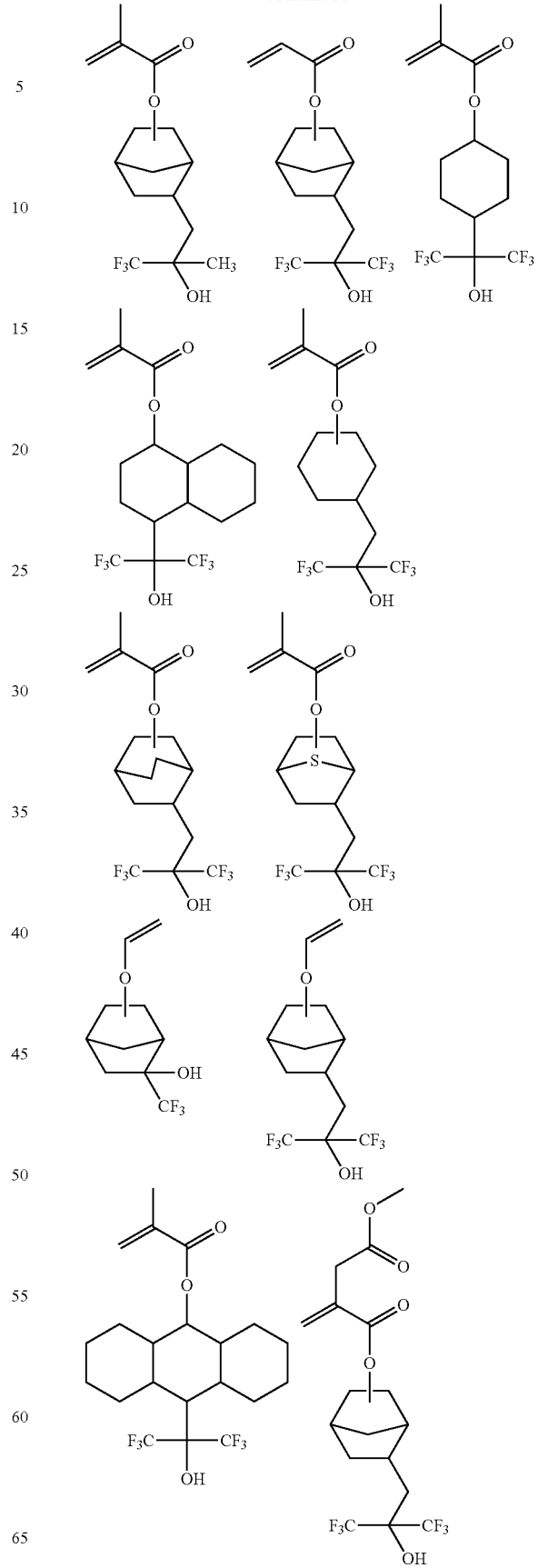

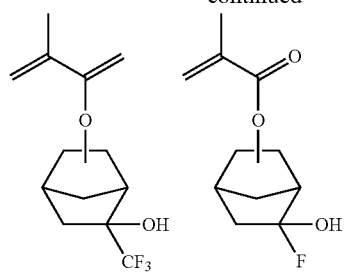
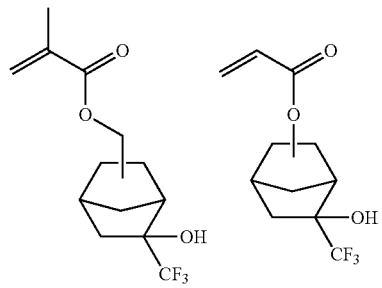
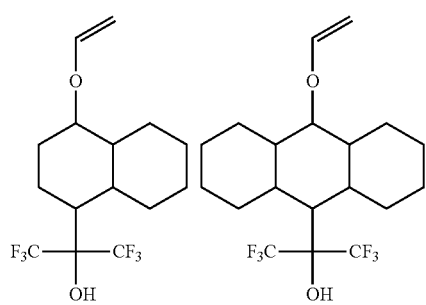
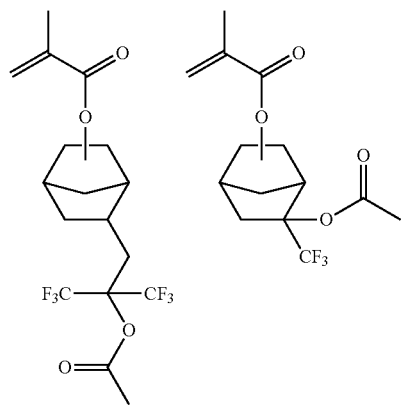
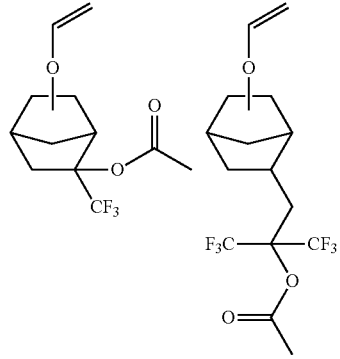
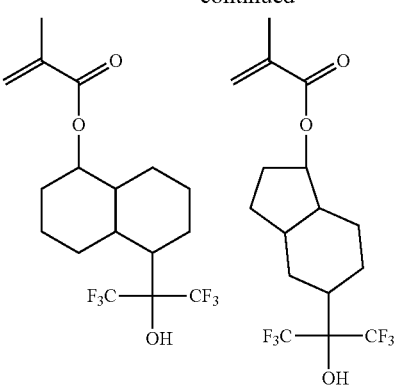
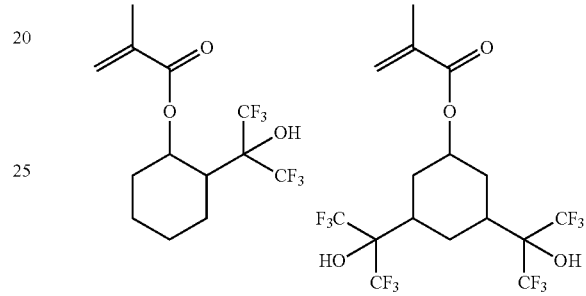
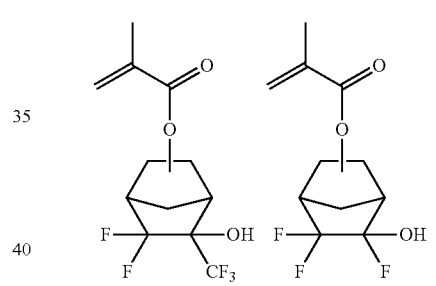
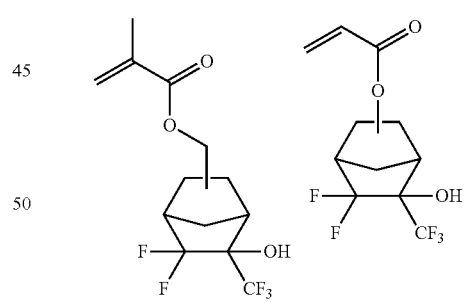
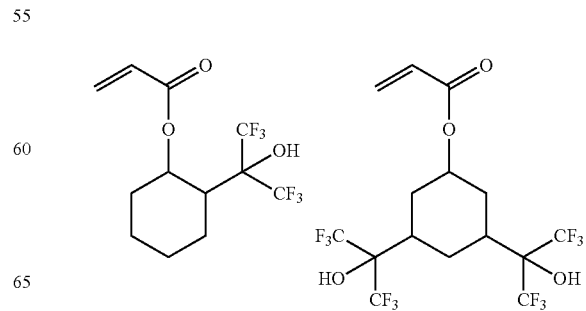

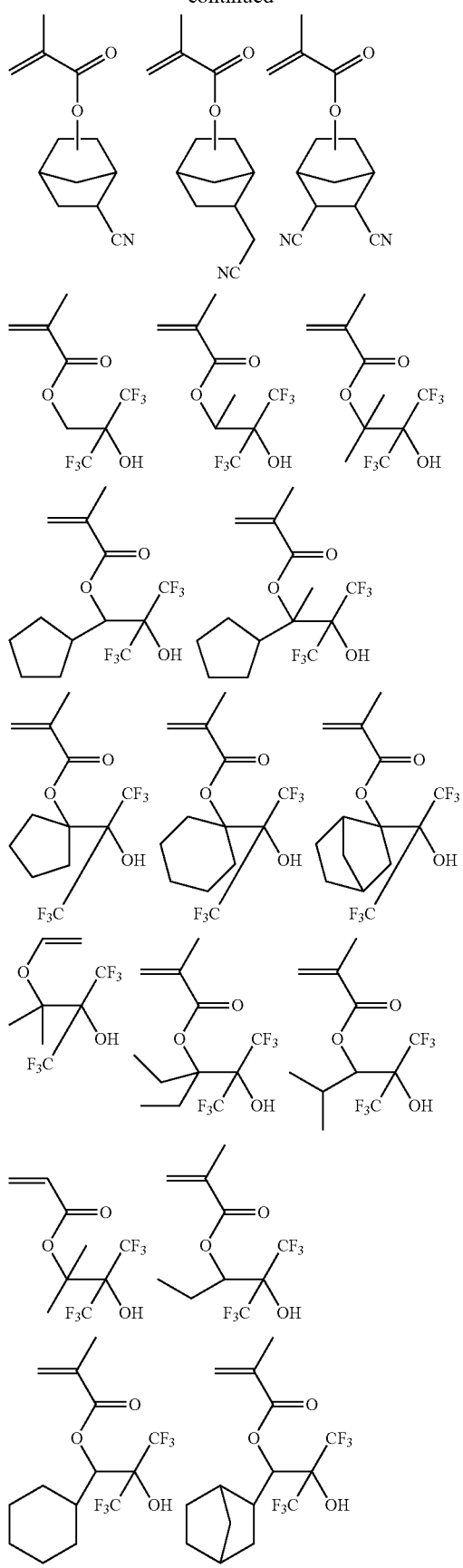
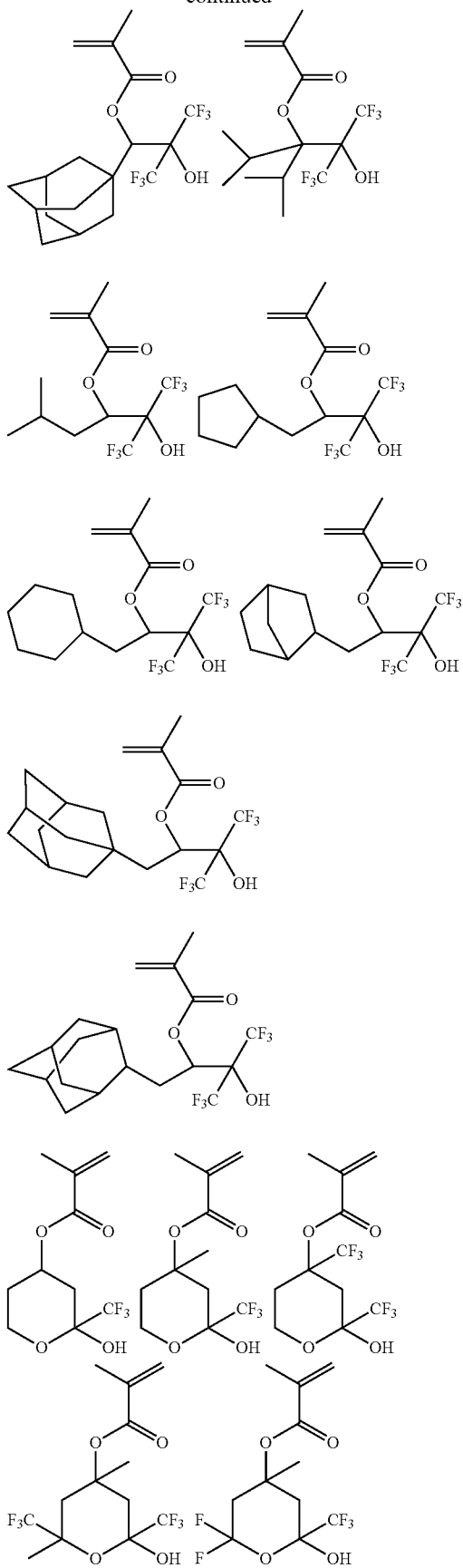

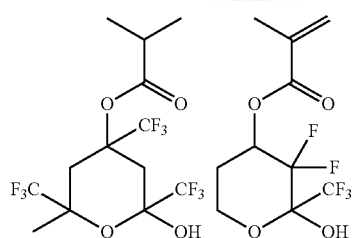
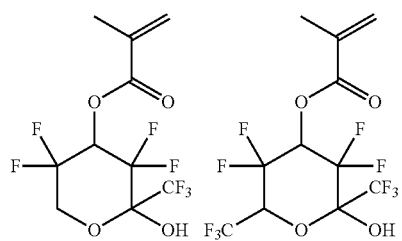
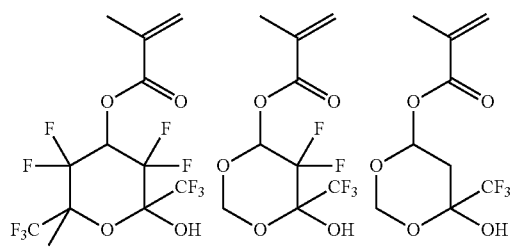
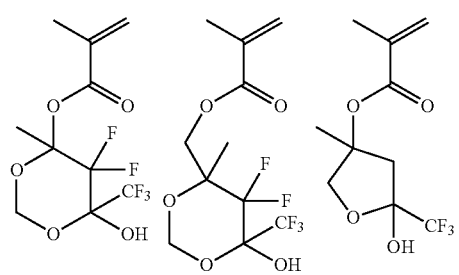
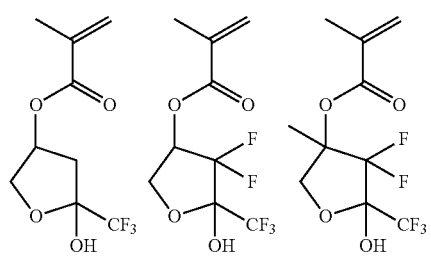
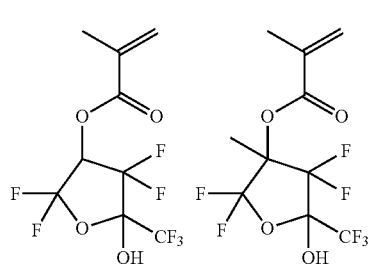
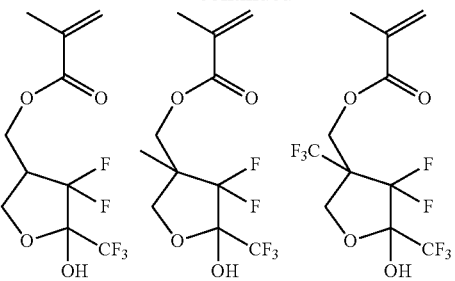
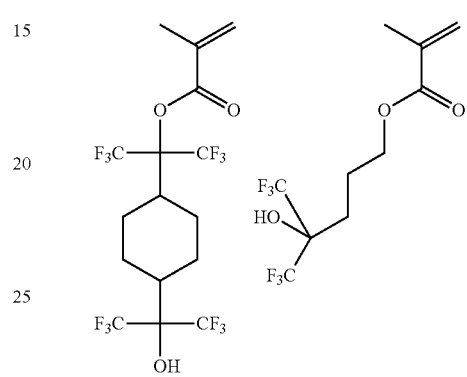
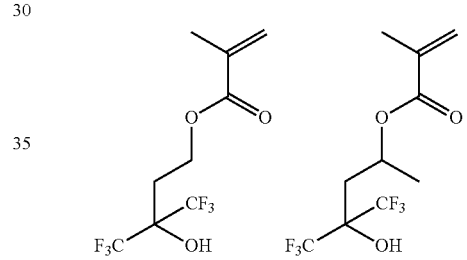
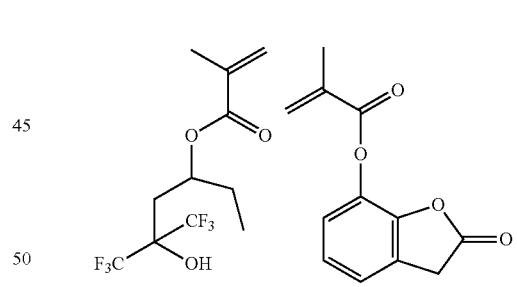
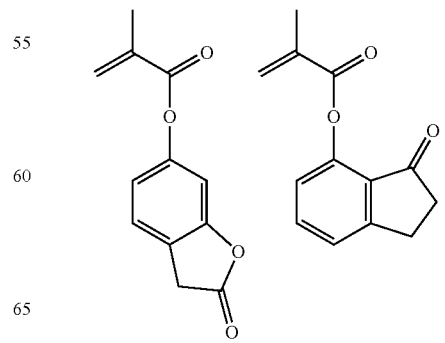

83
-continued
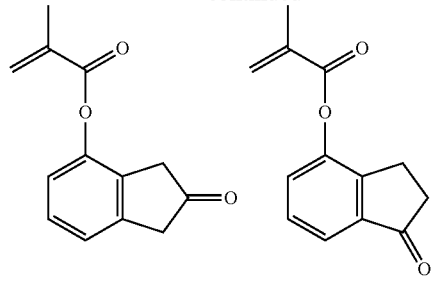
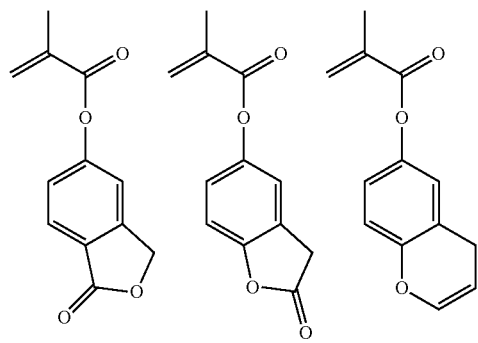
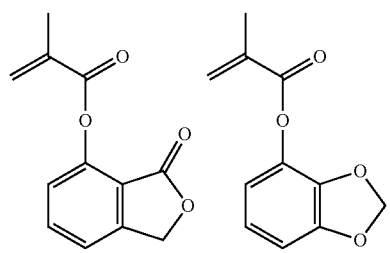
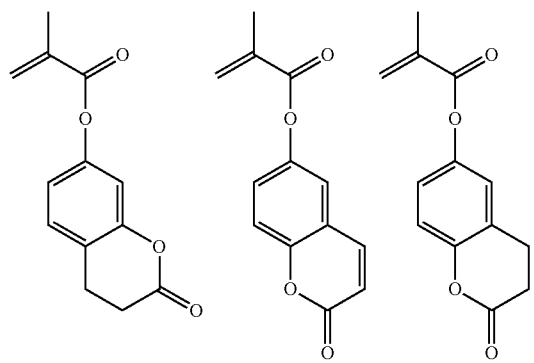
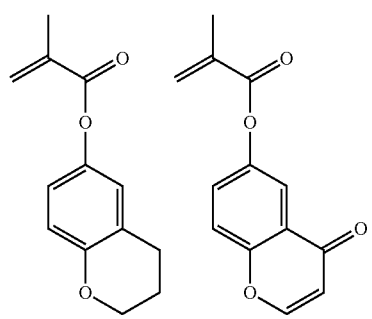
84
-continued
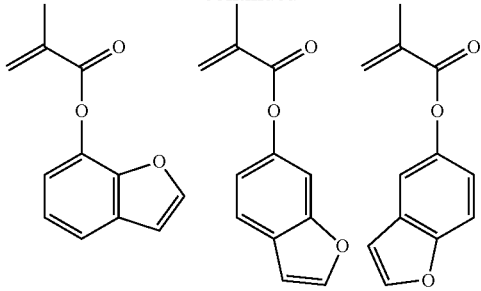
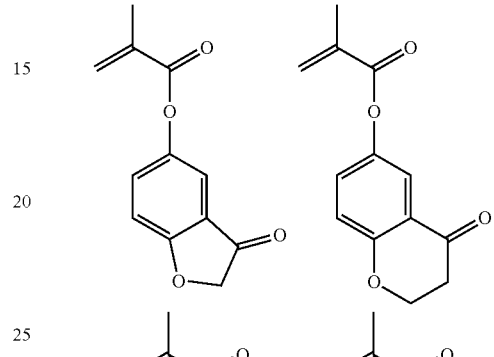
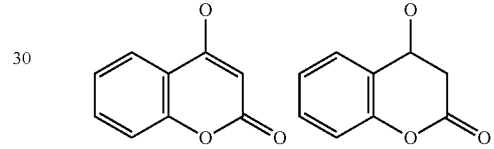
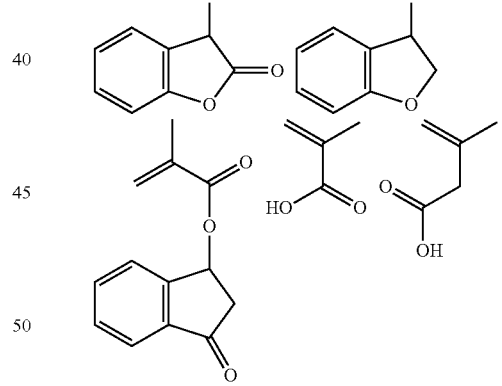
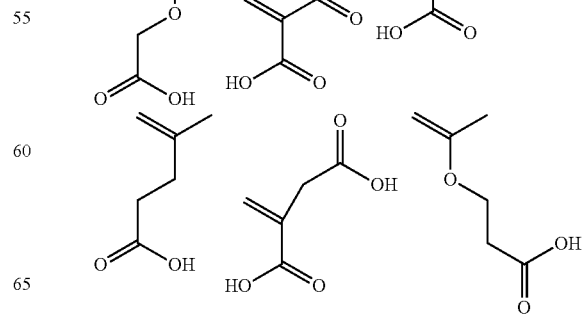

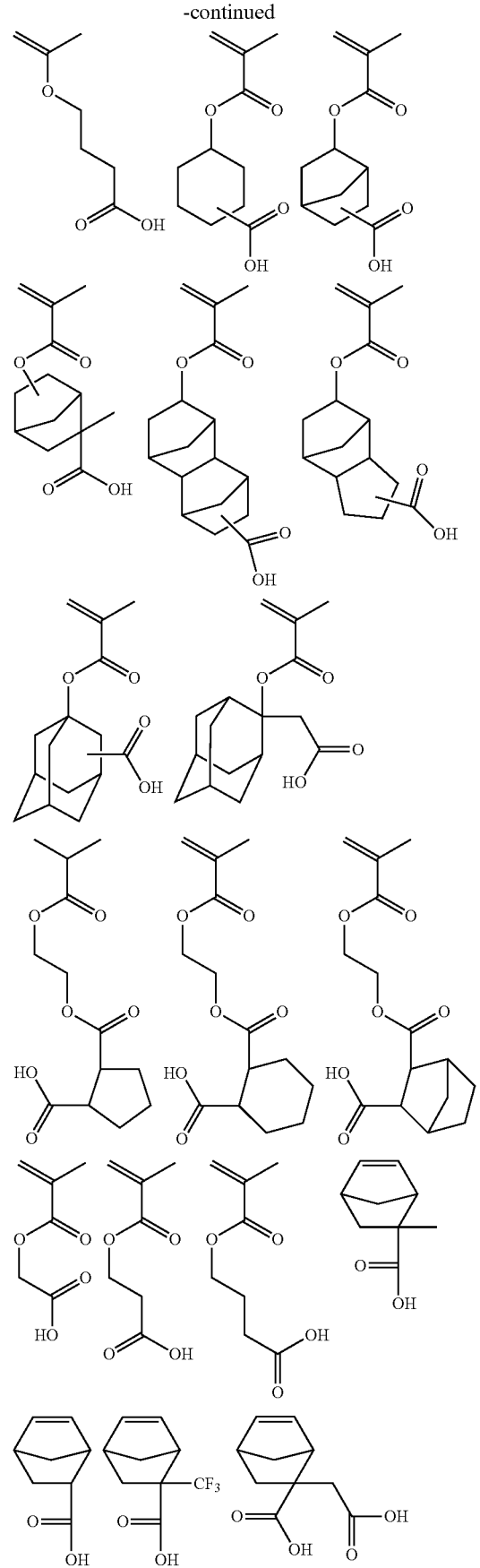
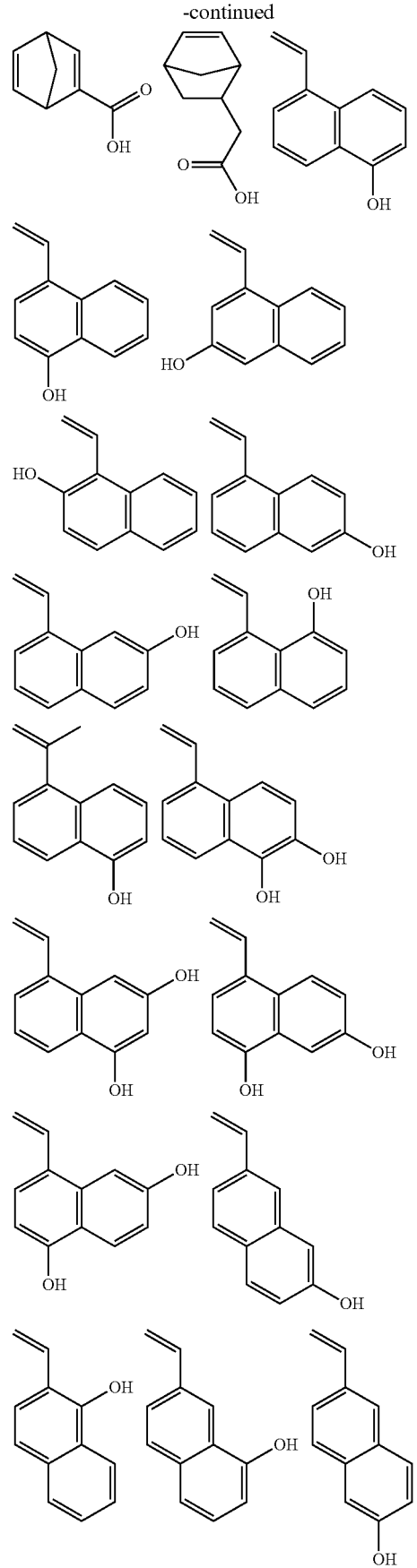

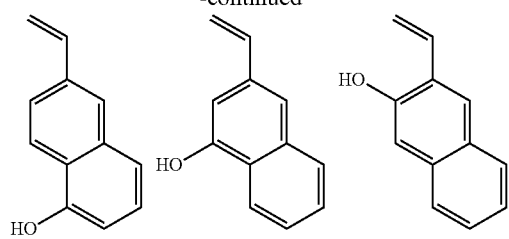
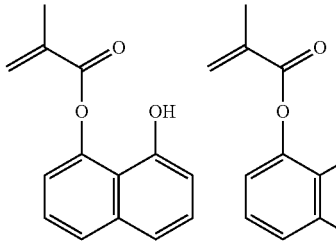
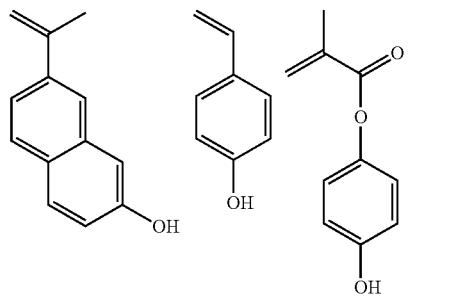
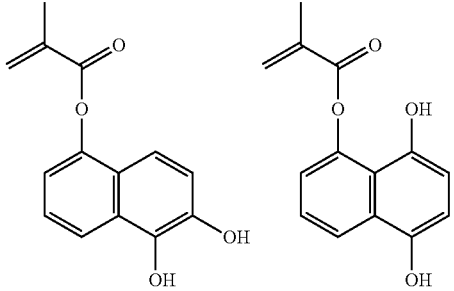
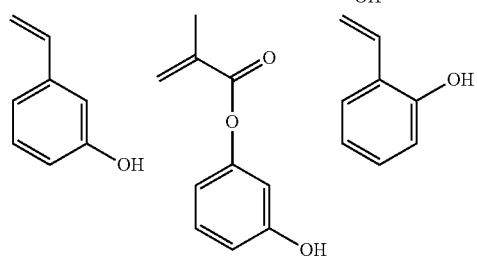
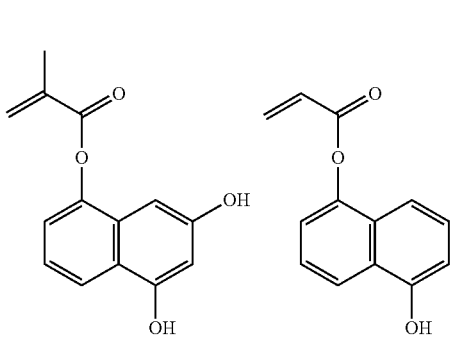
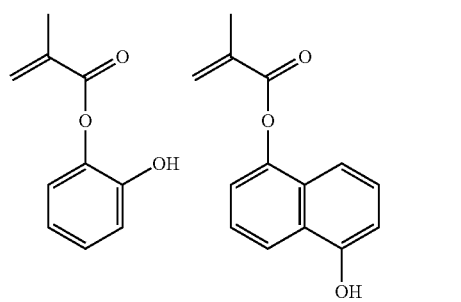
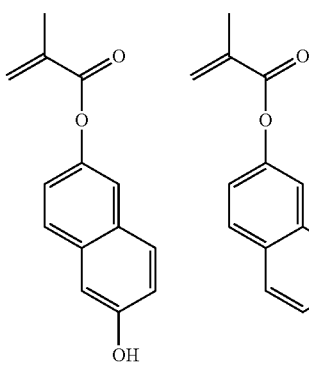
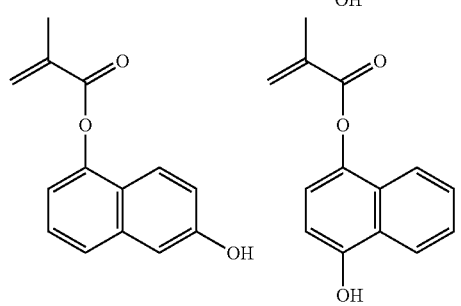
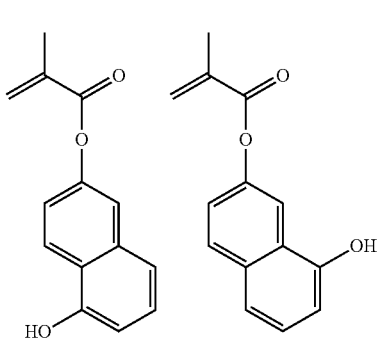
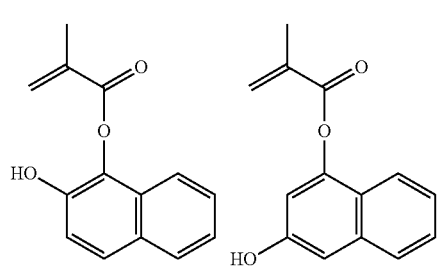

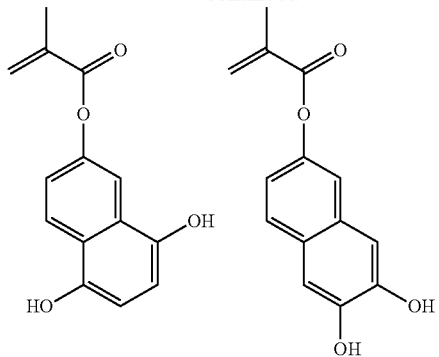
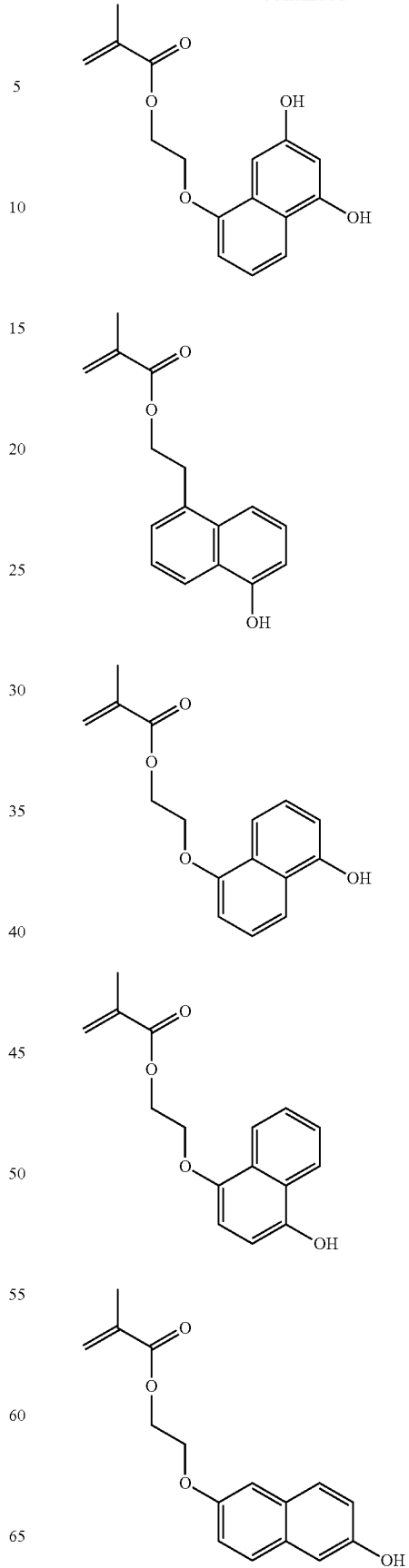

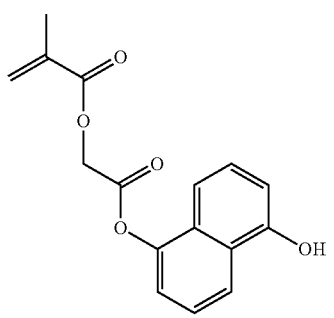
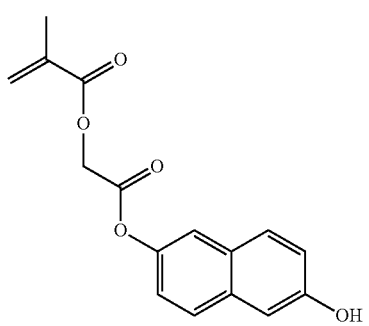
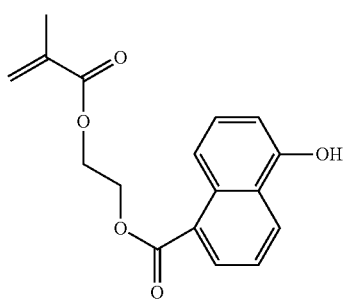
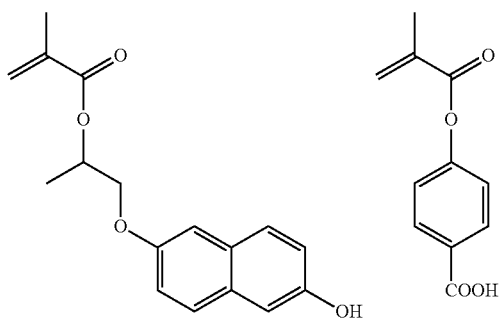
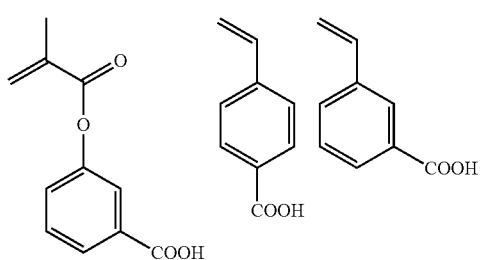
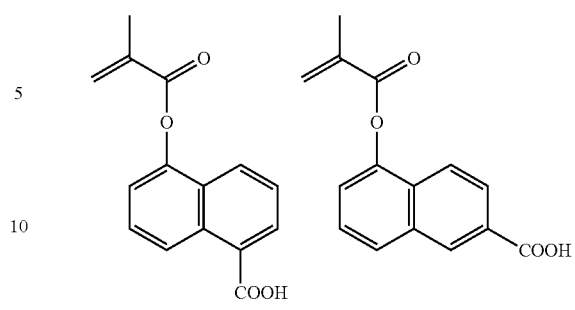
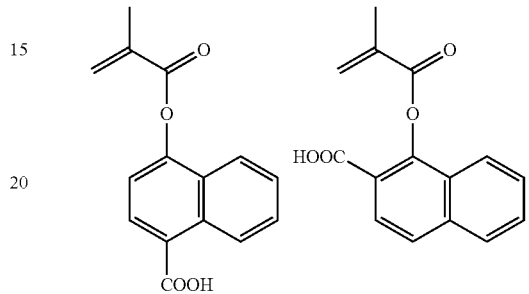
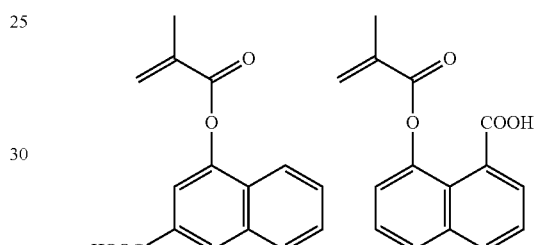
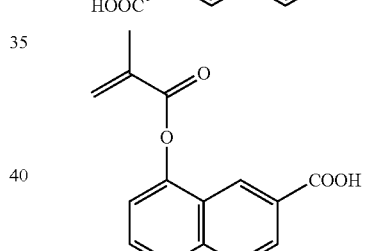
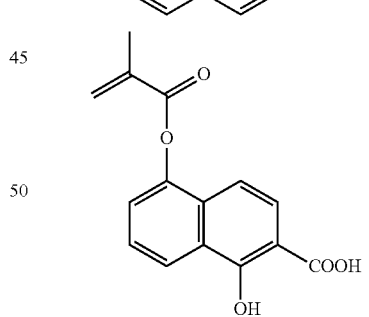
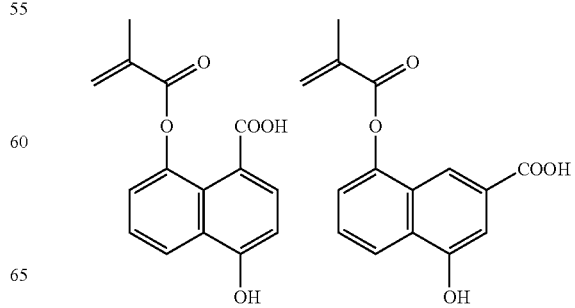

93
-continued
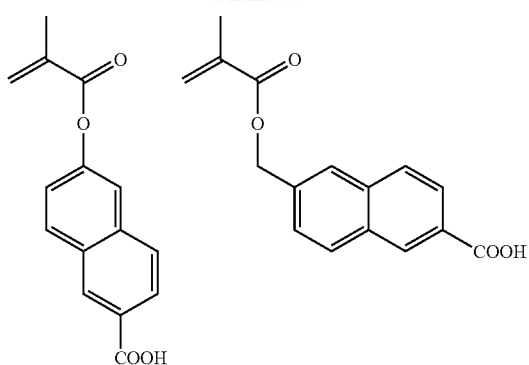
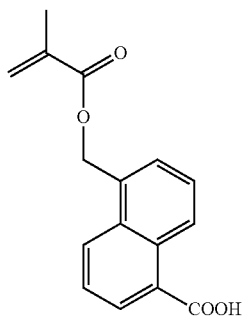
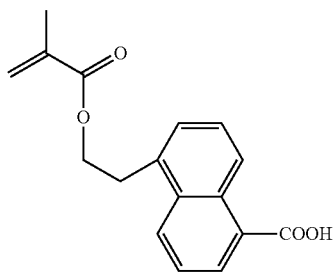
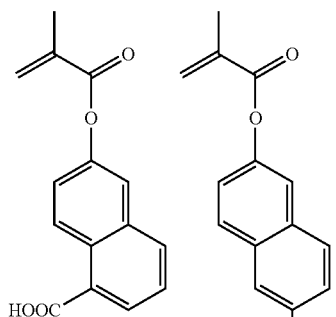
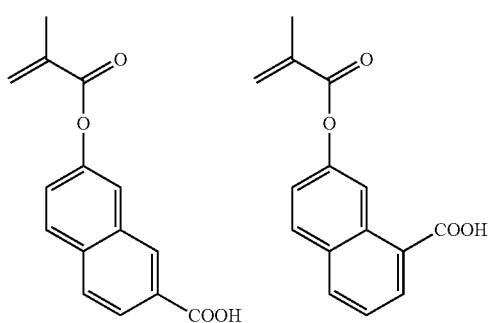
94
-continued
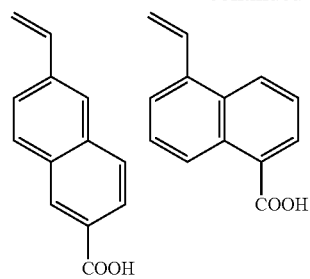
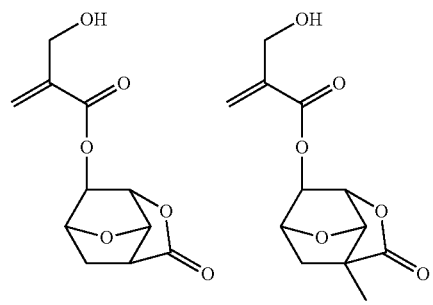
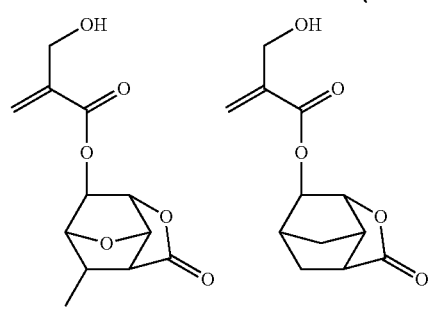
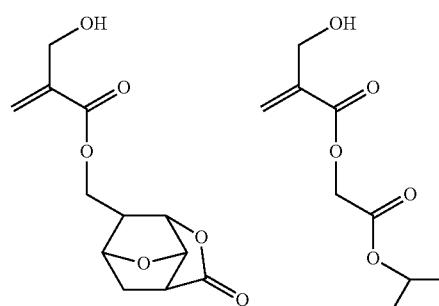
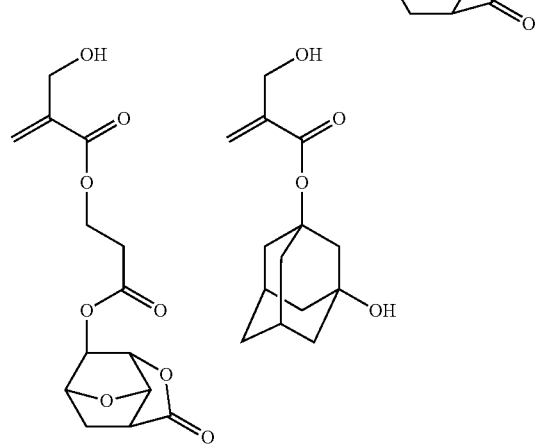

-continued
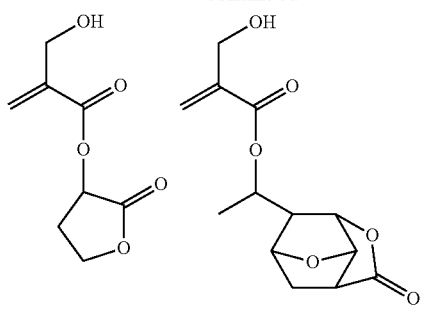
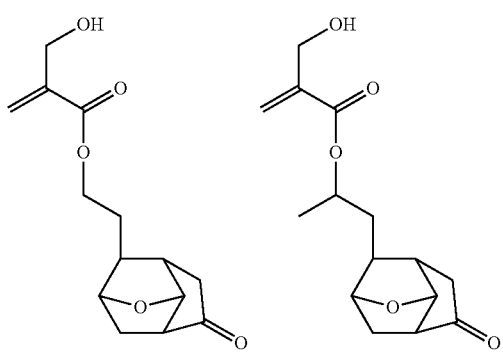
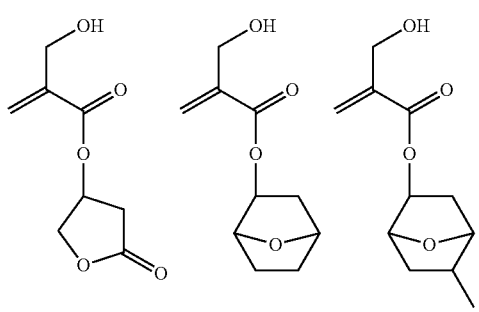
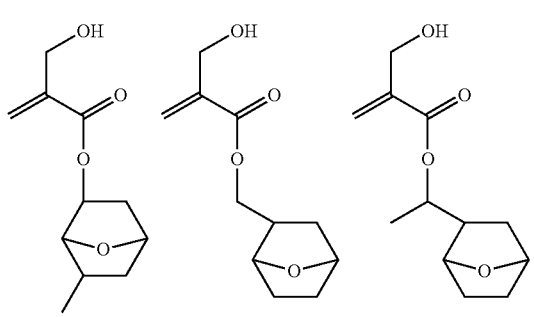
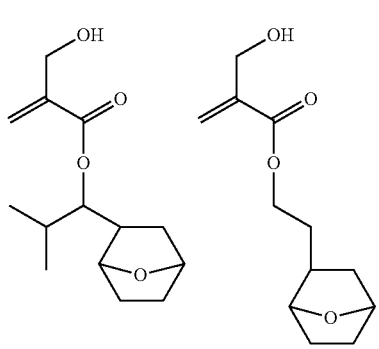
-continued
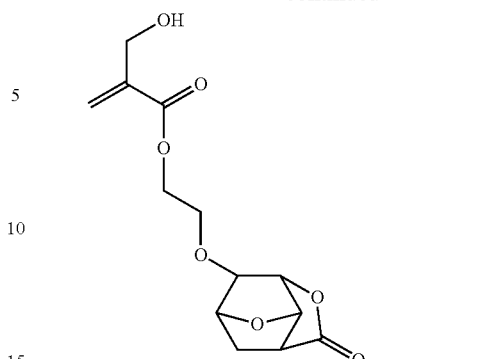
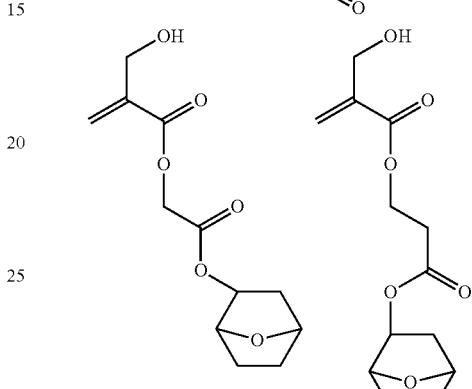
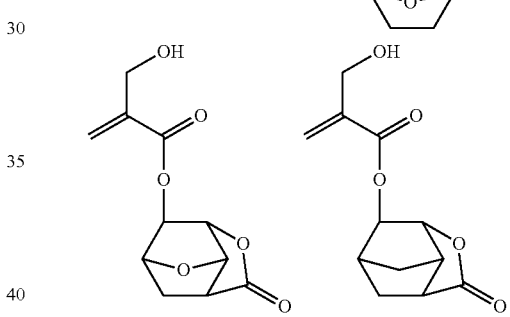
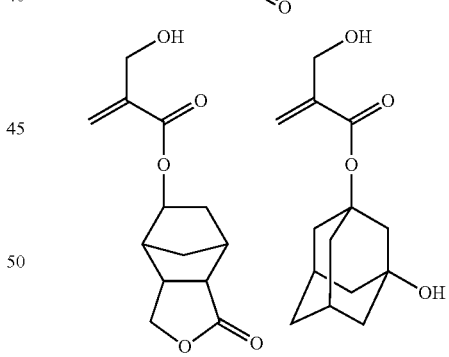
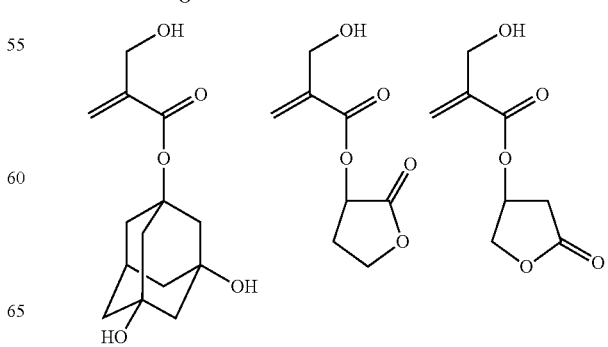

-continued

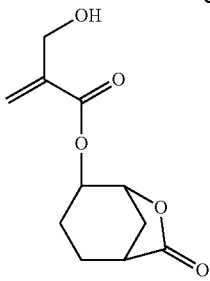

In the polymer, the recurring units (a1), (a2), (a3), (a4), (b), and (c) are present in proportions a1, a2, a3, a4, b, and c, respectively, which satisfy the range: $0 \leq a1 < 1.0$, $0 \leq a2 < 1.0$, $0 \leq a3 < 1.0$, $0 \leq a4 < 1.0$, $0 < a1+a2+a3+a4 < 1.0$, $0 < b \leq 0.9$, and $0 \leq c < 0.9$ (specifically $0 < c < 0.9$); preferably $0 \leq a1 \leq 0.5$, $0 \leq a2 \leq 0.5$, $0 \leq a3 \leq 0.5$, $0 \leq a4 \leq 0.5$, $0.01 \leq a1+a2+a3+a4 \leq 0.5$, $0.1 \leq b \leq 0.8$, and $0.1 \leq c < 0.8$; and
more preferably $0 \leq a1 \leq 0.3$, $0 \leq a2 \leq 0.3$, $0 \leq a3 \leq 0.3$, $0 \leq a4 \leq 0.3$, $0.015 \leq a1+a2+a3+a4 \leq 0.3$, $0.15 \leq b \leq 0.7$, and $0.15 \leq c < 0.7$.

The polymer may have copolymerized therein additional recurring units (d) other than the foregoing recurring units (a1), (a2), (a3), (a4), (b), and (c). Suitable recurring units (d) are derived from monomers including (meth)acrylates having a straight, branched or cyclic $C_1$-$C_{20}$ alkyl group, (meth)acrylates having a $C_2$-$C_{20}$ alkenyl group, (meth)acrylates having a $C_6$-$C_{20}$ aryl group, styrene, alkyl-substituted styrene, alkoxy-substituted styrene, acetoxy-substituted styrene, vinyl naphthalene, vinyl carbazole, acenaphthylene, indene, vinyl pyridine, vinyl anthracene, and vinyl pyrrolidone. A proportion d is preferably $0 \leq d \leq 0.3$, and more preferably $0 \leq d \leq 0.2$.

Further the polymer may have copolymerized therein recurring units (e1), (e2) or (e3) having a sulfonium salt represented by the general formula (10).

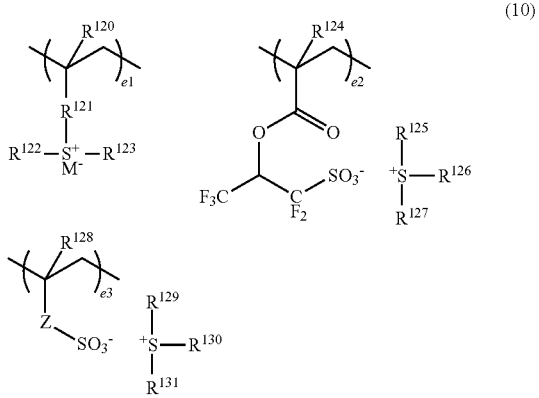

(10)

Herein $R^{120}$, $R^{124}$ and $R^{128}$ each are hydrogen or methyl. $R^{121}$ is a single bond, phenylene group, —O—R— or —C(=O)—Y—R— wherein Y is an oxygen atom or NH, and R is a straight, branched or cyclic $C_1$-$C_6$ alkylene, phenylene, or $C_3$-$C_{10}$ alkenylene group, which may contain a carbonyl (—CO—), ester (—COO—), ether (—O—) or hydroxyl radical. $R^{122}$, $R^{123}$, $R^{125}$, $R^{126}$, $R^{127}$, $R^{129}$, $R^{130}$, and $R^{131}$ are each independently a straight, branched or cyclic $C_1$-$C_{12}$ alkyl group which may contain a carbonyl, ester or ether radical, or a $C_6$-$C_{12}$ aryl group, $C_7$-$C_{20}$ aralkyl group or thiophenyl group. Z is a single bond, methylene, ethylene, phenylene, fluorinated phenylene, —O—$R^{132}$—, or —C(=O)—$Z_1$—$R^{132}$— wherein $Z_1$ is an oxygen atom or NH, and $R^{132}$ is a straight, branched or cyclic $C_1$-$C_6$ alkylene group, phenylene group or alkenylene group, which may contain a carbonyl, ester, ether or hydroxy radical. $M^-$ is a non-nucleophilic counter ion. The subscripts e1, e2 and e3 are numbers in the range: $0 \leq e1 \leq 0.3$, $0 \leq e2 \leq 0.3$, $0 \leq e3 \leq 0.3$, and $0 \leq e1+e2+e3 \leq 0.3$, preferably $0 < e1+e2+e3 \leq 0.3$.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide acids such as bis(trifluoromethylsulfonyl)imide, bis(perfluoroethylsulfonyl)imide, and bis(perfluorobutylsulfonyl)imide; and methide acids such as tris(trifluoromethylsulfonyl)methide and tris(perfluoroethylsulfonyl)methide.

Other non-nucleophilic counter ions include sulfonates having fluorine substituted at α-position as represented by the general formula (K-1) and sulfonates having fluorine substituted at α- and β-positions as represented by the general formula (K-2).

 (K-1)

 (K-2)

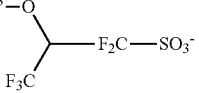

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl radical, lactone ring or fluorine. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl radical or lactone ring.

It is noted that proportions of recurring units (e1), (e2) and (e3) are $0 \leq e1+e2+e3 \leq 0.3$. When any of these recurring units are incorporated, the preferred proportions are $0.01 \leq e1+e2+e3 \leq 0.25$. Particularly when the resist composition is free of an acid generator of addition mode, the proportions are preferably $0.02 \leq e1+e2+e3 \leq 0.20$ and more preferably $0.03 \leq e1+e2+e3 \leq 0.18$. It is noted that a1+a2+a3+a4+b+c+d+e1+e2+e3=1.

The polymer serving as the base resin in the resist composition should preferably have a weight average molecular weight (Mw) in the range of 1,000 to 500,000, and more preferably 2,000 to 30,000, as measured by GPC using polystyrene standards. With too low a Mw, the efficiency of thermal crosslinking in the resist material after development may become low. A polymer with too high a Mw may lose alkali solubility and give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer used herein may be synthesized by any desired method, for example, by dissolving unsaturated bond-containing monomers corresponding to the respective recurring units (a1), (a2), (a3), (a4), (b), (c), (d), (e1), (e2), and (e3) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once removed with an acid catalyst, followed by protection or partial protection.

As described above, the photobase generator (PBG) may be incorporated into a polymer (serving as the base resin in the resist composition) as recurring units having a PBG group. Instead of incorporating a PBG group into a polymer, or in addition to the polymer having a PBG group incorporated therein, a compound having a partial structure of formula (i), (ii) or (iii) may be added as a PBG to the resist composition. The PBG to be added to the resist composition is referred to as PBG of addition mode. Specifically, PBGs of addition mode having the following general formulae (2) to (9) may be compounded.

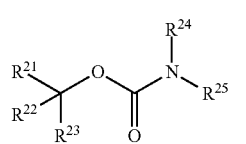
(2)

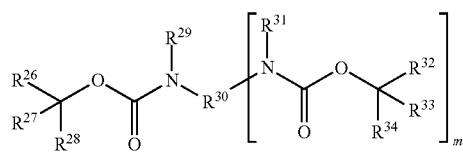
(3)

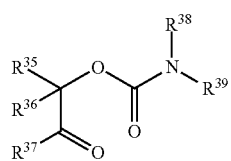
(4)

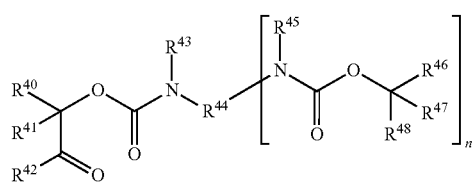
(5)

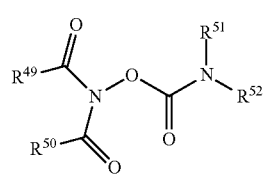
(6)

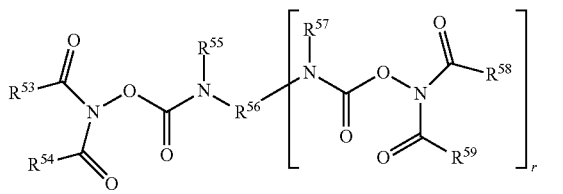
(7)

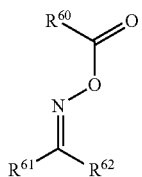
(8)

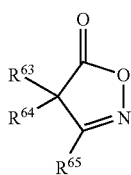
(9)

Herein $R^{21}$, $R^{22}$, $R^{23}$, $R^{26}$, $R^{27}$, $R^{28}$, $R^{32}$, $R^{33}$, $R^{34}$, $R^{35}$, $R^{36}$, $R^{37}$, $R^{40}$, $R^{41}$, $R^{42}$, $R^{46}$, $R^{47}$, and $R^{48}$ each are hydrogen, a straight, branched or cyclic $C_1$-$C_6$ alkyl group, or a $C_6$-$C_{14}$ aryl group, the aryl group may have a straight, branched or cyclic $C_1$-$C_6$ alkyl or alkoxy, nitro, halogen, cyano or trifluoromethyl radical, at least one of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ is an aryl group and at least one is hydrogen, or at least two of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ may bond together to form a $C_3$-$C_{10}$, preferably $C_4$-$C_8$ non-aromatic ring with the carbon atom to which they are attached. $R^{24}$, $R^{25}$, $R^{29}$, $R^{31}$, $R^{38}$, $R^{39}$, $R^{43}$, $R^{45}$, $R^{51}$, $R^{52}$, $R^{55}$, and $R^{57}$ each are hydrogen or a straight, branched or cyclic $C_1$-$C_{12}$ alkyl group which may have a double bond, ether, amino, carbonyl, hydroxyl or ester radical, a pair of $R^{24}$ and $R^{25}$, $R^{29}$ and $R^{31}$, $R^{29}$ and $R^{30}$, $R^{31}$ and $R^{30}$, $R^{38}$ and $R^{39}$, $R^{43}$ and $R^{44}$, $R^{44}$ and $R^{45}$, $R^{43}$ and $R^{45}$, $R^{51}$ and $R^{52}$, $R^{55}$ and $R^{56}$, $R^{55}$ and $R^{57}$, or $R^{56}$ and $R^{57}$ may bond together to form a $C_1$-$C_{10}$, preferably $C_4$-$C_8$ non-aromatic ring with the nitrogen atom to which they are attached. $R^{30}$, $R^{44}$, and $R^{56}$ each are a single bond, straight, branched or cyclic $C_1$-$C_{20}$ alkylene group, alkyne group, $C_6$-$C_{20}$ arylene group, $C_2$-$C_{12}$ alkenylene group, or $C_2$-$C_{12}$ alkynylene group, which groups may have a double bond, ether, amino, carbonyl, hydroxyl or ester radical. $R^{49}$, $R^{50}$, $R^{53}$, $R^{54}$, $R^{58}$, and $R^{59}$ each are a straight or branched $C_1$-$C_6$ alkyl group, a pair of $R^{49}$ and $R^{50}$, $R^{53}$ and $R^{54}$, or $R^{58}$ and $R^{59}$ may bond together to form a $C_1$-$C_{10}$, preferably $C_4$-$C_8$ ring with the carbon atoms to which they are attached and the nitrogen atom therebetween, which ring may contain a benzene ring, naphthalene ring, double bond or ether bond. $R^{60}$ is a straight, branched or cyclic $C_1$-$C_{16}$, alkyl, $C_6$-$C_{20}$ aryl or $C_2$-$C_{20}$ alkenyl group. $R^{61}$ is a $C_6$-$C_{20}$ aryl group. $R^{62}$ is hydrogen, a straight, branched or cyclic $C_1$-$C_{16}$, alkyl group or $C_6$-$C_{20}$ aryl group. $R^{63}$, $R^{64}$, and $R^{65}$ each are hydrogen, a straight, branched or cyclic $C_1$-$C_6$ alkyl group, $C_6$-$C_{14}$ aryl group, $C_2$-$C_{10}$ alkenyl or alkoxycarbonyl group, or cyano group, the alkyl, aryl and alkenyl groups optionally having a straight, branched or cyclic $C_1$-$C_6$ alkyl or alkoxy, alkoxycarbonyl, nitro, halogen, cyano, trifluoromethyl, sulfide, amino or ether radical. The subscripts m, n and r each are 1 or 2.

Examples of the PBG of formula (2) are given below wherein $R^{24}$ and $R^{25}$ are as defined above.
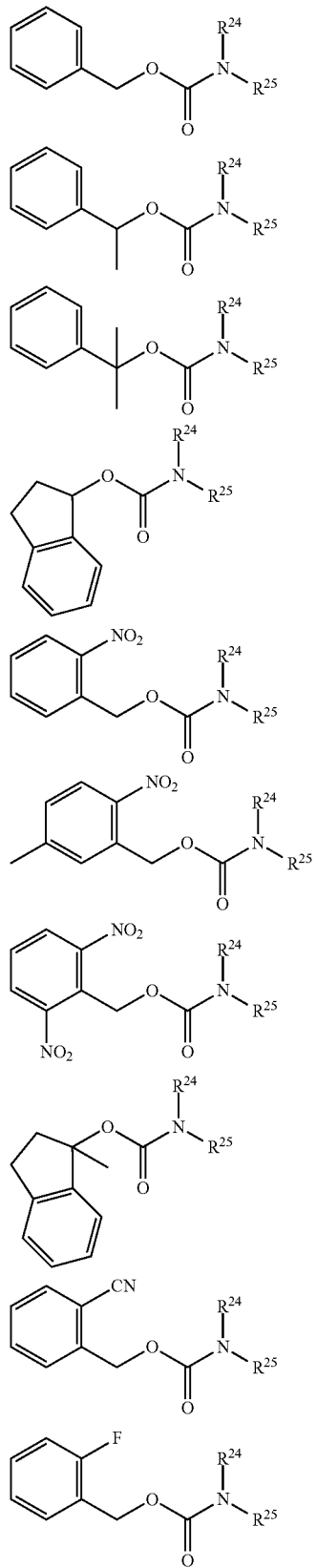
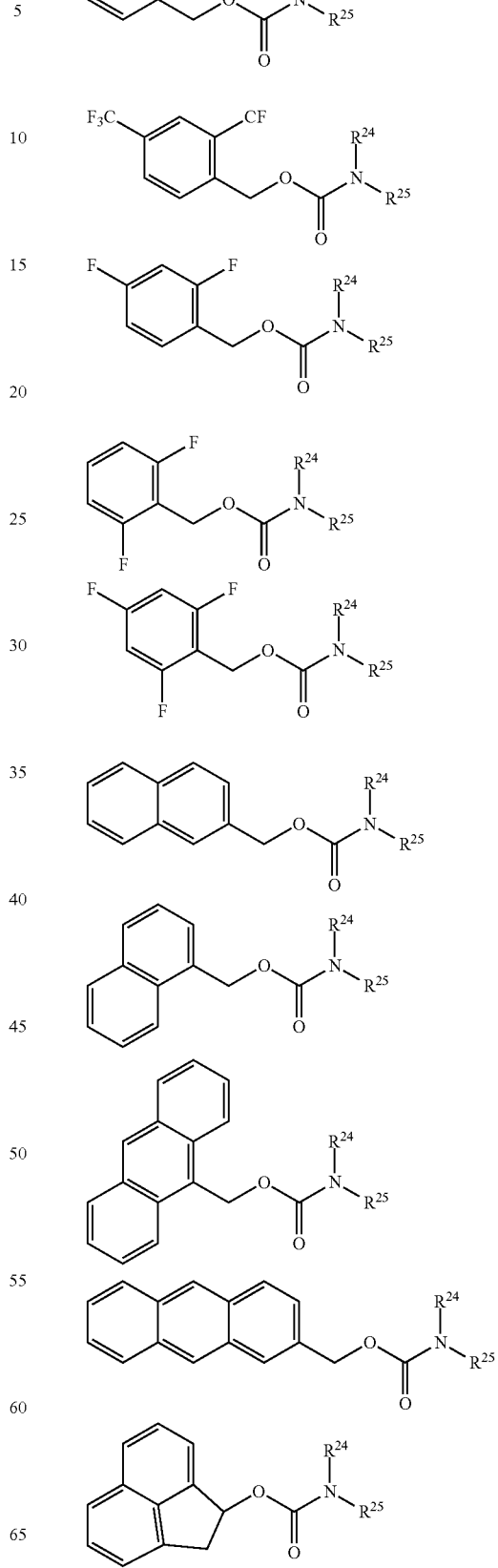

103
-continued
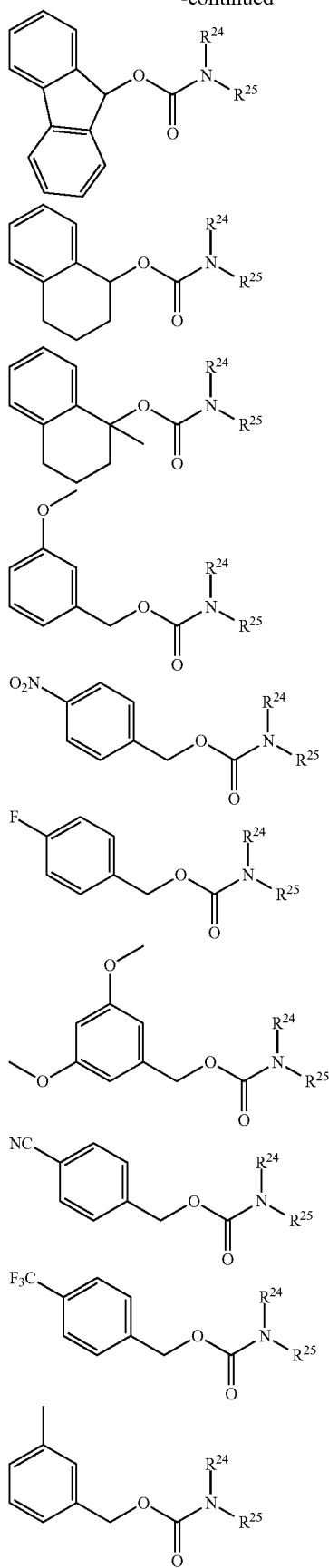
104
-continued
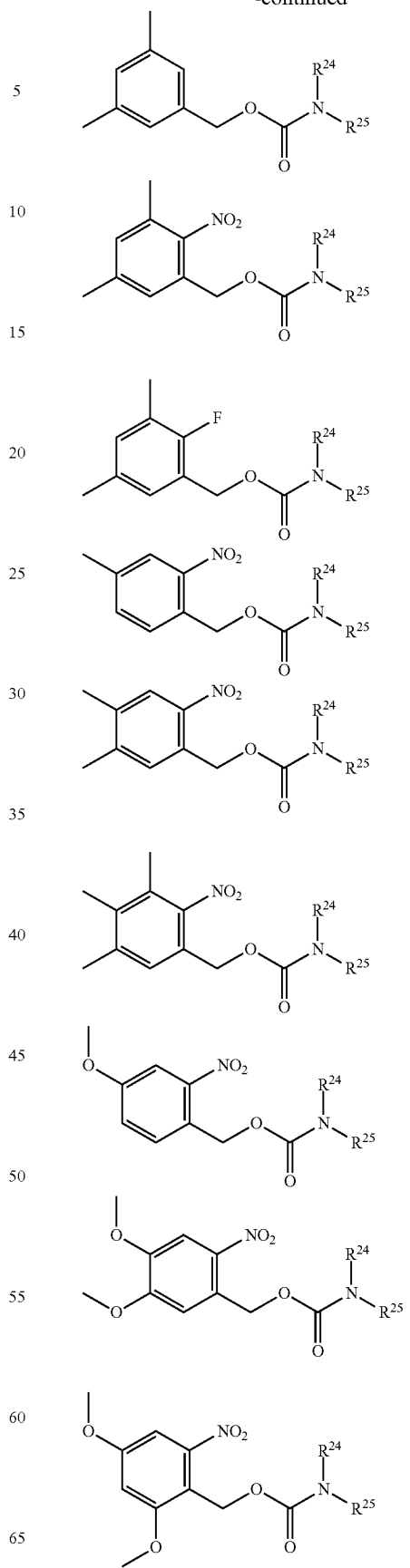

105
-continued
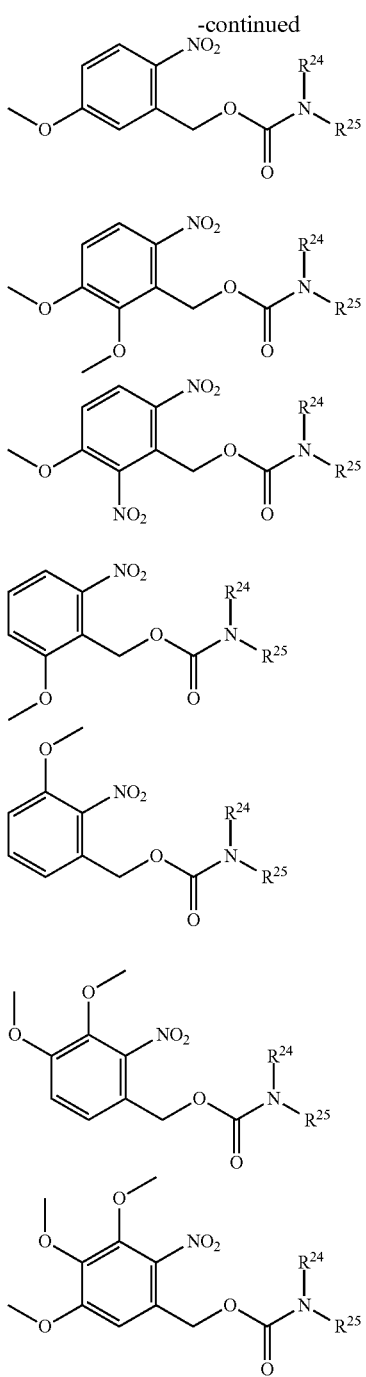
106
-continued
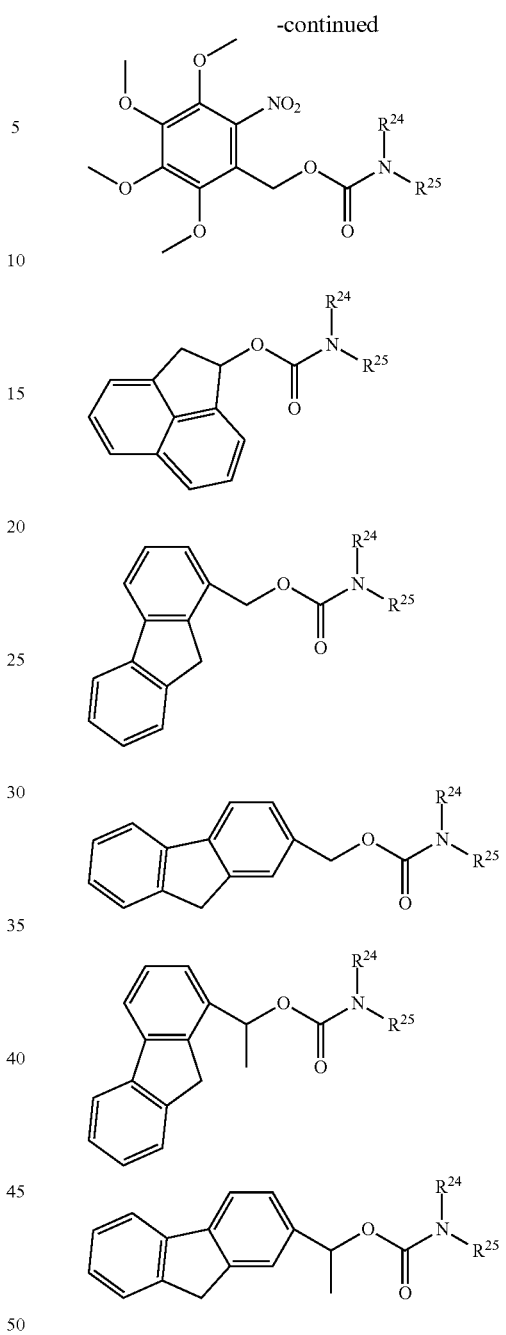
Examples of the PBG of formula (3) are given below. Note that $R^{29}$ to $R^{30}$ are as defined above, hereinafter.
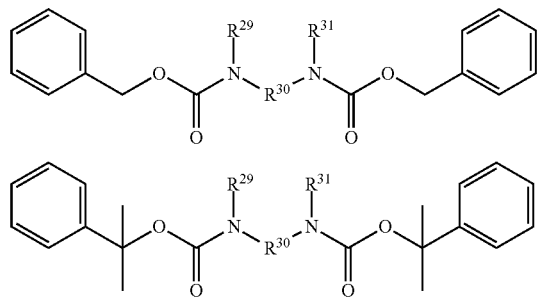
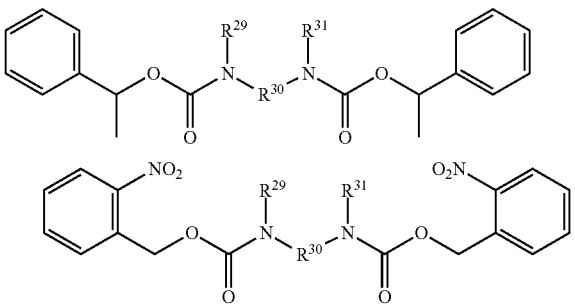

107 108
-continued
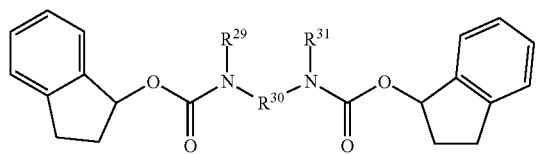 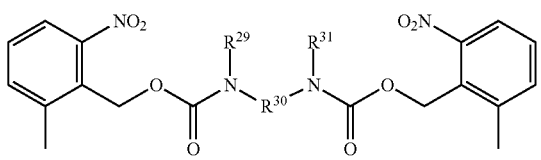
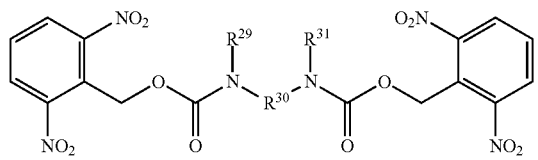 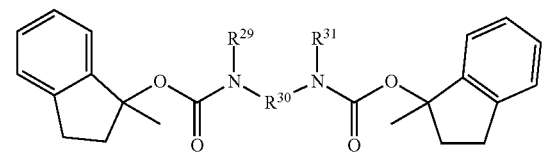
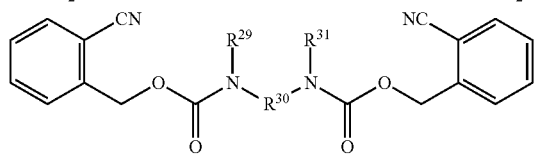 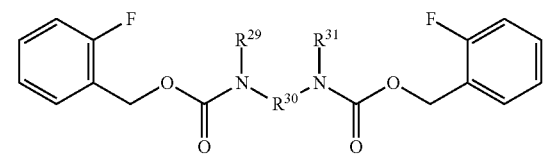
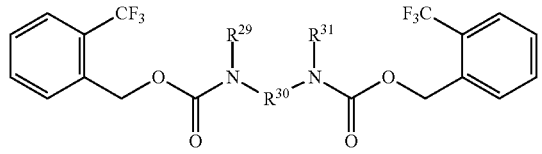 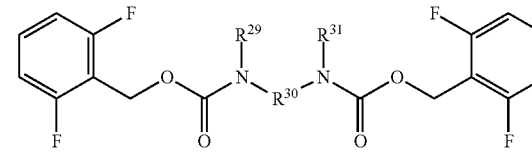
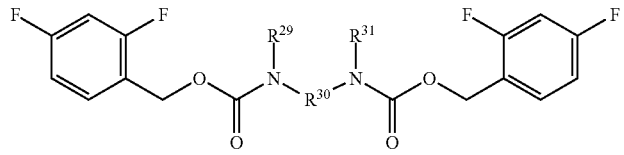
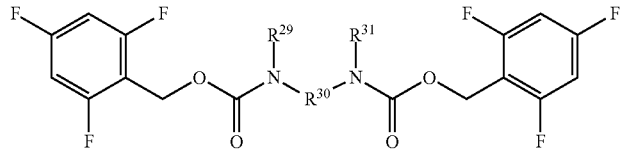
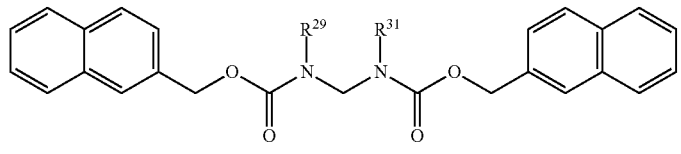
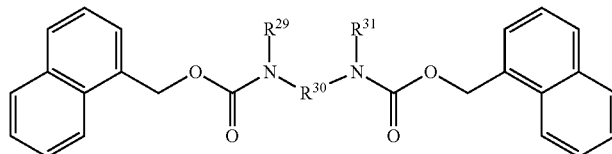
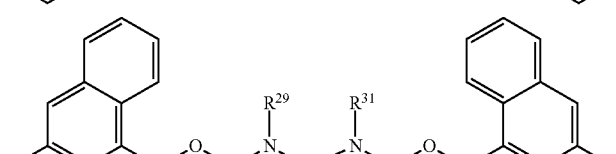
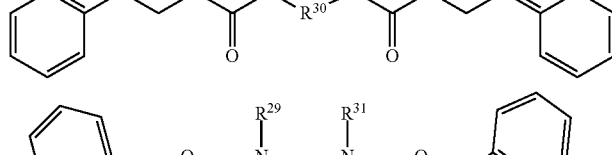
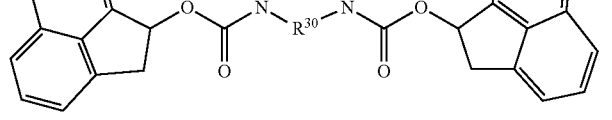
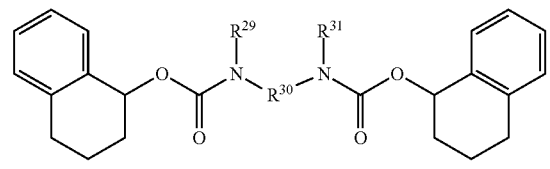

-continued
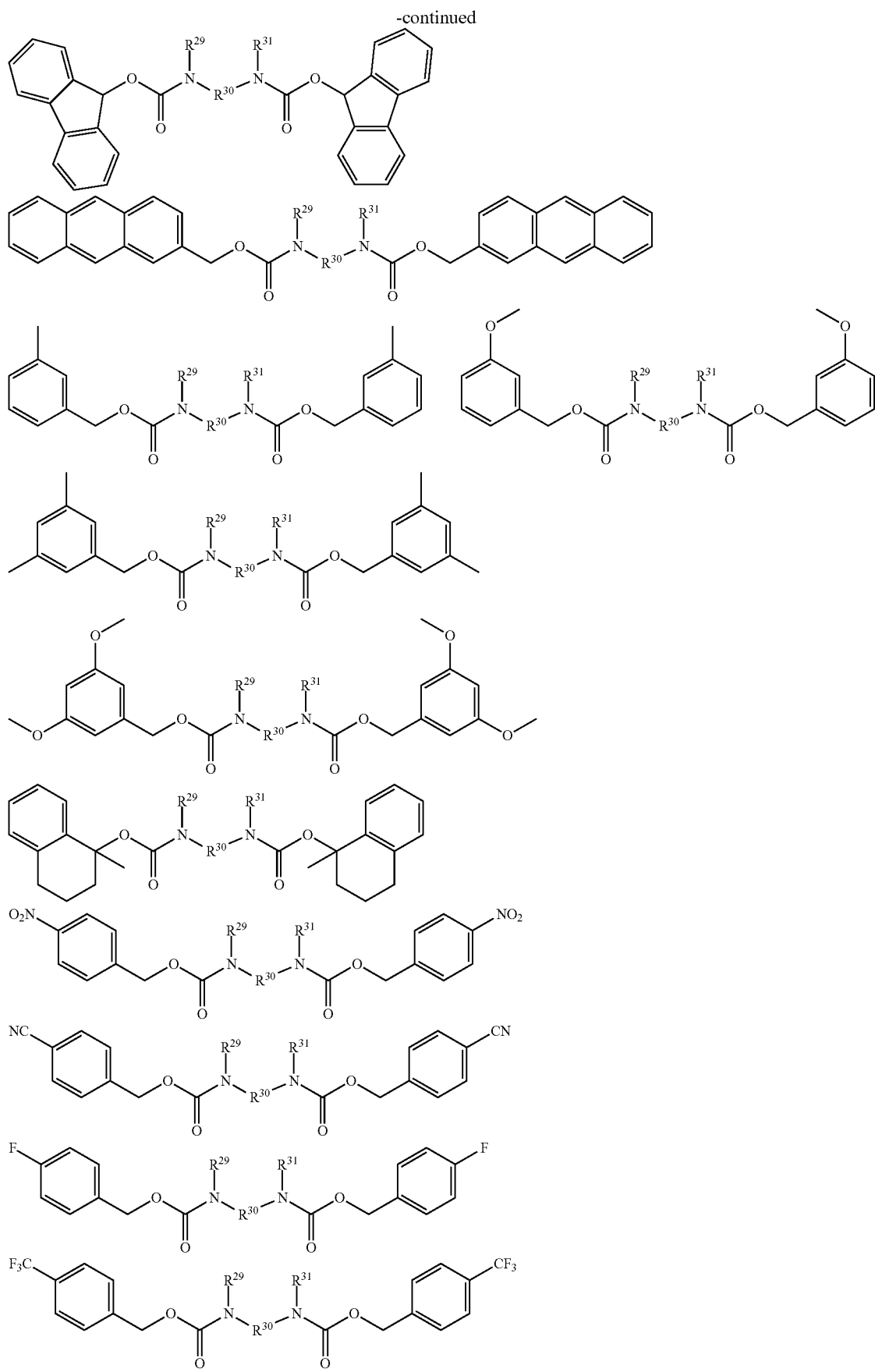

-continued
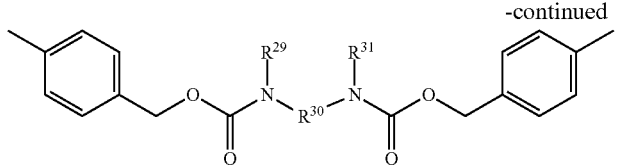
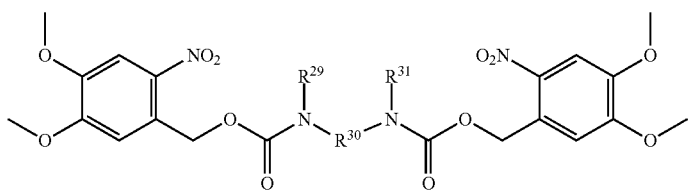
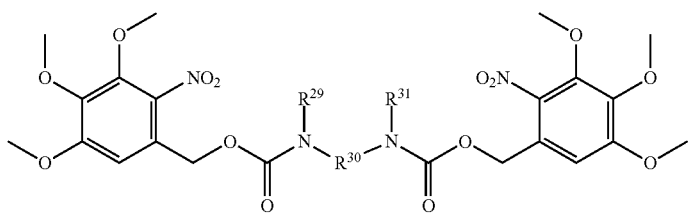
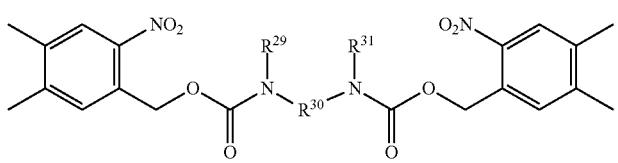
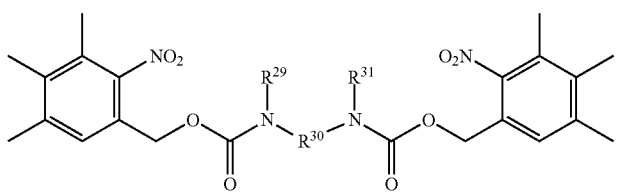
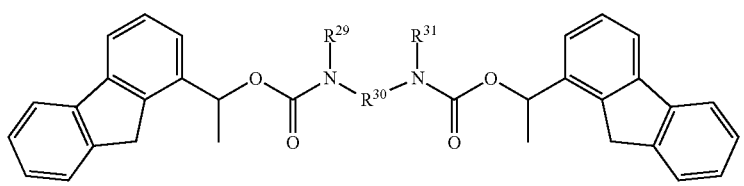
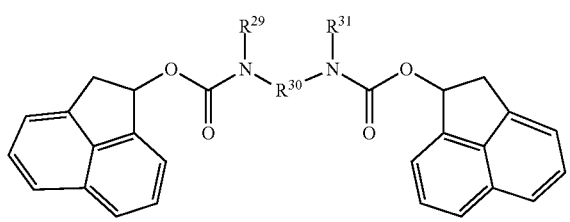
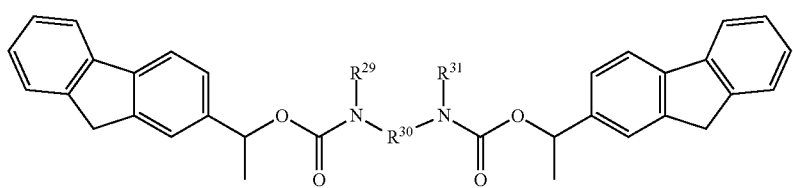

Examples of the PBGs of formula (3) releasing tri-branched amine compounds are given below.
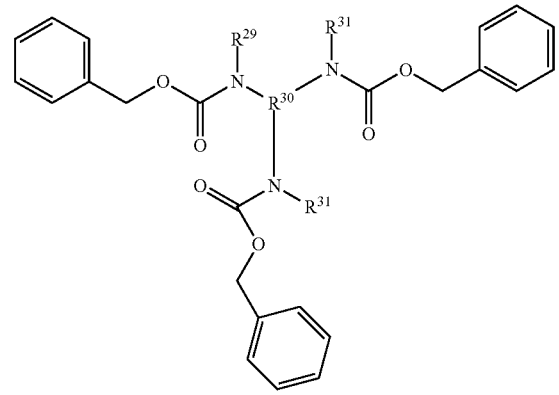
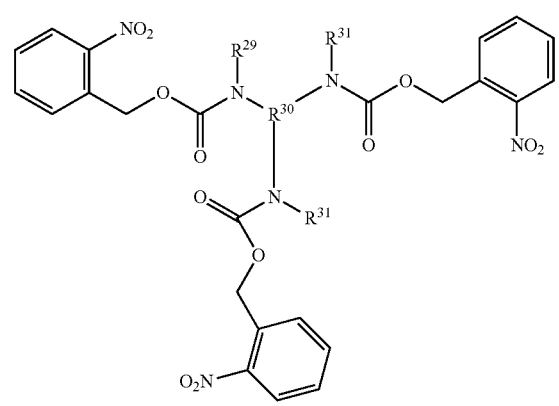
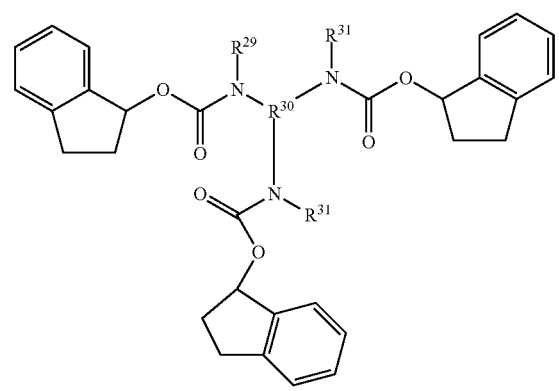
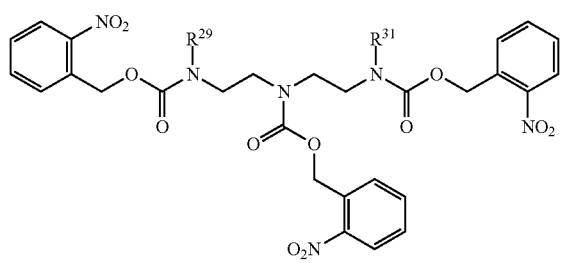
Examples of the PBG of formula (4) are given below. Note that $R^{38}$ and $R^{39}$ are as defined above, hereinafter.
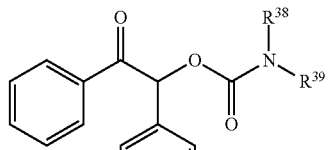
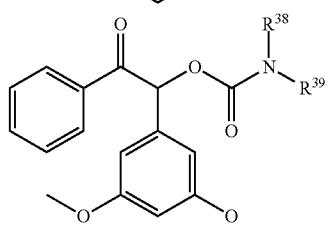
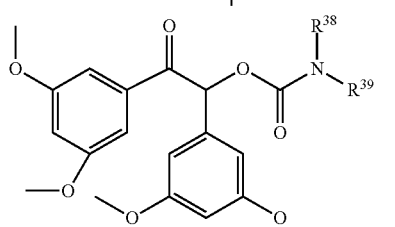
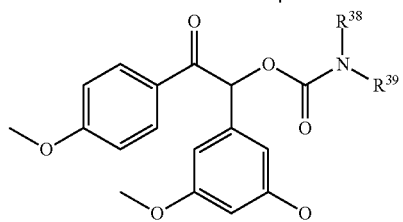
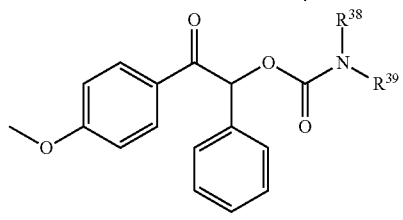
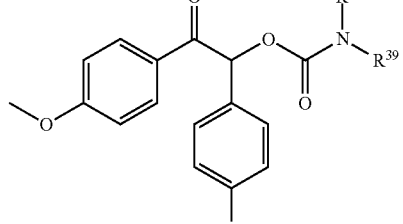
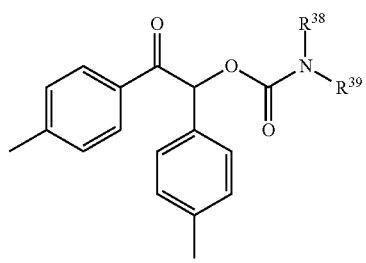

115
-continued
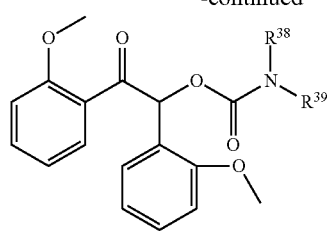
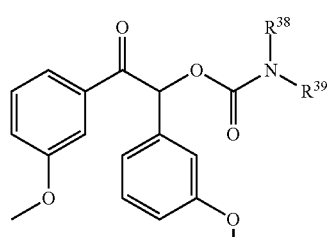
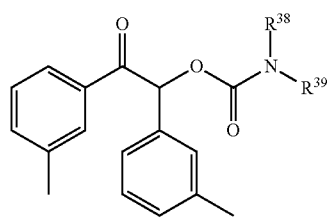
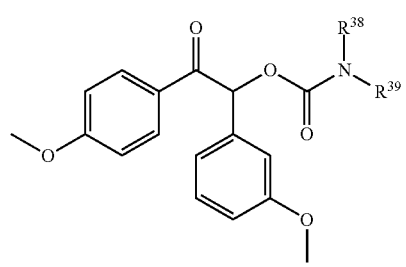
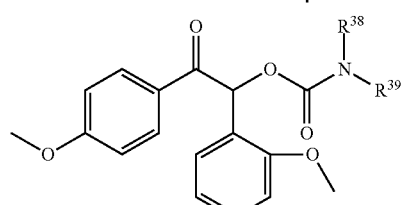
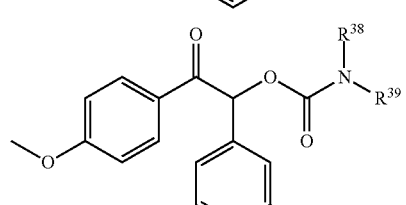
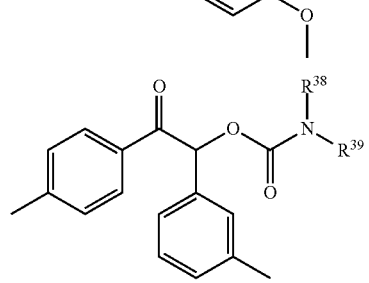
116
-continued
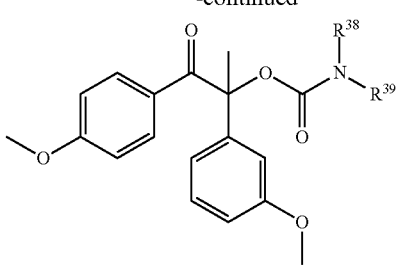
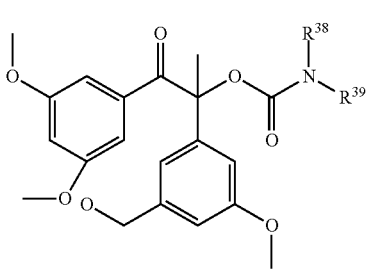
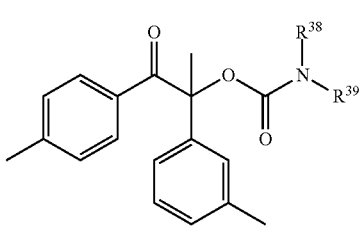
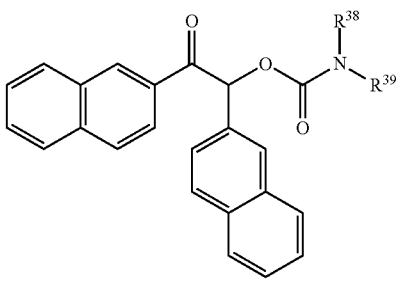
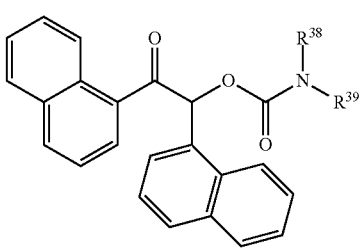
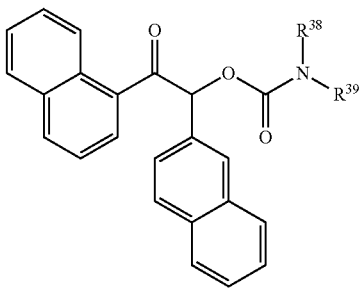

117
-continued
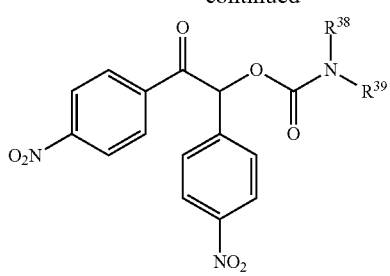
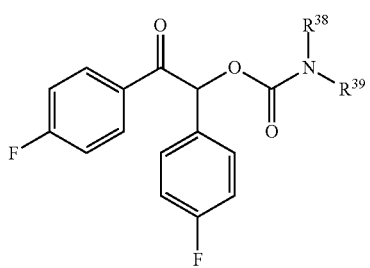
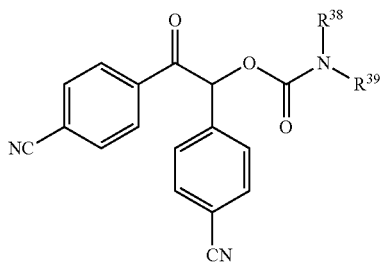
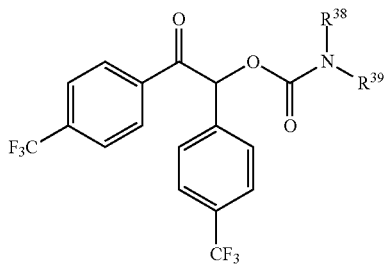
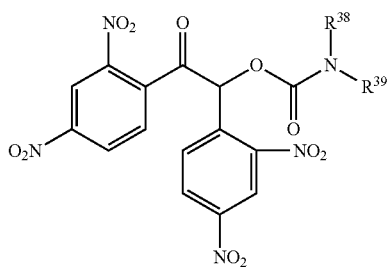
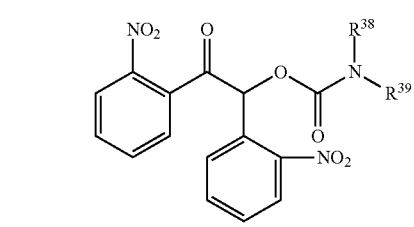
118
-continued
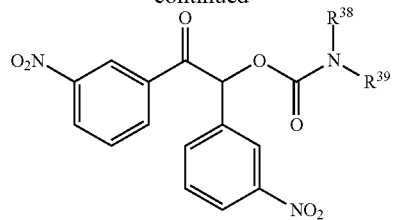
Examples of the PBG of formula (5) are given below. Note that $R^{43}$ to $R^{45}$ are as defined above, hereinafter.
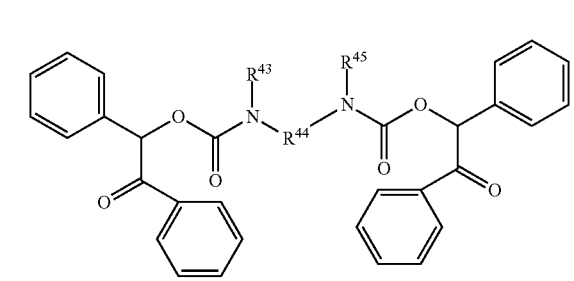
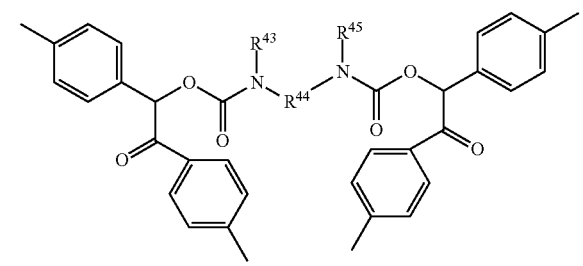
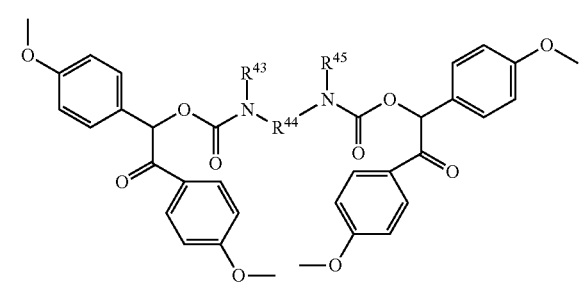
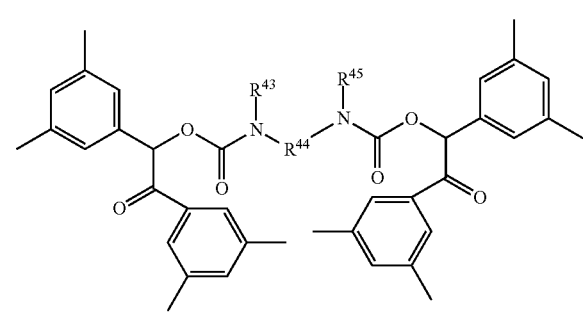

119
-continued
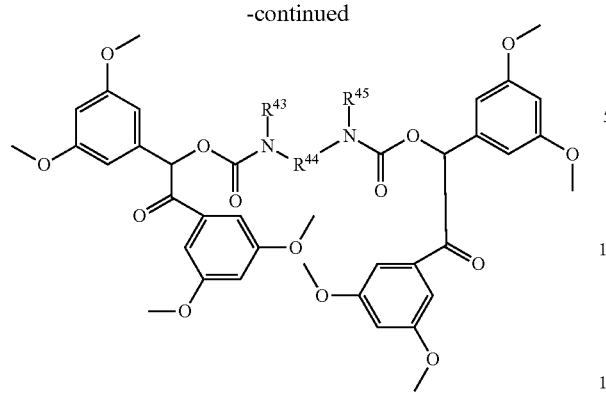
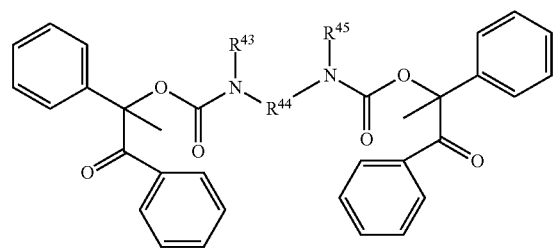
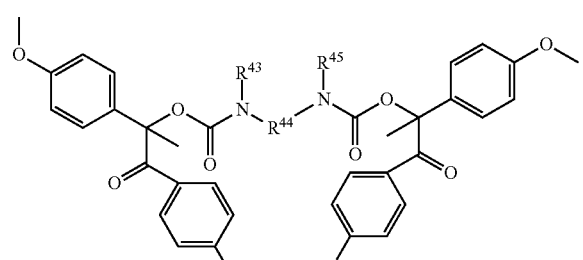
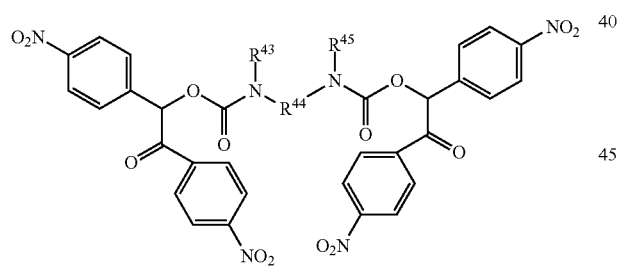
120
-continued
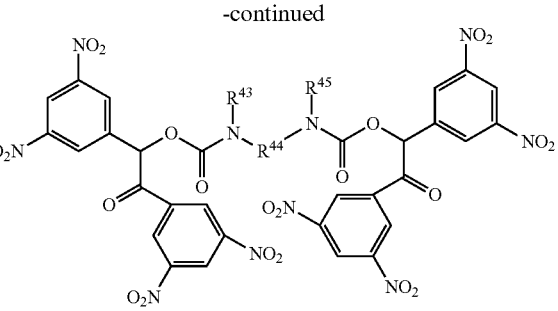
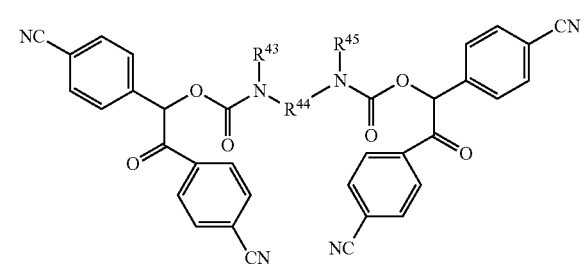
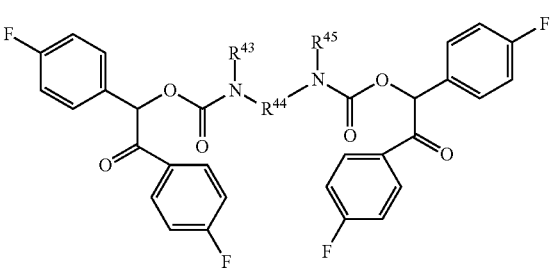
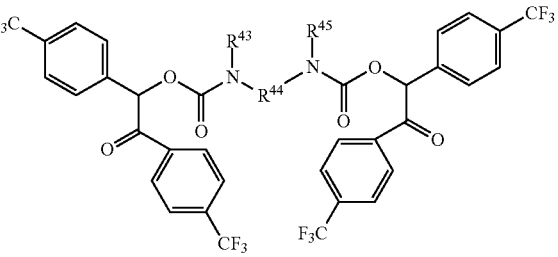
Examples of the PBGs of formula (4) releasing tri-branched amine compounds are given below.
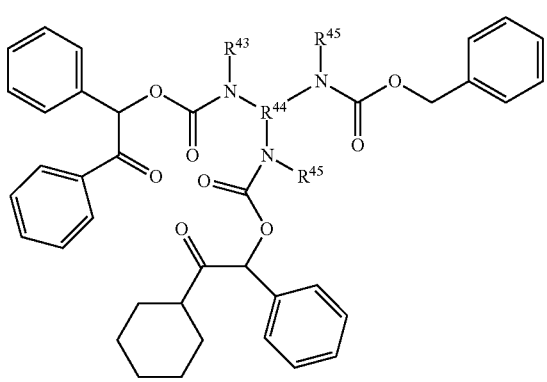

-continued
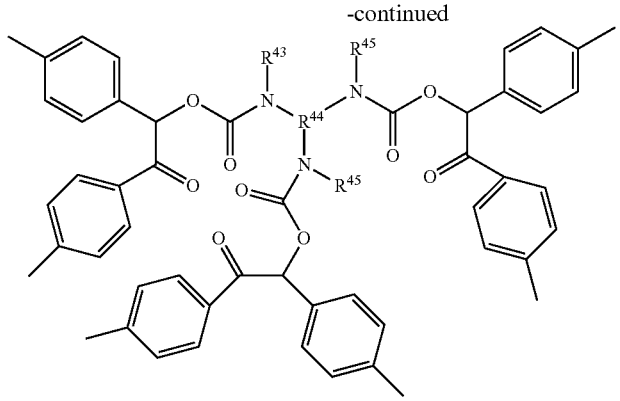
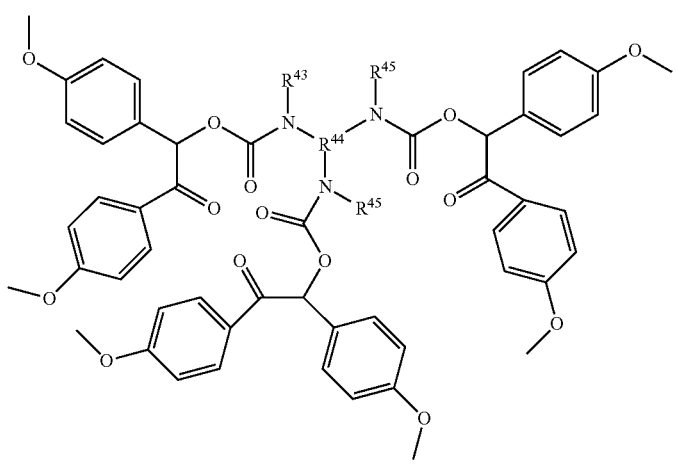
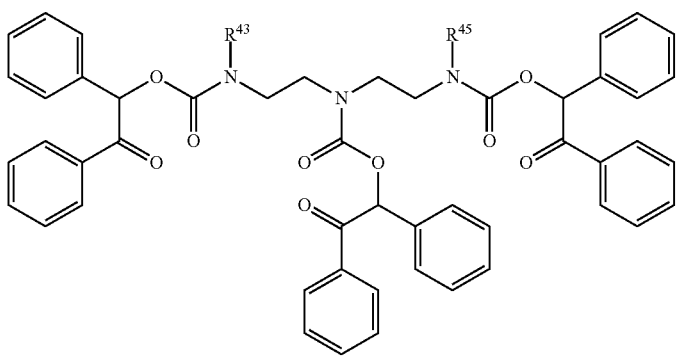
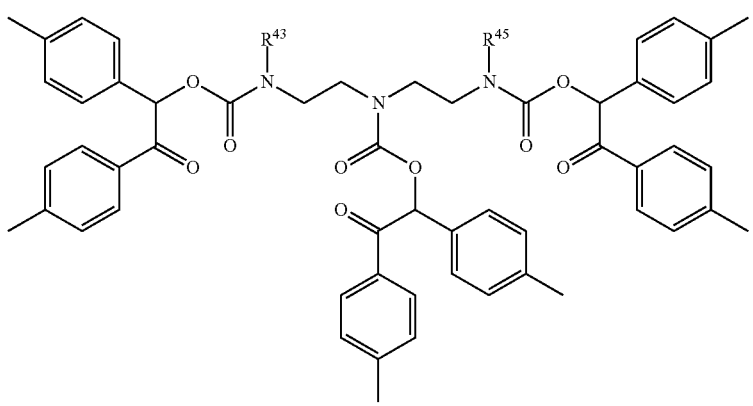

-continued
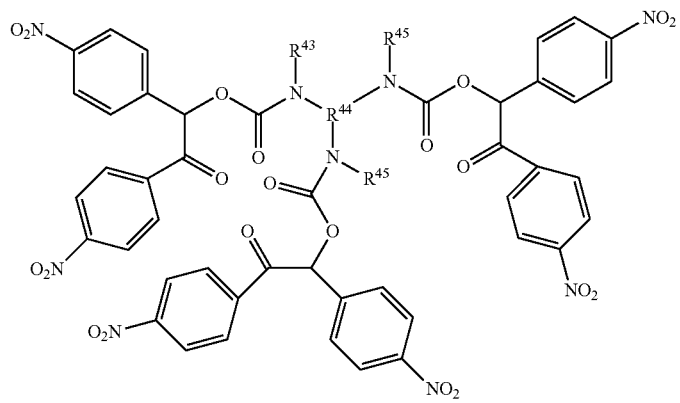
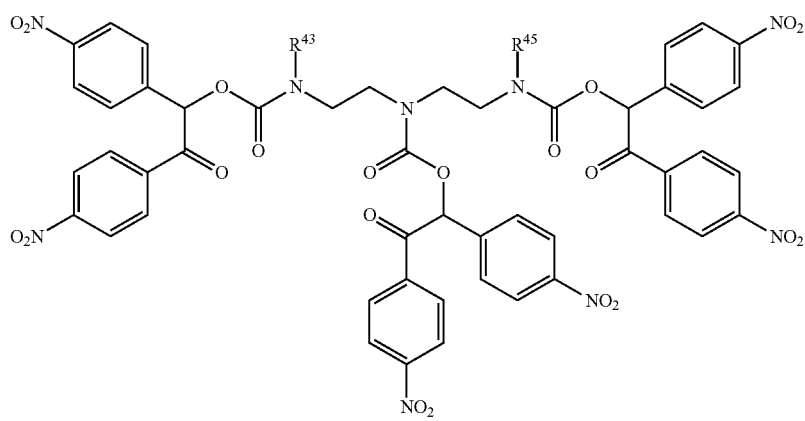
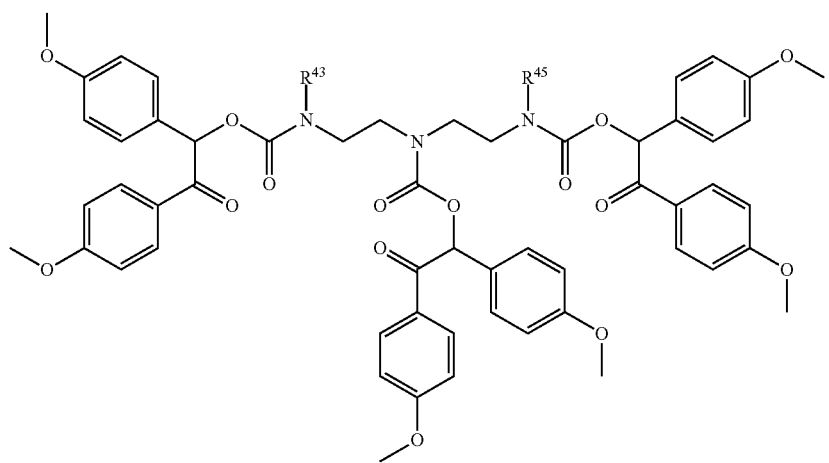

Examples of the PBG of formula (6) are given below wherein $R^{51}$ and $R^{52}$ are as defined above.
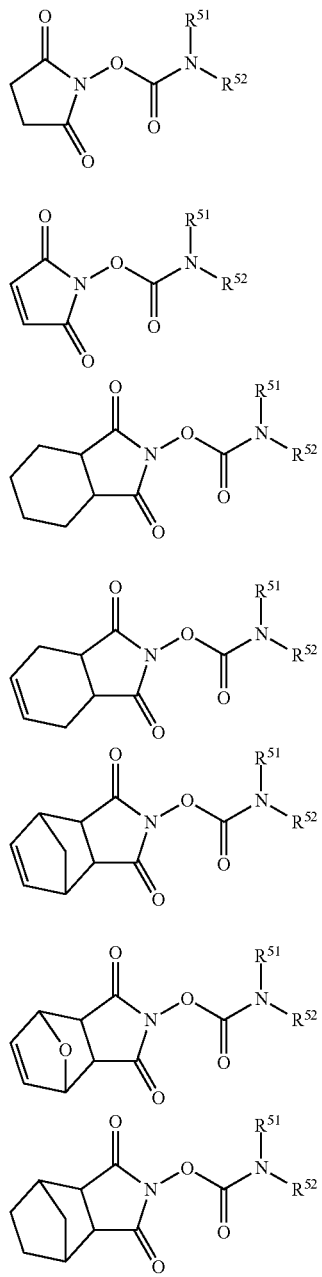
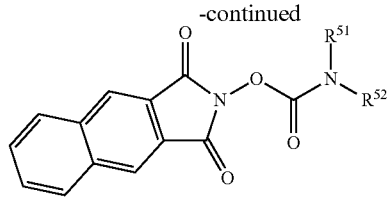
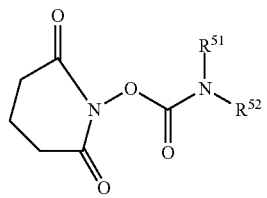
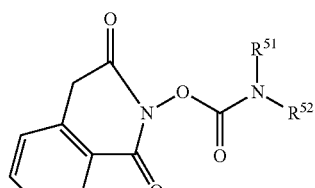
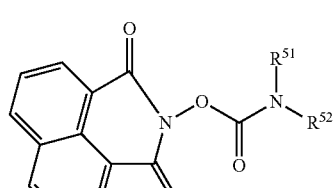
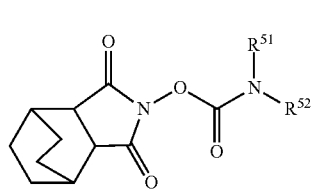
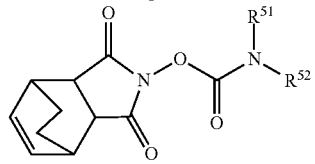
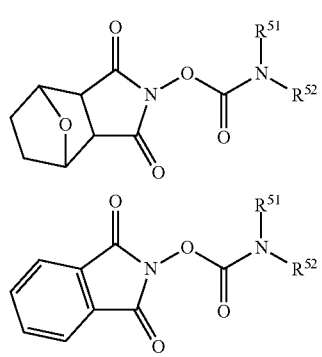
Examples of the PBG of formula (7) are given below. Note that $R^{55}$ to $R^{57}$ are as defined above, hereinafter.
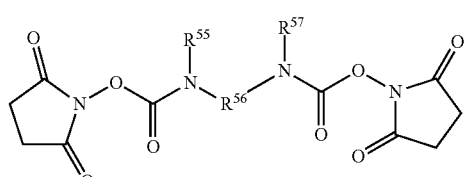
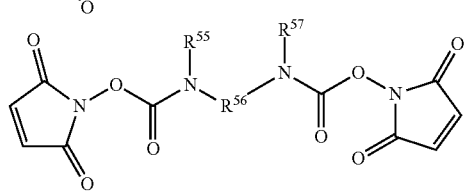

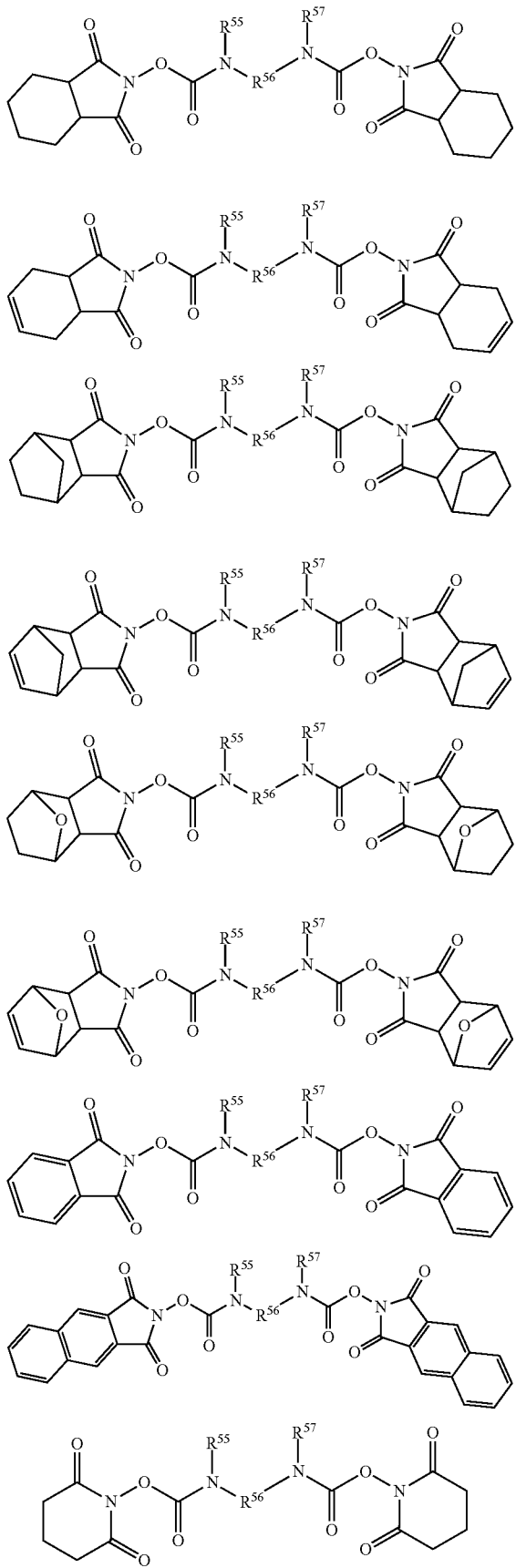
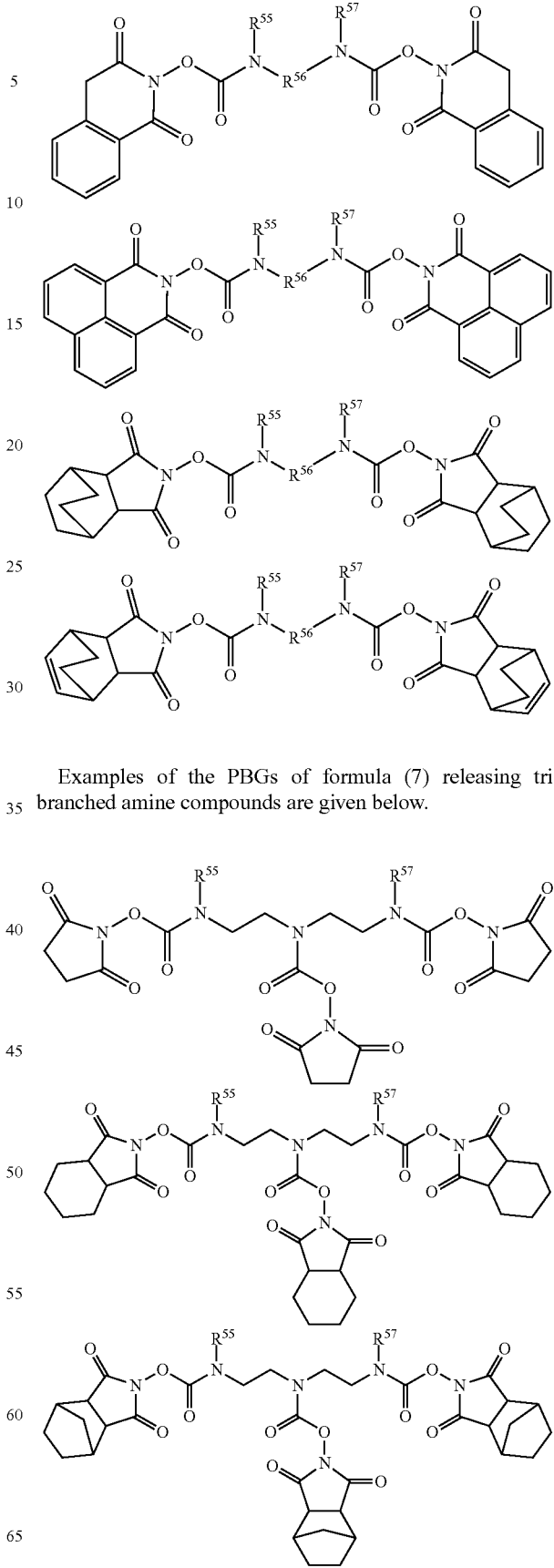
Examples of the PBGs of formula (7) releasing tri-branched amine compounds are given below.

-continued
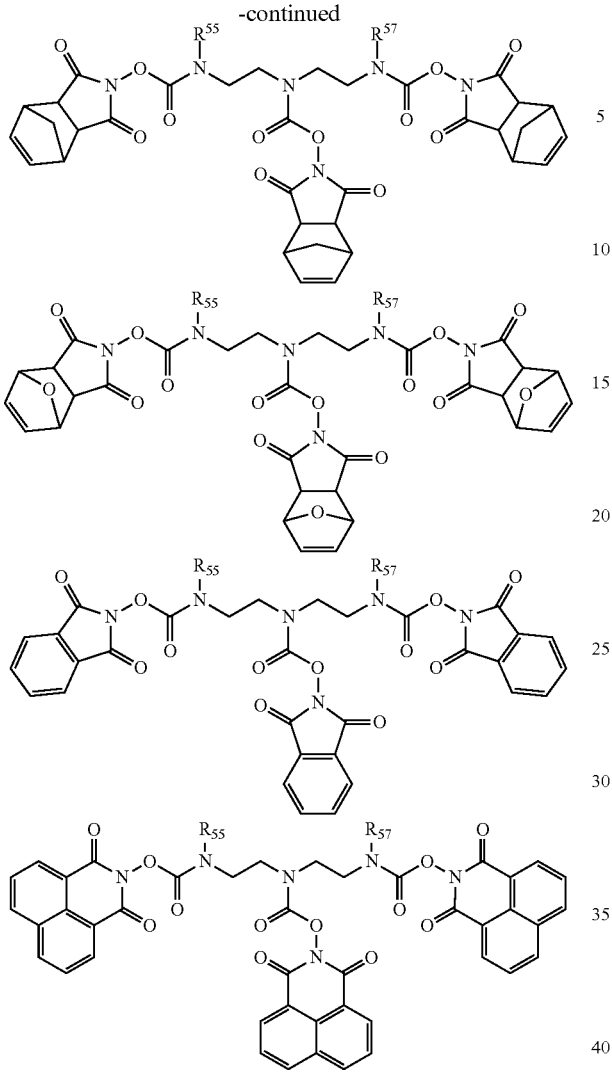
Examples of the PBG of formula (8) are given below.
-continued
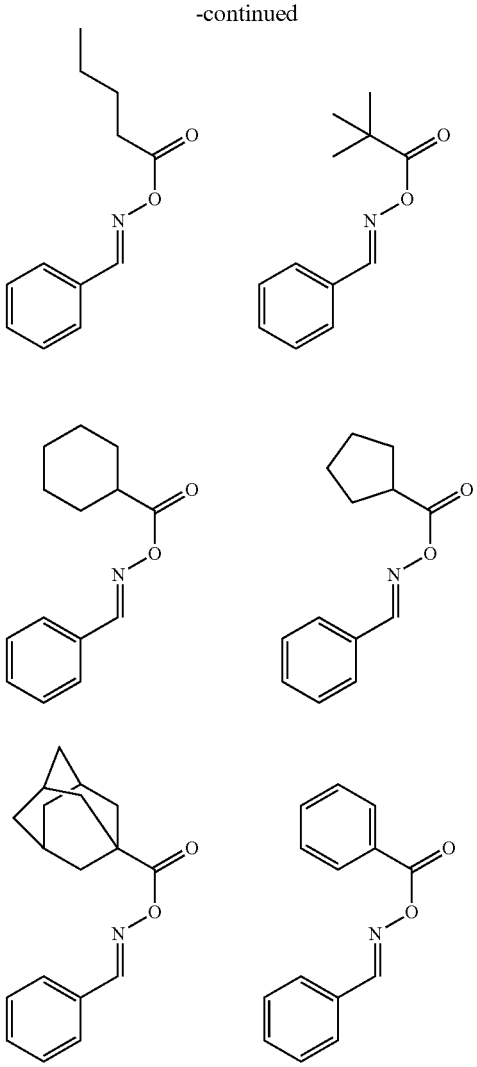
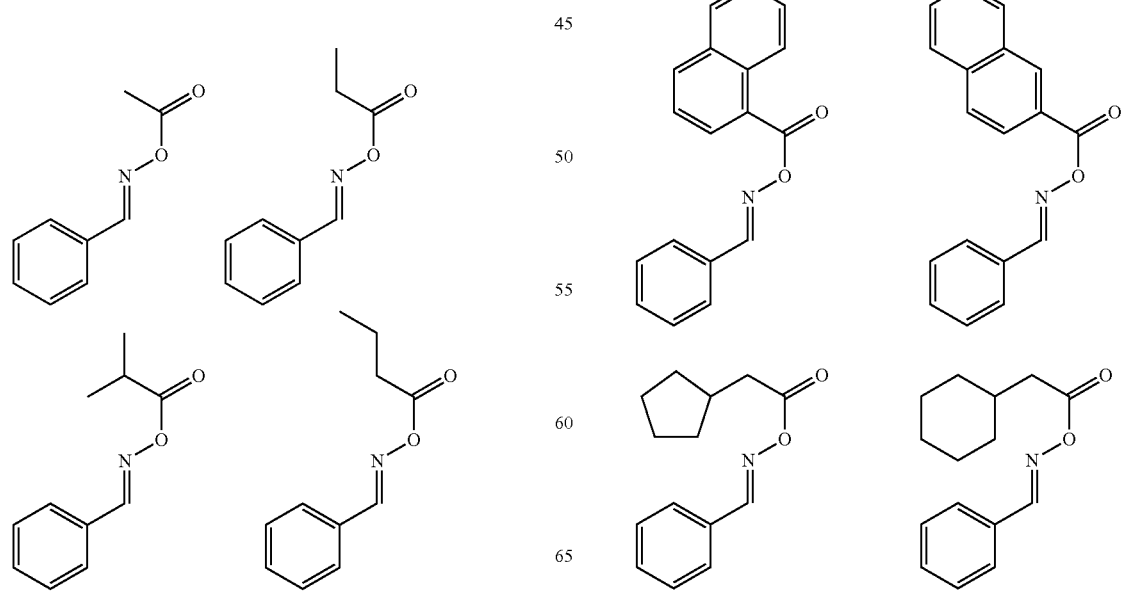

131
-continued
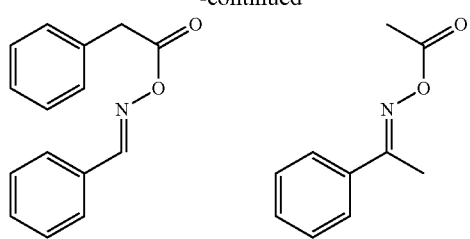
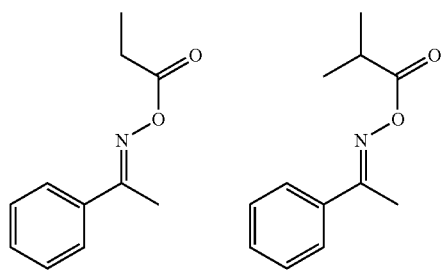
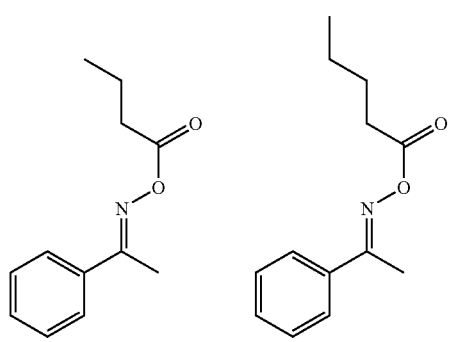
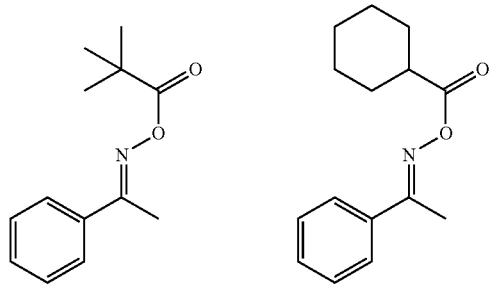
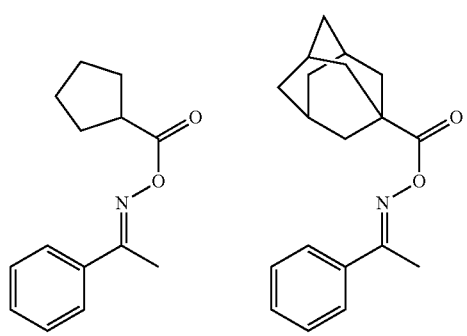
132
-continued
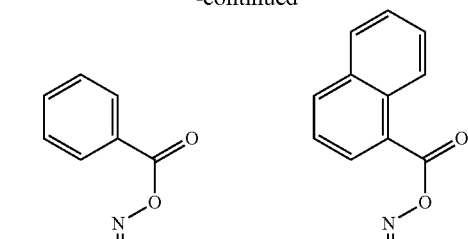
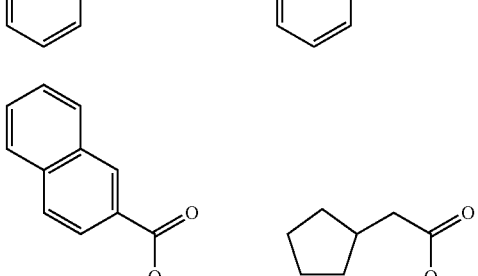
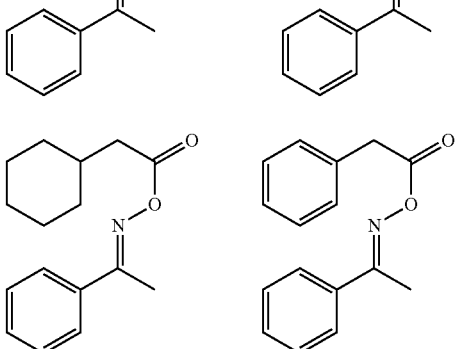
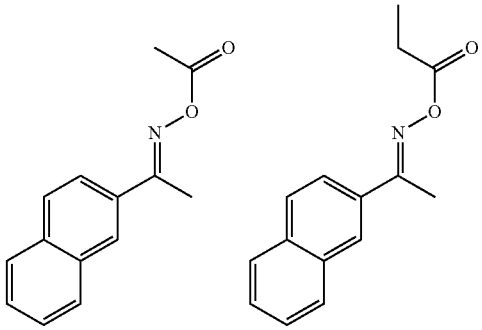
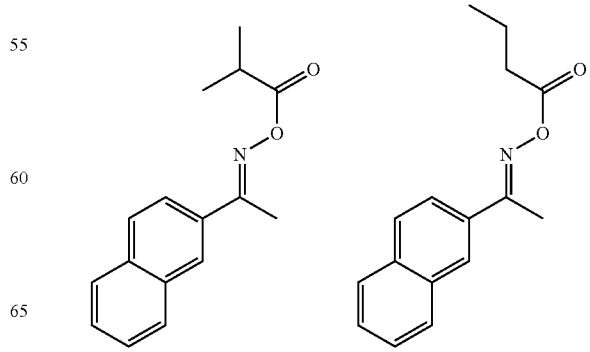

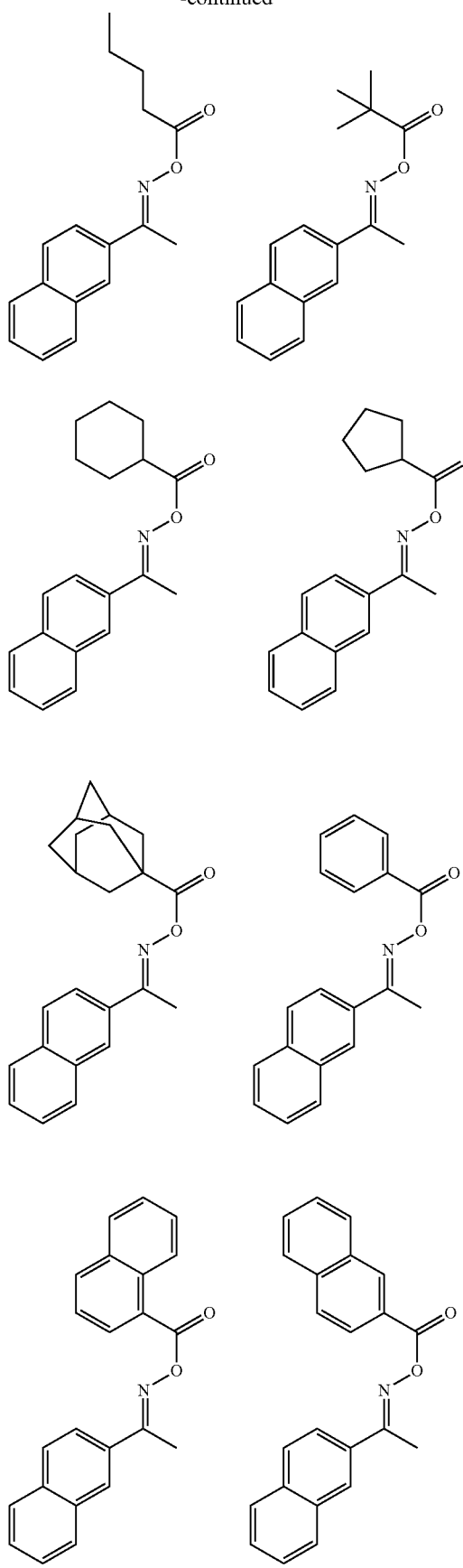
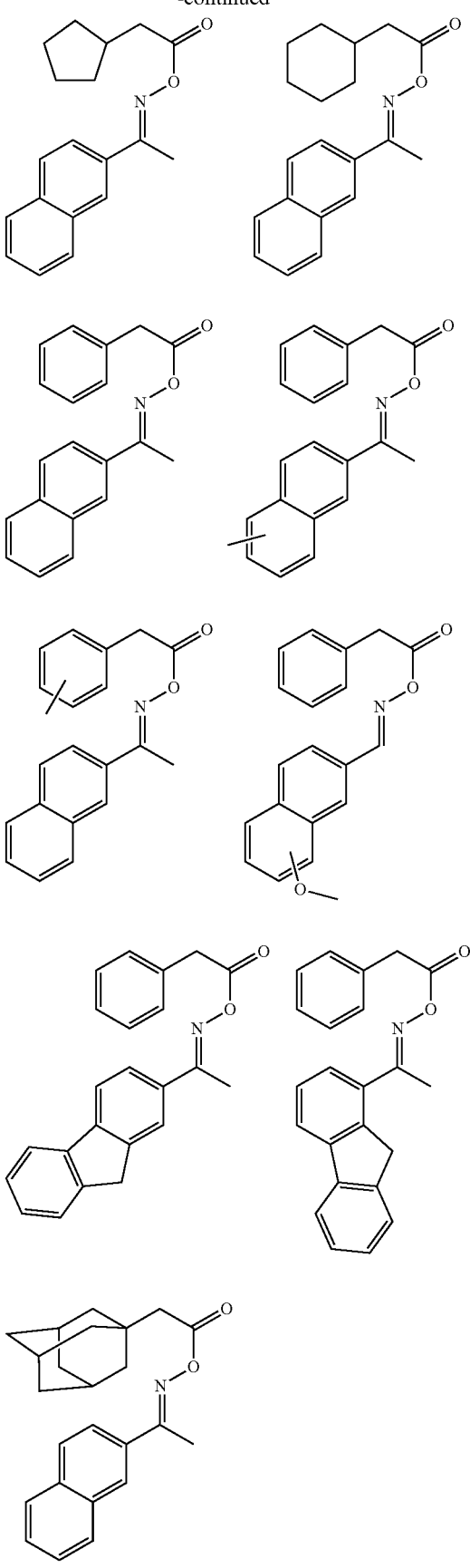

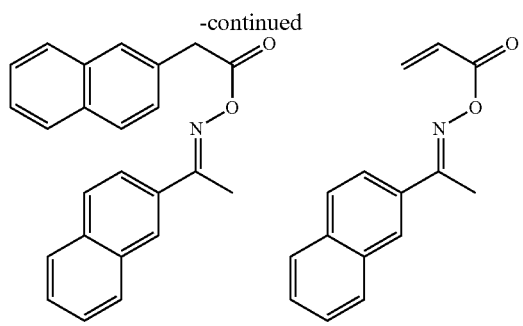
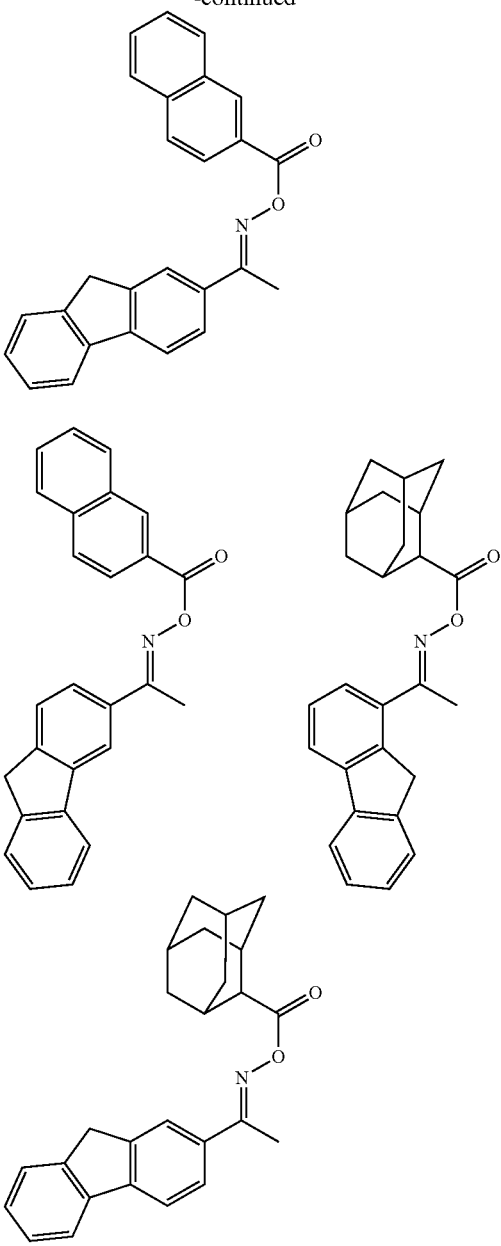

Examples of the PBG of formula (9) are given below.
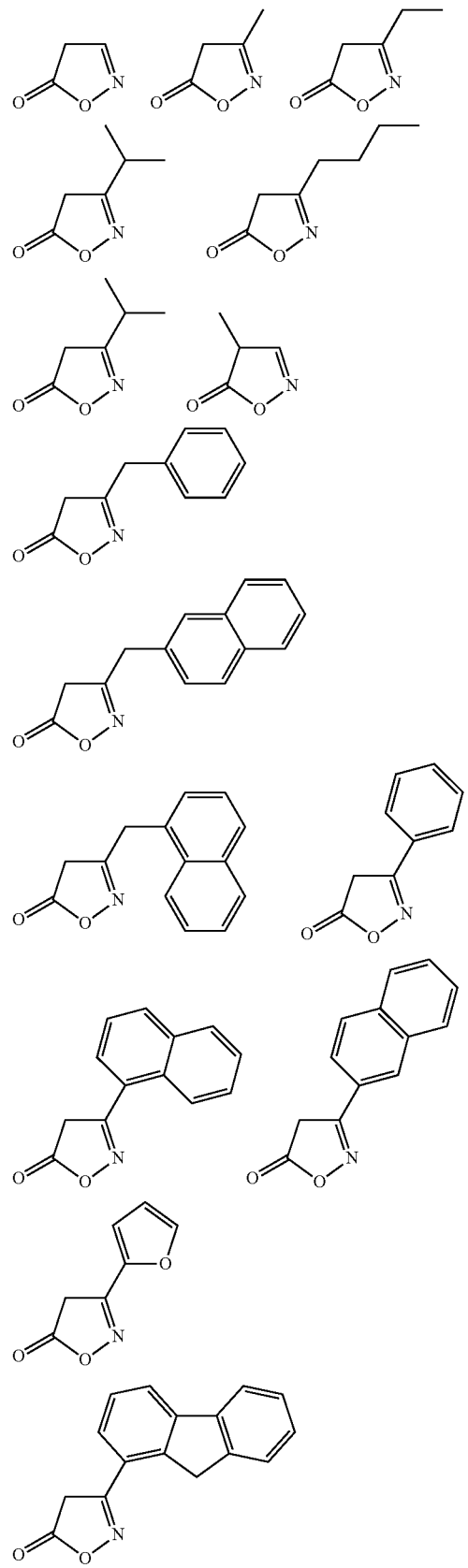
-continued
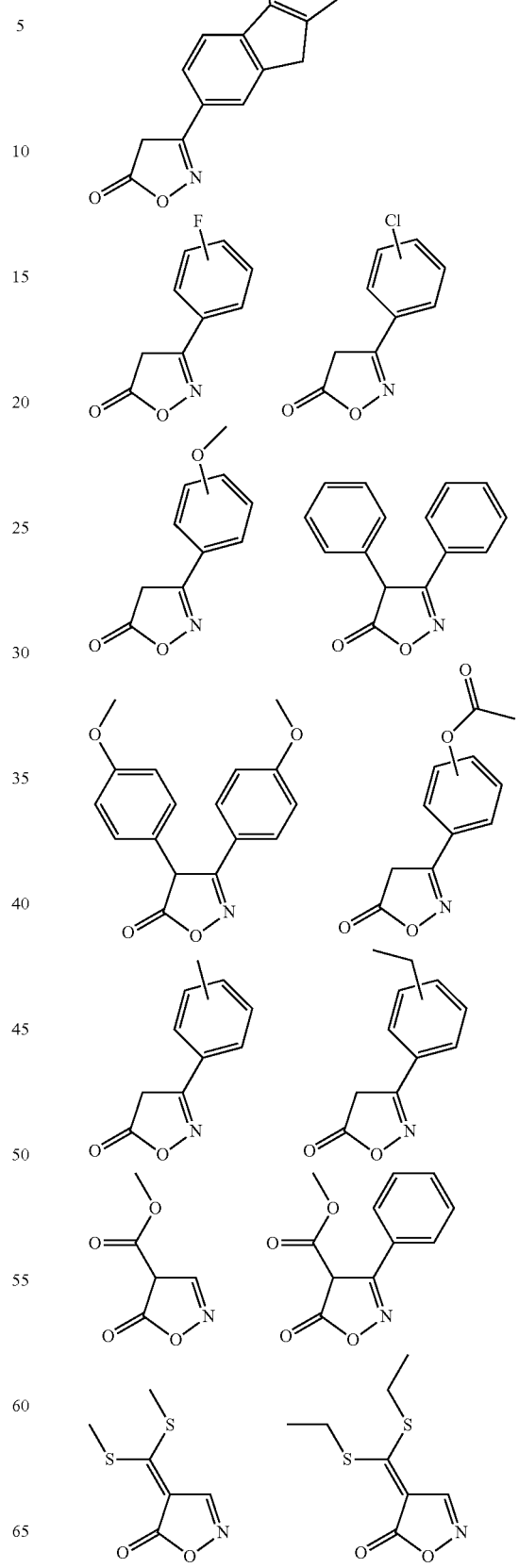

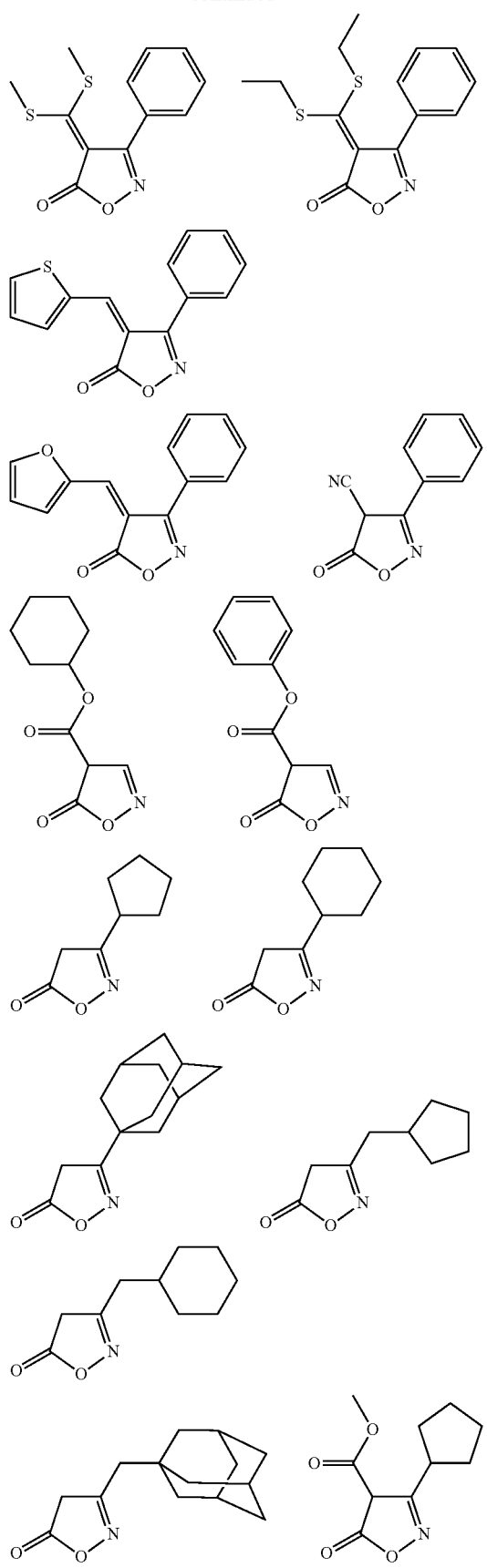
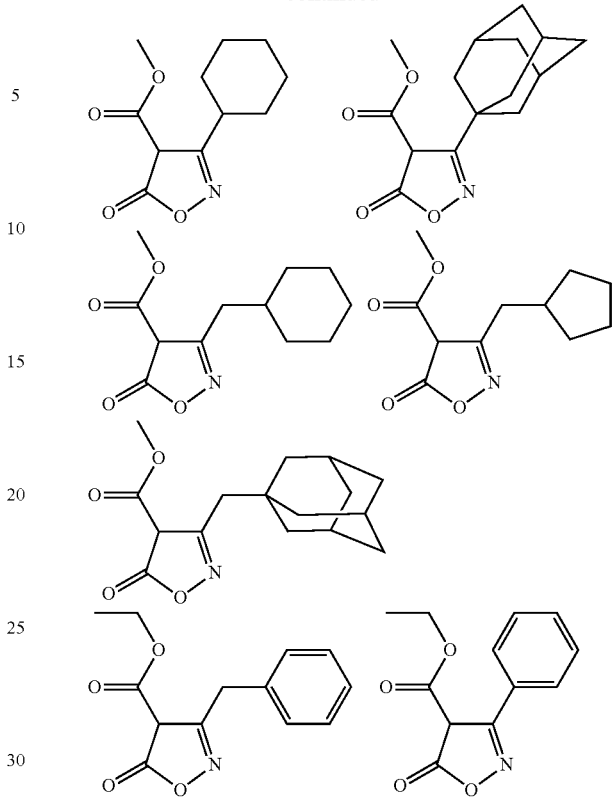

The PBG of addition mode having formulae (2) to (9) is preferably compounded in an amount of 0 to 10 parts, more preferably 0 to 8 parts by weight per 100 parts by weight of the base polymer. When used, the amount of PBG added is preferably at least 0.2 part, more preferably at least 0.5 part by weight on the same basis.

It is important for the dual-tone resist composition used in the patterning process that the PBG have a lower generation efficiency than the PAG. When a sulfonium or iodonium salt is used as the PAG, the PBGs of formula (1) to (9) may advantageously be used because of their low generation efficiency. However, in an example which uses an N-sulfonyloxyimide as the PAG and a compound of formula (6) or (7) as the PBG, neither positive nor negative tone response is available because their generation efficiencies are equal.

In the case of the negative resist composition having a thermal acid generator or acid added thereto, the process is not affected by the generation efficiency of the PBG. Rather a PBG having a high base generation efficiency is advantageously used because a higher sensitivity is available.

In the patterning process, a base amplifier which is decomposed with a base to generate another base may be used along with the PBG. When the base amplifier is used along with the PBG, a molar amount of amino groups is controlled relative to acid. That is, the sum of a total molar amount of amino group in the quencher, a total molar amount of amino group released from the PBG, and a total molar amount of amino group released from the base amplifier must be greater than a total molar amount of acid released from the PAG. The base amplifier may be attached to the polymer backbone or separately added to the resist composition.

The base amplifier attached to the polymer backbone (of backbone mode, hereinafter) corresponds to the recurring unit (a1) in formula (1) wherein one of $R^4$, $R^5$, and $R^6$ is an alkenyl group or contains a carbonyl, ester, lactone ring, carbonate, maleimide, amide or sulfo radical.

Examples of the base amplifier of backbone mode are given below wherein $R^1$ to $R^3$ are as defined above. Understandably the base amplifier of backbone mode may be copolymerized together with recurring units having an acid labile group or an adhesive group.
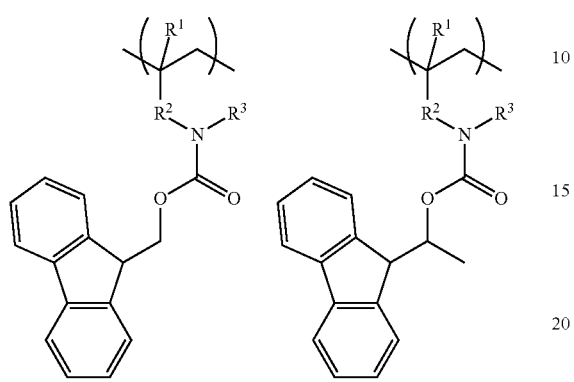
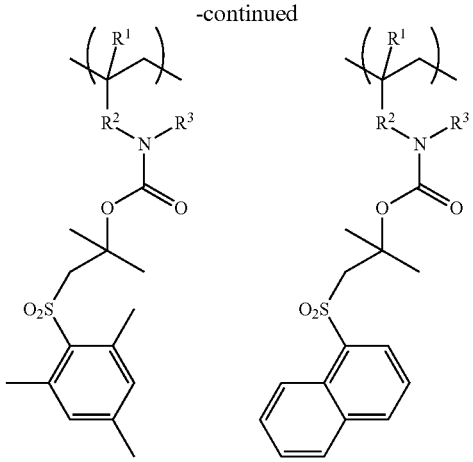
-continued
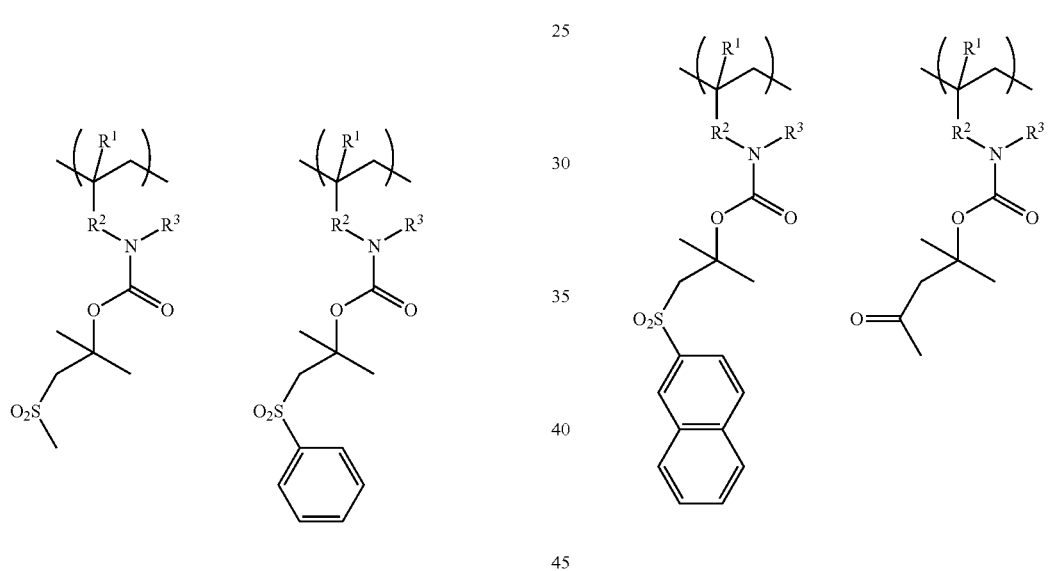
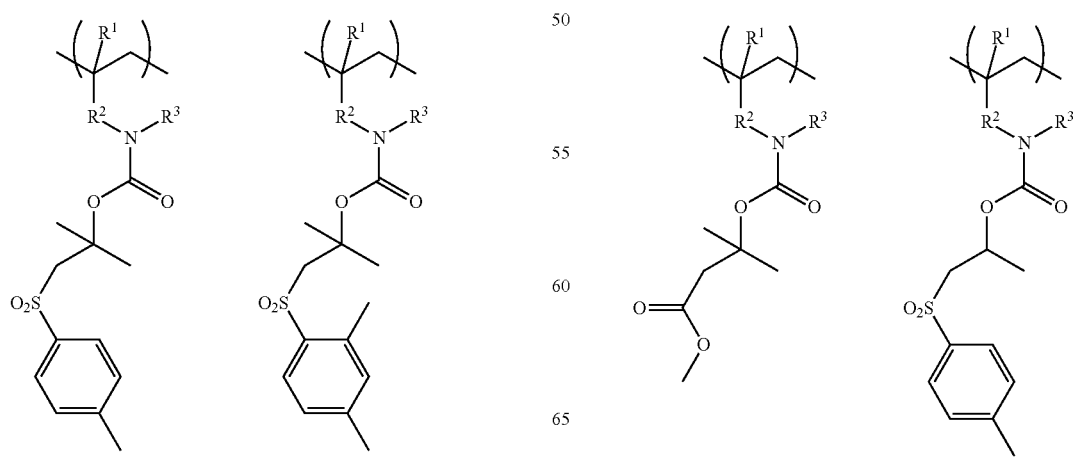

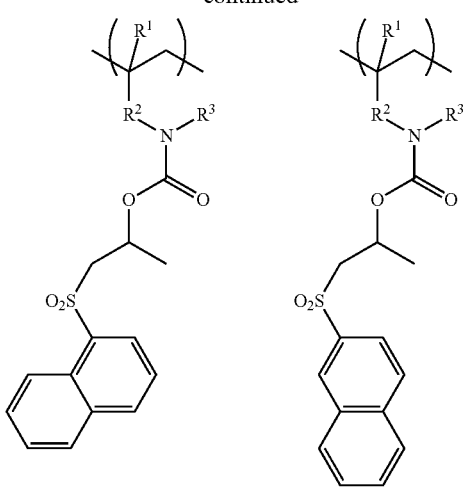
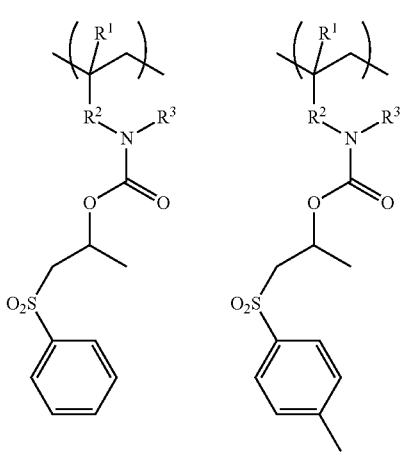

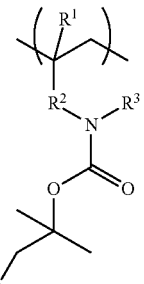
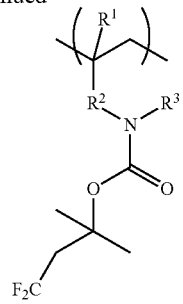

Examples of the base amplifier of addition mode include those of the following formulae (2') and (3').

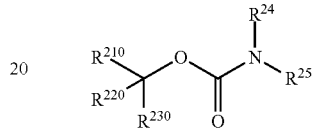

(2')

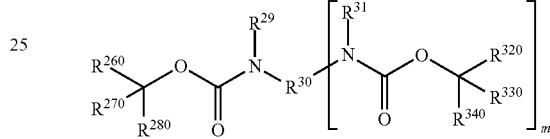

(3')

Herein $R^{210}$, $R^{220}$, $R^{230}$, $R^{260}$, $R^{270}$, $R^{280}$, $R^{320}$, $R^{330}$, and $R^{340}$ each are hydrogen, a straight, branched or cyclic $C_1$-$C_6$ alkyl, $C_6$-$C_{14}$ aryl or $C_7$-$C_{15}$ aralkyl group, at least one of $R^{210}$, $R^{220}$ and $R^{230}$ at least one of $R^{260}$, $R^{270}$ and $R^{280}$, or at least one of $R^{320}$, $R^{330}$ and $R^{340}$ is a $C_2$-$C_8$ alkenyl group, or an organic group selected from straight, branched or cyclic $C_1$-$C_6$ alkyl, $C_6$-$C_{14}$ aryl, and $C_7$-$C_{15}$ aralkyl groups each containing a carbonyl, ester, lactone, carbonate, maleimide, amide or sulfo radical. $R^{24}$, $R^{25}$, $R^{29}$, $R^{30}$, $R^{31}$, and m are as defined above.

Examples of the base amplifiers of formulae (2') and (3') are given below wherein $R^{24}$, $R^{25}$, $R^{29}$ to $R^{31}$ are as defined above.

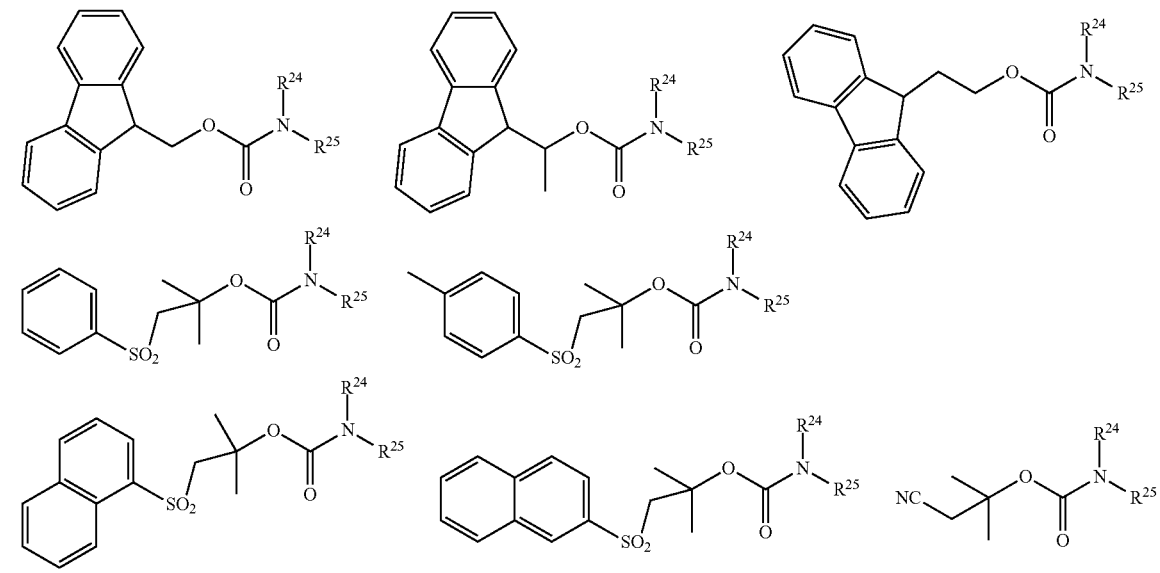

145
-continued
146
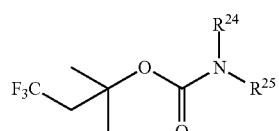
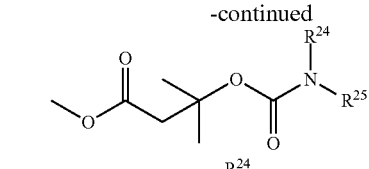
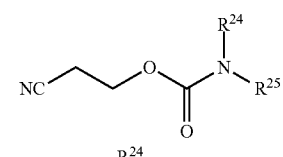
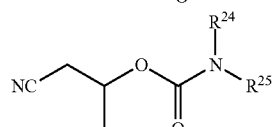
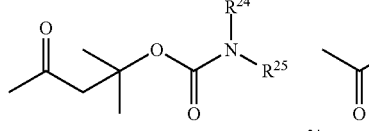
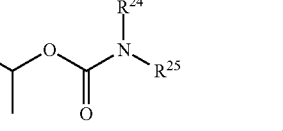
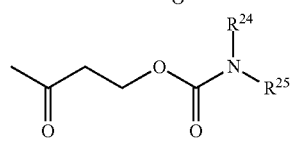
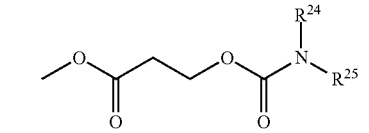
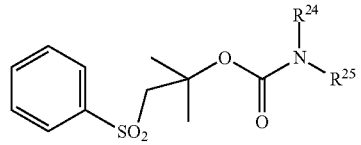
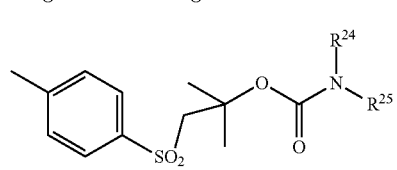
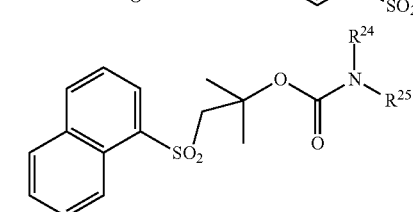
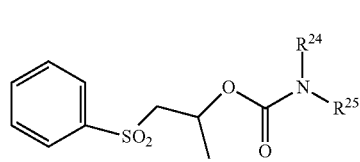
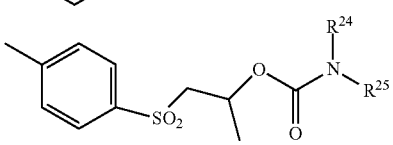
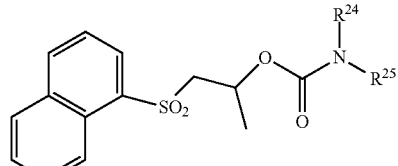
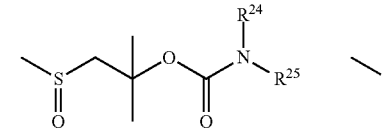
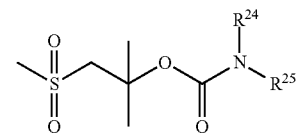
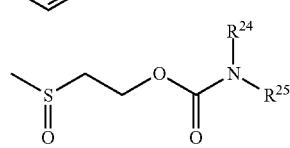
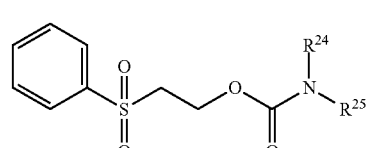
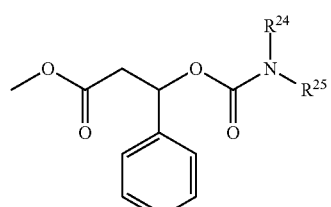
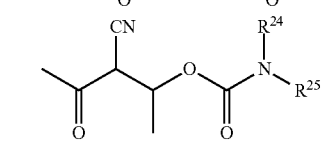
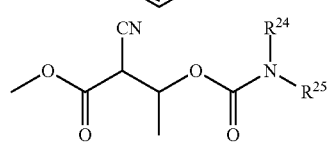
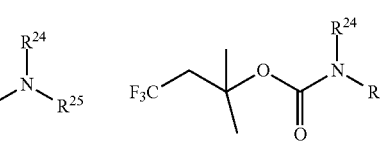
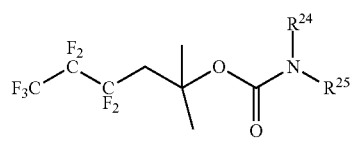
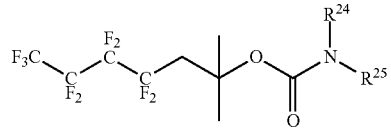
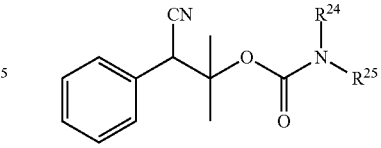

147 -continued 148
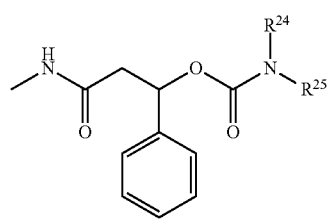 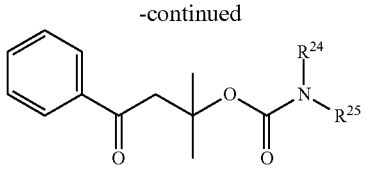 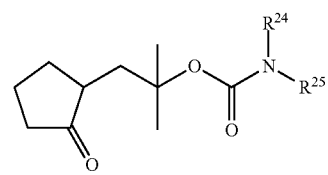
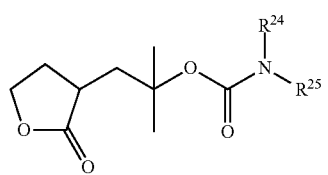 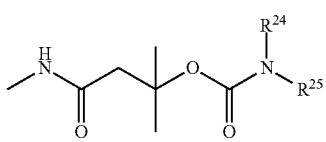 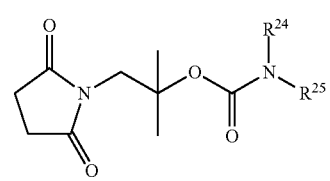
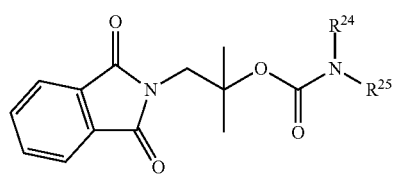 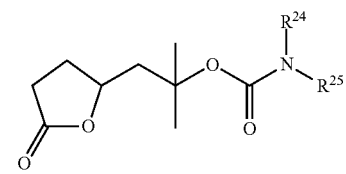 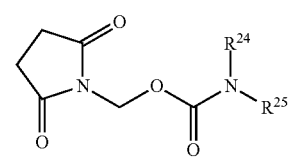
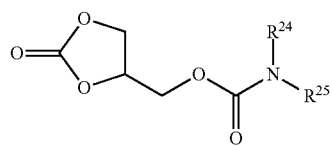 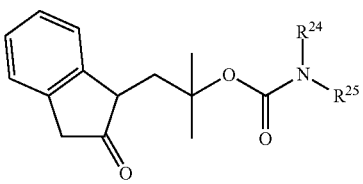 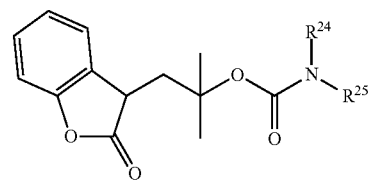
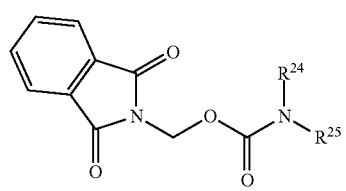 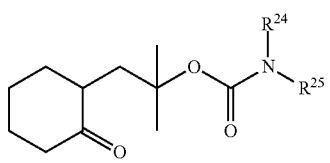 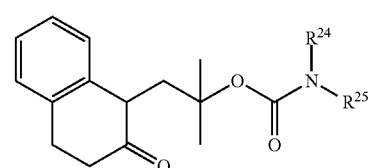
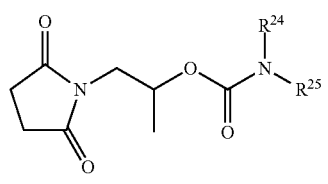 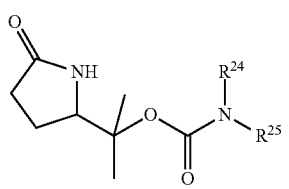
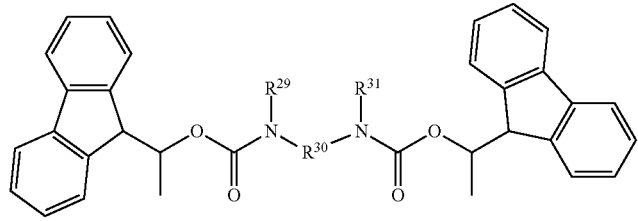
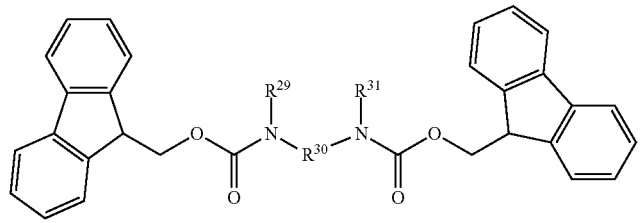

-continued
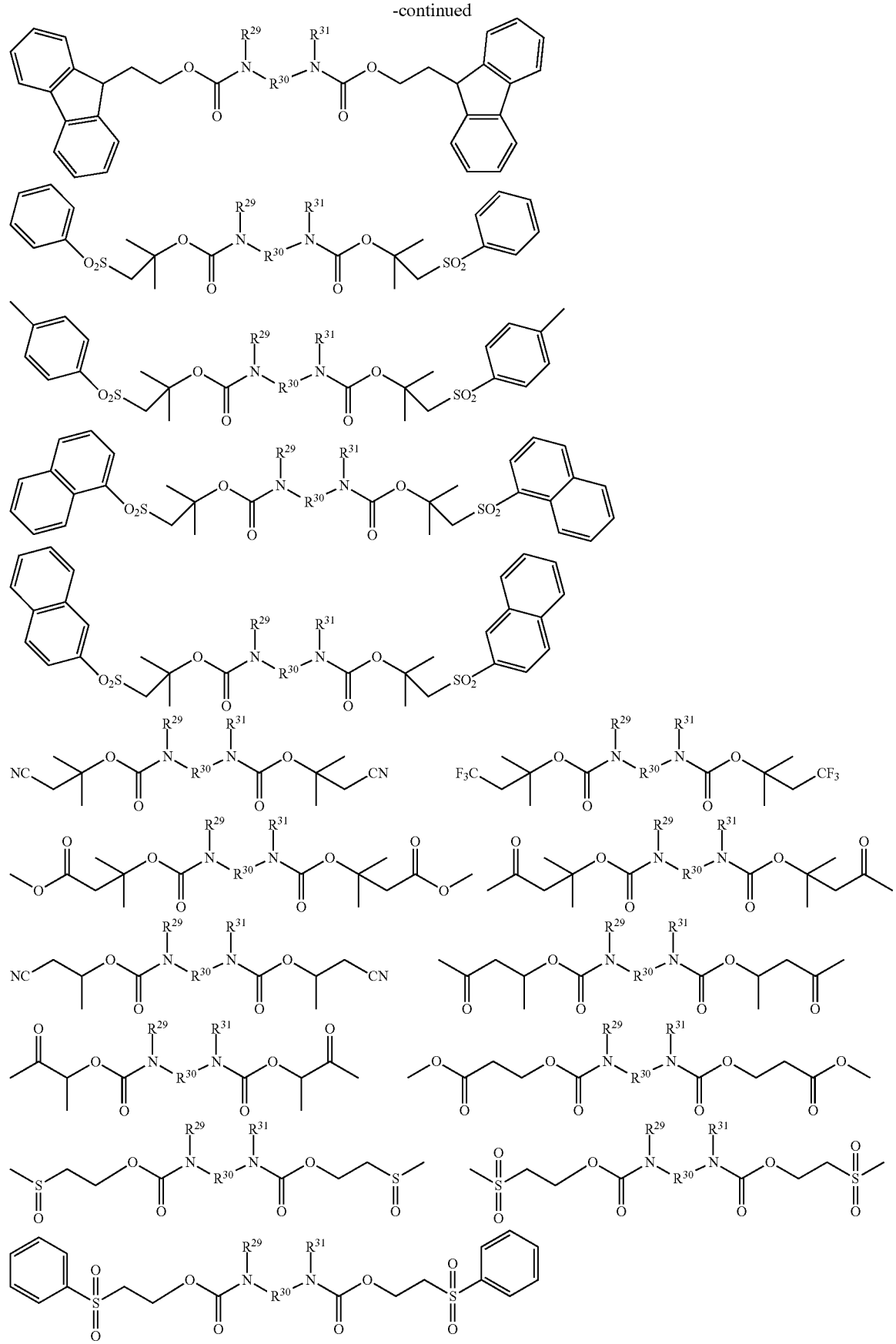

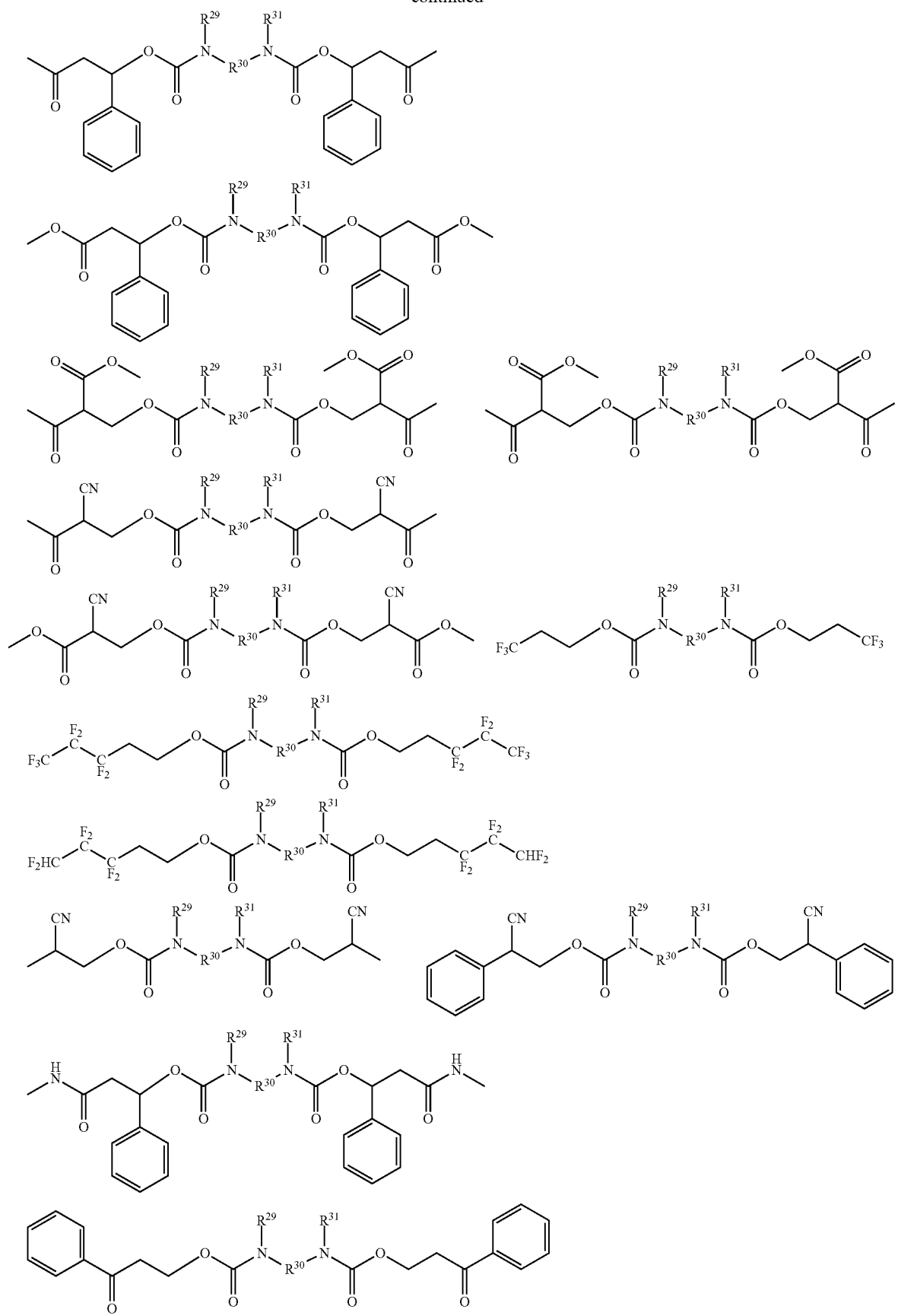

-continued
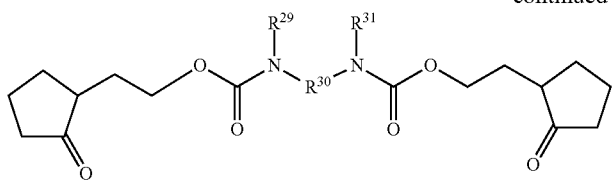
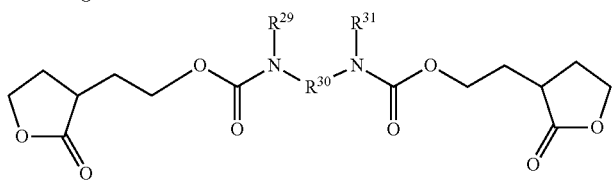
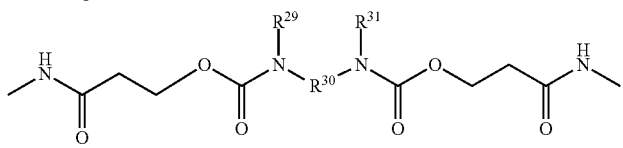
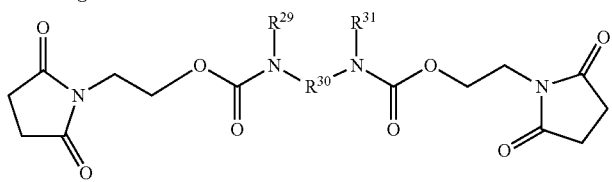
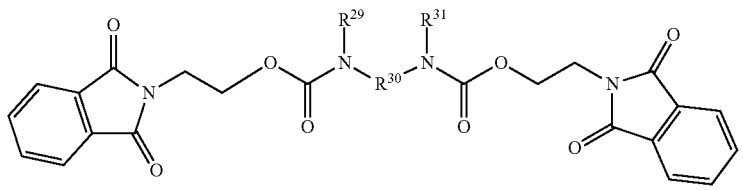
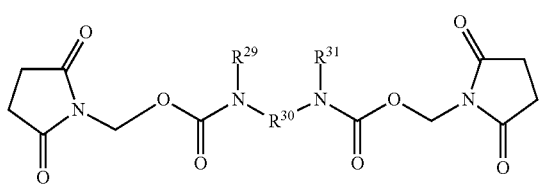
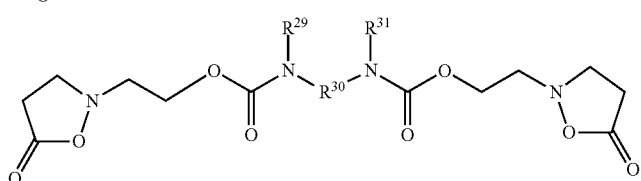
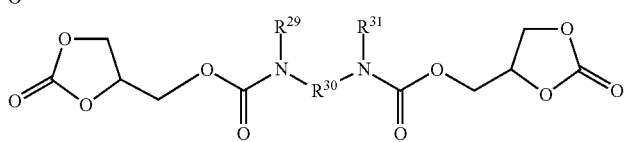
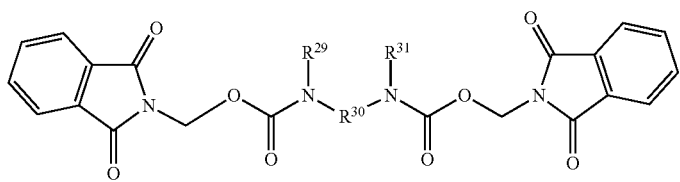
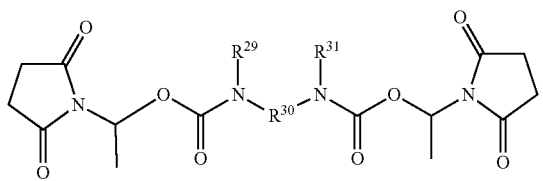

-continued

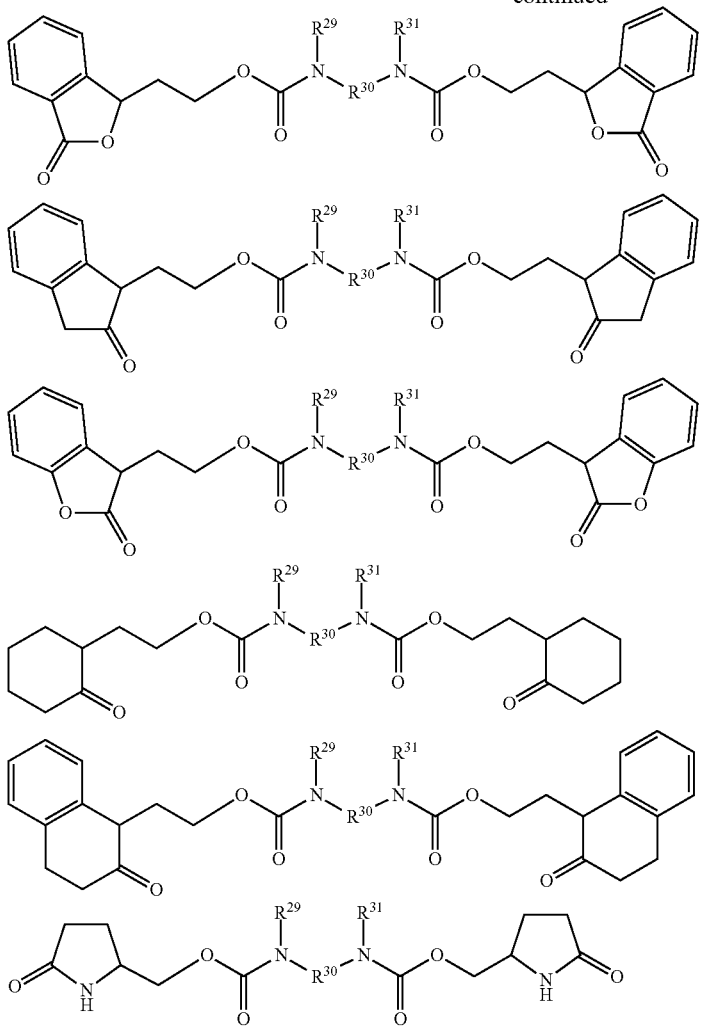

With respect to the amount of the base amplifier compounded, the base amplifier of backbone mode is preferably incorporated in an amount of 0.1 to 10 mol %, more preferably 0.3 to 8 mol %, and even more preferably 0.5 to 7 mol % based on the entire recurring units of the polymer. The base amplifier of addition mode is preferably used in an amount of 0.1 to 20 parts, more preferably 0.3 to 15 parts, and even more preferably 0.5 to 12 parts by weight per 100 parts by weight of the polymer.

Acid Generator

The resist composition contains a compound capable of generating an acid in response to actinic light or radiation, that is, photoacid generator (PAG) or a compound capable of generating an acid on application of heat, that is, thermal acid generator (TAG). When the polymer (base resin) has recurring units having a sulfonium salt represented by formula (10) incorporated therein, the PAG need not be added, but may be added if desired. The PAG may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary PAGs are described in U.S. Pat. No. 7,537,880 (JP-A 2008-111103, paragraphs [0122] to [0142]).

In the patterning process, the positive tone response at an intermediate exposure dose is not available unless the PAG has a higher photo-induced generation efficiency than the PBG. Then the PAG is preferably selected from those compounds capable of generating a sulfonic acid, imidic acid or methide acid. More preferred are sulfonium and iodonium salt base photoacid generators capable of generating such an acid at a high efficiency.

Examples of the PAG are illustrated below.

Sulfonium salts are salts of sulfonium cations with sulfonates, bis(substituted alkylsulfonyl)imides and tris(substituted alkylsulfonyl)methides.

Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium.

Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl]ethanesulfonate.

Exemplary bis(substituted alkylsulfonyl)imides include bis(trifluoromethylsulfonyl)imide, bis(pentafluoroethylsulfonyl)imide, bis(heptafluoropropylsulfonyl)imide, and 1,3-propylenebissulfonylimide.

A typical tris(substituted alkylsulfonyl)methide is tris(trifluoromethylsulfonyl)methide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary are aryliodonium cations such as diphenyliodonium, bis(4-tert-butylphenyl)iodonium, 4-tert-butoxyphenylphenyliodonium, and 4-methoxyphenylphenyliodonium. Suitable sulfonates are as exemplified above.

The PAG is preferably used in an amount of 0.1 to 30 parts, more preferably 0.5 to 25 parts by weight per 100 parts by weight of the polymer as the base resin.

The TAG used herein is selected from those compounds capable of generating an acid when heated at 50 to 200° C., typically trialkyl sulfonates. For the trialkyl sulfonates, exemplary cations include trimethylsulfonium, triethylsulfonium, tripropylsulfonium, tributylsulfonium, methylcyclopentylsulfonium, methylcyclohexylsulfonium, ethylcyclopentylsulfonium, and ethylcyclohexylsulfonium, and exemplary anions include sulfonic acids, imidic acids and methide acids as mentioned above. The acid may be any of sulfonic acids, imidic acids and methide acids as mentioned above. The TAG is preferably used in an amount of 0.1 to 30 parts, more preferably 0.5 to 20 parts by weight per 100 parts by weight of the polymer as the base resin.

The resist composition further comprises an organic solvent and a basic compound (or quencher). It may further comprise a dissolution regulator, surfactant, and acetylene alcohol, alone or in combination.

Solvent

Examples of the organic solvent added to the resist composition are described in U.S. Pat. No. 7,537,880 (JP-A 2008-111103, paragraphs [0144] to [0145]). The organic solvent used herein may be any organic solvent in which the base resin, acid generator, and other components are soluble. Illustrative, non-limiting, examples of the organic solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, and mixtures thereof because the acid generator is most soluble therein.

An appropriate amount of the organic solvent used is 200 to 8,000 parts, especially 400 to 6,000 parts by weight per 100 parts by weight of the polymer.

For use in the resist composition, exemplary basic compounds serving as the quencher are described in JP-A 2008-111103 (U.S. Pat. No. 7,537,880), paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

Quencher

As the quencher, those compounds of the structure described in JP-A 2008-111103, paragraphs [0152] to [0156] are especially preferred.

Exemplary quenchers which can be used herein include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amides, imides, and carbamates.

Organic nitrogen-containing compounds of the following general formula (B)-1 are also useful.

$$N(X)_n(Y)_{3-n} \quad (B)\text{-}1$$

In the formula, n is equal to 1, 2 or 3. The side chain X may be the same or different and is selected from groups of the following general formulae (X1) to (X3). The side chain Y may be the same or different and is hydrogen or a straight, branched or cyclic $C_1$-$C_{20}$ alkyl group which may contain an ether or hydroxyl radical. Two or three X's may bond together to form a ring.

$$\text{---}[\text{R}^{300}\text{---O---R}^{301}] \quad (X1)$$

$$\text{---}[\text{R}^{302}\text{---O---R}^{303}\text{---}\overset{\overset{\displaystyle O}{\|}}{C}\text{---R}^{304}] \quad (X2)$$

$$\text{---}[\text{R}^{305}\text{---}\overset{\overset{\displaystyle O}{\|}}{C}\text{---O---R}^{306}] \quad (X3)$$

Herein $R^{300}$, $R^{302}$ and $R^{305}$ are independently straight or branched $C_1$-$C_4$ alkylene groups. $R^{301}$ and $R^{304}$ are independently hydrogen or straight, branched or cyclic $C_1$-$C_{20}$ alkyl groups which may contain one or more hydroxyl, ether, ester radicals or lactone rings. $R^{303}$ is a single bond or a straight or branched $C_1$-$C_4$ alkylene group. $R^{306}$ is a straight, branched or cyclic $C_1$-$C_{20}$ alkyl group which may contain one or more hydroxyl, ether, ester radicals or lactone rings.

Also useful are organic nitrogen-containing compounds of cyclic structure having the general formula (B)-2.

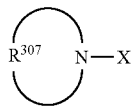
(B)-2

Herein X is as defined above, and $R^{307}$ is a straight or branched $C_2$-$C_{20}$ alkylene group which may contain one or more carbonyl, ether, ester or sulfide radicals.

Also useful are organic nitrogen-containing compounds having cyano represented by the general formulae (B)-3 to (B)-6.

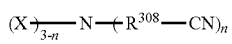
(B)-3

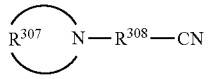
(B)-4

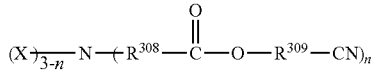
(B)-5

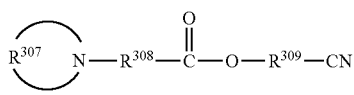
(B)-6

Herein, X, $R^{307}$ and n are as defined above, and $R^{308}$ and $R^{309}$ are each independently a straight or branched $C_1$-$C_4$ alkylene group.

Also included are organic nitrogen-containing compounds of imidazole structure having a polar functional group, represented by the general formula (B)-7.

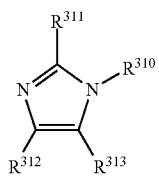
(B)-7

Herein, $R^{314}$ is a straight, branched or cyclic $C_2$-$C_{20}$ alkyl group having a polar functional group which is selected from among hydroxyl, carbonyl, ester, ether, sulfide, carbonate, cyano and acetal groups and mixtures thereof. $R^{311}$, $R^{312}$ and $R^{313}$ are each independently hydrogen, a straight, branched or cyclic $C_1$-$C_{10}$ alkyl group, aryl group or aralkyl group.

Also included are organic nitrogen-containing compounds of benzimidazole structure having a polar functional group, represented by the general formula (B)-8.

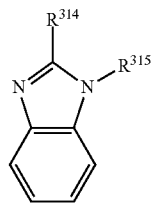
(B)-8

Herein $R^{314}$ is hydrogen, a straight, branched or cyclic $C_1$-$C_{10}$ alkyl group, aryl group or aralkyl group. $R^{315}$ is a straight, branched or cyclic $C_1$-$C_{20}$ alkyl group having a polar functional group. The alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

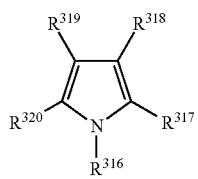
(B)-9

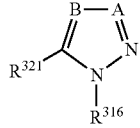
(B)-10

Herein, A is a nitrogen atom or $=$C—$R^{322}$. B is a nitrogen atom or $=$C—$R^{323}$. $R^{319}$ is a straight, branched or cyclic $C_2$-$C_{20}$ alkyl group which has one or more polar functional groups selected from among hydroxyl, carbonyl, ester, ether, sulfide, carbonate, cyano and acetal groups and mixtures thereof. $R^{317}$, $R^{318}$, $R^{319}$ and $R^{320}$ are each independently hydrogen, a straight, branched or cyclic $C_1$-$C_{10}$ alkyl group or aryl group, or a pair of $R^{317}$ and $R^{318}$ and a pair of $R^{319}$ and $R^{320}$ taken together, may form a benzene, naphthalene or pyridine ring. $R^{321}$ is hydrogen, a straight, branched or cyclic $C_1$-$C_{10}$ alkyl group or aryl group. $R^{322}$ and $R^{323}$ each are hydrogen, a straight, branched or cyclic $C_1$-$C_{10}$ alkyl group or aryl group, or a pair of $R^{321}$ and $R^{323}$, taken together, may form a benzene or naphthalene ring.

Also included are organic nitrogen-containing compounds of aromatic carboxylic acid ester structure, represented by the general formulae (B)-11 to (B)-14.

(B)-11

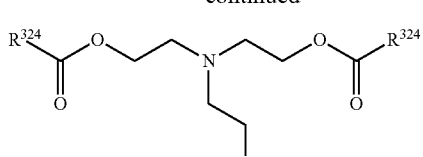
(B)-12

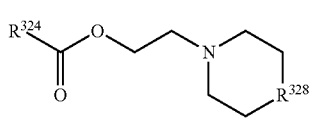
(B)-13

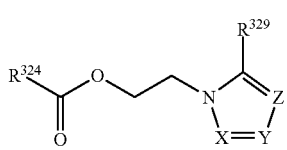
(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group in which some methylene groups may be replaced by oxygen atoms. $R^{327}$ is a $C_1$-$C_{10}$ alkyl or acyl group in which some methylene groups may be replaced by oxygen atoms. $R^{328}$ is a single bond, methylene, ethylene, sulfur atom or —$O(CH_2CH_2O)_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{333}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring.

Further included are nitrogen-containing compounds of 7-oxanorbornane-2-carboxylic ester structure, represented by the general formula (B)-15.

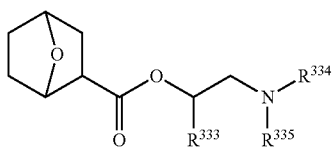
(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a $C_2$-$C_{20}$ heterocyclic or hetero-aromatic ring with the nitrogen atom to which they are attached.

Furthermore, those compounds having a carbamate group described in JP 3790649 may be used as the quencher. Although the compound having a carbamate group is free of an amino group, it functions as the quencher in that the carbamate group is decomposed with an acid to produce an amino group.

The quencher or basic compound is preferably compounded in an amount of 0.01 to 15 parts, more preferably 0.1 to 12 parts by weight per 100 parts by weight of the polymer as the base resin.

It is an advantageous amine amplifying mechanism that an amine is generated under the catalysis of the amine compound released from the PBG group or PBG represented by formulae (1) to (9). Utilization of this mechanism gives the advantages of an increased amine generation efficiency and non-linear generation of amine versus exposure dose. The non-linear amine generation leads to improvements in the contrast of inactivation and the contrast of negative conversion.

The resist composition used in the patterning process of the invention should meet that the sum of a total molar amount of amino group in the quencher and a total molar amount of amino group released from the PBG group-bearing recurring units of the polymer is greater than a total molar amount of acid released from the acid generator or the sum of a total molar amount of acid released from the acid generator and a total molar amount of acid released from the sulfonium salt-bearing recurring units of the polymer. This ensures that the acid released from the acid generator is inactivated in the over-exposed region.

Preferably the sum of total molar amounts of amino groups is at least 20%, more preferably at least 40% greater than the sum of total molar amounts of acid. If the sum of total molar amounts of amino groups is greater than the sum of total molar amounts of acid by more than 100%, then the amount of amine compound generated is always greater than the amount of acid generated, with a possible loss of a positive response region, that is, an exposure dose range at which alkaline dissolution once occurs as the exposure dose is increased. Therefore the amount of amino groups must be optimized relative to the amount of acid generated. It is desired from this standpoint that the molar difference between amine and acid be up to 100%, more desirably 25 to 80%, and even more desirably 30 to 70%.

If a total molar amount of amino group only in the quencher is greater than a total molar amount of acid released from the acid generator or the sum of a total molar amount of acid released from the acid generator and a total molar amount of acid released from the sulfonium salt-bearing recurring units of the polymer, the acid released from the acid generator is neutralized independent of whether the exposure dose is high or low, so that deprotection reaction does not occur, exhibiting no positive tone dissolution behavior. Therefore, the total molar amount of amino group in the quencher must be less than the total molar amount of acid released from the acid generator or the sum of a total molar amount of acid released from the acid generator and a total molar amount of acid released from the sulfonium salt-bearing recurring units of the polymer. When the PBG and the base amplifier are used together, the total molar amount of amino groups is preferably controlled such that the sum of a total molar amount of amino group in the quencher, a total molar amount of amino group released from the PBG, and a total molar amount of amino group released from the base amplifier be at least 20% greater than a total molar amount of acid.

When the base amplifier is used alone in the absence of PBG, an increase of amine generation in proportion to an exposure dose does not occur, exhibiting no negative tone response. Therefore, the base amplifier, if used, must be combined with the PBG.

As the total molar amount of amino group in the base generated increases, the sensitivity of positive tone conversion as shown in FIG. 7 decreases and at the same time, the sensitivity of negative tone conversion improves. If the total molar amount of amino group is too much, the sensitivities of positive and negative tone conversions cross each other, leaving no region where the film thickness becomes zero (0). When the amounts of the quencher and PBG added are controlled such that the exposure dose of negative conversion divided by the exposure dose of positive conversion may fall in a range from 3 to 8, line split is achieved in an actual pattern.

The sensitivities of positive and negative conversion may be adjusted in terms of PEB temperature. As the PEB temperature becomes higher, the sensitivity of positive conversion becomes higher and the sensitivity of negative conversion becomes lower, and hence, the exposure dose of negative conversion divided by the exposure dose of positive conversion becomes greater. Inversely, as the PEB temperature becomes lower, an inverse phenomenon occurs. If the PEB temperature becomes extremely lower, the sensitivities of positive and negative conversions cross each other. Namely, as the PEB temperature changes, not only the sensitivities of positive and negative conversions, but also the diffusion distances of acid and amine change. An attempt to elevate the PEB temperature beyond the necessity in order to make the sensitivity of positive conversion higher and the sensitivity of negative conversion lower undesirably results in an extension of the diffusion distance of acid and amine, inviting degradation of resolution. Rather than changing the PEB temperature to adjust the sensitivities of positive and negative conversions, it is preferred to adjust the sensitivities of positive and negative conversions by changing the amounts of the quencher and PBG added.

The acid generation efficiency of the PAG component relative to exposure dose must be higher than the base generation efficiency of the PBG. If the photo-acid generation efficiency is equal to the photo-base generation efficiency or if the generation efficiency of the PBG is higher than the photo-acid generation efficiency, no dual-tone characteristics are displayed. The contrast curve shown in FIG. 7 is displayed by the resist composition wherein the acid generation efficiency (C parameter) of the PAG relative to exposure dose is about 5 times the C parameter of the PBG. When the amount of amine quencher added is increased in the resist composition of FIG. 7, as alluded to previously, the sensitivity of positive conversion is reduced and instead, the sensitivity of negative conversion is enhanced. As a result, the sensitivity for opening holes by image reversal is improved. In order to further enhance the sensitivity for opening holes by image reversal, a base generator having a high base generation efficiency is used. The contrast curve shown in FIG. 12 is displayed by the resist composition wherein the C parameter of the acid generator is 2.5 times the C parameter of the base generator. In this case, the sensitivity of positive conversion is substantially equal and only the sensitivity of negative conversion is enhanced, as compared with FIG. 7. This enables to drastically enhance the sensitivity for opening holes by image reversal.

The PBG used in the patterning process may take the form of a PBG group which is decomposed to generate an amino group on the backbone, as represented by (a1) to (a4) in formula (1), or a PBG of addition mode as represented by formulae (2) to (9). Either form can provide the dual-tone response. A possible phenomenon is that amine may evaporate from an amine rich zone during PEB and re-deposit on an acid rich zone, whereby no pattern is formed in the zone where a space pattern is originally to be formed, or the top of a space pattern becomes overhung, leading to a top-bulged profile. Then a configurative or dimensional difference may arise between a dark pattern and a bright pattern, or a dark-bright (DB) difference due to a so-called chemical flare may arise. In that event, to prevent any DB difference by amine evaporation, it is preferred to use a PBG capable of generating an amino group attached to the backbone or a PBG capable of generating a high boiling amine or to apply a protective film on top of the resist film.

The photomask used in the patterning process may be a binary mask or a halftone phase shift mask comprising a quartz substrate and a halftone phase shifter film having a transmittance of 1 to 40% at the exposure wavelength disposed thereon. Although a typical halftone phase shift mask has a transmittance of about 6%, an optical image with a higher contrast is available from a halftone phase shift mask having a higher transmittance. The halftone phase shifter film may be a film of a chromium base material comprising chromium and oxygen and/or nitrogen or a material comprising silicon and oxygen and/or nitrogen, which meets the selected transmittance and phase difference. The material comprising silicon and oxygen and/or nitrogen is preferred because a higher transmittance is available while providing the selected phase difference, this being true especially on the lithography using ArF with an exposure wavelength of less than 200 nm as the light source. Examples of the material comprising silicon and oxygen and/or nitrogen include those consisting of Si and O and/or N, such as SiO, SiN, and SiON as well as similar materials which further contain carbon and a transition metal. It is noted that the terms "SiO", "SiN" and "SiON" refer to the constitution of elements, but not a constitutional ratio thereof, and the same applies hereinafter. The transmittance may be readily adjusted to the desired value by adding a transition metal. The transmittance may also be adjusted by changing the content of nitrogen and/or oxygen. Suitable transition metals include Mo, Ta, Zr, W, Ti, Cr, and Hf. Preferred from the standpoints of chemical resistance and workability are those materials containing Mo, Ta or Zr, for example, MoSiN, MoSiON, MoSiO, ZrSiN, ZrSiON, ZrSiO, TaSiN, TaSiON, and TaSiO. Although these exemplary materials contain a single transition metal, materials containing two or more transition metals are also useful, for example, MoZrSiN, MoZrSiON, MoZrSiO, MoTaSiN, MoTaSiON, MoTaSiO, ZrTaSiN, ZrTaSiON, and ZrTaSiO.

FIG. 1 illustrates the patterning process of the invention. As shown in FIG. 1A, a resist film 40 is formed on a processable substrate 20 on a substrate 10 directly or via an intermediate layer 30 by coating the positive resist composition thereon. The substrate 10 is generally a silicon substrate. The processable substrate or layer 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 may be a hard mask of $SiO_2$, SiN, SiON or p-Si, an undercoat film in the form of a carbon film, a silicon-containing intermediate film, or an organic antireflective coating.

Figure 1B:
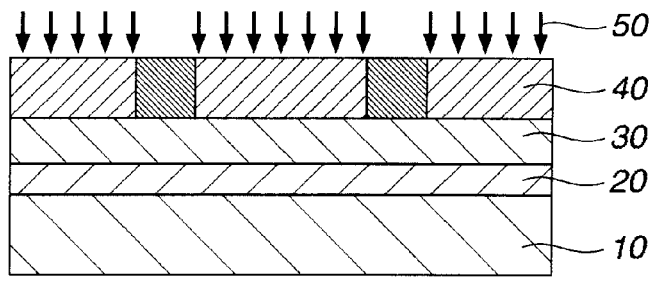
FIG. 1B shows the resist film being exposed.
Figure 1C:
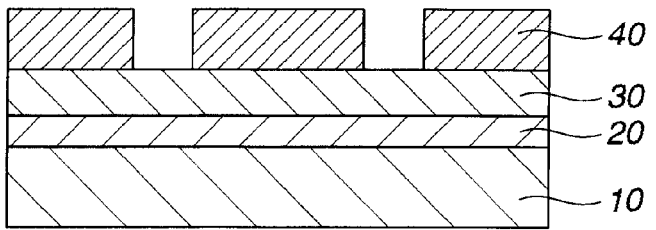
FIG. 1C shows the resist film being developed with alkaline developer.

Next the resist film is exposed at 50 in FIG. 1B and then developed as shown in FIG. 1C.

The patterning process of the invention imposes no particular limits on the exposure wavelength and exposure technique. The process is advantageous in forming a pattern with a feature size equal to or less than 60 nm while using an exposure wavelength of up to 200 nm, typically 193 nm, and modified illumination such as polarized illumination or dipole illumination. If desired, the immersion lithography may be used.

When a hole pattern is formed using the dual-tone resist composition or negative tone resist composition, light of the highest contrast is obtained from exposure by dipole illumination of two X and Y-direction line patterns. The contrast may be further enhanced by combining dipole illumination with s-polarized illumination.

Figure 29:
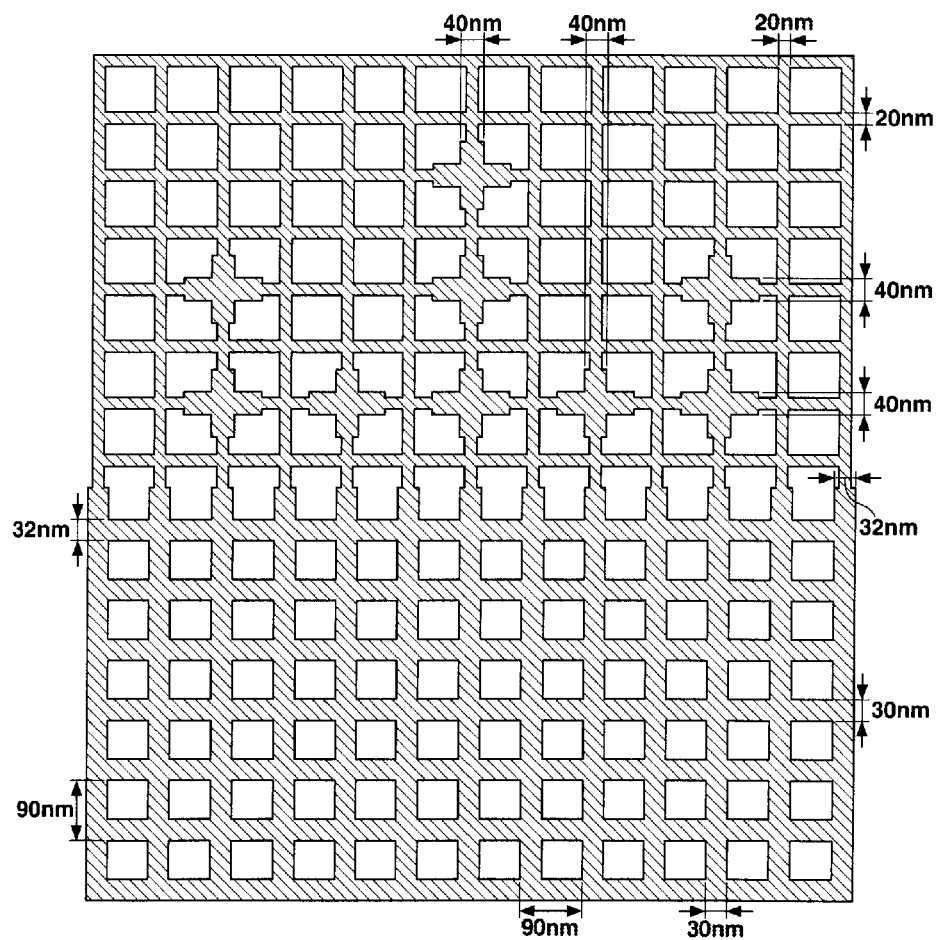
FIG. 29 illustrates a mask bearing a lattice-like pattern having a pitch of 90 nm and a line width of 20 nm on which thick crisscross or intersecting line segments are disposed where dots are to be formed.
Figure 31:
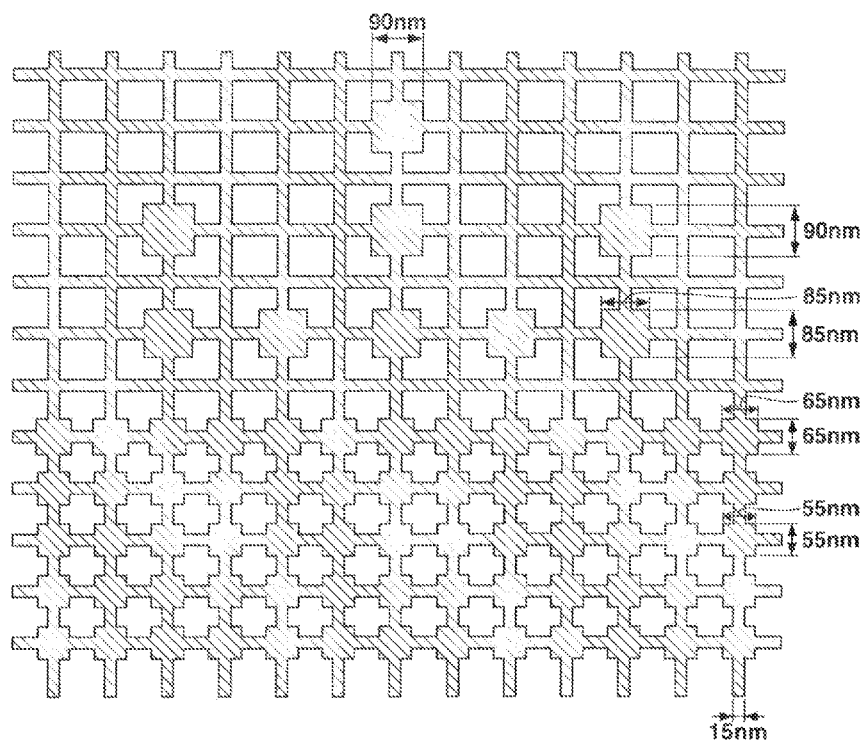
FIG. 31 illustrates a mask bearing a lattice-like pattern having a pitch of 90 nm and a line width of 15 nm on which thick dots are disposed where dots are to be formed.

In the practice of the invention, it is preferred to form two patterns of intersecting X and Y-direction lines or to form a pattern of holes at the intersections between gratings of a lattice-like pattern or on a dot pattern after development, using a binary mask or halftone phase shift mask. The preferred mask is a halftone phase shift mask having a transmittance of 3 to 15%. When holes are formed at random positions, a phase shift mask including a lattice-like first shifter having a line width equal to or less than a half pitch and a second shifter arrayed on the first shifter and consisting of lines whose on-wafer size is 2 to 30 nm thicker than the line width of the first shifter is used as shown in FIG. 29, whereby a pattern of holes is formed only where the thick shifter is arrayed. Alternatively, a phase shift mask including a lattice-like first shifter having a line width equal to or less than a half pitch and a second shifter arrayed on the first shifter and consisting of dots whose on-wafer size is 2 to 100 nm thicker than the line width of the first shifter is used as shown in FIG. 31, whereby a pattern of holes is formed only where the thick shifter is arrayed.

Figure 22:
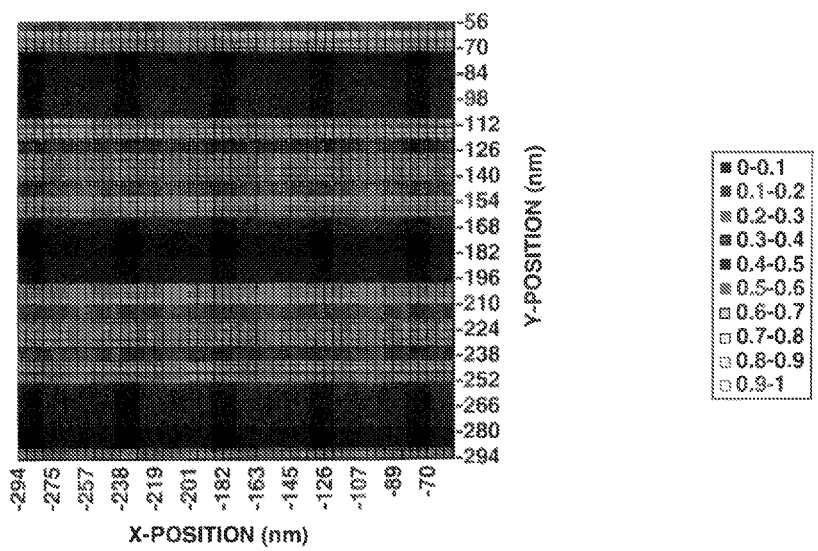
FIG. 22 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.

FIG. 22 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.

Figure 23:
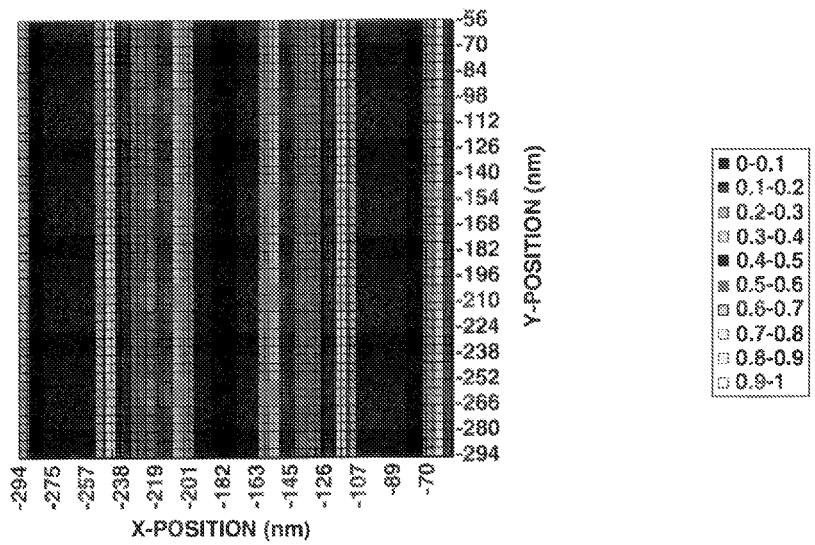
FIG. 23 is an optical image of Y-direction lines like FIG. 22.

FIG. 23 is an optical image of Y-direction lines having a pitch of 90 nm and a line size of 45 nm printed under conditions: ArF excimer laser of wavelength 193 nm, NA 1.3 lens, dipole illumination, 6% halftone phase shift mask, and s-polarization. A black area is a light shielded area while a white area is a high light intensity area. A definite contrast difference is recognized between white and black, indicating the presence of a fully light shielded area.

Figure 24:
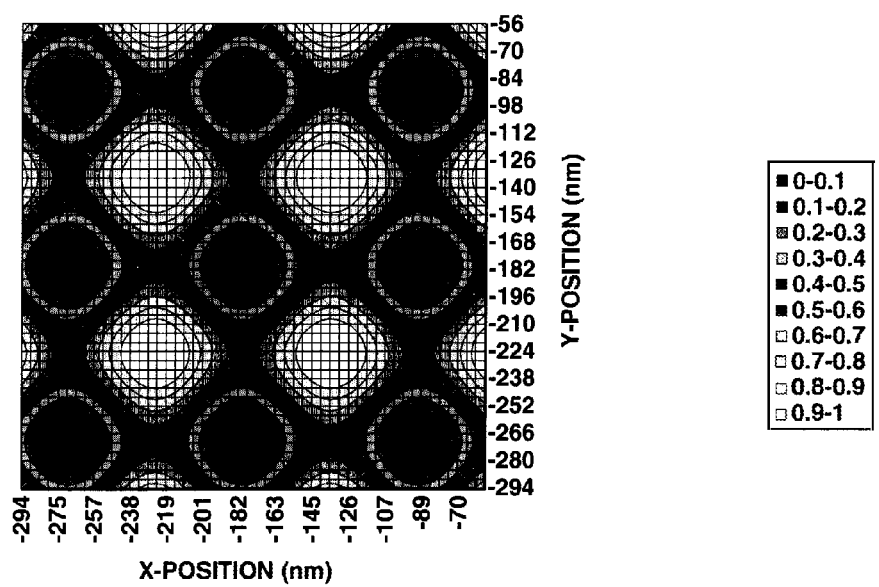
FIG. 24 shows a contrast image obtained by overlaying the optical image of X-direction lines in FIG. 22 with the optical image of Y-direction lines in FIG. 23.

FIG. 24 shows a contrast image obtained by overlaying the optical image of X-direction lines in FIG. 22 with that of Y-direction lines in FIG. 23. Against the expectation that a combination of X and Y lines may form a lattice-like image, weak light black areas draw circular shapes. As the pattern (circle) size becomes larger, the circular shape changes to a rhombic shape to merge with adjacent ones. As the circle size becomes smaller, circularity is improved, which is evidenced by the presence of a fully light shielded small circle.

Exposure by double dipole illuminations of X- and Y-direction lines combined with polarized illumination presents a method of forming light of the highest contrast. This method, however, has the drawback that the throughput is substantially reduced by double exposures and mask exchange therebetween. To continuously carry out two exposures while exchanging a mask, the exposure tool must be equipped with two mask stages although the existing exposure tool includes a single mask stage. Higher throughputs may be obtained by carrying out exposure of X direction lines continuously on 25 wafers in a front-opening unified pod (FOUP), exchanging the mask, and carrying out exposure continuously on the same 25 wafers, rather than exchanging a mask on every exposure of a single wafer. However, a problem arises that as the time duration until the first one of 25 wafers is exposed in the second exposure is prolonged, the environment affects the resist such that the resist after development may change its size and shape. To block the environmental impact on wafers in standby until the second exposure, it is effective that the resist film is overlaid with a protective film.

Figure 32:
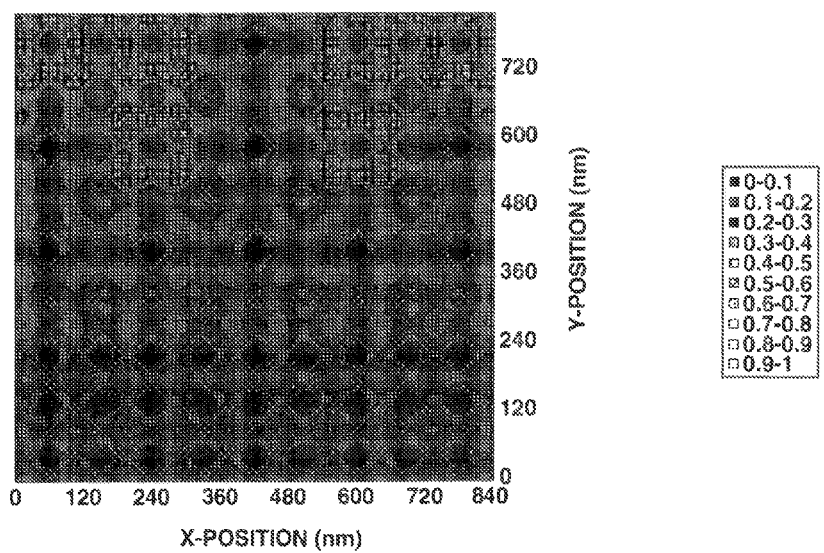
FIG. 32 is an optical image resulting from the mask of FIG. 31, showing its contrast.
Figure 33:
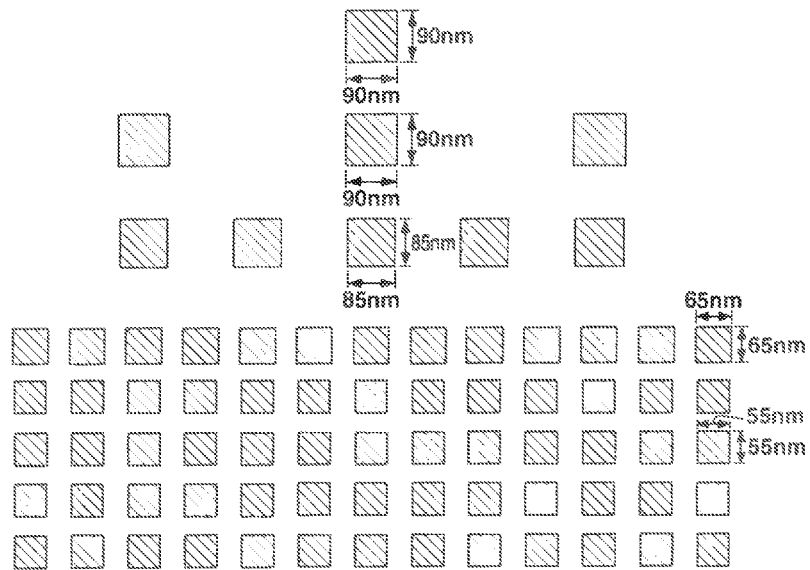
FIG. 33 illustrates a mask without a lattice-like pattern.

To proceed with a single mask, it is proposed in Non-Patent Document 1 to carry out two exposures by dipole illuminations in X and Y directions using a mask bearing a lattice-like pattern. When this method is compared with the above method using two masks, the optical contrast is somewhat reduced, but the throughput is improved by the use of a single mask. As described in Non-Patent Document 1, the method involves forming X-direction lines in a first photoresist film by X-direction dipole illumination using a mask bearing a lattice-like pattern, insolubilizing the X-direction lines by light irradiation, coating a second photoresist film thereon, and forming Y-direction lines by Y-direction dipole illumination, thereby forming holes at the interstices between X- and Y-direction lines. Although only a single mask is needed, this method includes additional steps of insolubilizing the first photoresist pattern between the two exposures, and coating and developing the second photoresist film. Then the wafer must be removed from the exposure stage between the two exposures to give rise to the problem of an increased alignment error. To minimize the alignment error between two exposures, two exposures must be continuously carried out without removing the wafer from the exposure stage. FIG. 32 shows the shape of apertures for dipole illumination for forming Y-direction or vertical lines using a mask bearing a lattice-like pattern, and FIG. 33 shows the shape of apertures for dipole illumination for forming X-direction or horizontal lines. The addition of s-polarized illumination to dipole illumination provides a further improved contrast and is thus preferably employed. After two exposures for forming X- and Y-direction lines using a lattice-like mask are performed in an overlapping manner, development is performed to form a hole pattern.

Figure 34:
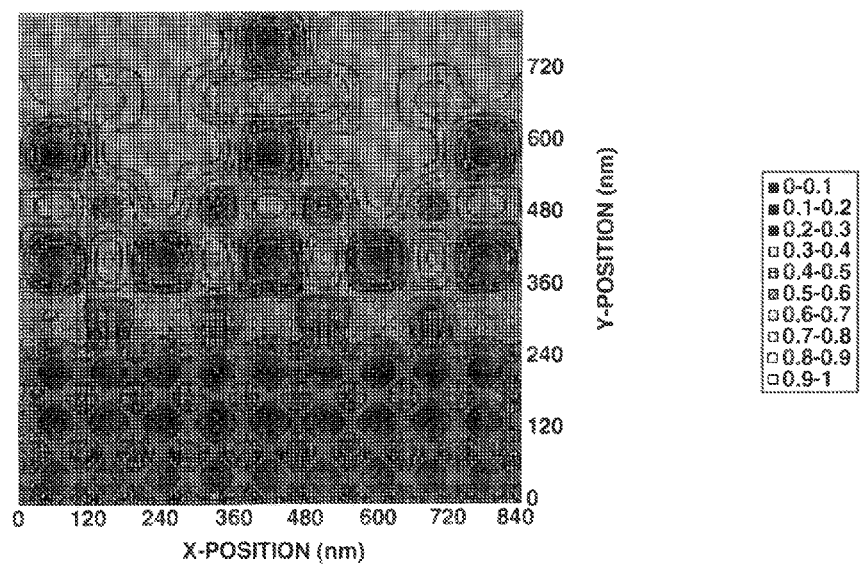
FIG. 34 is an optical image resulting from the mask of FIG. 33, showing its contrast.

When it is desired to form a hole pattern via a single exposure using a lattice-like mask, a quadra-pole illumination or cross-pole illumination in the aperture configuration shown in FIG. 34 is used. The contrast may be improved by combining it with X-Y polarized illumination or azimuthally polarized illumination of circular polarization.

In the hole pattern forming process of the invention, when two exposures are involved, these exposures are carried out by changing the illumination and mask for the second exposure from those for the first exposure, whereby a fine size pattern can be formed at the highest contrast and to dimensional uniformity. The masks used in the first and second exposures bear first and second patterns of intersecting lines whereby a pattern of holes at intersections of lines is formed in the resist film after development. The first and second lines are preferably at right angles although an angle of intersection other than 90° may be employed. The first and second lines may have the same or different size and/or pitch. If a single mask bearing first lines in one area and second lines in a different area is used, it is possible to perform first and second exposures continuously. In this case, however, the maximum area available for exposure is one half. Notably, the continuous exposures lead to a minimized alignment error. Of course, the single exposure provides a smaller alignment error than the two continuous exposures.

Figure 25:
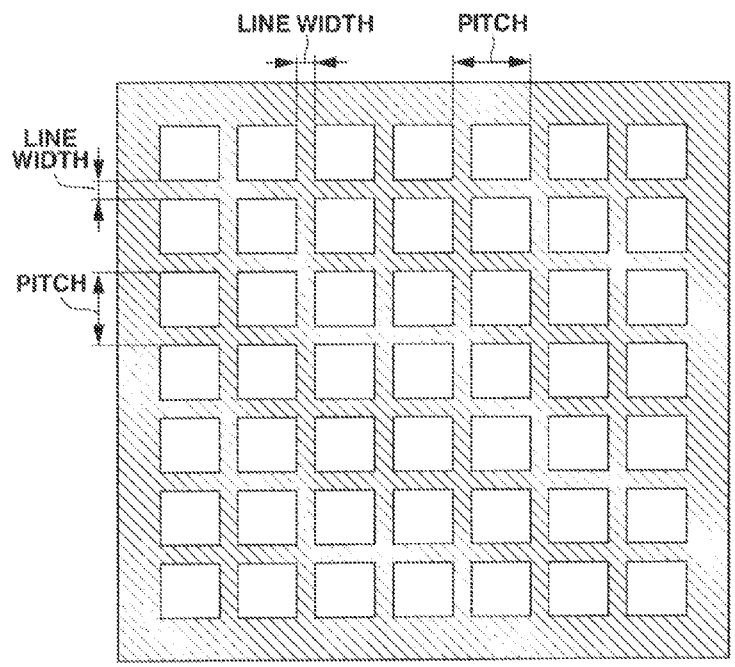
FIG. 25 illustrates a mask bearing a lattice-like pattern.
Figure 27:
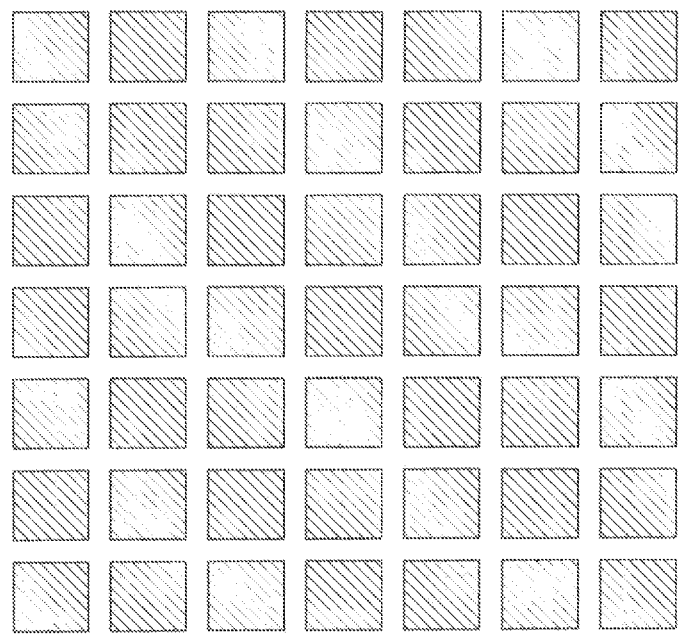
FIG. 27 illustrates a mask bearing a dot pattern of square dots having a pitch of 90 nm and a side width of 60 nm.

When two exposures are performed using a single mask without reducing the exposure area, the mask pattern may be a lattice-like pattern as shown in FIG. 25, a dot pattern as shown in FIG. 27, or a combination of a dot pattern and a lattice-like pattern as shown in FIG. 31. The use of a lattice-like pattern contributes to the most improved light contrast, but has the drawback of a reduced resist sensitivity due to a lowering of light intensity. On the other hand, the use of a dot pattern suffers a lowering of light contrast, but provides the merit of an improved resist sensitivity.

Where holes are arrayed in horizontal and vertical directions, the above-described illumination and mask pattern are used. Where holes are arrayed at a different angle, for example, at an angle of 45°, a mask of a 45° arrayed pattern is combined with dipole illumination or cross-pole illumination.

Figure 26:
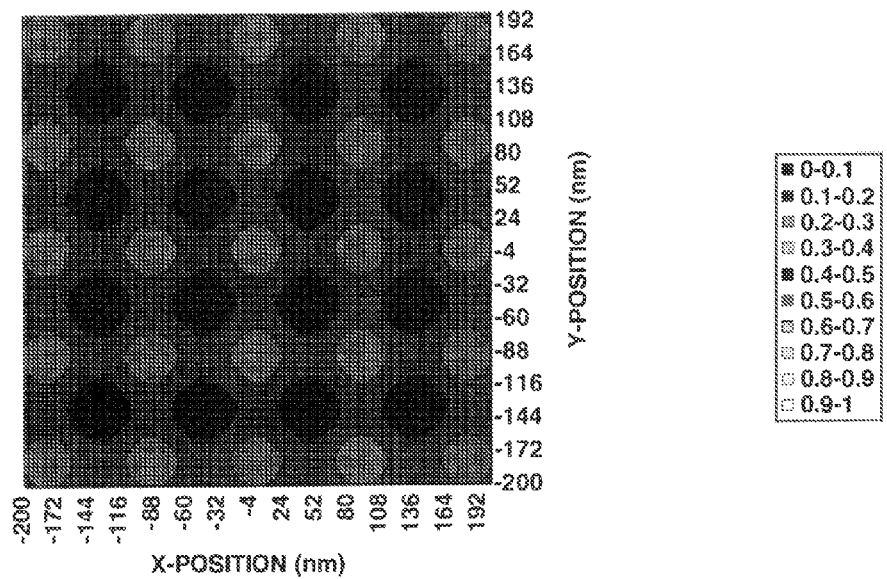
FIG. 26 is an optical image printed from a lattice-like line pattern having a pitch of 90 nm and a line width of 30 nm printed under conditions: NA 1.3 lens, cross-pole illumination, 6% halftone phase shift mask, and azimuthally polarized illumination.

On use of a mask bearing a lattice-like pattern as shown in FIG. 25 where light is fully shielded at intersections between gratings, black spots having a very high degree of light shielding appear as shown in FIG. 26. FIG. 26 is an optical image of a lattice-like line pattern having a pitch of 90 nm and a line width of 30 nm printed under conditions: NA 1.3 lens, cross-pole illumination, 6% halftone phase shift mask, and azimuthally polarized illumination. A fine hole pattern may be formed by performing exposure through a mask bearing such a pattern and positive/negative reversal of dual-tone resist.

Figure 28:
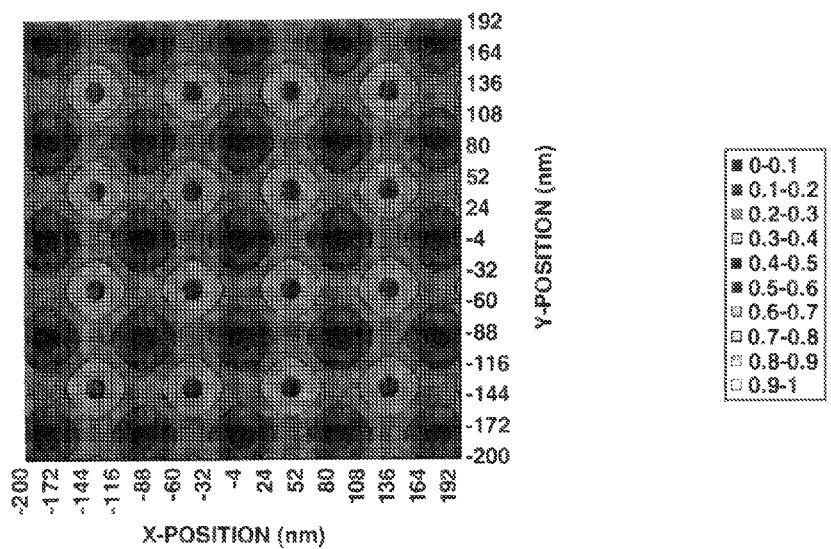
FIG. 28 is an optical image resulting from the mask of FIG. 27, printed under conditions: NA 1.3 lens, cross-pole illumination, 6% halftone phase shift mask, and azimuthally polarized illumination, showing its contrast.

On use of a mask bearing a dot pattern of square dots having a pitch of 90 nm and a side width of 60 nm as shown in FIG. 27, under conditions: NA 1.3 lens, cross-pole illumination, 6% halftone phase shift mask, and azimuthally polarized illumination, an optical image is obtained as shown in FIG. 28 that depicts the contrast thereof. Although the circle of fully light shielded spot in FIG. 28 has a smaller area than in FIG. 26, which indicates a low contrast as compared with the lattice-like pattern mask, the formation of a hole pattern is possible owing to the presence of black or light shielded spots.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Proc. SPIE Vol. 5753, p 171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

Figure 30:
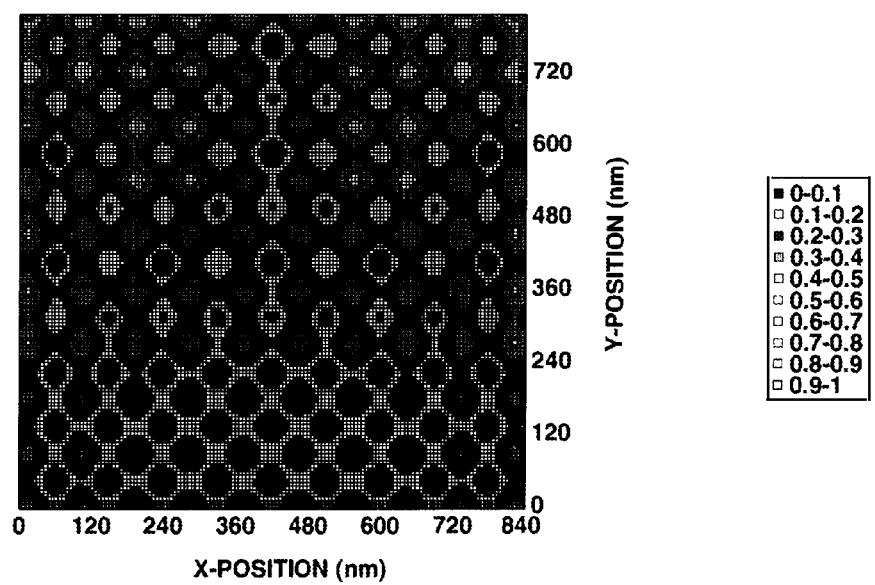
FIG. 30 is an optical image resulting from the mask of FIG. 29, showing its contrast.

To form a random pitch hole pattern by positive/negative reversal, a mask is used in which a lattice-like pattern is arrayed over the entire surface and the width of gratings is thickened only where holes are to be formed. As shown in FIG. 29, on a lattice-like pattern having a pitch of 90 nm and a line width of 20 nm, thick crisscross or intersecting line segments are disposed where dots are to be formed. A black area corresponds to the halftone shifter portion. Line segments with a width of 30 nm are disposed in the dense pattern portion whereas thicker line segments (width 40 nm in FIG. 29) are disposed in more isolated pattern portions. Since the isolated pattern provides light with a lower intensity than the dense pattern, thicker line segments are used. Since the peripheral area of the dense pattern provides light with a relatively low intensity, line segments having a width of 32 nm are assigned to the peripheral area which width is slightly greater than that in the internal area of the dense pattern. FIG. 30 shows an optical image from the mask of FIG. 29, indicating the contrast thereof. Black or light shielded areas are where holes are formed via positive/negative reversal. Black spots are found at positions other than where holes are formed, but few are transferred in practice because they are of small size. Optimization such as reduction of the width of grating lines corresponding to unnecessary holes can inhibit transfer of unnecessary holes.

Also useful is a mask in which a lattice-like pattern is arrayed over the entire surface and thick dots are disposed only where holes are to be formed. As shown in FIG. 31, on a lattice-like pattern having a pitch of 90 nm and a line width of 15 nm, thick dots are disposed where dots are to be formed. A black area corresponds to the halftone shifter portion. Square dots having one side with a size of 55 nm are disposed in the dense pattern portion whereas larger square dots (side size 90 nm in FIG. 31) are disposed in more isolated pattern portions. Although square dots are shown in the figure, the dots may have any shape including rectangular, rhombic, pentagonal, hexagonal, heptagonal, octagonal, and polygonal shapes and even circular shape.

FIG. 32 shows an optical image from the mask of FIG. 31, indicating the contrast thereof. The presence of black or light shielded spots substantially equivalent to those of FIG. 25 indicates that holes are formed via positive/negative reversal.

On use of a mask bearing no lattice-like pattern arrayed as shown in FIG. 33, black or light shielded spots do not appear as shown in FIG. 34. In this case, holes are difficult to form, or even if holes are formed, a variation of mask size is largely reflected by a variation of hole size because the optical image has a low contrast.

In the process of the invention, a resist film of the resist composition defined herein is formed on the processable layer directly or via an intermediate intervening layer such as a hard mask. The resist film preferably has a thickness of 10 to 1,000 nm, more preferably 20 to 500 nm. The resist film is prebaked prior to exposure, with the preferred pre-baking conditions including a temperature of 60 to 180° C., especially 70 to 150° C. and a time of 10 to 300 seconds, especially 15 to 200 seconds.

In the case of the negative resist composition having a TAG added thereto, the resist film is prebaked at a temperature not causing the TAG to be decomposed, and the TAG is decomposed during PEB and deprotection reaction takes place at the same time. Since most trialkylsulfonium salts have a decomposition temperature of around 100° C., it is preferable to perform prebake at a temperature below 100° C. and PEB at a temperature above 100° C. In the case of the negative resist composition having an acid added thereto, it is preferable to perform prebake at a temperature not inducing deprotection and PEB at a temperature inducing deprotection. The acid strength and the protective group are selected in such a combination that deprotection reaction does not take place at a temperature below 100° C., but takes place at a temperature above 100° C. If deprotection reaction takes place during prebake, negative conversion does not occur during subsequent exposure where the base is generated.

This is followed by patternwise exposure. For the exposure, preference is given to high-energy radiation having a wavelength of 140 to 250 nm, and especially ArF excimer laser radiation of 193 nm. The exposure may be done either in a dry atmosphere such as air or nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves exposing the prebaked resist film to light through a projection lens, with deionized water or another liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film. Alternatively, a protective coating may be applied onto the resist film after pre-baking for preventing any leach-outs from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the resist film, deionized water rinsing (or post-soaking) may be carried out for extracting the acid generator and the like from the film surface or washing away particles, or after exposure, rinsing (or post-soaking) may be carried out for removing water droplets left on the resist film.

Sometimes the amine released from the PBG may evaporate during bake and re-deposit on the surface of resist in an acid rich region, giving rise to a phenomenon that the region which is originally designed to allow for progress of acid-catalyzed deprotection reaction and to open a space after development is not opened. To prevent such a phenomenon, it is desirable to use a PBG capable of generating a high-boiling amine, and ideally an amine having an amino group attached to the polymer backbone. However, the high-boiling bulky amines and polymer-bound amines have a low acid trapping ability and hence, a low inactivation ability. The low inactivation ability may lead to a low contrast of negative conversion, resulting in a negative pattern having an inversely tapered profile and degraded edge roughness. The amine released from a PBG of addition mode has a high inactivation ability, but can evaporate to induce chemical flare during bake. For preventing chemical flare, it is effective to apply a protective film on top of the resist film.

Suitable materials of which the protective film is made include those described in JP-A 2006-91798, JP-A 2007-316581, JP-A 2008-81716, JP-A 2008-111089, and JP-A 2009-205132.

To the resist composition, an additive for rendering the resist surface water repellent may be added. A typical additive is a polymer having a fluoroalcohol group. After spin coating, the polymer segregates toward the resist surface to reduce the surface energy, thereby improving water slip. Such additives are described in JP-A 2007-297590 and JP-A 2008-122932.

Exposure is typically carried out so as to provide an exposure dose of about 1 to 200 $mJ/cm^2$, preferably about 10 to 150 $mJ/cm^2$, and more preferably about 15 to 120 $mJ/cm^2$. This is followed by baking (PEB) on a hot plate at 50 to 150° C. for 1 to 5 minutes, preferably at 60 to 140° C. for 1 to 3 minutes. During PEB, deprotection reaction is driven by the acid catalyst, and diffusions of acid and amine occur at the same time. While a drop of resolution by acid diffusion has been pointed out, the resist composition according to the invention ensures that amine diffusion has a greater impact on the resolution and the size variation of a hole pattern. In order to control diffusion of amine, PEB at a lower temperature is preferred. To this end, a protective group with a low activation energy enough to allow deprotection reaction with acid to take place during PEB is preferable. Typical of the protective group with a low activation energy is an acetal protective group.

Thereafter the resist film is developed with a developer in the form of an aqueous alkaline solution, for example, an aqueous solution of 0.1 to 5 wt %, preferably 2 to 3 wt % tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

Next, using the resist film as a mask, the intermediate intervening layer of hard mask or the like is etched, and the processable layer further etched. For etching of the intermediate intervening layer of hard mask or the like, dry etching with fluorocarbon or halogen gases may be used. For etching of the processable layer, the etching gas and conditions may be properly chosen so as to establish an etching selectivity relative to the hard mask, and specifically, dry etching with fluorocarbon, halogen, oxygen, hydrogen or similar gases may be used. Thereafter, the resist film is removed. Removal of resist film may be carried out after etching of the intermediate intervening layer of hard mask or the like. It is noted that removal of the resist film may be achieved by dry etching with oxygen or radicals, or using strippers such as amine-containing organic solvents or sulfuric acid/aqueous hydrogen peroxide.

Alternatively, ion implantation may be carried out on the substrate using the thus developed resist pattern as a mask. In the case of a negative pattern resulting from organic solvent development, the remaining film contains carboxyl groups resulting from deprotection reaction and thus offers low barrier properties against ion implantation. In contrast, the negative pattern formed by the patterning process of the invention has the advantage that the remaining film contains cyclic protective groups and thus offers high ion barrier properties. For the same reason, the film has high resistance to dry etching.

In addition, the crosslinking negative resist composition and the negative pattern formation by organic solvent development suffers a problem of dissolution residue in space portions. In contrast, the pattern forming process of the invention leaves no residue in space portions because the dissolution rate of space portions is increased by carboxyl group resulting from deprotection reaction.

After development, a process for shrinking a hole pattern or trench pattern may be carried out. Suitable shrink processes include thermal flow by heat baking, RELACS® of coating a shrink agent, baking and stripping the extra shrink agent, SAFIRE®, and the like.

Example

Examples of the invention are given below by way of illustration and not by way of limitation. For all polymers, Mw and Mn are determined by GPC versus polystyrene standards.

Synthesis Examples

Polymers to be added to resist compositions were prepared by combining various monomers, effecting copolymerization reaction in tetrahydrofuran medium, crystallization from methanol, repeatedly washing with hexane, isolation, and drying. The resulting polymers (Polymers 1 to 12) had the composition shown below. The composition of each polymer was analyzed by ¹H-NMR, and the Mw and Mw/Mn determined by GPC.

Polymer 1
  Mw=8,300
  Mw/Mn=1.76

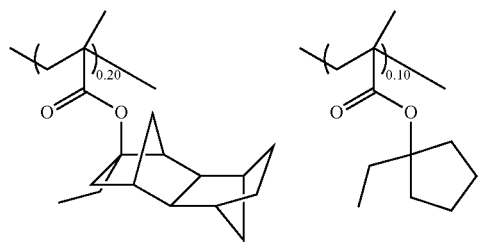

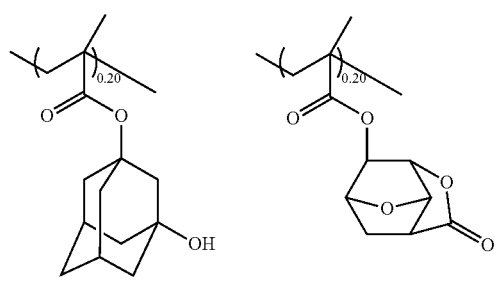

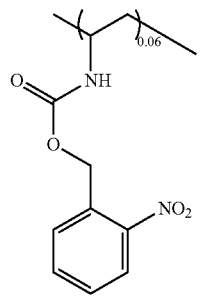

Polymer 2
  Mw=8,800
  Mw/Mn=1.77

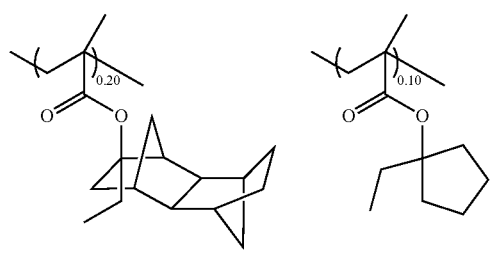

-continued

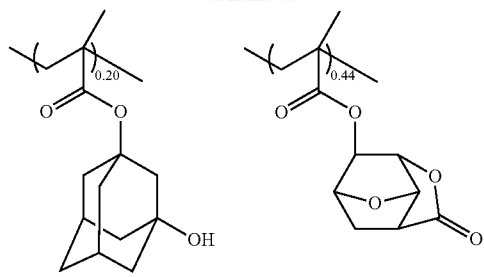

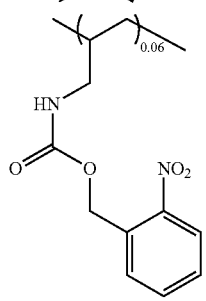

Polymer 3
  Mw=7,600
  Mw/Mn=1.79

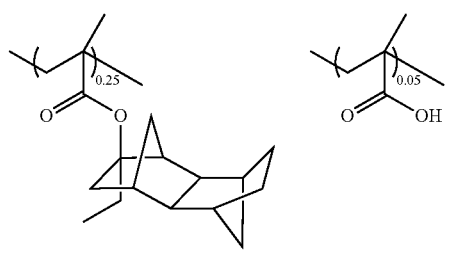

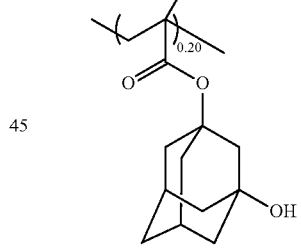

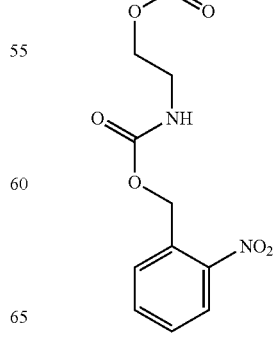

Polymer 4
Mw=8,300
Mw/Mn=1.92
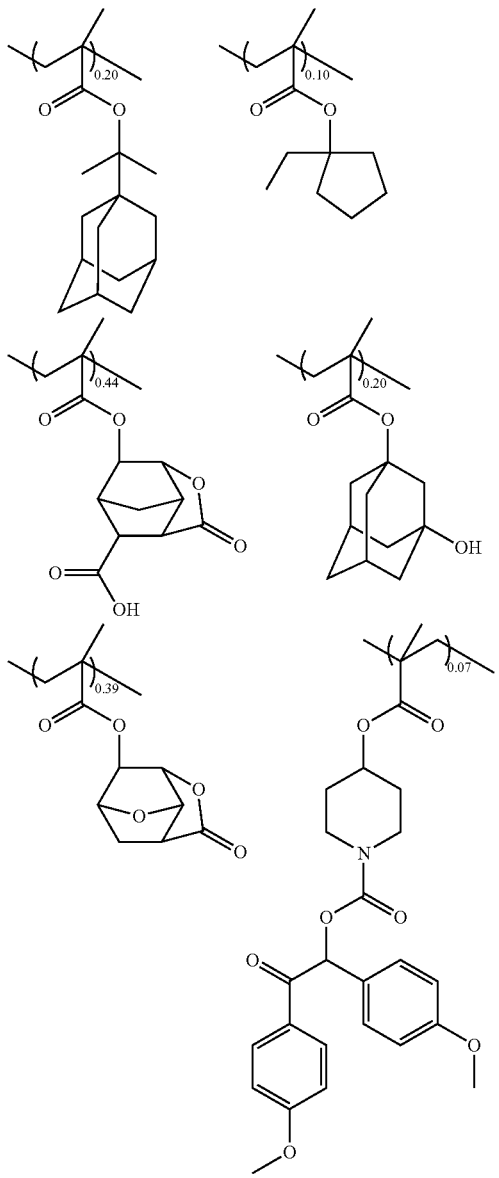
Polymer 5
Mw=8,900
Mw/Mn=1.83
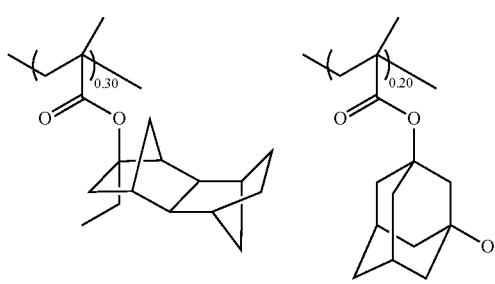
-continued
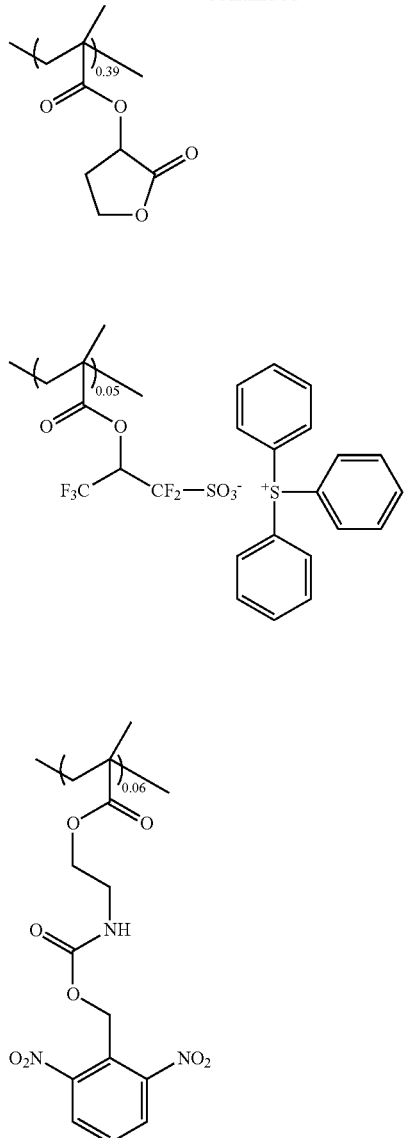
Polymer 6
Mw=7,300
Mw/Mn=1.81
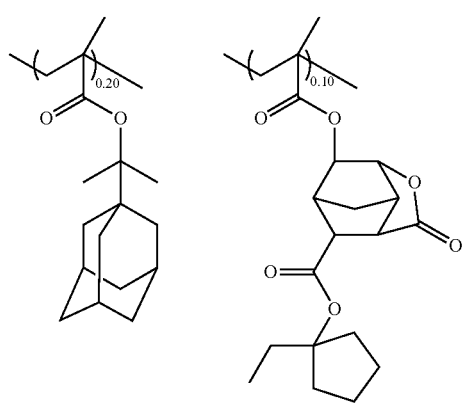

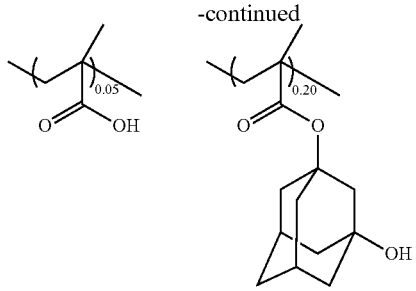
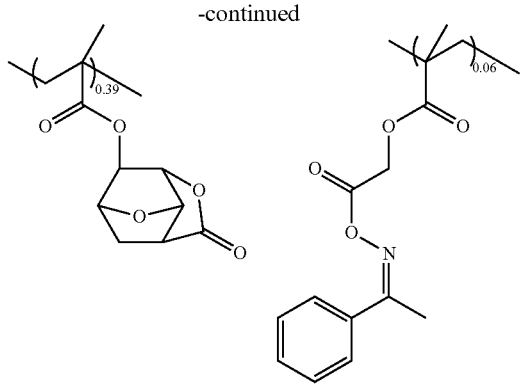
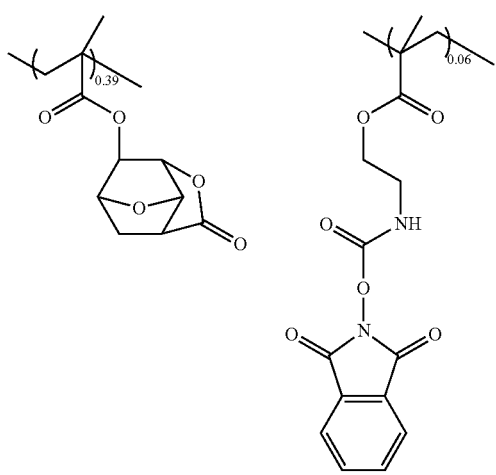
Polymer 8
 Mw=9,300
 Mw/Mn=1.93
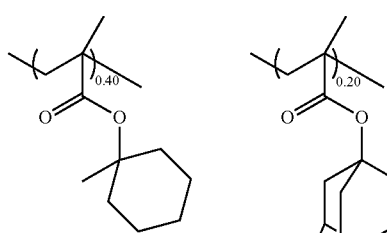
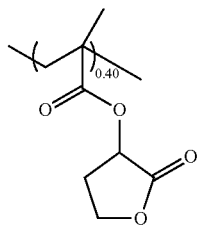
Polymer 7
 Mw=8,300
 Mw/Mn=1.79
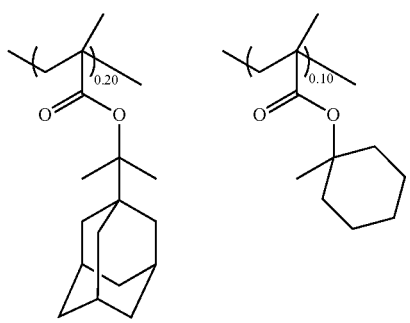
Polymer 9
 Mw=9,600
 Mw/Mn=1.98
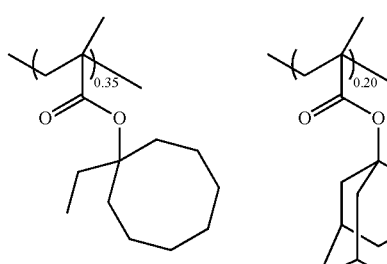
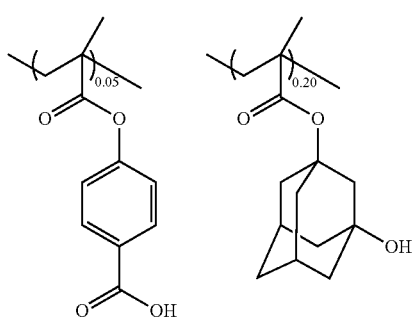
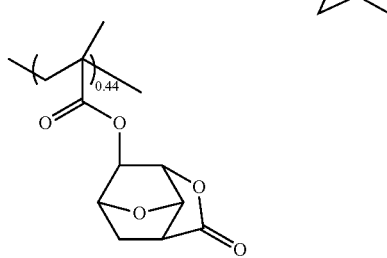

177
-continued
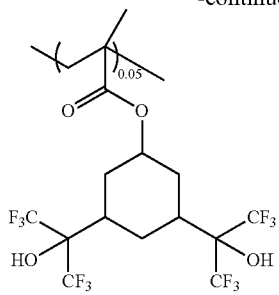
Polymer 10
Mw=9,600
Mw/Mn=1.98
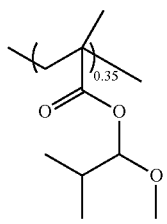 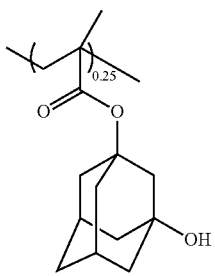
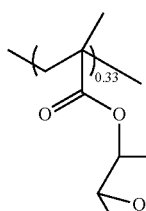 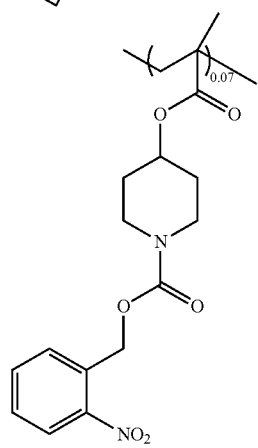
Polymer 11
Mw=9,400
Mw/Mn=1.98
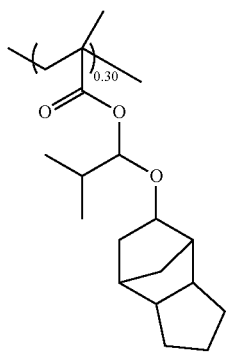 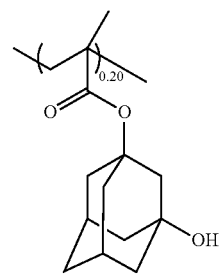
178
-continued
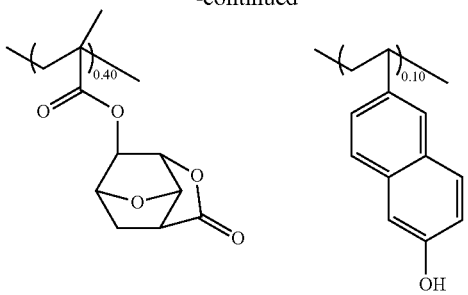
Polymer 12
Mw=9,400
Mw/Mn=1.98
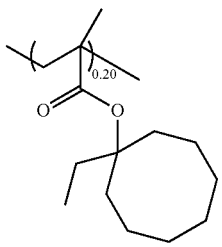 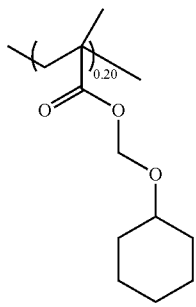
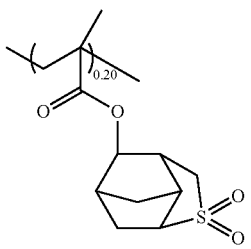
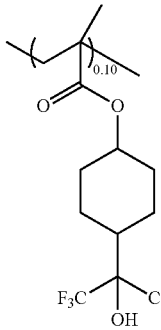
Comparative Polymer 1
Mw=9,900
Mw/Mn=1.99
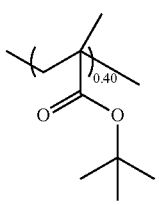 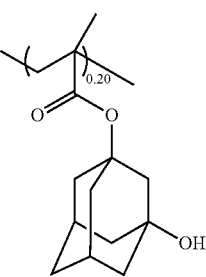

-continued

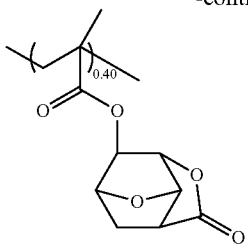

Preparation of Resist Composition

A resist solution was prepared by dissolving each polymer (Polymers 1 to 12 or Comparative Polymer 1), a photoacid generator (PAG1), a thermal acid generator (TAG1 to 7), an acid (Acid 1 to 4), a comparative thermal acid generator (Comparative TAG1), a photobase generator (PBG1 to 9), and base amplifier (BG1 to 3), a basic compound (amine quencher: Quenchers 1, 2), and a repellent (for rendering the resist film surface water repellent, Repellent Polymer 1) in a solvent in accordance with the recipe shown in Tables 1-1 and 1-2, and filtering through a Teflon® filter with a pore size of 0.2 μm. The solvent contained 50 ppm of surfactant FC-4430 (3M-Sumitomo Co., Ltd.).

The components in Table 1 are identified below.

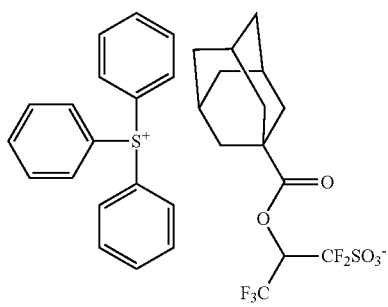

PAG 1

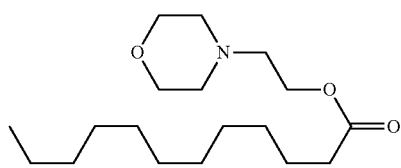

Quencher 1

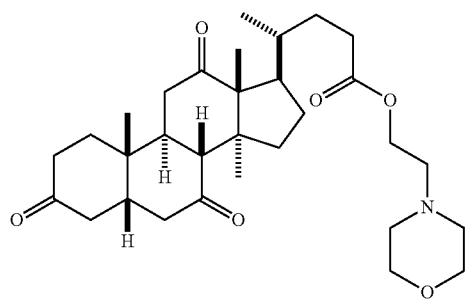

Quencher 2

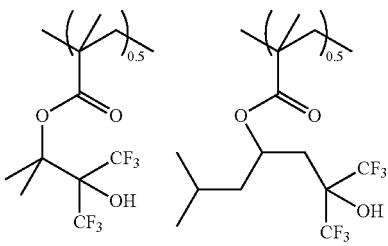

Repellent Polymer 1
Mw = 8,900
Mw/Mn = 1.96

-continued
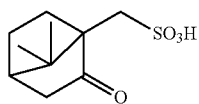
Acid 1
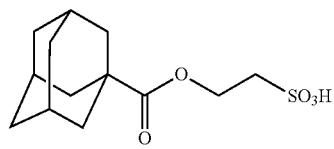
Acid 2
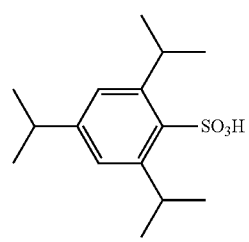
Acid 3
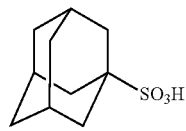
Acid 4
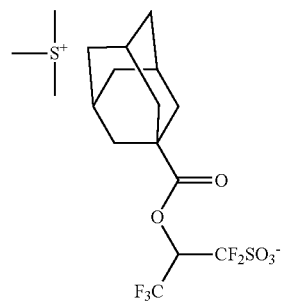
TAG 1
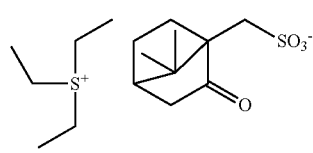
TAG 2
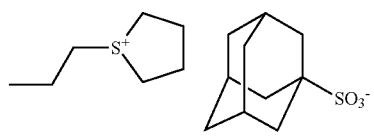
TAG 3

-continued
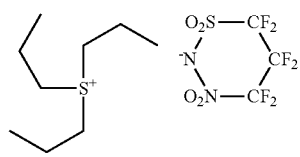
TAG 4
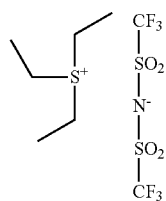
TAG 5
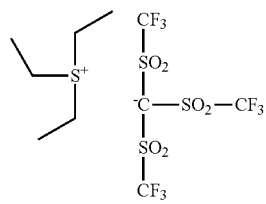
TAG 6
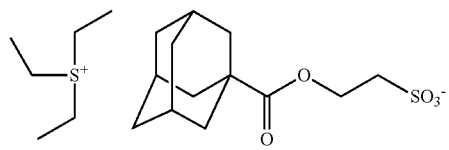
TAG 7
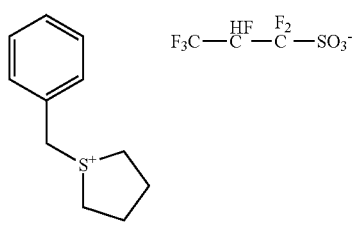
Comparative TAG 1
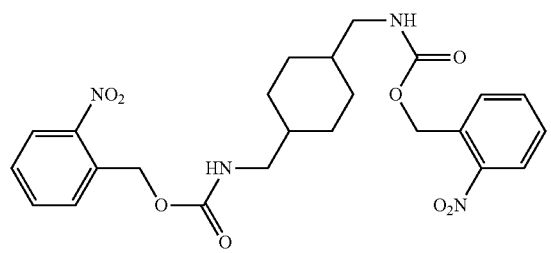
PBG 1

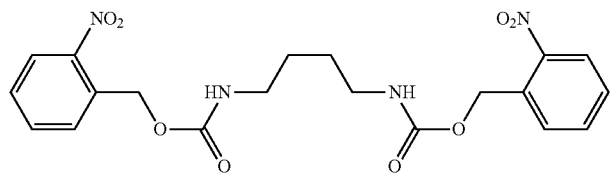
PBG 2
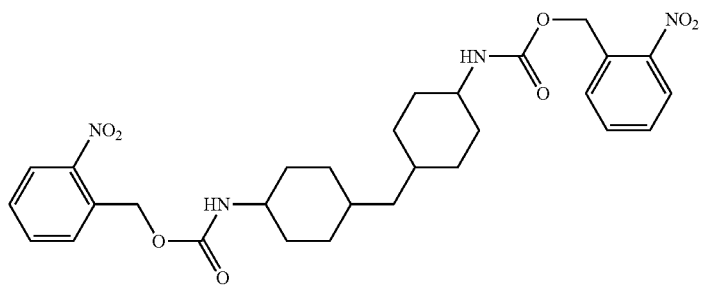
PBG 3
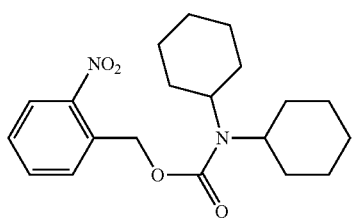
PBG 4
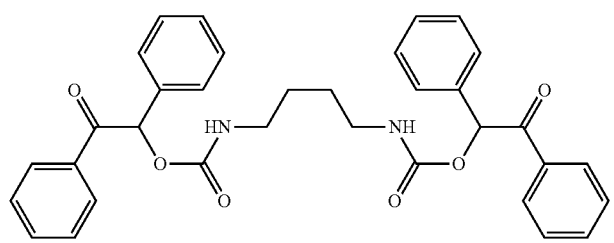
PBG 5
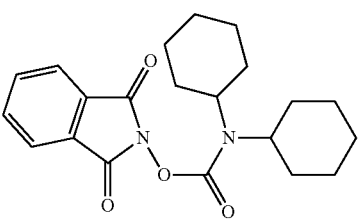
PBG 6
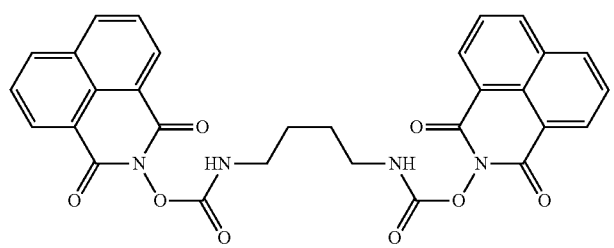
PBG 7

-continued
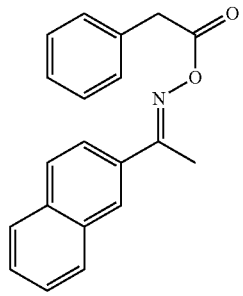
PBG 8
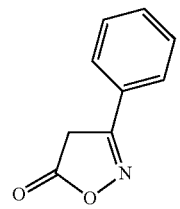
PBG 9
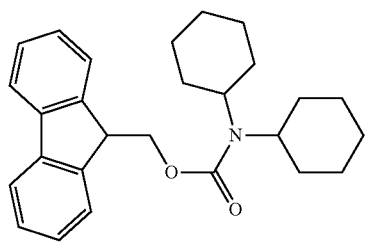
BG1
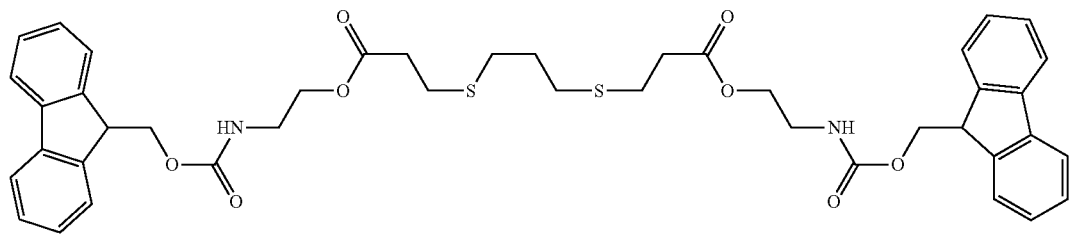
BG2
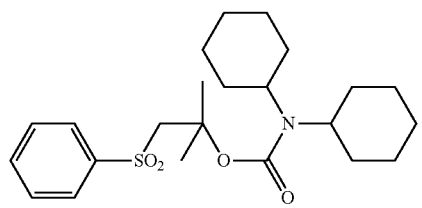
BG3

Organic Solvent:
propylene glycol monomethyl ether acetate (PGMEA)
cyclohexanone (CyH)
propylene glycol monomethyl ether (PGME)

TABLE 1-1

| | | Polymer (pbw) | Photobase generator (pbw) | Base amplifier (pbw) | Acid generator/Acid (pbw) | Basic compound (pbw) | Repellent (pbw) | Organic solvent (pbw) | |
|---|---|---|---|---|---|---|---|---|---|
| Resist | 1 | Polymer 1 (100) | — | — | PAG1 (14.0) | Quencher1 (2.70) | Repellent Polymer 1 (4.0) | PGMEA CyH | (1,500) (500) |
| | 2 | Polymer 2 (100) | — | — | PAG1 (14.0) | Quencher1 (3.00) | Repellent Polymer 1 (4.0) | PGMEA CyH | (1,500) (500) |
| | 3 | Polymer 3 (100) | — | — | PAG1 (14.0) | Quencher1 (3.00) | Repellent Polymer 1 (4.0) | PGMEA CyH | (1,500) (500) |
| | 4 | Polymer 4 (100) | — | — | PAG1 (14.0) | Quencher1 (2.00) | Repellent Polymer 1 (4.0) | PGMEA CyH | (1,500) (500) |
| | 5 | Polymer 5 (100) | — | — | — | Quencher1 (2.30) | Repellent Polymer 1 (4.0) | PGMEA PGME | (1,800) (200) |
| | 6 | Polymer 6 (100) | — | — | PAG1 (14.0) | Quencher1 (3.20) | Repellent Polymer 1 (4.0) | PGMEA CyH | (1,500) (500) |
| | 7 | Polymer 7 (100) | — | — | PAG1 (14.0) | Quencher1 (2.60) | Repellent Polymer 1 (4.0) | PGMEA CyH | (1,500) (500) |
| | 8 | Polymer 8 (100) | PBG1 (7.3) | — | PAG1 (14.0) | Quencher2 (2.88) | — | PGMEA CyH | (1,500) (500) |
| | 9 | Polymer 8 (100) | PBG1 (5.0) | BG1 (3.7) | PAG1 (14.0) | Quencher2 (2.88) | — | PGMEA CyH | (1,500) (500) |
| | 10 | Polymer 8 (100) | PBG2 (6.5) | — | PAG1 (14.0) | Quencher2 (2.88) | — | PGMEA CyH | (1,500) (500) |
| | 11 | Polymer 8 (100) | PBG3 (8.3) | — | PAG1 (14.0) | Quencher2 (2.88) | — | PGMEA CyH | (1,500) (500) |
| | 12 | Polymer 8 (100) | PBG4 (9.0) | — | PAG1 (14.0) | Quencher2 (5.00) | — | PGMEA CyH | (1,500) (500) |
| | 13 | Polymer 8 (100) | PBG5 (8.2) | — | PAG1 (14.0) | Quencher2 (2.88) | — | PGMEA CyH | (1,500) (500) |
| | 14 | Polymer 8 (100) | PBG6 (9.0) | — | PAG1 (14.0) | Quencher2 (6.0) | — | PGMEA CyH | (1,500) (500) |
| | 15 | Polymer 8 (100) | PBG7 (9.0) | — | PAG1 (14.0) | Quencher2 (2.88) | — | PGMEA CyH | (1,500) (500) |
| | 16 | Polymer 8 (100) | PBG8 (8.0) | — | PAG1 (14.0) | Quencher2 (6.0) | — | PGMEA CyH | (1,500) (500) |
| | 17 | Polymer 8 (100) | PBG9 (4.5) | — | PAG1 (14.0) | Quencher2 (5.0) | — | PGMEA CyH | (1,500) (500) |
| | 18 | Polymer 8 (100) | PBG1 (5.0) | BG2 (5.0) | PAG1 (14.0) | Quencher2 (2.88) | — | PGMEA CyH | (1,500) (500) |
| | 19 | Polymer 8 (100) | PBG1 (5.0) | BG3 (5.0) | PAG1 (14.0) | Quencher2 (2.88) | — | PGMEA CyH | (1,500) (500) |
| | 20 | Polymer 9 (100) | PBG2 (6.5) | — | Acid2 (4.0) | — | Repellent Polymer 1 (4.0) | PGMEA PGME | (1,500) (500) |

TABLE 1-2

| | | Polymer (pbw) | Photobase generator (pbw) | Base amplifier (pbw) | Acid generator/Acid (pbw) | Basic compound (pbw) | Repellent (pbw) | Organic solvent (pbw) | |
|---|---|---|---|---|---|---|---|---|---|
| Resist | 21 | Polymer 9 (100) | PBG2 (6.5) | — | Acid3 (3.0) | — | Repellent Polymer 1 (4.0) | PGMEA PGME | (1,500) (500) |
| | 22 | Polymer 9 (100) | PBG2 (6.5) | — | Acid4 (6.0) | — | Repellent Polymer 1 (4.0) | PGMEA PGME | (1,500) (500) |
| | 23 | Polymer 1 (100) | — | — | TAG1 (6.0) | — | Repellent Polymer 1 (4.0) | PGMEA PGME | (1,500) (500) |
| | 24 | Polymer 10 (100) | — | — | Acid1 (3.8) | — | Repellent Polymer 1 (4.0) | PGMEA PGME | (1,500) (500) |

TABLE 1-2-continued

| | | Polymer (pbw) | Photobase generator (pbw) | Base amplifier (pbw) | Acid generator/Acid (pbw) | Basic compound (pbw) | Repellent (pbw) | Organic solvent (pbw) | |
|---|---|---|---|---|---|---|---|---|---|
| | 25 | Polymer 10 (100) | — | — | Acid4 (3.5) | — | Repellent Polymer 1 (4.0) | PGMEA PGME | (1,500) (500) |
| | 26 | Polymer 10 (100) | — | — | TAG2 (5.5) | — | Repellent Polymer 1 (4.0) | PGMEA PGME | (1,500) (500) |
| | 27 | Polymer 10 (100) | — | — | TAG3 (5.5) | — | Repellent Polymer 1 (4.0) | PGMEA PGME | (1,500) (500) |
| | 28 | Polymer 11 (100) | PBG2 (6.5) | — | TAG3 (5.0) | — | Repellent Polymer 1 (4.0) | PGMEA CyH | (1,500) (500) |
| | 29 | Polymer 12 (100) | PBG1 (6.5) | — | TAG7 (7.0) | — | Repellent Polymer 1 (4.0) | PGMEA PGME | (1,500) (500) |
| | 30 | Polymer 1 (100) | — | — | TAG4 (6.0) | — | Repellent Polymer 1 (4.0) | PGMEA PGME | (1,500) (500) |
| | 31 | Polymer 1 (100) | — | — | TAG5 (5.0) | — | Repellent Polymer 1 (4.0) | PGMEA PGME | (1,500) (500) |
| | 32 | Polymer 1 (100) | — | — | TAG6 (7.0) | — | Repellent Polymer 1 (4.0) | PGMEA PGME | (1,500) (500) |
| Comparative Resist | 1 | Polymer 8 (100) | — | — | PAG1 (14.0) | Quencher1 (3.00) | Repellent Polymer 1 (4.0) | PGMEA CyH | (1,500) (500) |
| | 2 | Polymer 8 (100) | PBG2 (1.5) | — | PAG1 (14.0) | Quencher1 (3.00) | Repellent Polymer 1 (4.0) | PGMEA CyH | (1,500) (500) |
| | 3 | Polymer 8 (100) | PBG2 (1.5) | — | TAG1 (6.0) | — | Repellent Polymer 1 (4.0) | PGMEA PGME | (1,500) (500) |
| | 4 | Comparative Polymer 1 (100) | PBG2 (6.5) | — | Comparative TAG1 (6.0) | — | Repellent Polymer 1 (4.0) | PGMEA CyH | (1,500) (500) |
| | 5 | Polymer 8 (100) | PBG2 (6.5) | — | Comparative TAG1 (6.0) | — | Repellent Polymer 1 (4.0) | PGMEA CyH | (1,500) (500) |

Table 2 shows values of a, b, c, d, and e, provided that "e" is the sum of a molar amount "a" of amino group released from PBG group in the polymer, a molar amount "b" of amino groups released from the base generator and base amplifier added, and a molar amount "c" of amino group in the quencher, divided by a total molar amount "d" of acid released from PAG, acid released from sulfonium salt-bearing recurring units, acid released from thermal acid generator, and acid added.

TABLE 2

| | a | b | c | d | e |
|---|---|---|---|---|---|
| Resist 1 | 0.0257 | 0 | 0.00862 | 0.0214 | 1.604 |
| Resist 2 | 0.0256 | 0 | 0.00958 | 0.0214 | 1.644 |
| Resist 3 | 0.0253 | 0 | 0.00958 | 0.0214 | 1.630 |
| Resist 4 | 0.0281 | 0 | 0.00639 | 0.0214 | 1.612 |
| Resist 5 | 0.0245 | 0 | 0.00734 | 0.0198 | 1.608 |
| Resist 6 | 0.0243 | 0 | 0.01022 | 0.0214 | 1.613 |
| Resist 7 | 0.0259 | 0 | 0.00830 | 0.0214 | 1.598 |
| Resist 8 | 0 | 0.0292 | 0.00559 | 0.0214 | 1.625 |
| Resist 9 | 0 | 0.0292 | 0.00559 | 0.0214 | 1.625 |
| Resist 10 | 0 | 0.0292 | 0.00559 | 0.0214 | 1.625 |
| Resist 11 | 0 | 0.0292 | 0.00559 | 0.0214 | 1.625 |
| Resist 12 | 0 | 0.0333 | 0.00559 | 0.0214 | 1.626 |
| Resist 13 | 0 | 0.0291 | 0.00559 | 0.0214 | 1.621 |
| Resist 14 | 0 | 0.0243 | 0.01165 | 0.0214 | 1.681 |
| Resist 15 | 0 | 0.0318 | 0.00559 | 0.0214 | 1.746 |
| Resist 16 | 0 | 0.0264 | 0.01165 | 0.0214 | 1.778 |
| Resist 17 | 0 | 0.0280 | 0.00971 | 0.0214 | 1.759 |
| Resist 18 | 0 | 0.0328 | 0.00559 | 0.0214 | 1.792 |
| Resist 19 | 0 | 0.0318 | 0.00559 | 0.0214 | 1.750 |
| Resist 20 | 0 | 0.0292 | 0 | 0.0139 | 2.099 |
| Resist 21 | 0 | 0.0292 | 0 | 0.0141 | 2.070 |
| Resist 22 | 0 | 0.0292 | 0 | 0.0148 | 1.972 |
| Resist 23 | 0.0257 | 0 | 0 | 0.0128 | 2.010 |
| Resist 24 | 0.0322 | 0 | 0 | 0.0164 | 1.965 |
| Resist 25 | 0.0322 | 0 | 0 | 0.0162 | 1.986 |
| Resist 26 | 0.0322 | 0 | 0 | 0.0157 | 2.048 |
| Resist 27 | 0.0322 | 0 | 0 | 0.0159 | 2.025 |
| Resist 28 | 0 | 0.0292 | 0 | 0.0145 | 2.017 |
| Resist 29 | 0 | 0.0260 | 0 | 0.0132 | 1.969 |
| Resist 30 | 0.0257 | 0 | 0 | 0.0133 | 1.945 |
| Resist 31 | 0.0257 | 0 | 0 | 0.0125 | 2.056 |
| Resist 32 | 0.0257 | 0 | 0 | 0.0132 | 1.950 |
| Comparative Resist 1 | 0 | 0 | 0.00958 | 0.0214 | 0.448 |
| Comparative Resist 2 | 0 | 0.0067 | 0.00958 | 0.0214 | 0.762 |
| Comparative Resist 3 | 0 | 0.0067 | 0 | 0.01282 | 0.525 |
| Comparative Resist 4 | 0 | 0.0291 | 0 | 0.01463 | 1.992 |
| Comparative Resist 5 | 0 | 0.0291 | 0 | 0.01463 | 1.992 |

Contrast Curve Evaluation

On a substrate (silicon wafer) having an antireflective coating (ARC-29A, Nissan Chemical Industries Ltd.) of 80 nm thick, the resist solution (Resist 1 in Table 1-1) was spin coated, then baked on a hot plate at 100° C. for 60 seconds to form a resist film of 110 nm thick. On a substrate (silicon wafer) having an antireflective coating (ARC-29A, Nissan Chemical Industries Ltd.) of 80 nm thick, the resist solution (Resist 23 or Comparative Resist 3 in Table 1-2) was spin coated, then baked on a hot plate at 75° C. for 60 seconds to form a resist film of 110 nm thick. On a substrate (silicon wafer) having an antireflective coating (ARC-29A, Nissan Chemical Industries Ltd.) of 80 nm thick, the resist solution (Comparative Resists 1 and 2 in Table 1-2) was spin coated, then baked on a hot plate at 100° C. for 60 seconds to form a resist film of 110 nm thick.

Figure 40:
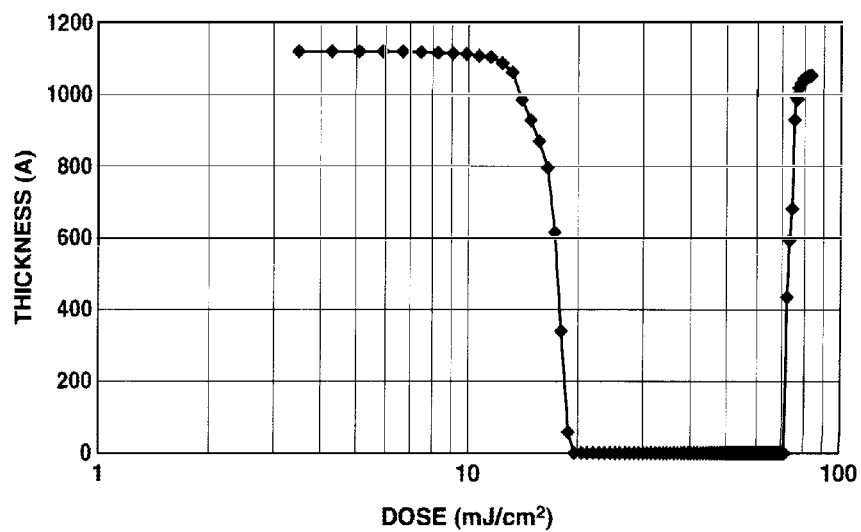
FIG. 40 is a diagram showing thickness versus exposure dose of a resist film of Resist 1.
Figure 41:
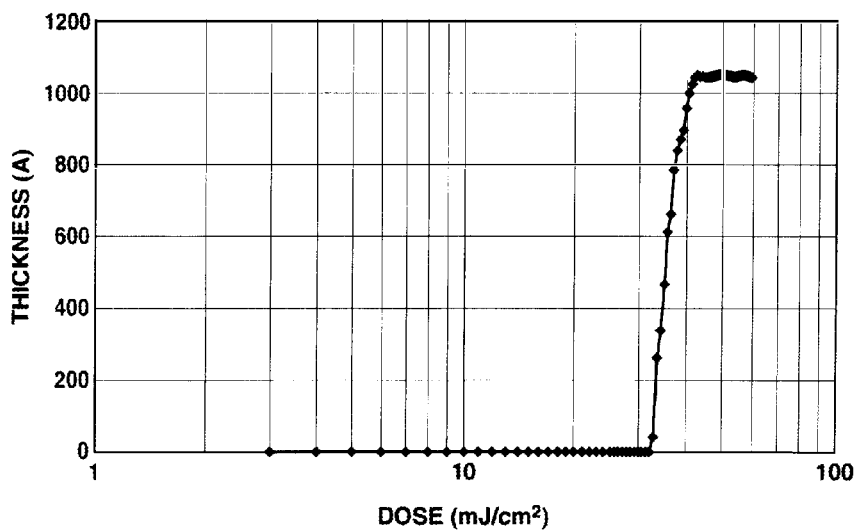
FIG. 41 is a diagram showing thickness versus exposure dose of a resist film of Resist 23.
Figure 42:
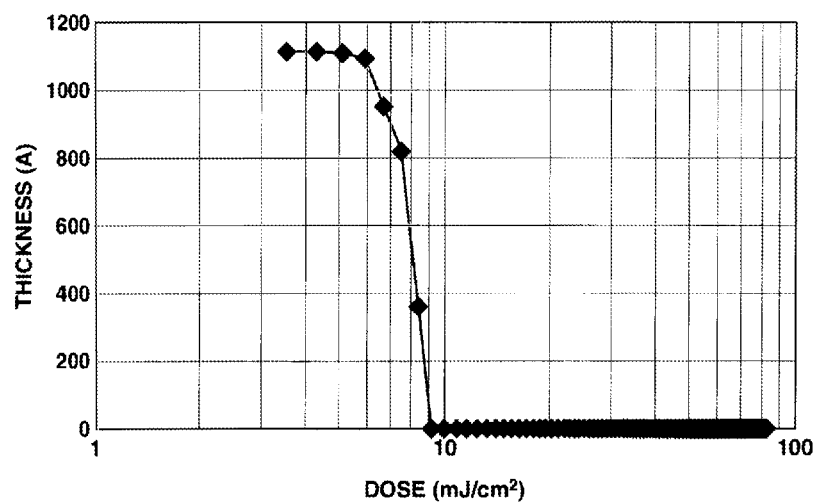
FIG. 42 is a diagram showing thickness versus exposure dose of a resist film of Comparative Resist 1.
Figure 43:
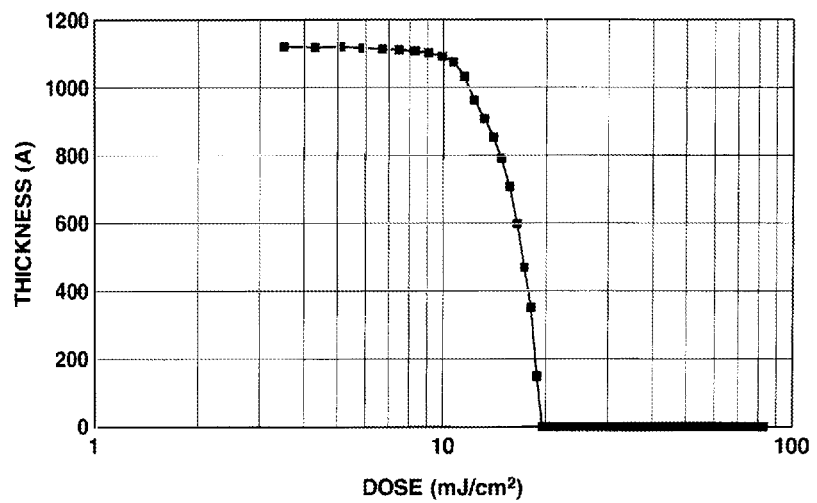
FIG. 43 is a diagram showing thickness versus exposure dose of a resist film of Comparative Resist 2.
Figure 44:
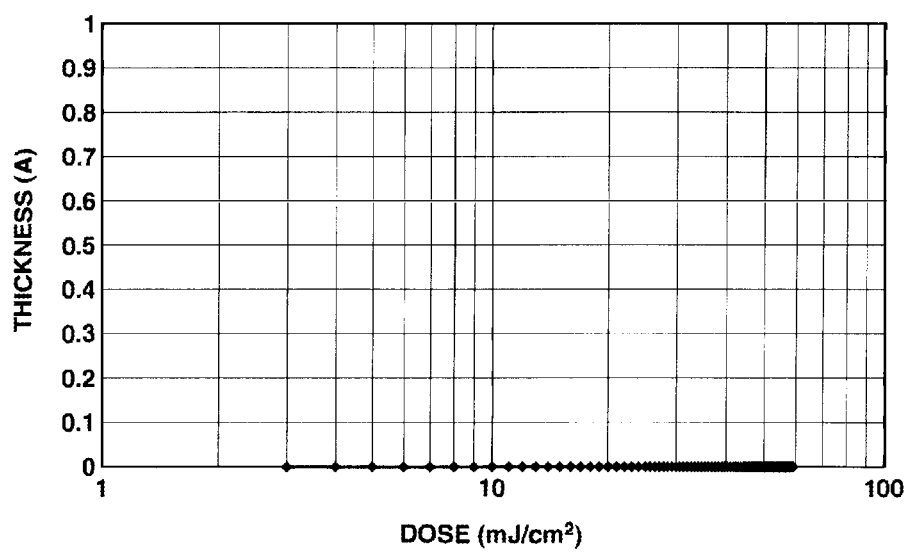
FIG. 44 is a diagram showing thickness versus exposure dose of a resist film of Comparative Resist 3.

Using an ArF excimer laser scanner model NSR-S307E (Nikon Corp., NA 0.85, σ 0.93, standard illumination), open-frame exposure was carried out with a varying exposure dose. After exposure, the resist film was baked (PEB) at 110° C. for 60 seconds and then developed for 30 seconds with a 2.38 wt % TMAH aqueous solution. The thickness of the resist film as developed was measured by an optical film thickness gauge. The results (thickness versus exposure dose) of Resist 1 are plotted in FIG. 40, and the results of Resist 23 plotted in FIG. 41. It is seen from FIG. 40 that the sensitivity of positive conversion when the film thickness reaches 0 is 18 mJ/cm$^2$, and the sensitivity of negative conversion when the film thickness starts increasing is 72 mJ/cm$^2$, demonstrating that Resist 1 displays dual-tone resist dissolution characteristics. It is seen from FIG. 41 that the sensitivity of negative conversion when the film thickness starts increasing is 33 mJ/cm$^2$, demonstrating that Resist 23 displays negative resist dissolution characteristics. The results of Comparative Resists 1, 2 and 3 are plotted in FIGS. 42, 43 and 44, respectively.

Patterning Test 1

On a substrate (silicon wafer) having a spin-on carbon film (ODL-102 by Shin-Etsu Chemical Co., Ltd.) of 200 nm thick and a spin-on silicon-containing film (SHB-A940 by Shin-Etsu Chemical Co., Ltd.) of 35 nm thick deposited thereon, the resist solution (Resists 1 to 32, Comparative Resists 1 to 5 shown in Tables 1-1 and 1-2) was spin coated, then baked on a hot plate at 100° C. for 60 seconds in Examples 1-1 to 1-19 and Comparative Examples 1, 2 or at 75° C. for 60 seconds in Examples 1-20 to 1-32 and Comparative Examples 3 to 5 to form a resist film of 80 nm thick. The resist films of Resists 1 to 7, Resists 20 to 32, and Comparative Resists 1 to 5 were ready for exposure without a protective film. On the resist films of Resists 8 to 19, a protective coating solution #1 shown in Table 3 was coated and baked at 90° C. for 60 seconds to form a protective film of 50 nm thick.

Using an ArF excimer laser scanner NSR-S610C (Nikon Corp., NA 1.30, σ 0.98/0.78) with dipole illumination combined with azimuthally polarized illumination, the coated substrate was exposed to two mask patterns of X and Y-direction lines having a line width of 50 nm and a pitch of 100 nm (expressed as on-wafer size). After exposure, the resist film was baked (PEB) at the temperature shown in Tables 4-1 and 4-2 for 60 seconds and then developed for 30 seconds with a 2.38 wt % TMAH aqueous solution.

The resist film was observed under a measuring SEM (S-9380, Hitachi Hitechnologies, Ltd.) to see whether or not holes with a size of 50 nm were formed while the exposure dose for hole formation was recorded. When a hole pattern was formed by image reversal, the size of 50 holes was measured, and a size variation 3σ was determined. The results are shown in Tables 4-1 and 4-2.

TABLE 4-1

| | | PEB temp. (° C.) | Dose (mJ/cm$^2$) | Hole size (nm) | Hole size variation 3σ (nm) |
|---|---|---|---|---|---|
| Example 1-1 | Resist 1 | 100 | 95 | 48 | 2.0 |
| Example 1-2 | Resist 2 | 100 | 99 | 46 | 2.0 |
| Example 1-3 | Resist 3 | 100 | 84 | 44 | 1.9 |
| Example 1-4 | Resist 4 | 100 | 79 | 48 | 2.1 |
| Example 1-5 | Resist 5 | 100 | 86 | 52 | 2.2 |
| Example 1-6 | Resist 6 | 100 | 84 | 49 | 2.2 |
| Example 1-7 | Resist 7 | 110 | 89 | 48 | 2.2 |
| Example 1-8 | Resist 8 | 95 | 94 | 47 | 2.4 |
| Example 1-9 | Resist 9 | 95 | 77 | 44 | 2.2 |
| Example 1-10 | Resist 10 | 95 | 78 | 43 | 2.1 |
| Example 1-11 | Resist 11 | 95 | 96 | 47 | 2.1 |
| Example 1-12 | Resist 12 | 95 | 89 | 47 | 2.3 |
| Example 1-13 | Resist 13 | 95 | 85 | 47 | 2.4 |
| Example 1-14 | Resist 14 | 95 | 77 | 41 | 2.1 |
| Example 1-15 | Resist 15 | 95 | 100 | 40 | 2.5 |
| Example 1-16 | Resist 16 | 95 | 65 | 48 | 2.6 |
| Example 1-17 | Resist 17 | 95 | 98 | 49 | 2.6 |
| Example 1-18 | Resist 18 | 95 | 79 | 52 | 2.6 |
| Example 1-19 | Resist 19 | 95 | 76 | 53 | 3.3 |
| Example 1-20 | Resist 20 | 120 | 80 | 55 | 4.6 |

TABLE 3

| | Polymer (pbw) | Organic solvent (pbw) |
|---|---|---|
| Protective coating solution #1 | TC Polymer 1 (75) TC Polymer 2 (25) | diisoamyl ether (2500) 2-methyl-1-butanol (250) |

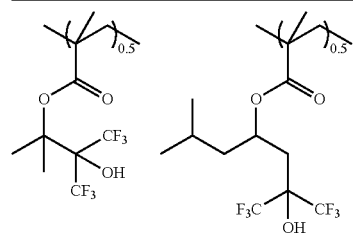

TC Polymer 1

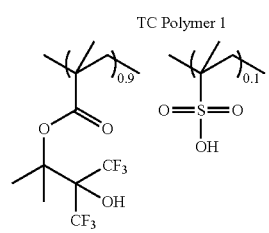

TC Polymer 2

TABLE 4-2

| | | PEB temp. (° C.) | Dose (mJ/cm$^2$) | Hole size (nm) | Hole size variation 3σ (nm) |
|---|---|---|---|---|---|
| Example 1-21 | Resist 21 | 130 | 92 | 54 | 4.8 |
| Example 1-22 | Resist 22 | 130 | 94 | 55 | 4.9 |
| Example 1-23 | Resist 23 | 110 | 65 | 50 | 3.9 |
| Example 1-24 | Resist 24 | 110 | 82 | 51 | 3.5 |
| Example 1-25 | Resist 25 | 110 | 88 | 52 | 3.3 |
| Example 1-26 | Resist 26 | 115 | 99 | 56 | 4.0 |
| Example 1-27 | Resist 27 | 120 | 93 | 55 | 4.3 |
| Example 1-28 | Resist 28 | 115 | 70 | 52 | 4.0 |
| Example 1-29 | Resist 29 | 115 | 45 | 48 | 4.0 |
| Example 1-30 | Resist 30 | 110 | 52 | 52 | 4.2 |
| Example 1-31 | Resist 31 | 110 | 42 | 55 | 4.8 |
| Example 1-32 | Resist 32 | 110 | 55 | 50 | 4.0 |
| Comparative Example 1-1 | Comparative Resist 1 | 110 | — | no holes formed | — |
| Comparative Example 1-2 | Comparative Resist 2 | 110 | — | no holes formed | — |
| Comparative Example 1-3 | Comparative Resist 3 | 110 | — | entire film dissolved away | — |
| Comparative Example 1-4 | Comparative Resist 4 | 160 | — | no holes formed | — |
| Comparative Example 1-5 | Comparative Resist 5 | 160 | — | no holes formed | — |

Patterning Test 2

On a substrate (silicon wafer) having a spin-on carbon film (ODL-102 by Shin-Etsu Chemical Co., Ltd.) of 200 nm thick and a spin-on silicon-containing film (SHB-A940 by Shin-Etsu Chemical Co., Ltd.) of 35 nm thick deposited thereon, the resist solution (Resist 8 or 23) was spin coated, then baked on a hot plate at 100° C. for 60 seconds to form a resist film of 80 nm thick. On the resist film, protective coating solution #1 shown in Table 3 was coated and baked at 90° C. for 60 seconds to form a protective film of 50 nm thick.

Figure 35:
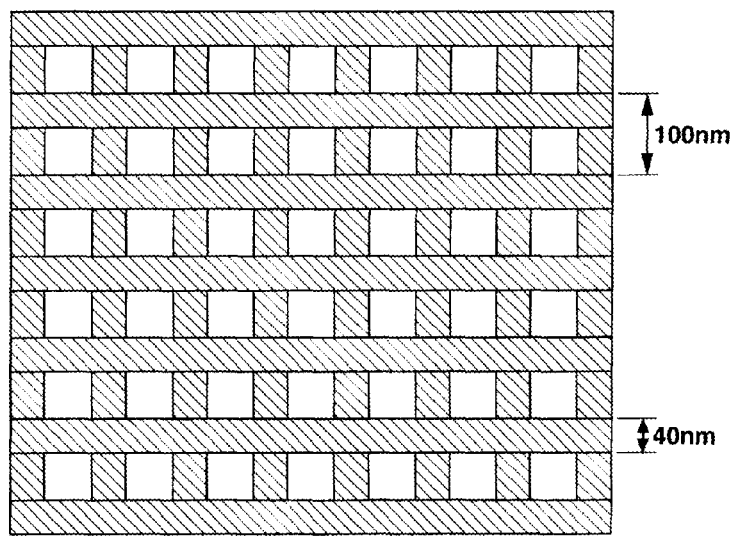
FIG. 35 illustrates a lattice-like mask used in patterning tests 2 and 4.

Using an ArF excimer laser immersion lithography scanner NSR-610C (Nikon Corp., NA 1.30, σ 0.98/0.78, cross-pole opening 20 degrees, azimuthally polarized illumination, 6% halftone phase shift mask), the coated substrate was exposed to a lattice-like mask pattern with a line width of 40 nm and a pitch of 100 nm (expressed as on-wafer size) whose layout is shown in FIG. 35, while the exposure dose was varied. After exposure, the resist film was baked (PEB) at the temperature shown in Table 5 for 60 seconds and then developed for 30 seconds with a 2.38 wt % TMAH aqueous solution.

The resist film was observed under a measuring SEM (S-9380, Hitachi Hitechnologies, Ltd.) to see whether or not holes with a size of 50 nm were formed while the exposure dose for hole formation was recorded. When a hole pattern was formed by image reversal, the size of 50 holes was measured, and a size variation 3σ was determined. The results are shown in Table 5.

TABLE 5

| | | PEB temp. (° C.) | Dose (mJ/cm$^2$) | Hole size (nm) | Hole size variation 3σ (nm) |
|---|---|---|---|---|---|
| Example 2-1 | Resist 8 | 95 | 150 | 49 | 3.5 |
| Example 2-2 | Resist 23 | 110 | 80 | 47 | 3.8 |

Patterning Test 3

On a substrate (silicon wafer) having a spin-on carbon film (ODL-102 by Shin-Etsu Chemical Co., Ltd.) of 200 nm thick and a spin-on silicon-containing film (SHB-A940 by Shin-Etsu Chemical Co., Ltd.) of 35 nm thick deposited thereon, the resist solution (Resist 8 or 23) was spin coated, then baked on a hot plate at 100° C. for 60 seconds to form a resist film of 80 nm thick. On the resist film, protective coating solution #1 shown in Table 3 was coated and baked at 90° C. for 60 seconds to form a protective film of 50 nm thick.

Figure 36:
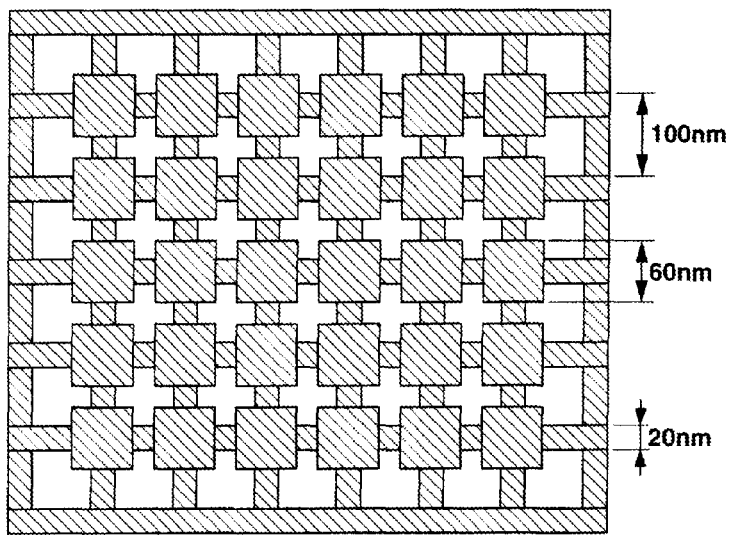
FIG. 36 illustrates a lattice-like pattern mask with dots disposed at intersections, used in patterning test 3.
Figure 37:
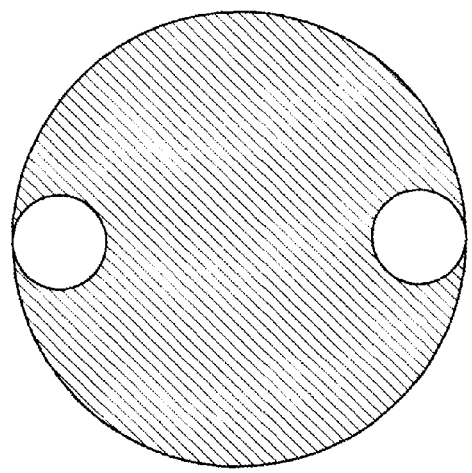
FIG. 37 illustrates an aperture configuration in an exposure tool of dipole illumination for enhancing the contrast of Y-direction lines.
Figure 38:
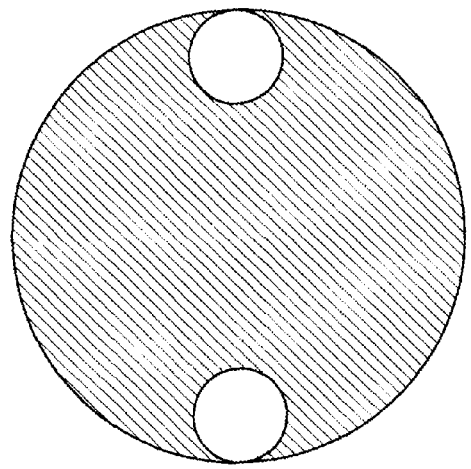
FIG. 38 illustrates an aperture configuration in an exposure tool of dipole illumination for enhancing the contrast of X-direction lines.
Figure 39:
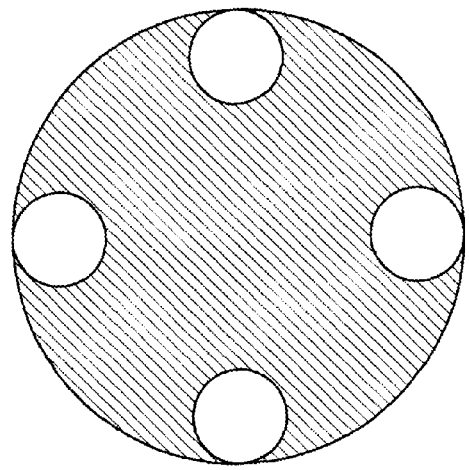
FIG. 39 illustrates an aperture configuration in an exposure tool of cross-pole illumination for enhancing the contrast of both X and Y-direction lines.

Using an ArF excimer laser immersion lithography scanner NSR-610C (Nikon Corp., NA 1.30, σ 0.98/0.78, cross-pole opening 20 degrees, 6% halftone phase shift mask, azimuthally polarized illumination), the coated substrate was exposed to a lattice-like mask pattern with a line width of 20 nm and a pitch of 100 nm (on-wafer size) having dots disposed at intersections between gratings, whose layout is shown in FIG. 36, while the dose was varied. After exposure, the resist film was baked (PEB) at the temperature shown in Table 6 for 60 seconds and then developed for 30 seconds with a 2.38 wt % TMAH aqueous solution.

The resist film was observed under a measuring SEM (S-9380, Hitachi Hitechnologies, Ltd.) to see whether or not holes with a size of 50 nm were formed while the exposure dose for hole formation was recorded. When a hole pattern was formed by image reversal, the size of 50 holes was measured, and a size variation 3σ was determined. The results are shown in Table 6.

TABLE 6

| | | PEB temp. (° C.) | Dose (mJ/cm$^2$) | Hole size (nm) | Hole size variation 3σ (nm) |
|---|---|---|---|---|---|
| Example 3-1 | Resist 8 | 95 | 135 | 49 | 3.8 |
| Example 3-2 | Resist 23 | 110 | 72 | 47 | 4.2 |

Patterning Test 4

On a substrate (silicon wafer) having a spin-on carbon film (ODL-102 by Shin-Etsu Chemical Co., Ltd.) of 200 nm thick and a spin-on silicon-containing film (SHB-A940 by Shin-Etsu Chemical Co., Ltd.) of 35 nm thick deposited thereon, the resist solution (Resist 8 or 23) was spin coated, then baked on a hot plate at 100° C. for 60 seconds to form a resist film of 80 nm thick. On the resist film, protective coating solution #1 shown in Table 3 was coated and baked at 90° C. for 60 seconds to form a protective film of 50 nm thick.

Using an ArF excimer laser immersion lithography scanner NSR-610C (Nikon Corp., NA 1.30, σ 0.98/0.78, dipole opening 20 degrees, azimuthally polarized illumination), exposure was performed through a 6% halftone phase shift mask bearing a lattice-like pattern with a line width of 40 nm and a pitch of 100 nm (on-wafer size) whose layout is shown in FIG. 35, while the dose was varied. The same area was subjected to two continuous exposures by X and Y dipole illuminations. After exposure, the resist film was baked (PEB) at the temperature shown in Table 7 for 60 seconds and then developed for 30 seconds with a 2.38 wt % TMAH aqueous solution.

The resist film was observed under a measuring SEM (S-9380, Hitachi Hitechnologies, Ltd.) to see whether or not holes with a size of 50 nm were formed while the exposure dose for hole formation was recorded. When a hole pattern was formed by image reversal, the size of 50 holes was measured, and a size variation 3σ was determined. The results are shown in Table 7.

TABLE 7

| | | PEB temp. (° C.) | Dose (mJ/cm$^2$) | Hole size (nm) | Hole size variation 3σ (nm) |
|---|---|---|---|---|---|
| Example 4-1 | Resist 8 | 95 | 95 | 49 | 3.0 |
| Example 4-2 | Resist 23 | 110 | 68 | 46 | 3.8 |

Patterning Test 5

On a substrate (silicon wafer) having a spin-on carbon film (ODL-102 by Shin-Etsu Chemical Co., Ltd.) of 200 nm thick and a spin-on silicon-containing film (SHB-A940 by Shin-Etsu Chemical Co., Ltd.) of 35 nm thick deposited thereon, the resist solution (Resist 8 or 23) was spin coated, then baked on a hot plate at 100° C. for 60 seconds to form a resist film of 80 nm thick. On the resist film, protective coating solution #1 shown in Table 3 was coated and baked at 90° C. for 60 seconds to form a protective film of 50 nm thick.

Using an ArF excimer laser immersion lithography scanner NSR-610C (Nikon Corp., NA 1.30, σ 0.98/0.78, dipole opening 20 degrees, azimuthally polarized illumination), exposure was performed through a 6% halftone phase shift mask bearing a dot pattern with a side size of 60 nm and a pitch of 90 nm (on-wafer size) whose layout is shown in FIG. 27, while the dose was varied. The same area was subjected to two continuous exposures by X and Y dipole illuminations. After exposure, the resist film was baked (PEB) at the temperature shown in Table 8 for 60 seconds and then developed for 30 seconds with a 2.38 wt % TMAH aqueous solution.

The resist film was observed under a measuring SEM (S-9380, Hitachi Hitechnologies, Ltd.) to see whether or not holes with a size of 50 nm were formed while the exposure dose for hole formation was recorded. When a hole pattern was formed by image reversal, the size of 50 holes was measured, and a size variation 3σ was determined. The results are shown in Table 8.

TABLE 8

| | | PEB temp. (° C.) | Dose (mJ/cm²) | Hole size (nm) | Hole size variation 3σ (nm) |
|---|---|---|---|---|---|
| Example 5-1 | Resist 8 | 95 | 85 | 49 | 3.2 |
| Example 5-2 | Resist 23 | 110 | 58 | 45 | 3.9 |

Resist 32 in which the total molar amount of amino groups exceeded the total molar amount of generated acid displayed dual-tone characteristics. When its resist film was exposed through masks bearing two intersecting line patterns or a mask bearing a dot pattern and a lattice-like pattern and developed in aqueous alkaline solution, a hole pattern could be formed at a high accuracy by image reversal.

Japanese Patent Application No. 2011-025594 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of coating a resist composition onto a substrate, exposure, bake, and development in alkaline water to form a negative pattern,
the resist composition comprising a polymer comprising recurring units having a tertiary ester acid labile group containing a cyclic structure and/or an acetal acid labile group, adapted to turn soluble in alkaline developer under the reaction by acid, an acid generator and/or an acid, a photobase generator capable of generating an amino-containing compound, an optional quencher for neutralizing the acid generated by the acid generator for inactivation, and an organic solvent.

2. The process of claim 1 wherein the sum of a molar amount of amino group in the quencher and a molar amount of amino group in the compound generated by the photobase generator is greater than the sum of a molar amount of the acid generated by the acid generator and a molar amount of the acid separately added.

3. The process of claim 1 wherein the acid generator generates an acid upon exposure to radiation.

4. The process of claim 3 wherein the acid generator is to generates sulfonic acid, imide acid or methide acid upon exposure to radiation.

5. The process of claim 1 wherein the acid generator generates an acid upon application of heat.

6. The process of claim 5 wherein the acid generator is a thermal acid generator comprising a trialkylsulfonium salt of 1 to 10 carbon atoms.

7. The pattern forming process of claim 1, comprising the steps of coating a resist composition onto a substrate, bake, exposure, post-exposure bake, and development to form a negative pattern in which a more dose region of resist film is not dissolved and a less dose region of resist film is dissolved in alkaline developer,
the resist composition comprising a polymer comprising recurring units having a tertiary ester acid labile group containing a cyclic structure and/or an acetal acid labile group, adapted to turn soluble in alkaline developer under the reaction by acid, an acid, a photobase generator capable of generating an amino-containing compound, and an organic solvent.

8. The process of claim 7 wherein the molar amount of amino group in the compound generated by the photobase generator is greater than the molar amount of the acid separately added.

9. The process of claim 1, further comprising the step of forming a protective film on the resist film prior to the exposure step,
the protective film being formed of a material comprising a polymer having a 1,1,1,3,3,3-hexafluoro-2-propanol residue dissolved in an alcohol solvent of at least 4 carbon atoms, an ether solvent of 8 to 12 carbon atoms, or a mixture thereof.

10. A pattern forming process comprising the steps of coating a resist composition onto a substrate, bake, exposure, post-exposure bake, and development to form a negative pattern in which a more dose region of resist film is not dissolved and a less dose region of resist film is dissolved in alkaline developer,
the resist composition comprising a polymer comprising recurring units having a tertiary ester acid labile group containing a cyclic structure and/or an acetal acid labile group, adapted to turn soluble in alkaline developer under the reaction by acid, a sulfonium salt and/or iodonium salt, a photobase generator capable of generating an amino-containing compound, a quencher having an amino group for neutralizing the acid generated by the sulfonium salt and/or iodonium salt for inactivation, and an organic solvent,
wherein the sum of a molar amount of amino group in the quencher and a molar amount of amino group in the compound generated by the photobase generator is greater than the molar amount of the acid generated by the sulfonium salt and/or iodonium salt.

11. A pattern forming process comprising the steps of coating a resist composition onto a substrate, bake, exposure, post-exposure bake, and development to form a negative pattern in which a more dose region of resist film is not dissolved and a less dose region of resist film is dissolved in alkaline developer,
the resist composition comprising a polymer comprising recurring units having a tertiary ester acid labile group containing a cyclic structure and/or an acetal acid labile group and recurring units having a sulfonium salt, adapted to turn soluble in alkaline developer under the reaction by acid, a photobase generator capable of generating an amino-containing compound, a quencher having an amino group for neutralizing the acid generated by the sulfonium salt-containing recurring unit for inactivation, and an organic solvent,
wherein the sum of a molar amount of amino group in the quencher and a molar amount of amino group in the compound generated by the photobase generator is greater than the molar amount of the acid generated by the sulfonium salt-containing recurring unit.

12. The process of claim 10 or 11 wherein the acid generator is to generate sulfonic acid, imide acid or methide acid upon exposure to radiation.

13. The process of claim 1, 7, 10 or 11 wherein the photobase generator is photo-decomposed to generate an amino-containing compound.

14. The process of any one of claim 1, 7, 10 or 11 wherein the photobase generator has a partial structure represented by the following formula (i), (ii) or (iii)

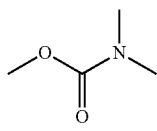
(i)

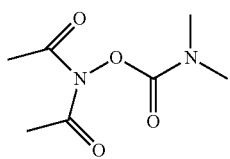
(ii)

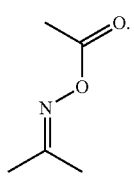
(iii)

15. The process of claim 14 wherein the photobase generator comprises a recurring unit (a1), (a2), (a3) or (a4) in the general formula (1), the recurring unit being attached to the backbone of the polymer,

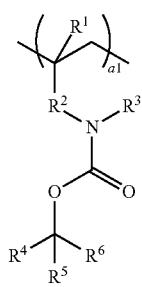
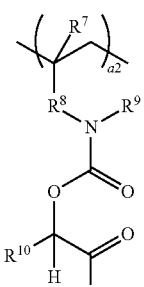
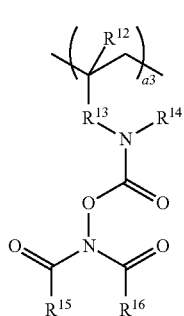
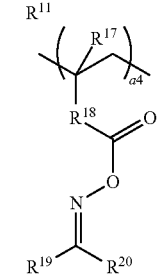
(1)

wherein $R^1$, $R^7$, $R^{12}$ and $R^{17}$ each are hydrogen or methyl, $R^2$, $R^8$, $R^{13}$ and $R^{18}$ each are a single bond, methylene, ethylene, phenylene, phenylmethylene, phenylethylene, phenylpropylene, or —C(=O)—O—$R^{21}$—, $R^{21}$ is a straight, branched or cyclic $C_1$-$C_{10}$ alkylene group, $C_6$-$C_{10}$ arylene group, or $C_2$-$C_{12}$ alkenylene group, $R^3$, $R^9$ and $R^{14}$ each are hydrogen, a straight, branched or cyclic $C_1$-$C_{10}$ alkyl group, or $C_6$-$C_{10}$ aryl group, or may bond with $R^{21}$ to form a ring with the nitrogen atom to which they are attached, $R^4$, $R^5$ and $R^6$ each are hydrogen, a straight, branched or cyclic $C_1$-$C_{10}$ alkyl group, or a $C_6$-$C_{14}$ aryl group which may contain a straight, branched or cyclic $C_1$-$C_6$ alkyl, $C_1$-$C_6$ alkoxy, nitro, halogen, cyano or trifluoromethyl radical, or a pair of $R^4$ and $R^5$, $R^5$ and $R^6$, or $R^4$ and $R^6$ may bond together to form a ring with the carbon atom to which they are attached, with the proviso that not all $R^4$, $R^5$ and $R^6$ are hydrogen nor all are alkyl, $R^{10}$ and $R^{11}$ each are a $C_6$-$C_{14}$ aryl group which may contain a straight, branched or cyclic $C_1$-$C_6$ alkyl, $C_1$-$C_6$ alkoxy, nitro, halogen, cyano, trifluoromethyl or carbonyl radical, $R^{15}$ and $R^{16}$ each are a straight or branched $C_1$-$C_6$ alkyl group, or $R^{15}$ and $R^{16}$ may bond together to form a ring with the carbon atoms to which they are attached and the nitrogen atom therebetween, the ring may contain a benzene ring, naphthalene ring, double bond or ether bond, $R^{19}$ and $R^{20}$ each are hydrogen, a straight, branched or cyclic $C_1$-$C_8$ alkyl group, or a $C_6$-$C_{14}$ aryl group which may have a substituent as listed for $R^4$, $R^5$ and $R^6$, at least one of $R^{19}$ and $R^{20}$ is aryl, or both $R^{19}$ and $R^{20}$ may be aryl, or $R^{19}$ and $R^{20}$ may bond together to form a ring with the carbon atom to which they are attached, a1, a2, a3, and a4 are in the range: $0 \leq a1 < 1.0$, $0 \leq a2 < 1.0$, $0 \leq a3 < 1.0$, $0 \leq a4 < 1.0$, and $0 < a1+a2+a3+a4 < 1.0$.

16. The process of claim 14 wherein the photobase generator is at least one compound selected from compounds having the general formulae (2) to (9):

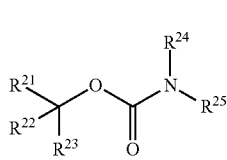
(2)

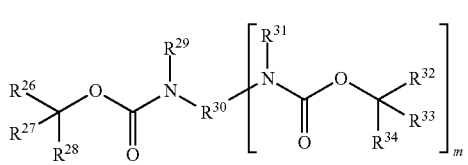
(3)

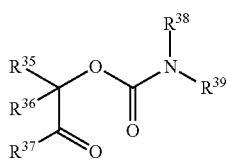
(4)

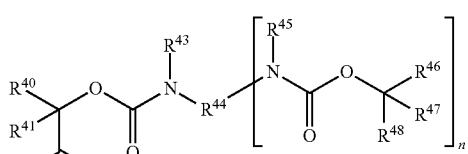
(5)

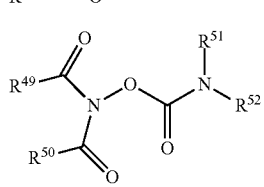
(6)

-continued

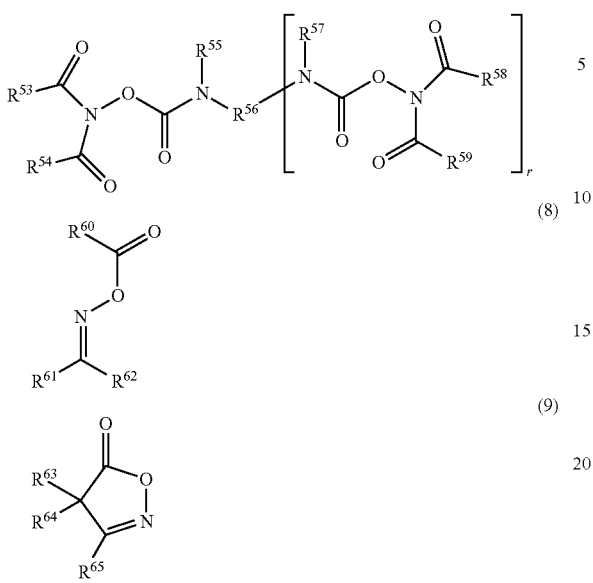

(7)

(8)

(9)

wherein $R^{21}$, $R^{22}$, $R^{23}$, $R^{26}$, $R^{27}$, $R^{28}$, $R^{32}$, $R^{33}$, $R^{34}$, $R^{35}$, $R^{36}$, $R^{37}$, $R^{40}$, $R^{41}$, $R^{42}$, $R^{46}$, $R^{47}$ and $R^{48}$ each are hydrogen, a straight, branched or cyclic $C_1$-$C_6$ alkyl group, or a $C_6$-$C_{14}$ aryl group which may contain a straight, branched or cyclic $C_1$-$C_6$ alkyl or alkoxy, nitro, halogen, cyano or trifluoromethyl radical, at least one of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ is an aryl group, and at least one is hydrogen, or at least two of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ may bond together to form a ring with the carbon atom to which they are attached, $R^{24}$, $R^{25}$, $R^{29}$, $R^{31}$, $R^{38}$, $R^{39}$, $R^{43}$, $R^{45}$, $R^{51}$, $R^{52}$, $R^{55}$ and $R^{57}$ each are hydrogen, or a straight, branched or cyclic $C_1$-$C_{12}$ alkyl group which may contain a double bond, ether, amino, carbonyl, hydroxyl, or ester radical, or a pair of $R^{24}$ and $R^{25}$, $R^{29}$ and $R^{31}$, $R^{29}$ and $R^{30}$, $R^{31}$ and $R^{30}$, $R^{38}$ and $R^{39}$, $R^{43}$ and $R^{44}$, $R^{44}$ and $R^{45}$, $R^{43}$ and $R^{45}$, $R^{51}$ and $R^{52}$, $R^{55}$, and $R^{56}$, $R^{55}$ and $R^{57}$, and $R^{56}$ and $R^{57}$ may bond together to form a ring with the nitrogen atom to which they are attached, $R^{30}$, $R^{44}$, and $R^{56}$ each are a single bond, a straight, branched or cyclic $C_1$-$C_{20}$ alkylene group, alkyne group, $C_6$-$C_{20}$ arylene group, $C_2$-$C_{12}$ alkenylene group, or $C_2$-$C_{12}$ alkynylene group, which may contain a double bond, ether, amino, carbonyl, hydroxyl or ester radical, $R^{49}$, $R^{50}$, $R^{53}$, $R^{54}$, $R^{58}$, and $R^{59}$ each are a straight or branched $C_1$-$C_6$ alkyl group, or a pair of $R^{49}$ and $R^{50}$, $R^{53}$ and $R^{54}$, and $R^{58}$ and $R^{59}$ may bond together to form a ring with the carbon atoms to which they are attached and the nitrogen atom therebetween, the ring may contain a benzene ring, naphthalene ring, double bond, or ether bond, $R^{60}$ is a straight, branched or cyclic $C_1$-$C_{16}$ alkyl group, $C_6$-$C_{20}$ aryl group, or $C_2$-$C_{20}$ alkenyl group, $R^{61}$ is a $C_6$-$C_{20}$ aryl group, $R^{62}$ is hydrogen, a straight, branched or cyclic $C_1$-$C_{16}$ alkyl group, or $C_6$-$C_{20}$ aryl group, $R^{63}$, $R^{64}$, and $R^{65}$ each are hydrogen, a straight, branched or cyclic $C_1$-$C_6$ alkyl group, $C_6$-$C_{14}$ aryl group, $C_2$-$C_{10}$ alkenyl or alkoxycarbonyl group, or cyano group, the alkyl, aryl, and alkenyl groups may contain a straight, branched or cyclic $C_1$-$C_6$ alkyl or alkoxy, alkoxycarbonyl, nitro, halogen, cyano, trifluoromethyl, sulfide, amino or ether radical, m, n and r each are 1 or 2.

17. The pattern forming process of claim 1, 7, 10 or 11 wherein the process involves positive/negative reversal, and the exposure step includes exposure to ArF excimer laser radiation of 193 nm wavelength, by the immersion lithography wherein water is interposed between a lens and the substrate or the dry lithography wherein air or nitrogen is present between a lens and the substrate.

18. The pattern forming process of claim 17 wherein positive/negative reversal is carried out by two exposures of two intersecting line patterns, or exposure of a dot pattern or lattice-like pattern.

19. The pattern forming process of claim 18 wherein the two intersecting line patterns, dot pattern or lattice-like pattern is borne on a halftone phase shift mask having a transmittance of 3 to 15%.

20. The process of claim 19 wherein the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed.

21. The process of claim 19 wherein the phase shift mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

* * * * *